(12) United States Patent
Murakami

(10) Patent No.: US 9,032,275 B2
(45) Date of Patent: May 12, 2015

(54) TRANSMISSION APPARATUS AND TRANSMISSION METHOD

(71) Applicant: Panasonic Intellectual Property Corporation of America, Torrance, CA (US)

(72) Inventor: Yutaka Murakami, Osaka (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 0 days.

(21) Appl. No.: 14/229,551

(22) Filed: Mar. 28, 2014

(65) Prior Publication Data

US 2014/0215293 A1  Jul. 31, 2014

Related U.S. Application Data

(63) Continuation of application No. 14/055,617, filed on Oct. 16, 2013, now Pat. No. 8,738,992, which is a continuation of application No. 13/145,018, filed as application No. PCT/JP2010/006668 on Nov. 12, 2010, now Pat. No. 8,595,588.

(30) Foreign Application Priority Data

| Nov. 13, 2009 | (JP) | ............................... | 2009-260503 |
| Jul. 12, 2010 | (JP) | ............................... | 2010-157991 |
| Jul. 30, 2010 | (JP) | ............................... | 2010-172577 |
| Oct. 14, 2010 | (JP) | ............................... | 2010-231807 |

(51) Int. Cl.
*H03M 13/00* (2006.01)
*H03M 13/11* (2006.01)
*H03M 13/13* (2006.01)

(52) U.S. Cl.
CPC ...... *H03M 13/1105* (2013.01); *H03M 13/1111* (2013.01); *H03M 13/1154* (2013.01); *H03M 13/13* (2013.01)

(58) Field of Classification Search
CPC ......... H04L 1/007; H04L 1/08; H04L 1/1829; H04L 1/1642; H04L 1/1621; H04L 29/06; H04L 1/1809; H04L 1/1848; H04L 69/324; H04W 28/04; H03M 13/1111; H03M 13/1154; H03M 13/13; H03M 13/1105
See application file for complete search history.

(56) References Cited

U.S. PATENT DOCUMENTS 8,595,588 B2   11/2013 Murakami
8,745,471 B2    6/2014 Murakami
(Continued)

FOREIGN PATENT DOCUMENTS

CN    101103533    1/2008
CN    101490964    7/2009
(Continued)

OTHER PUBLICATIONS

International Search Report dated Dec. 14, 2010.
(Continued)

*Primary Examiner* — Guerrier Merant
(74) *Attorney, Agent, or Firm* — Dickinson Wright PLLC

(57) ABSTRACT

An encoding method and encoder of a time-varying LDPC-CC with high error correction performance are provided. In an encoding method of performing low density parity check convolutional coding (LDPC-CC) of a time varying period of q using a parity check polynomial of a coding rate of (n−1)/n (where n is an integer equal to or greater than 2), the time varying period of q is a prime number greater than 3, the method receiving an information sequence as input and encoding the information sequence using Equation 1 as a g-th (g=0, 1, . . . , q−1) parity check polynomial to satisfy 0.

6 Claims, 75 Drawing Sheets

(56) References Cited

U.S. PATENT DOCUMENTS

| | | | |
|---|---|---|---|
| 2005/0058089 | A1 | 3/2005 | Vijayan |
| 2006/0195754 | A1 | 8/2006 | Shen |
| 2007/0157062 | A1 | 7/2007 | Lee |
| 2010/0180176 | A1 | 7/2010 | Yosoku |
| 2010/0205511 | A1 | 8/2010 | Murakami |
| 2010/0265865 | A9 | 10/2010 | Vijayan |
| 2014/0044094 | A1 | 2/2014 | Vijayan |

FOREIGN PATENT DOCUMENTS

| | | |
|---|---|---|
| EP | 1 837 999 | 9/2007 |
| EP | 2 068 450 | 6/2009 |
| JP | 2007-525102 | 8/2007 |
| JP | 2008-124613 | 5/2008 |
| JP | 2009-177228 | 8/2009 |
| JP | 2009-246926 | 10/2009 |

OTHER PUBLICATIONS

English translation of Search Report from annex of Chinese Office Action dated Dec. 4, 2013.
A. Pusane, et al., "On Deriving Good LDPC Convolutional Codes from QC LDPC Block Codes," Proceedings of the IEEE International Symposium on Information Theory, Nice, France, Jun. 24-29, 2007, pp. 1221-1225.
Cardinal, et al., "A New Approach for the Construction of Powerful LDPC Convolutional Codes," Proceedings of the IEEE Vehicular Technology Conference, Montreal, Quebec, Canada, May 11, 2008, pp. 1176-1180.
T. Kishigami, et al., "LDPC-Convolutional Codes for E-MBS FEC," Panasonic, IEEE 802.16 Broadband Wireless Access Working Group, <http://ieee802.org/16>, IEEE C802.16rn-09/0162, Jan. 5, 2009, pp. 1-6.
Truhachev, et al., "Distance Bounds for Periodically Time-Varying and Tail-Biting LDPC Convolutional Codes," IEEE Transactions on Information Theory, vol. 56, No. 9, Sep. 2010, pp. 4301-4308.
R. Gallager, "Low-Density Parity-Check Codes," IRE Transactions on Information Theory, IT-8, Cambridge, Massachusetts, 1962, pp. 21-28.
D. MacKay, "Good Error-Correcting Codes Based on Very Sparse Matrices," IEEE Transactions on Information Theory, vol. 45, No. 2, Mar. 1999, pp. 399-431.
M. Fossorier, "Quasi-Cyclic Low-Density Parity-Check Codes From Circulant Permutation Matrices," IEEE Transactions on Information Theory, vol. 50, No. 8, Aug. 2004, pp. 1788-1793.
M. Fossorier, et al., "Reduced Complexity Iterative Decoding of Low-Density Parity Check Codes Based on Belief Propagation," IEEE Transactions on Communications, vol. 47, No. 5, May 1999, pp. 673-680.
J. Chen, et al., "Reduced-Complexity Decoding of LDPC Codes," IEEE Transactions on Communications, vol. 53, No. 8, Aug. 2005, pp. 1288-1299.
J. Zhang, et al., "Shuffled Iterative Decoding," IEEE Transactions on Communications, vol. 53, No. 2, Feb. 2005, pp. 209-213.
"Amendment and Corrigendum to IEEE Std 802.16-2004," IEEE Standard for Local and Metropolitan Area Networks, IEEE Std 802.16e-2005, IEEE Std 802.16-2004/Cor1-2005, New York, NY, Feb. 28, 2006, pp. i-xxxix, 1-822.
A. Feltstrom, et al., "Time-Varying Periodic Convolutional Codes With Low-Density Parity-Check Matrix," IEEE Transactions on Information Theory, vol. 45, No. 6, Sep. 1999, pp. 2181-2191.
R. Tanner, et al., "LDPC Block and Convolutional Codes Based on Circulant Matrices," IEEE Transactions on Information Theory, vol. 50, No. 12, Dec. 2004, pp. 2966-2984.
H. Ma, et al., "On Tail Biting Convolutional Codes," IEEE Transactions on Communications, vol. COM-34, No. 2, Feb. 1986, pp. 104-111.
C. Weib, et al., "Code Construction and Decoding of Parallel Concatenated Tail-Biting Codes," IEEE Transactions on Information Theory, vol. 47, No. 1, Jan. 2001, pp. 366-386.
M. Tavares, et al., "Tail-Biting LDPC Convolutional Codes," Proceedings of the IEEE ISIT 2007, Nice, France, Jun. 24-29, 2007, pp. 2341-2345.
G. Miller, et al., "Bounds on the Maximum-Likelihood Decoding Error Probability of Low-Density Parity-Check Codes," IEEE Transactions on Information Theory, vol. 47, No. 7, Sorrento, Italy, Nov. 2001, pp. 2696-2710.
R. Gallager, "A Simple Derivation of the Coding Theorem and Some Applications," IEEE Transactions on Information Theory, vol. IT-11, No. 1, Jan. 1965, pp. 3-18.
A. Viterbi, "Error Bounds for Convolutional Codes and an Asymptotically Optimum Decoding Algorithm," IEEE Transactions on Information Theory, vol. IT-13, No. 2, Apr. 1967, pp. 260-269.
A. Viterbi, et al., "Principles of Digital Communication and Coding," McGraw-Hill Book Company, New York, NY, 1979, pp. 318-323.
Office Action dated Feb. 3, 2015 for U.S. Appl. No. 14/597,810.
Japanese Office Action dated Feb. 24, 2015.

$$H_{[0,n]} = \begin{pmatrix} h_1^{(0)}(0) & h_1^{(1)}(1) & \cdots & h_1^{(M)}(M) & 0 & \cdots & 0 & \cdots & 0 \\ h_2^{(0)}(0) & h_2^{(1)}(1) & \cdots & h_2^{(M)}(M) & 0 & & & & \vdots \\ 0 & h_1^{(0)}(1) & \cdots & \cdots & h_1^{(M)}(M+1) & \cdots & & & 0 \\ 0 & h_2^{(0)}(1) & \cdots & \cdots & h_2^{(M)}(M+1) & \cdots & & & h_1^{(M)}(n) \\ & 0 & \cdots & & & \cdots & & & h_2^{(M)}(n) \\ & & & & & & & & \vdots \\ & & & & & & & 0 & h_2^{(0)}(n) \end{pmatrix}$$

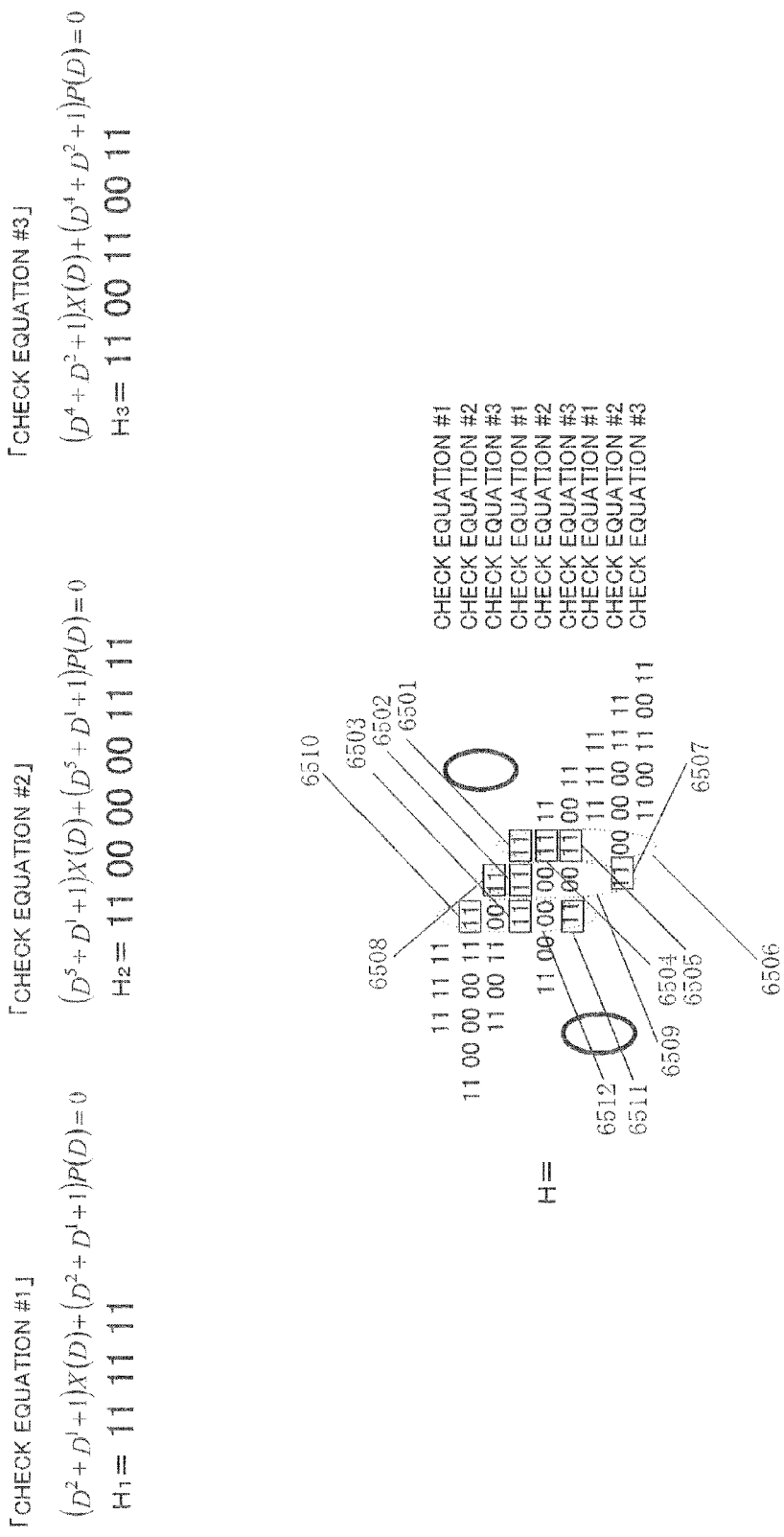

GENERATOR POLYNOMIAL $\quad G = [1 \ (D^2+1)/(D^2+D+1)]$

PARITY CHECK POLYNOMIAL $\quad (D^2+1)X(D)+(D^2+D+1)P(D)=0$

CHECK MATRIX H =

$$\begin{matrix}
1100000000000000000000000000000000000\ldots \\
0111000000000000000000000000000000000\ldots \\
1101100000000000000000000000000000000\ldots \\
0011011100000000000000000000000000000\ldots \\
0000110111000000000000000000000000000\ldots \\
0000001101110000000000000000000000000\ldots \\
0000000011011100000000000000000000000\ldots \\
0000000000110111000000000000000000000\ldots \\
0000000000001101110000000000000000000\ldots \\
\ldots\ldots\ldots\ldots\ldots\ldots\ldots\ldots\ldots\ldots\ldots\ldots\ldots
\end{matrix}$$

TRANSMISSION SEQUENCE wi = (xi, pi)

TRANSMISSION VECTOR w = (x1,p1,x2,p2,x3,p3,x4,p4,x5,p5,...,xi,pi,...)

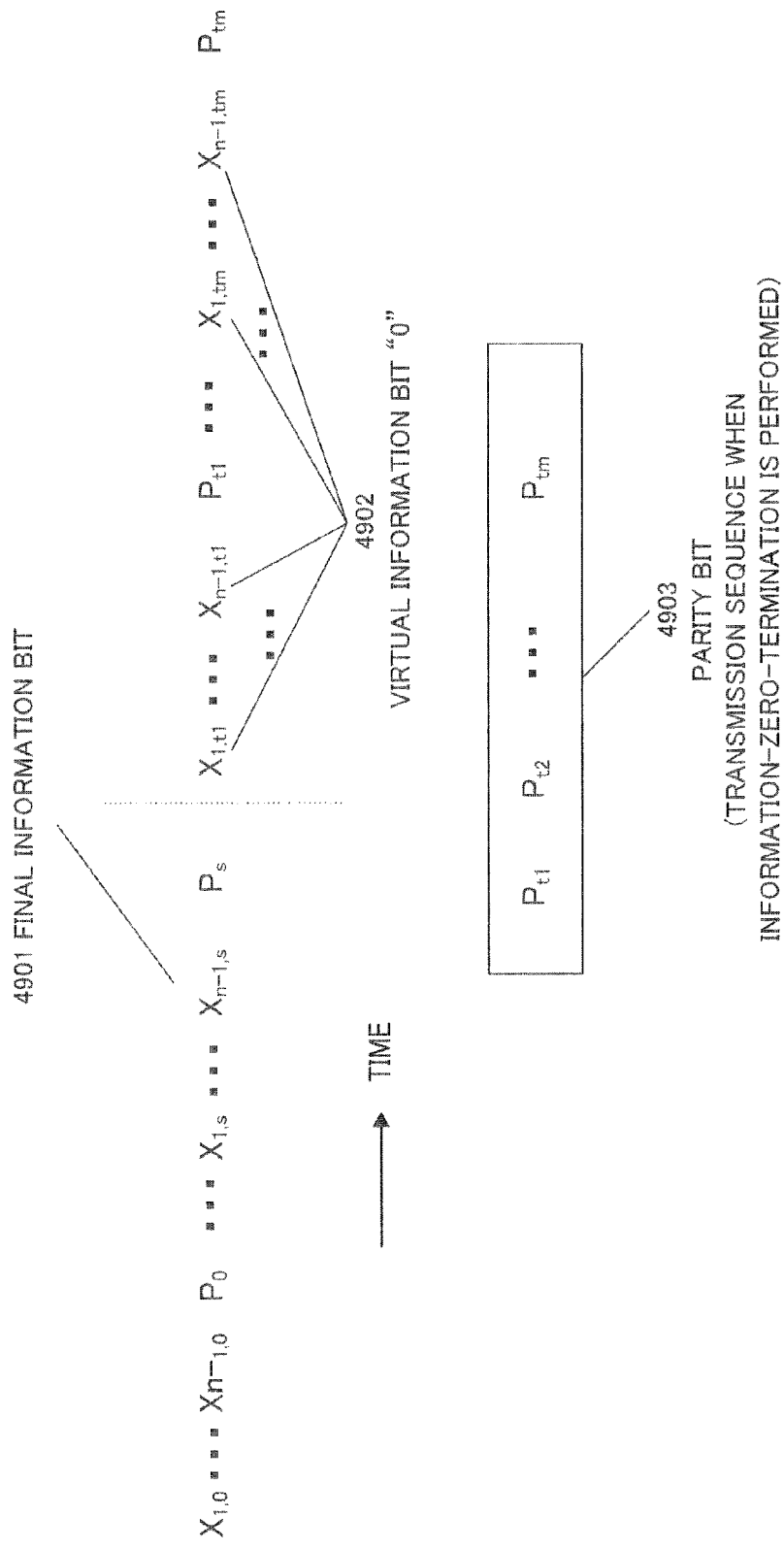

TIME-VARYING PERIOD $s = \text{LCM}(\alpha_1, \alpha_2, \cdots, \alpha_{n-2}, \alpha_{n-1}, \beta)$ $A_{X1,i}(D)X_1(D) + A_{X2,i}(D)X_2(D) + \cdots + A_{Xn-2,i}(D)X_{n-2}(D) + A_{Xn-1,i}(D)X_{n-1}(D) + B_i(D)P(D) =$ $(D^{a_{1,i,1}} + D^{a_{1,i,2}} + \cdots + D^{a_{1,i,r_{1,i}}})X_1(D) + (D^{a_{2,i,1}} + D^{a_{2,i,2}} + \cdots + D^{a_{2,i,r_{2,i}}})X_2(D) + \cdots$ $+ (D^{a_{n-1,i,1}} + D^{a_{n-1,i,2}} + \cdots + D^{a_{n-1,i,m-1,i}})X_{n-1}(D)$ $+ (D^{b_{i,1}} + D^{b_{i,2}} + \cdots + D^{b_{i,\omega_i}})P(D) =$ $\underbrace{X_1(D)\sum_{k=1}^{r_{1,i}} D^{a_{1,i,k}}}_{\text{TIME-VARYING PERIOD } \alpha_1} + \underbrace{X_2(D)\sum_{k=1}^{r_{2,i}} D^{a_{2,i,k}}}_{\text{TIME-VARYING PERIOD } \alpha_2} + \cdots + \underbrace{X_{n-2}(D)\sum_{k=1}^{r_{n-2,i}} D^{a_{n-2,i,k}}}_{\text{TIME-VARYING PERIOD } \alpha_{n-2}} + \underbrace{X_{n-1}(D)\sum_{k=1}^{r_{n-1,i}} D^{a_{n-1,i,k}}}_{\text{TIME-VARYING PERIOD } \alpha_{n-1}} + \underbrace{P(D)\sum_{k=1}^{\omega_i} D^{b_{i,k}}}_{\text{TIME-VARYING PERIOD } \beta} = 0$

FIG.59

TRANSMISSION APPARATUS AND TRANSMISSION METHOD

CROSS REFERENCE TO RELATED APPLICATIONS

This is a continuation application of application Ser. No. 14/055,617 filed Oct. 16, 2013, which is a continuation application of application Ser. No. 13/145,018 filed Jul. 18, 2011, which is a 371 application of PCT/JP2010/006668 filed Nov. 12, 2010, which is based on Japanese Application No. 2009-260503 filed Nov. 13, 2009, Japanese Application No. 2010-157991 filed Jul. 12, 2010, Japanese Application No. 2010-172577 filed Jul. 30, 2010, and Japanese Application No. 2010-231807 filed Oct. 14, 2010, the entire contents of each of which are incorporated by reference herein.

TECHNICAL FIELD

The present invention relates to an encoding method, decoding method, encoder and decoder using low density parity check convolutional codes (LDPC-CC) supporting a plurality of coding rates.

BACKGROUND ART

In recent years, attention has been attracted to a low-density parity-check (LDPC) code as an error correction code that provides high error correction capability with a feasible circuit scale. Because of its high error correction capability and ease of implementation, an LDPC code has been adopted in an error correction coding scheme for IEEE802.11n high-speed wireless LAN systems, digital broadcasting systems, and so forth.

An LDPC code is an error correction code defined by low-density parity check matrix H. Furthermore, the LDPC code is a block code having the same block length as the number of columns N of check matrix H (see Non-Patent Literature 1, Non-Patent Literature 2, Non-Patent Literature 3). For example, random LDPC code, QC-LDPC code (QC: Quasi-Cyclic) are proposed.

However, a characteristic of many current communication systems is that transmission information is collectively transmitted per variable-length packet or frame, as in the case of Ethernet (registered trademark). A problem with applying an LDPC code, which is a block code, to a system of this kind is, for example, how to make a fixed-length LDPC code block correspond to a variable-length Ethernet (registered trademark) frame. IEEE802.11n applies padding processing or puncturing processing to a transmission information sequence, and thereby adjusts the length of the transmission information sequence and the block length of the LDPC code. However, it is difficult to avoid the coding rate from being changed or a redundant sequence from being transmitted through padding or puncturing.

Studies are being carried out on LDPC-CC (Low-Density Parity-Check Convolutional Codes) capable of performing encoding or decoding on an information sequence of an arbitrary length for LDPC code (hereinafter, this will be represented by "LDPC-BC: Low-Density Parity-Check Block Code") of such a block code (e.g. see Non-Patent Literature 8 and Non-Patent Literature 9).

LDPC-CC is a convolutional code defined by a low density parity check matrix. For example, parity check matrix $H^T[0, n]$ of LDPC-CC of a coding rate of R=1/2(=b/c) is shown in FIG. 1. Here, element $h_1^{(m)}(t)$ of $H^T[0, n]$ takes 0 or 1.

All elements other than $h_1^{(m)}(t)$ are 0. M represents the LDPC-CC memory length, and n represents the length of an LDPC-CC codeword. As shown in FIG. 1, a characteristic of an LDPC-CC check matrix is that it is a parallelogram-shaped matrix in which 1 is placed only in diagonal terms of the matrix and neighboring elements, and the bottom-left and top-right elements of the matrix are zero.

An LDPC-CC encoder defined by parity check matrix $H^T[0, n]$ when $h_1^{(0)}(t)=1$ and $h_h^{(0)}(t)=1$ here is represented by FIG. 2. As shown in FIG. 2, an LDPC-CC encoder is formed with 2×(M+1) shift registers of a bit length of c and a mod2 adder (exclusive OR operator). Thus, a feature of the LDPC-CC encoder is that it can be realized with a very simple circuit compared to a circuit that performs multiplication of a generator matrix or an LDPC-BC encoder that performs calculation based on a backward (forward) substitution method.

Also, since the encoder in FIG. 2 is a convolutional code encoder, it is not necessary to divide an information sequence into fixed-length blocks when encoding, and an information sequence of any length can be encoded.

Patent Literature 1 describes an LDPC-CC generating method based on a parity check polynomial. In particular, Patent Literature 1 describes a method of generating an LDPC-CC using parity check polynomials of a time varying period of 2, time varying period of 3, time varying period of 4 and time varying period of a multiple of 3.

CITATION LIST

Patent Literature

PTL 1
Japanese Patent Application Laid-Open No. 2009-246926

Non-Patent Literature

NPL 1
R. G. Gallager, "Low-density parity check codes," IRE Trans. Inform. Theory, IT-8, pp-21-28, 1962.
NPL 2
D. J. C. Mackay, "Good error-correcting codes based on very sparse matrices," IEEE Trans. Inform. Theory, vol. 45, no. 2, pp 399-431, March 1999.
NPL 3
M. P. C. Fossorier, "Quasi-cyclic low-density parity-check codes from circulant permutation matrices," IEEE Trans. Inform. Theory, vol. 50, no. 8, pp. 1788-1793, November 2001.
NPL 4
M. P. C. Fossorier, M. Mihaljevic, and H. Imai, "Reduced complexity iterative decoding of low density parity check codes based on belief propagation," IEEE Trans. Commun., vol. 47., no. 5, pp. 673-680, May 1999.
NPL 5
J. Chen, A. Dholakia, E. Eleftheriou, M. P. C. Fossorier, and X.-Yu Hu, "Reduced-complexity decoding of LDPC codes," IEEE Trans. Commun., vol. 53., no. 8, pp. 1288-1299, August 2005.
NPL 6
J. Zhang, and M. P. C. Fossorier, "Shuffled iterative decoding," IEEE
Trans. Commun., vol. 53, no. 2, pp. 209-213, February 2005.
NPL 7
IEEE Standard for Local and Metropolitan Area Networks, IEEE P802.16e/D12, October 2005.

NPL 8
A. J. Feltstrorn, and K. S. Zigangirov, "Time-varying periodic convolutional codes with low-density parity-check matrix," IEEE Trans. Inform. Theory, vol. 45, no. 6, pp. 2181-2191, September 1999.

NPL 9
R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.

NPL 10
H. H. Ma, and J. K. Wolf, "On tail biting convolutional codes," IEEE Trans. Commun., vol. com-34, no. 2, pp. 104-111, February 1986.

NPL 11
C. Weib, C. Bettstetter, and S. Riedel, "Code construction and decoding of parallel concatenated tail-biting codes," IEEE Trans. Inform. Theory, vol. 47, no. 1, pp. 366-386, January 2001.

NPL 12
M. B. S. Tavares, K. S. Zigangirov, and G. P. Fettweis, "Tail-biting LDPC convolutional codes," Proc. of IEEE ISIT 2007, pp. 2341-2345, June 2007.

NPL 13
G. Muller, and D. Burshtein, "Bounds on the maximum likelihood decoding error probability of low-density parity check codes," IEEE Trans. Inf. Theory, vol. 47, no. 7, pp. 2696-2710, November 2001.

NPL 14
R. G. Gallager, "a simple derivation of the coding theorem and some applications," IEEE Trans. Inf. Theory, vol. IT-11, no. 1, pp. 3-18, January 1965.

NPL 15
A. J. Viterbi, "Error bounds for convolutional codes and an asymptotically optimum decoding algorithm," IEEE Trans. Inf. Theory, vol. IT-13, no. 2, pp. 260-269, April 1967.

NPL 16
A. J. Viterbi, and J. K. Omura, "Principles of digital communication and coding," McGraw-Hill, New York 1979.

SUMMARY OF INVENTION

Technical Problem

However, although Patent Literature 1 describes details of the method of generating an LDPC-CC of time varying periods of 2, 3 and 4, and a time varying period of a multiple of 3, the time varying periods are limited.

It is therefore an object of the present invention to provide an encoding method, decoding method, encoder and decoder of a time-varying LDPC-CC having high error correction capability.

Solution to Problem

One aspect of the encoding method of the present invention is an encoding method of performing low density parity check convolutional coding (LDPC-CC) of a time varying period of q using a parity check polynomial of a coding rate of (n−1)/n (where n is an integer equal to or greater than 2), the time varying period of q being a prime number greater than 3, the method receiving an information sequence as input and encoding the information sequence using equation 116 as the g-th (g=0, 1, . . . , q−1) parity check polynomial that satisfies 0.

One aspect of the encoding method of the present invention is an encoding method of performing low density parity check convolutional coding (LDPC-CC) of a time varying period of q using a parity check polynomial of a coding rate of (n−1)/n (where n is an integer equal to or greater than 2), the time varying period of q being a prime number greater than 3, the method receiving an information sequence as input and encoding the information sequence using a parity check polynomial that satisfies:

"$a_{\#0,k,1}\% q = a_{\#1,k,1}\% q = a_{\#2,k,1}\% q = a_{\#3,k,1}\% q = \ldots = a_{\#g,k,1}\% q = \ldots = a_{\#q-2,k,1}\% q = a_{\#q-1,k,1}\% q = v_{p=k}$ ($v_{p=k}$: fixed-value),"

"$b_{\#0,1}\% q = b_{\#1,1}\% q = b_{\#2,1}\% q = b_{\#3,1}\% q = \ldots = b_{\#g,1}\% q = \ldots = b_{\#q-2,1}\% q = b_{\#}q-1,1\% q = w$ ($w$: fixed-value),"

"$a_{\#0,k,2}\% q = a_{\#1,k,2}\% q = a_{\#2,k,2}\% q = a_{\#3,k,2}\% q = \ldots = a_{\#g,k,2}\% q = \ldots = a_{\#q-2,k,2}\% q = a_{\#q-1,k,2}\% q = v_{p=k}$ ($v_{p=k}$: fixed-value),"

"$b_{\#0,2}\% q = b_{\#1,2}\% q = b_{\#2,2}\% q = b_{\#3,2}\% q = \ldots = b_{\#g,2}\% q = \ldots = b_{\#q-2,2}\% q = b_{\#q-1,2}\% q = z$ ($z$: fixed-value)," and "$a_{\#0,k,3}\% q = a_{\#1,k,3}\% q = a_{\#2,k,2}\% q = a_{\#3,k,3}\% q = \ldots = a_{\#g,k,3}\% q = \ldots = a_{\#q-2,k,3}\% q = a_{\#q-1,k,3}\% q = s_{p=k}$ ($s_{p=k}$: fixed-value),"

of a g-th (g=0, 1, . . . , q−1) parity check polynomial that satisfies 0 represented by equation 117 for k=1, 2, . . . , n−1.

One aspect of the encoder of the present invention is an encoder that performs low density parity check convolutional coding (LDPC-CC) of a time varying period of q using a parity check polynomial of a coding rate of (n−1)/n (where n is an integer equal to or greater than 2), the time varying period of q being a prime number greater than 3, including a generating section that receives information bit $X_r[i]$ (r=1, 2, . . . , n−1) at point in time i as input, designates an equation equivalent to the g-th (g=0, 1, q−1) parity check polynomial that satisfies 0 represented by equation 116 as equation 118 and generates parity bit P[i] at point in time i using an equation with k substituting for g in equation 118 when i%q=k and an output section that outputs parity bit P[i].

One aspect of the decoding method of the present invention is a decoding method corresponding to the above-described encoding method for performing low density parity check convolutional coding (LDPC-CC) of a time varying period of q (prime number greater than 3) using a parity check polynomial of a coding rate of (n−1)/n (where n is an integer equal to or greater than 2), for decoding an encoded information sequence encoded using equation 116 as the g-th (g=0, 1, . . . , q−1) parity check polynomial that satisfies 0, the method receiving the encoded information sequence as input and decoding the encoded information sequence using belief propagation (BP) based on a parity check matrix generated using equation 116 which is the g-th parity check polynomial that satisfies 0.

One aspect of the decoder of the present invention is a decoder corresponding to the above-described encoding method for performing low density parity check convolutional coding (LDPC-CC) of a time varying period of q (prime number greater than 3) using a parity check polynomial of a coding rate of (n−1)/n (where n is an integer equal to or greater than 2), that performs decoding an encoded information sequence encoded using equation 116 as the g-th (g=0, 1, q−1) parity check polynomial that satisfies 0, including a decoding section that receives the encoded information sequence as input and decodes the encoded information sequence using belief propagation (BP) based on a parity check matrix generated using equation 116 which is the g-th parity check polynomial that satisfies 0.

Advantageous Effects of Invention

The present invention can achieve high error correction capability, and can thereby secure high data quality.

BRIEF DESCRIPTION OF DRAWINGS

FIG. 1 shows an LDPC-CC check matrix;
FIG. 3 shows an example of LDPC-CC check matrix of a time varying period of in;
FIG. 4A shows parity check polynomials of an LDPC-CC of a time varying period of 3 and the configuration of parity check matrix H of this LDPC-CC;
FIG. 5 shows a parity check matrix of a (7, 5) convolutional code;
FIG. 6 shows an example of the configuration of LDPC-CC check matrix H of a coding rate of 2/3 and a time varying period of 2;
FIG. 7 shows an example of the configuration of an LDPC-CC check matrix of a coding rate of 2/3 and a time varying period of m;
FIG. 8 shows an example of the configuration of an LDPC-CC check matrix of a coding rate of (n−1)/n and a time varying period of in.

FIG. 58 shows "information-zero-termination" of an LDPC-CC of a coding rate of (n−1)/n;

FIG. 59 shows an encoding method according to Embodiment 12;

DESCRIPTION OF EMBODIMENT

Figure 2:
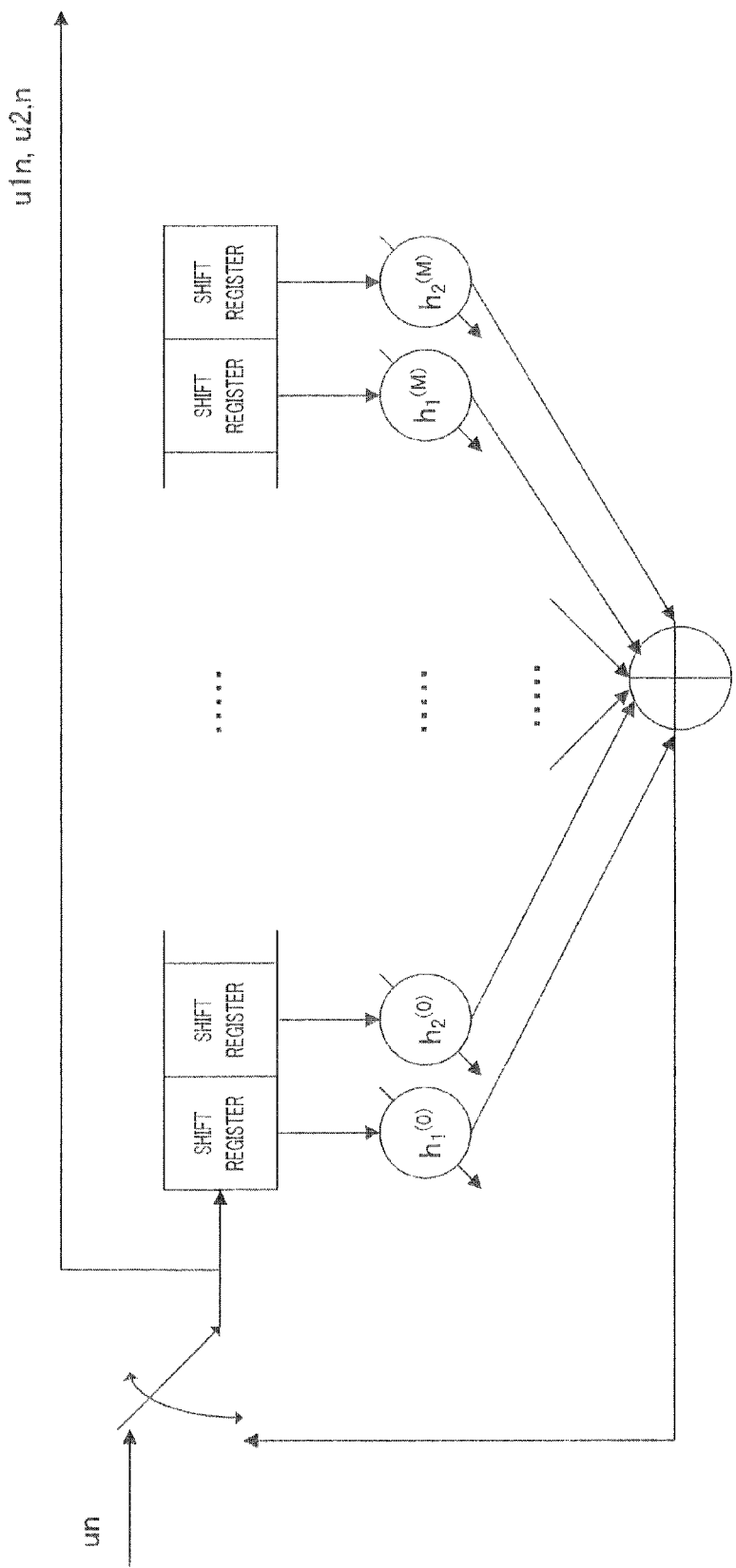
FIG. 2 shows a configuration of an LDPC-CC encoder.

Now, embodiments of the present invention will be described in detail with reference to the accompanying drawings.

Before describing specific configurations and operations of embodiments, an LDPC-CC based on parity check polynomials described in Patent Literature 1 will be described first.

[LDPC-CC Based on Parity Check Polynomial]

First, an LDPC-CC of a time varying period of 4 will be described. A case in which the coding rate is 1/2 is described below as an example.

Consider equations 1-1 to 1-4 as parity check polynomials of an LDPC-CC having a time varying period of 4. At this time, X(D) is a polynomial representation of data (information) and P(D) is a parity polynomial representation. Here, in equations 1-1 to 1-4, parity check polynomials have been assumed in which there are four terms in X(D) and P(D), respectively, the reason being that four terms are desirable from the standpoint of achieving good received quality.

[1]

$$(D^{a1}+D^{a2}+D^{a3}+D^{a4})X(D)+(D^{b1}+D^{b2}+D^{b3}+D^{b4})P(D)=0 \quad \text{(Equation 1-1)}$$

$$(D^{A1}+D^{A2}+D^{A3}+D^{A4})X(D)+(D^{B1}+D^{B2}+D^{B3}+D^{B4})P(D)=0 \quad \text{(Equation 1-2)}$$

$$(D^{\alpha1}+D^{\alpha2}+D^{\alpha3}+D^{\alpha4})X(D)+(D^{\beta1}+D^{\beta2}+D^{\beta3}+D^{\beta4})P(D)=0 \quad \text{(Equation 1-3)}$$

$$(D^{E1}+D^{E2}+D^{E3}+D^{E4})X(D)+(D^{F1}+D^{F2}+D^{F3}+D^{F4})P(D)=0 \quad \text{(Equation 1-4)}$$

In equation 1-1, it is assumed that a1, a2, a3 and a4 are integers (where a1≠a2≠a3≠a4, and a1 to a4 are all mutually different). Use of the notation "X≠Y≠...≠Z" is assumed to express the fact that X, Y, ..., Z are all mutually different. Also, it is assumed that b1, b2, b3 and b4 are integers (where b1≠b2≠b3·b4). A parity check polynomial of equation 1-1 is called "check equation #1," and a sub-matrix based on the parity check polynomial of equation 1-1 is designated first sub-matrix H1.

In equation 1-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 1-2 is called "check equation #2," and a sub-matrix based on the parity check polynomial of equation 1-2 is designated second sub-matrix $H_2$.

In equation 1-3, it is assumed that α1, α2, α3, and α4 are integers (where α1≠α2≠α3≠α4). Also, it is assumed that α1, β2, β3, and β4 are integers (where β1≠β2≠β3≠β4). A parity check polynomial of equation 1-3 is called "check equation #3," and a sub-matrix based on the parity check polynomial of equation 1-3 is designated third sub-matrix $H_3$.

In equation 1-4, it is assumed that E1, E2, E3, and E4 are integers (where E1≠E2≠E3≠E4). Also, it is assumed that F1, F2, F3, and F4 are integers (where F1≠F2≠F3≠F4). A parity check polynomial of equation 1-4 is called "check equation #4," and a sub-matrix based on the parity check polynomial of equation 1-4 is designated fourth sub-matrix $H_4$.

Figure 3:
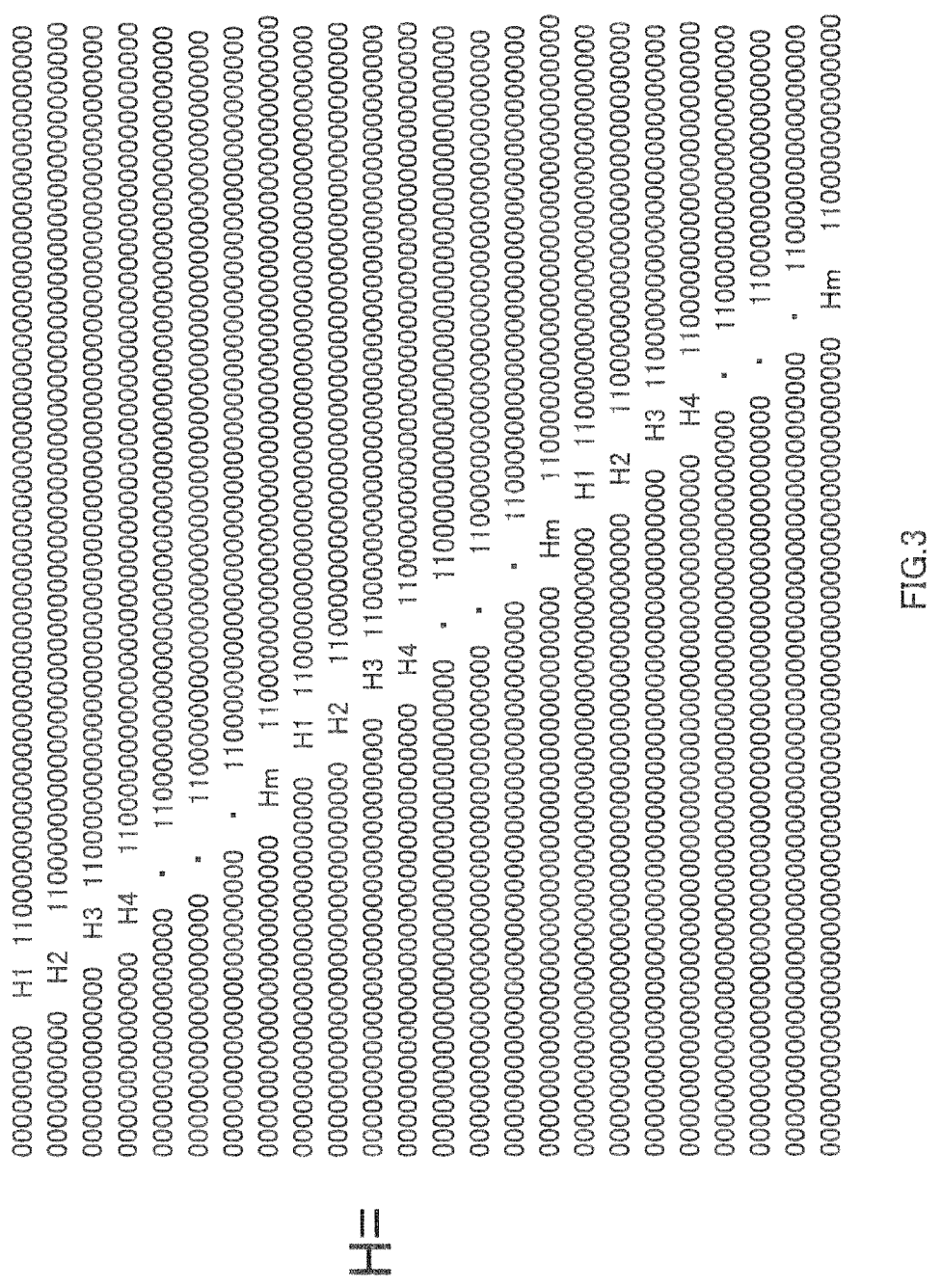

Next, consider an LDPC-CC of a time varying period of 4 that generates a check matrix as shown in FIG. 3 from first sub-matrix $H_1$, second sub-matrix $H_2$, third sub-matrix $H_3$ and fourth sub-matrix $H_4$.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), (α1, α2, α3, α4), (β1, β2, β3, β4), (E1, E2, E3, E4) and (F1, F2, F3, F4), in equations 1-1 to 1-4 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of the other parity check equations ("check equation #2," "check equation #3" and "check equation #4").

By this means, the column weight of parity check matrix H configured from equations 1-1 to 1-4 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 4, an LDPC-CC offering good reception performance can be achieved by generating an LDPC-CC as described above.

Table 1 shows examples of LDPC-CCs (LDPC-CCs #1 to #3) of a time varying period of 4 and a coding rate of 1/2 for which the above condition about "remainder" holds true. In table 1, LDPC-CCs of a time varying period of 4 are defined by four parity check polynomials: "check polynomial #1," "check polynomial #2," "check polynomial #3," and "check polynomial #4."

In equation 2-1, it is assumed that a1, a2, a3, and a4 are integers (where a1≠a2a3≠a4). Also, it is assumed that b1, b2, b3, and b4 are integers (where b1≠b2≠b3≠b4). A parity check polynomial of equation 2-1 is called "check equation #1," and a sub-matrix based on the parity check polynomial of equation 2-1 is designated first sub-matrix $H_1$.

In equation 2-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 2-2 is called "cheek equation #2," and a sub-matrix based on the parity check polynomial of equation 2-2 is designated second sub-matrix $H_2$.

Next, consider an LDPC-CC of a time varying period of 2 generated from first sub-matrix $H_1$ and second sub-matrix $H_2$.

At this time, if k is designated as a remainder after dividing the values of combinations of orders of X(D) and P(D), (a1,

TABLE 1

| Code | Parity check polynomial |
|---|---|
| LDPC-CC #1 of a time varying period of 4 and a coding rate of ½ | Check polynomial #1:<br>$(D^{458} + D^{435} + D^{341} + 1)X(D) + (D^{598} + D^{373} + D^{67} + 1)P(D) = 0$<br>Check polynomial #2:<br>$(D^{287} + D^{213} + D^{130} + 1)X(D) + (D^{545} + D^{542} + D^{103} + 1)P(D) = 0$<br>Check polynomial #3:<br>$(D^{557} + D^{495} + D^{326} + 1)X(D) + (D^{561} + D^{502} + D^{351} + 1)P(D) = 0$<br>Check polynomial #4:<br>$(D^{426} + D^{329} + D^{99} + 1)X(D) + (D^{321} + D^{55} + D^{42} + 1)P(D) = 0$ |
| LDPC-CC #2 of a time varying period of 4 and a coding rate of ½ | Check polynomial #1:<br>$(D^{503} + D^{454} + D^{49} + 1)X(D) + (D^{569} + D^{467} + D^{402} + 1)P(D) = 0$<br>Check polynomial #2:<br>$(D^{518} + D^{473} + D^{203} + 1)X(D) + (D^{598} + D^{499} + D^{145} + 1)P(D) = 0$<br>Check polynomial #3:<br>$(D^{403} + D^{397} + D^{62} + 1)X(D) + (D^{294} + D^{267} + D^{69} + 1)P(D) = 0$<br>Check polynomial #4:<br>$(D^{483} + D^{385} + D^{94} + 1)X(D) + (D^{426} + D^{415} + D^{413} + 1)P(D) = 0$ |
| LDPC-CC #3 of a time varying period of 4 and a coding rate of ½ | Check polynomial #1:<br>$(D^{454} + D^{447} + D^{17} + 1)X(D) + (D^{494} + D^{237} + D^{7} + 1)P(D) = 0$<br>Check polynomial #2:<br>$(D^{583} + D^{545} + D^{506} + 1)X(D) + (D^{325} + D^{71} + D^{66} + 1)P(D) = 0$<br>Check polynomial #3:<br>$(D^{430} + D^{425} + D^{407} + 1)X(D) + (D^{582} + D^{47} + D^{45} + 1)P(D) = 0$<br>Check polynomial #4:<br>$(D^{434} + D^{353} + D^{127} + 1)X(D) + (D^{345} + D^{207} + D^{38} + 1)P(D) = 0$ |

A case with a coding rate of 1/2 has been described above as an example, but even when the coding rate is (n−1)/n, if the above condition about "remainder" also holds true for four coefficient sets of information $X_1(D), X_2(D), \ldots, X_{n-1}(D)$, respectively, the code is still a regular LDPC code and good receiving quality can be achieved.

In the case of a time varying period of 2, also, it has been confirmed that a code with good characteristics can be found if the above condition about "remainder" is applied. An LDPC-CC of a time varying period of 2 with good characteristics is described below. A case in which the coding rate is 1/2 is described below as an example.

Consider equations 2-1 and 2-2 as parity check polynomials of an LDPC-CC having a time varying period of 2. At this time, X(D) is a polynomial representation of data (information) and P(D) is a parity polynomial representation. Here, in equations 2-1 and 2-2, parity check polynomials have been assumed in which there are four terms in X(D) and P(D), respectively, the reason being that four terms are desirable from the standpoint of achieving good received quality.

[2]

$$(D^{a1}+D^{a2}+D^{a3}+D^{a4})X(D)+(D^{b1}+D^{b2}+D^{b3}+D^{b4})P(D)=0 \quad \text{(Equation 2-1)}$$

$$(D^{A1}+D^{A2}+D^{A3}+D^{A4})X(D)+(D^{B1}+D^{B2}+D^{B3}+D^{B4})P(D)=0 \quad \text{(Equation 2-2)}$$

a2, a3, a4), (b1, b2, b3, b4), (A1, A2, A3, A4), (B1, B2, B3, B4), in equations 2-1 and 2-2 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of "check equation #2."

By this means, the column weight of parity check matrix H configured from equations 2-1 and 2-2 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 8, an LDPC-CC enabling reception performance to be further improved can be achieved by generating an LDPC-CC as described above.

Table 2 shows examples of LDPC-CCs (LDPC-CCs #1 and #2) of a time varying period of 2 and a coding rate of 1/2 for which the above condition about "remainder" holds true. In table 2, LDPC-CCs of a time varying period of 2 are defined by two parity check polynomials: "check polynomial #1" and "check polynomial #2."

TABLE 2

| Code | Parity check polynomial |
| --- | --- |
| LDPC-CC #1 of a time varying period of 2 and a coding rate of 1/2 | Check polynomial 1: $(D^{551} + D^{465} + D^{98} + 1)X(D) + (D^{407} + D^{386} + D^{373} + 1)P(D) = 0$<br>Check polynomial 2: $(D^{443} + D^{433} + D^{54} + 1)X(D) + (D^{559} + D^{557} + D^{546} + 1)P(D) = 0$ |
| LDPC-CC #2 of a time varying period of 2 and a coding rate of 1/2 | Check polynomial 1: $(D^{265} + D^{190} + D^{99} + 1)X(D) + (D^{295} + D^{246} + D^{69} + 1)P(D) = 0$<br>Check polynomial #2: $(D^{275} + D^{226} + D^{213} + 1)X(D) + (D^{298} + D^{147} + D^{45} + 1)P(D) = 0$ |

A case has been described above where (LDPC-CC of a time varying period of 2), the coding rate is 1/2 as an example, but even when the coding rate is $(n-1)/n$, if the above condition about "remainder" holds true for the four coefficient sets in information $X_1(D), X_2(D), \ldots, X_{n-1}(D)$, respectively, the code is still a regular LDPC code and good receiving quality can be achieved.

In the case of a time varying period of 3, also, it has been confirmed that a code with good characteristics can be found if the following condition about "remainder" is applied. An LDPC-CC of a time varying period of 3 with good characteristics is described below. A case in which the coding rate is 1/2 is described below as an example.

Consider equations 3-1 to 3-3 as parity check polynomials of an LDPC-CC having a time varying period of 3. At this time, X(D) is a polynomial representation of data (information) and P(D) is a parity polynomial representation. Here, in equations 3-1 to 3-3, parity check polynomials are assumed such that there are three terms in X(D) and P(D), respectively. [3]

$$(D^{a1}+D^{a2}+D^{a3}+D^{a4})X(D)+(D^{b1}+D^{b2}+D^{b3}+D^{b4})P(D)=0 \quad \text{(Equation 3-1)}$$

$$(D^{A1}+D^{A2}+D^{A3}+D^{A4})X(D)+(D^{B1}+D^{B2}+D^{B3}+D^{B4})P(D)=0 \quad \text{(Equation 3-2)}$$

In equation 3-1, it is assumed that a1, a2, and a3 are integers (where a1≠a2≠a3). Also, it is assumed that b1, b2 and b3 are integers (where b1≠b2≠b3). A parity check polynomial of equation 3-1 is called "check equation #1," and a sub-matrix based on the parity check polynomial of equation 3-1 is designated first sub-matrix $H_1$.

In equation 3-2, it is assumed that A1, A2 and A3 are integers (where A1≠A2≠A3). Also, it is assumed that B1, B2 and B3 are integers (where B1≠B2≠B3). A parity check polynomial of equation 3-2 is called "check equation #2," and a sub-matrix based on the parity check polynomial of equation 3-2 is designated second sub-matrix $H_2$.

In equation 3-3, it is assumed that α1, α2 and α3 are integers (where α1≠α2≠α3). Also, it is assumed that β1, β2 and β3 are integers (where β1≠β2≠β3). A parity check polynomial of equation 3-3 is called "check equation #3," and a sub-matrix based on the parity check polynomial of equation 3-3 is designated third sub-matrix $H_3$.

Next, consider an LDPC-CC of a time varying period of 3 generated from first sub-matrix $H_1$, second sub-matrix $H_2$ and third sub-matrix $H_3$.

At this time, if k is designated as a remainder after dividing the values of combinations of orders of X(D) and P(D), (a1, a2, a3), (b1, b2, b3), (A1, A2, A3), (B1, B2, B3), (α1, α2, α3) and (β1, β2, β3), in equations 3-1 to 3-3 by 3, provision is made for one each of remainders 0, 1, and 2 to be included in three-coefficient sets represented as shown above (for example, (a1, a2, a3)), and to hold true for all the above three-coefficient sets.

For example, if orders (a1, a2, a3) of X(D) of "check equation #1" are set as (a1, a2, a3)=(6, 5, 4), remainders k after dividing orders (a1, a2, a3) by 3 are (0, 2, 1), and one each of 0, 1, 2 are included in the three-coefficient set as remainders k. Similarly, if orders (b1, b2, b3) of P(D) of "check equation #1" are set as (b1, b2, b3)=(3, 2, 1), remainders k after dividing orders (b1, b2, b3) by 3 are (0, 2, 1), and one each of 0, 1, 2 are included in the three-coefficient set as remainders k. It is assumed that the above condition about "remainder" also holds true for the three-coefficient sets of X(D) and P(D) of "check equation #2" and "check equation #3."

By generating an LDPC-CC as above, it is possible to generate a regular LDPC-CC code in which the row weight is equal in all rows and the column weight is equal in all columns, without some exceptions. Here, "exceptions" refer to part in the beginning of a parity check matrix and part in the end of the parity check matrix, where the row weights and columns weights are not the same as row weights and column weights of the other part. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be achieved. This is because, when considered in column units, positions at which "1" is present are arranged so as to propagate belief accurately, as described above.

The above belief propagation will be described below using accompanying drawings. FIG. 4A shows parity check polynomials of an LDPC-CC of a time varying period of 3 and the configuration of parity check matrix H of this LDPC-CC.

"Check equation #1" illustrates a case in which (a1, a2, a3)=(2, 1, 0) and (b1, b2, b3)=(2, 1, 0) in a parity check polynomial of equation 3-1, and remainders after dividing the coefficients by 3 are as follows: (a1%3, a2%3, a3%3)=(2, 1, 0) and (b1%3, b2%3, b3%3)=(2, 1, 0), where "Z %3" represents a remainder after dividing Z by 3.

"Check equation #2" illustrates a case in which (A1, A2, A3)=(5, 1, 0) and (B1, B2, B3)=(5, 1, 0) in a parity check polynomial of equation 3-2, and remainders after dividing the coefficients by 3 are as follows: (A1%3, A2%3, A3%3)=(2, 1, 0) and (B1%3, B2%3, B3%3)=(2, 1, 0)

"Check equation #3" illustrates a case in which (α1, α2, α3)=(4, 2, 0) and (β1, β2, β3)=(4, 2, 0) in a parity check polynomial of equation 3-3, and remainders after dividing the coefficients by 3 are as follows: (α1%3, α2%3, α3%3)=(1, 2, 0) and (β1%3, β2%3, β3%3)=(1, 2, 0).

Therefore, the example of LDPC-CC of a time varying period of 3 shown in FIG. 4A satisfies the above condition about "remainder," that is, a condition that
(a1%3, a2%3, a3%3),
(b1%3, b2%3, b3%3), (A1%3, A2%3, A3%3),
(B1%3, B2%3, B3%3),
(α1%3, α2%3, α3%3) and
(β1%3, β2%3, β3%3) are any of the following: (0, 1, 2), (0, 2, 1), (1, 0, 2), (1, 2, 0), (2, 0, 1) and (2, 1, 0).

Returning to FIG. 4A again, belief propagation will now be explained. By column computation of column 6506 in BP decoding, for "1" of area 6201 of "check equation #1," belief is propagated from "1" of area 6504 of "check equation #2" and from "1" of area 6505 of "check equation #3." As described above, "1" of area 6201 of "check equation #1" is a coefficient for which a remainder after division by 3 is 0 (a3%3=0 (a3=0) or b3%3=0 (b3=0)). Also, "1" of area 6504 of "check equation #2" is a coefficient for which a remainder after division by 3 is 1 (A2%3=1 (A2=1) or B2%3=1 (B2=1)). Furthermore, "1" of area 6505 of "check equation #3" is a coefficient for which a remainder after division by 3 is 2 (α2%3=2 (α2=2) or β2%3=2 (β2=2)).

Thus, for "1" of area 6201 for which a remainder is 0 in the coefficients of "check equation #1," in column computation of column 6506 in BP decoding, belief is propagated from "1" of area 6504 for which a remainder is 1 in the coefficients of "check equation #2" and from "1" of area 6505 for which a remainder is 2 in the coefficients of "check equation #3."

Similarly, for "1" of area 6202 for which a remainder is 1 in the coefficients of "check equation #1," in column computation of column 6509 in BP decoding, belief is propagated from "1" of area 6507 for which a remainder is 2 in the coefficients of "check equation #2" and from "1" of area 6508 for which a remainder is 0 in the coefficients of "check equation #3."

Similarly, for "1" of area 6203 for which a remainder is 2 in the coefficients of "check equation #1," in column computation of column 6512 in BP decoding, belief is propagated from "1" of area 6510 for which a remainder is 0 in the coefficients of "check equation #2" and from "1" of area 6511 for which a remainder is 1 in the coefficients of "check equation #3."

Figure 4B:
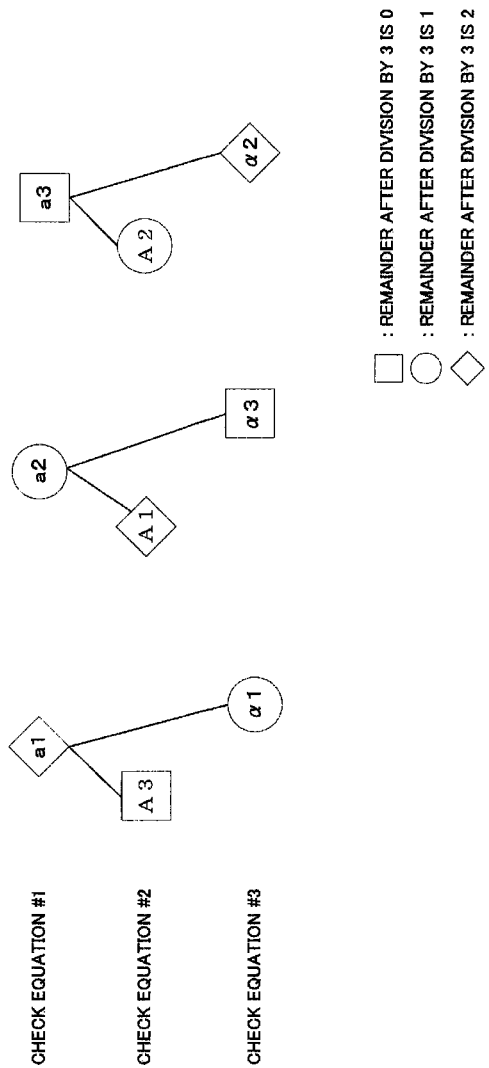
FIG. 4B shows the belief propagation relationship of terms relating to X(D) of "check equation #1" to "check equation #3" in FIG. 4A.

A supplementary explanation of belief propagation will now be given using FIG. 4B. FIG. 4B shows the belief propagation relationship of terms relating to X(D) of "check equation #1" to "check equation #3" in FIG. 4A. "Check equation #1" to "check equation #3" in FIG. 4A illustrate cases in which (a1, a2, a3)=(2, 1, 0), (A1, A2, A3)=(5, 1, 0), and (α1, α2, α3)=(4, 2, 0), in terms relating to X(D) of equations 3-1 to 3-3.

In FIG. 4B, terms (a3, A3, α3) inside squares indicate coefficients for which a remainder after division by 3 is 0, terms (a2, A2, α2) inside circles indicate coefficients for which a remainder after division by 3 is 1, and terms (a1, A1, α1) inside diamond-shaped boxes indicate coefficients for which a remainder after division by 3 is 2.

As can be seen from FIG. 4B, for a1 of "check equation #1," belief is propagated from A3 of "check equation #2" and from a1 of "check equation #3" for which remainders after division by 3 differ; for a2 of "check equation #1," belief is propagated from A1 of "check equation #2" and from α3 of "check equation #3" for which remainders after division by 3 differ; and, for a3 of "check equation #1," belief is propagated from A2 of "check equation #2" and from α2 of "check equation #3" for which remainders after division by 3 differ. While FIG. 4B shows the belief propagation relationship of terms relating to X(D) of "check equation #1" to "check equation #3," the same applies to terms relating to P(D).

Thus, for "check equation #1," belief is propagated from coefficients for which remainders after division by 3 are 0, 1, and 2 among coefficients of "check equation #2." That is to say, for "check equation #1," belief is propagated from coefficients for which remainders after division by 3 are all different among coefficients of "check equation #2." Therefore, beliefs with low correlation are all propagated to "check equation #1."

Similarly, for "check equation #2," belief is propagated from coefficients for which remainders after division by 3 are 0, 1, and 2 among coefficients of "check equation #1." That is to say, for "check equation #2," belief is propagated from coefficients for which remainders after division by 3 are all different among coefficients of "check equation #1." Also, for "check equation #2," belief is propagated from coefficients for which remainders after division by 3 are 0, 1, and 2 among coefficients of "check equation #3." That is to say, for "check equation #2," belief is propagated from coefficients for which remainders after division by 3 are all different among coefficients of "check equation #3."

Similarly, for "check equation #3," belief is propagated from coefficients for which remainders after division by 3 are 0, 1, and 2 among coefficients of "check equation #1." That is to say, for "check equation #3," belief is propagated from coefficients for which remainders after division by 3 are all different among coefficients of "check equation #1." Also, for "check equation #3," belief is propagated from coefficients for which remainders after division by 3 are 0, 1, and 2 among coefficients of "check equation #2." That is to say, for "check equation #3," belief is propagated from coefficients for which remainders after division by 3 are all different among coefficients of "check equation #2."

By providing for the orders of parity check polynomials of equations 3-1 to 3-3 to satisfy the above condition about "remainder" in this way, belief is necessarily propagated in all column computations, so that it is possible to perform belief propagation efficiently in all check equations and further increase error correction capability.

A case in which the coding rate is 1/2 has been described above for an LDPC-CC of a time varying period of 3, but the coding rate is not limited to 1/2. A regular LDPC code is also formed and good received quality can be achieved when the coding rate is (n−1)/n (where n is an integer equal to or greater than 2) if the above condition about "remainder" holds true for three-coefficient sets in information $X_1(D), X_2(D), \ldots, X_{n-1}(D)$.

A case in which the coding rate is (n−1)/n (where n is an integer equal to or greater than 2) is described below.

Consider equations 4-1 to 4-3 as parity check polynomials of an LDPC-CC having a time varying period of 3. At this time, $X_1(D), X_2(D), \ldots, X_{n-1}(D)$ are polynomial representations of data (information) $X_1, X_2, \ldots, X_{n-1}$ and P(D) is a polynomial representation of parity. Here, in equations 4-1 to 4-3, parity check polynomials are assumed such that there are three terms in $X_1(D), X_2(D), \ldots, X_{n-1}(D)$ and P(D), respectively.

[4]

$$(D^{a1,1}+D^{a1,2}+D^{a1,3})X_1(D)+(D^{a2,1}+D^{a2,2}+D^{a2,3})X_2(D)+\ldots+(D^{an-1,1}+D^{an-1,2}+D^{an-1,3})X_{n-1}(D)+(D^{b1}+D^{b2}+D^{b3})P(D)=0 \quad \text{(Equation 4-1)}$$

$$(D^{A1,1}+D^{A1,2}+D^{A1,3})X_1(D)+(D^{A2,1}+D^{A2,2}+D^{A2,3})X_2(D)+\ldots+(D^{An-1,1}+D^{An-1,2}+D^{An-1,3})X_{n-1}(D)+(D^{B1}+D^{B2}+D^{B3})P(D)=0 \quad \text{(Equation 4-2)}$$

$$(D^{\alpha1,1}+D^{\alpha1,2}+D^{\alpha1,3})X_1(D)+(D^{\alpha2,1}+D^{\alpha2,2}+D^{\alpha2,3})X_2(D)+\ldots+(D^{\alpha n-1,1}+D^{\alpha n-1,2}+D^{\alpha n-1,3})X_1(D)+(D^{\beta1}+D^{\beta2}+D^{\beta3})P(D)=0 \quad \text{(Equation 4-3)}$$

In equation 4-1, it is assumed that $a_{i,1}, a_{i,2},$ and $a_{i,3}$ (where i=1, 2, ..., n−1) are integers (where $a_{i,1} \neq a_{i,2} \neq a_{i,3}$). Also, it is assumed that b1, b2 and b3 are integers (where b1≠b2≠b3). A parity check polynomial of equation 4-1 is called "check equation #1," and a sub-matrix based on the parity check polynomial of equation 4-1 is designated first sub-matrix $H_1$.

In equation 4-2, it is assumed that $A_{i,1}$, $A_{i,2}$, and $A_{i,3}$ (where i=1, 2, ..., n-1) are integers (where $A_{i,1} \neq A_{i,2} \neq A_{i,3}$). Also, it is assumed that B1, B2 and B3 are integers (where B1≠B2≠B3). A parity check polynomial of equation 4-2 is called "check equation #2," and a sub-matrix based on the parity check polynomial of equation 4-2 is designated second sub-matrix $H_2$.

In equation 4-3, it is assumed that $\alpha_{i,1}$, $\alpha_{i,2}$, and $\alpha_{i,3}$ (where i=1, 2, ..., n-1) are integers (where $+_{i,1} \neq \alpha_{i,2} \neq \alpha_{i,3}$). Also, it is assumed that β1, β2 and β3 are integers (where β1≠β2≠≠β3). A parity check polynomial of equation 4-3 is called "check equation #3," and a sub-matrix based on the parity check polynomial of equation 4-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of orders of $X_1(D)$, $X_2(D)$, ..., $X_{n-1}(D)$ and P(D), $(a_{1,1}, a_{1,2}, a_{1,3})$,
$(a_{2,1}, a_{2,2}, a_{2,3})$, ...,
$(a_{n-1,1}, a_{n-1,2}, a_{n-1,3})$,
(b1, b2, b3),
$(A_{1,1}, A_{1,2}, A_{1,3})$,
$(A_{2,1}, A_{2,2}, A_{2,3})$, ...,
$(A_{n-1,1}, A_{n-1,2}, A_{n-1,3})$,
(B1, B2, B3),
$(\alpha_{1,1}, \alpha_{1,2}, \alpha_{1,3})$,
$(\alpha_{2,1}, \alpha_{2,2}, \alpha_{2,3})$, ...,
$(\alpha_{n-1,1}, \beta_{n-1,2}, \alpha_{n-1,3})$,
(β1, β2, β3), in equations 4-1 to 4-3 by 3, provision is made for one each of remainders 0, 1, and 2 to be included in three-coefficient sets represented as shown above (for example, $(a_{1,1}, a_{1,2}, a_{1,3})$), and to hold true for all the above three-coefficient sets.

That is to say, provision is made for
$(a_{1,1}\%3, a_{1,2}\%3, a_{1,3}\%3)$,
$(a_{2,1}\%3, a_{2,2}\%3, a_{2,3}\%3)$, ...,
$(a_{n-1,1}\%3, a_{n-1,2}\%3, a_{n-1,3}\%3)$,
(b1%3, b2%3, b3%3),
$(A_{1,1}\%3, A_{1,2}\%3, A_{1,3}\%3)$,
$(A_{2,1}\%3, A_{2,2}\%3, A_{2,3}\%3)$, ...,
$(A_{n-1,1}\%3, A_{n-1,2}\%3, A_{n-1,3}\%3)$,
(B1%3, B2%3, B3%3),
$(\alpha_{1,1}\%3, \alpha_{1,2}\%3, \alpha_{1,3}\%3)$,
$(\alpha_{2,1}\%3, \alpha_{2,2}\%3, \alpha_{2,3}\%3)$, ...,
$(\alpha_{n-1,1}\%3, \alpha_{n-1,2}\%3, \alpha_{n-1,3}\%3)$ and
(β1%3, β2%3, β3%3)
to be any of the following: (0, 1, 2), (0, 2, 1), (1, 0, 2), (1, 2, 0), (2, 0, 1) and (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be achieved in the same way as in the case of a coding rate of 1/2.

Table 3 shows examples of LDPC-CCs (LDPC-CCs #1, #2, #3, #4, #5 and #6) of a time varying period of 3 and a coding rate of 1/2 for which the above "remainder" related condition holds true. In table 3, LDPC-CCs of a time varying period of 3 are defined by three parity check polynomials: "check (polynomial) equation #1," "check (polynomial) equation #2" and "check (polynomial) equation #3."

TABLE 3

| Code | Parity check polynomial |
|---|---|
| LDPC-CC #1 of a time varying period of 3 and a coding rate of 1/2 | Check polynomial #1: $(D^{428} + D^{325} + 1)X(D) + (D^{538} + D^{332} + 1)P(D) = 0$<br>Check polynomial #2: $(D^{538} + D^{380} + 1)X(D) + (D^{449} + D^1 + 1)P(D) = 0$<br>Check polynomial #3: $(D^{583} + D^{170} + 1)X(D) + (D^{364} + D^{242} + 1)P(D) = 0$ |
| LDPC-CC #2 of a time varying period of 3 and a coding rate of 1/2 | Check polynomial #1: $(D^{562} + D^{71} + 1)X(D) + (D^{325} + D^{155} + 1)P(D) = 0$<br>Check polynomial #2: $D^{215} + D^{106} + 1)X(D) + (D^{566} + D^{142} + 1)P(D) = 0$<br>Check polynomial #3: $(D^{590} + D^{559} + 1)X(D) + (D^{127} + D^{110} + 1)P(D) = 0$ |
| LDPC-CC #3 of a time varying period of 3 and a coding rate of 1/2 | Check polynomial #1: $(D^{112} + D^{53} + 1)X(D) + (D^{110} + D^{88} + 1)P(D) = 0$<br>Check polynomial #2: $(D^{103} + D^{47} + 1)X(D) + (D^{85} + D^{83} + 1)P(D) = 0$<br>Check polynomial #3: $(D^{148} + D^{89} + 1)X(D) + (D^{146} + D^{49} + 1)P(D) = 0$ |
| LDPC-CC #4 of a time varying period of 3 and a coding rate of 1/2 | Check polynomial #1: $(D^{350} + D^{322} + 1)X(D) + (D^{448} + D^{338} + 1)P(D) = 0$<br>Check polynomial #2: $(D^{529} + D^{32} + 1)X(D) + (D^{238} + D^{188} + 1)P(D) = 0$<br>Check polynomial #3: $(D^{592} + D^{572} + 1)X(D) + (D^{578} + D^{568} + 1)P(D) = 0$ |
| LDPC-CC #5 of a time varying period of 3 and a coding rate of 1/2 | Check polynomial #1: $(D^{410} + D^{82} + 1)X(D) + (D^{835} + D^{47} + 1)P(D) = 0$<br>Check polynomial #2: $(D^{875} + D^{796} + 1)X(D) + (D^{962} + D^{871} + 1)P(D) = 0$<br>Check polynomial #3: $(D^{605} + D^{547} + 1)X(D) + (D^{950} + D^{439} + 1)P(D) = 0$ |

TABLE 3-continued

| Code | Parity check polynomial |
|---|---|
| LDPC-CC #6 of a time varying period of 3 and a coding rate of ½ | Check polynomial #1: $(D^{373} + D^{56} + 1)X(D) + (D^{406} + D^{218} + 1)P(D) = 0$<br>Check polynomial #2: $(D^{457} + D^{197} + 1)X(D) + (D^{491} + D^{22} + 1)P(D) = 0$<br>Check polynomial #3: $(D^{485} + D^{70} + 1)X(D) + (D^{236} + D^{181} + 1)P(D) = 0$ |

Furthermore, Table 4 shows examples of LDPC-CCs of a time varying period 3 and coding rates of 1/2, 2/3, 3/4 and 5/6, and Table 5 shows examples of LDPC-CCs of a time varying period 3 and coding rates of 1/2, 2/3, 3/4 and 4/5.

TABLE 4

| Code | Parity check polynomial |
|---|---|
| LDPC-CC of a time varying period of 3 and a coding rate of ½ | Check polynomial #1: $(D^{373} + D^{56} + 1)X_1(D) + (D^{406} + D^{218} + 1)P(D) = 0$<br>Check polynomial #2: $(D^{457} + D^{197} + 1)X_1(D) + (D^{491} + D^{22} + 1)P(D) = 0$<br>Check polynomial #3: $(D^{485} + D^{70} + 1)X_1(D) + (D^{236} + D^{181} + 1)P(D) = 0$ |
| LDPC-CC of a time varying period of 3 and a coding rate of ⅔ | Check polynomial #1:<br>$(D^{373} + D^{56} + 1)X_1(D) + (D^{86} + D^{4} + 1)X_2(D) + (D^{406} + D^{218} + 1)P(D) = 0$<br>Check polynomial #2:<br>$(D^{457} + D^{197} + 1)X_1(D) + (D^{368} + D^{295} + 1)X_2(D) + (D^{491} + D^{22} + 1)P(D) = 0$<br>Check polynomial #3:<br>$(D^{485} + D^{70} + 1)X_1(D) + (D^{475} + D^{398} + 1)X_2(D) + (D^{236} + D^{181} + 1)P(D) = 0$ |
| LDPC-CC of a time varying period of 3 and a coding rate of ¾ | Check polynomial #1: $(D^{373} + D^{56} + 1)X_1(D) + (D^{86} + D^{4} + 1)X_2(D) +$<br>$(D^{388} + D^{134} + 1)X_3(D) + (D^{406} + D^{218} + 1)P(D) = 0$<br>Check polynomial #2: $(D^{457} + D^{197} + 1)X_1(D) + (D^{368} + D^{295} + 1)X_2(D) +$<br>$(D^{155} + D^{136} + 1)X_3(D) + (D^{491} + D^{22} + 1)P(D) = 0$<br>Check polynomial #3: $(D^{485} + D^{70} + 1)X_1(D) + (D^{475} + D^{398} + 1)X_2(D) +$<br>$(D^{493} + D^{77} + 1)X_3(D) + (D^{236} + D^{181} + 1)P(D) = 0$ |
| LDPC-CC of a time varying period of 3 and a coding rate of ⅚ | Check polynomial #1:<br>$(D^{373} + D^{56} + 1)X_1(D) + (D^{86} + D^{4} + 1)X_2(D) + (D^{388} + D^{134} + 1)X_3(D) +$<br>$(D^{250} + D^{197} + 1)X_4(D) + (D^{295} + D^{113} + 1)X_5(D) + (D^{406} + D^{218} + 1)P(D) = 0$<br>Check polynomial #2:<br>$(D^{457} + D^{197} + 1)X_1(D) + (D^{368} + D^{295} + 1)X_2(D) + (D^{155} + D^{136} + 1)X_3(D) +$<br>$(D^{220} + D^{146} + 1)X_4(D) + (D^{311} + D^{115} + 1)X_5(D) + (D^{491} + D^{22} + 1)P(D) = 0$<br>Check polynomial #3:<br>$(D^{485} + D^{70} + 1)X_1(D) + (D^{475} + D^{398} + 1)X_2(D) + (D^{493} + D^{77} + 1)X_3(D) +$<br>$(D^{490} + D^{239} + 1)X_4(D) + (D^{394} + D^{278} + 1)X_5(D) + (D^{236} + D^{181} + 1)P(D) = 0$ |

TABLE 5

| Code | Parity check polynomial |
|---|---|
| LDPC-CC of a time varying period of 3 and a coding rate of ½ | Check polynomial #1: $(D^{268} + D^{164} + 1)X_1(D) + (D^{92} + D^{7} + 1)P(D) = 0$<br>Check polynomial #2 $(D^{370} + D^{317} + 1)X_1(D) + (D^{95} + D^{22} + 1)P(D) = 0$<br>Check polynomial #3: $(D^{346} + D^{86} + 1)X_1(D) + (D^{88} + D^{26} + 1)P(D) = 0$ |
| LDPC-CC of a time varying period of 3 and a coding rate of ⅔ | Check polynomial #1:<br>$(D^{268} + D^{164} + 1)X_1(D) + (D^{385} + D^{242} + 1)X_2(D) + (D^{92} + D^{7} + 1)P(D) = 0$<br>Check polynomial #2:<br>$(D^{370} + D^{317} + 1)X_1(D) + (D^{125} + D^{103} + 1)X_2(D) + (D^{95} + D^{22} + 1)P(D) = 0$<br>Check polynomial #3:<br>$(D^{346} + D^{86} + 1)X_1(D) + (D^{319} + D^{290} + 1)X_2(D) + (D^{88} + D^{26} + 1)P(D) = 0$ |
| LDPC-CC of a time varying period of 3 and a coding rate of ¾ | Check polynomial #1: $(D^{268} + D^{164} + 1)X_1(D) + (D^{385} + D^{242} + 1)X_2(D) +$<br>$(D^{343} + D^{284} + 1)X_3(D) + (D^{92} + D^{7} + 1)P(D) = 0$<br>Check polynomial #2: $(D^{370} + D^{317} + 1)X_1(D) + (D^{125} + D^{103} + 1)X_2(D) +$<br>$(D^{259} + D^{14} + 1)X_3(D) + (D^{95} + D^{22} + 1)P(D) = 0$<br>Check polynomial #3: $(D^{346} + D^{86} + 1)X_1(D) + (D^{319} + D^{290} + 1)X_2(D) +$<br>$(D^{145} + D^{11} + 1)X_3(D) + (D^{88} + D^{26} + 1)P(D) = 0$ |
| LDPC-CC of a time varying period of 3 and a coding rate of ⅘ | Check polynomial #1:<br>$(D^{268} + D^{164} + 1)X_1(D) + (D^{385} + D^{242} + 1)X_2(D) +$<br>$(D^{343} + D^{284} + 1)X_3(D) + (D^{310} + D^{113} + 1)X_4(D) + (D^{92} + D^{7} + 1)P(D) = 0$<br>Check polynomial #2:<br>$(D^{370} + D^{317} + 1)X_1(D) + (D^{125} + D^{103} + 1)X_2(D) +$<br>$(D^{259} + D^{14} + 1)X_3(D) + (D^{394} + D^{188} + 1)X_4(D) + (D^{95} + D^{22} + 1)P(D) = 0$<br>Check polynomial #3:<br>$(D^{346} + D^{86} + 1)X_1(D) + (D^{319} + D^{290} + 1)X_2(D) +$<br>$(D^{145} + D^{11} + 1)X_3(D) + (D^{239} + D^{67} + 1)X_4(D) + (D^{88} + D^{26} + 1)P(D) = 0$ |

It has been confirmed that, as in the case of a time varying period of 3, a code with good characteristics can be found if the condition about "remainder" below is applied to an LDPC-CC having a time varying period of a multiple of 3 (for example, 6, 9, 12, . . . ). An LDPC-CC of a multiple of a time varying period of 3 with good characteristics is described below. The case of an LDPC-CC of a coding rate of 1/2 and a time varying period of 6 is described below as an example.

Consider equations 5-1 to 5-6 as parity check polynomials of an LDPC-CC having a time varying period of 6.

[5]

$$(D^{a1,1}+D^{a1,2}+D^{a1,3})X(D)+(D^{b1,1}+D^{b1,2}+D^{b1,3})P(D)=\quad\text{(Equation 5-1)}$$

$$(D^{a2,1}+D^{a2,2}+D^{a2,3})X(D)+(D^{b2,1}+D^{b2,2}+D^{b2,3})P(D)=\quad\text{(Equation 5-2)}$$

$$(D^{a1,1}+D^{a1,2}+D^{a1,3})X(D)+(D^{b1,1}+D^{b1,2}+D^{b1,3})P(D)=\quad\text{(Equation 5-3)}$$

$$(D^{a3,1}+D^{a3,2}+D^{a3,3})X(D)+(D^{b3,1}+D^{b3,2}+D^{b3,3})P(D)=\quad\text{(Equation 5-4)}$$

$$(D^{a5,1}+D^{a5,2}+D^{a5,3})X(D)+(D^{b5,1}+D^{b5,2}+D^{b5,3})P(D)=\quad\text{(Equation 5-5)}$$

$$(D^{a6,1}+D^{a6,2}+D^{a6,3})X(D)+(D^{b6,1}+D^{b6,2}+D^{b6,3})P(D)=\quad\text{(Equation 5-6)}$$

At this time, X(D) is a polynomial representation of data (information) and P(D) is a parity polynomial representation. With an LDPC-CC of a time varying period of 6, if i %6=k (where k=0, 1, 2, 3, 4, 5) is assumed for parity Pi and information Xi at point in time i, a parity check polynomial of equation 5+(k+1) holds true. For example, if i=1, i %6=1 (k=1), equation 6 holds true.

[6]

$$(D^{a2,1}+D^{a2,2}+D^{a2,3})X_1+(D^{b2,1}+D^{b2,2}+D^{b2,3})P_1=0 \quad\text{(Equation 6)}$$

Here, in equations 5-1 to 5-6, parity check polynomials are assumed such that there are three terms in X(D) and P(D), respectively.

In equation 5-1, it is assumed that a1,1, a1,2, a1,3 are integers (where a1, 1≠a1, 2≠a1, 3). Also, it is assumed that b1,1, b1,2, and b1,3 are integers (where b1, 1≠b1, 2≠b1,3). A parity check polynomial of equation 5-1 is called "check equation #1," and a sub-matrix based on the parity check polynomial of equation 5-1 is designated first sub-matrix $H_1$.

In equation 5-2, it is assumed that a2,1, a2,2, and a2,3 are integers (where a2, 1≠a2, 2≠a2,3). Also, it is assumed that b2,1, b2,2, and b2,3 are integers (where b2, 1≠b2, 2≠b2,3). A parity check polynomial of equation 5-2 is called "check equation #2," and a sub-matrix based on the parity check polynomial of equation 5-2 is designated second sub-matrix $H_2$.

In equation 5-3, it is assumed that a3,1, a3,2, and a3,3 are integers (where a3,1≠a3,2≠a3,3). Also, it is assumed that b3,1, b3,2, and b3,3 are integers (where b3,1≠b3,2≠b3,3). A parity check polynomial of equation 5-3 is called "check equation #3," and a sub-matrix based on the parity check polynomial of equation 5-3 is designated third sub-matrix $H_3$.

In equation 5-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of equation 5-4 is called "check equation #4," and a sub-matrix based on the parity check polynomial of equation 5-4 is designated fourth sub-matrix $H_4$.

In equation 5-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of equation 5-5 is called "check equation #5," and a sub-matrix based on the parity check polynomial of equation 5-5 is designated fifth sub-matrix $H_5$.

In equation 5-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of equation 5-6 is called "check equation #6," and a sub-matrix based on the parity check polynomial of equation 5-6 is designated sixth sub-matrix $H_6$.

Next, an LDPC-CC of a time varying period of 6 is considered that is generated from first sub-matrix $H_1$, second sub-matrix $H_2$, third sub-matrix $H_3$, fourth sub-matrix $H_4$, fifth sub-matrix $H_5$ and sixth sub-matrix $H_6$.

At this time, if k is designated as a remainder after dividing the values of combinations of orders of X(D) and P(D), (a1,1, a1,2, a1,3),
(b1,1, b1,2, b1,3),
(a2,1, a2,2, a2,3),
(b2,1, b2,2, b2,3),
(a3,1, a3,2, a3,3),
(b3,1, b3,2, b3,3),
(a4,1, a4,2, a4,3),
(b4,1, b4,2, b4,3),
(a5,1, a5,2, a5,3),
(b5,1, b5,2, b5,3),
(a6,1, a6,2, a6,3),
(b6,1, b6,2, b6,3), in equations 5-1 to 5-6 by 3, provision is made for one each of remainders 0, 1, and 2 to be included in three-coefficient sets represented as shown above (for example, (a1,1, a1,2, a1,3)), and to hold true for all the above three-coefficient sets.

That is to say, provision is made for
(a1,1%3, a1,2%3, a1,3%3),
(b1,1%3, b1,2%3, b1,3%3),
(a2,1%3, a2,2%3, a2,3%3),
(b2,1%3, b2,2%3, b2,3%3),
(a3,1%3, a3,2%3, a3,3%3),
(b3,1%3, b3,2%3, b3,3%3),
(a4,1%3, a4,2%3, a4,3%3),
(b4,1%3, b4,2%3, b4,3%3),
(a5,1%3, a5,2%3, a5,3%3),
(b5,1%3, b5,2%3, b5,3%3),
(a6,1%3, a6,2%3, a6,3%3) and
(b6,1%3, b6,2%3, b6,3%3) to be any of the following: (0, 1, 2), (0, 2, 1), (1, 0, 2), (1, 2, 0), (2, 0, 1) and (2, 1, 0).

By generating an LDPC-CC in this way, if an edge is present when a Tanner graph is drawn for "check equation #1," belief in "check equation #2 or check equation #5" and belief in "check equation #3 or check equation #6" are propagated accurately.

Also, if an edge is present when a Tanner graph is drawn for "check equation #2," belief in "check equation #1 or check equation #4" and belief in "check equation #3 or check equation #6" are propagated accurately.

If an edge is present when a Tanner graph is drawn for "check equation #3," belief in "check equation #1 or check equation #4" and belief in "check equation #2 or check equation #5" are propagated accurately. If an edge is present when a Tanner graph is drawn for "check equation #4," belief in "check equation #2 or check equation #5" and belief in "check equation #3 or check equation #6" are propagated accurately.

If an edge is present when a Tanner graph is drawn for "check equation #5," belief in "check equation #1 or check equation #4" and belief in "check equation #3 or check equation #6" are propagated accurately. If an edge is present when a Tanner graph is drawn for "check equation #6," belief in "check equation #1 or check equation #4" and belief in "check equation #2 or check equation #5" are propagated accurately.

Consequently, an LDPC-CC of a time varying period of 6 can maintain better error correction capability in the same way as when the time varying period is 3.

Figure 4C:
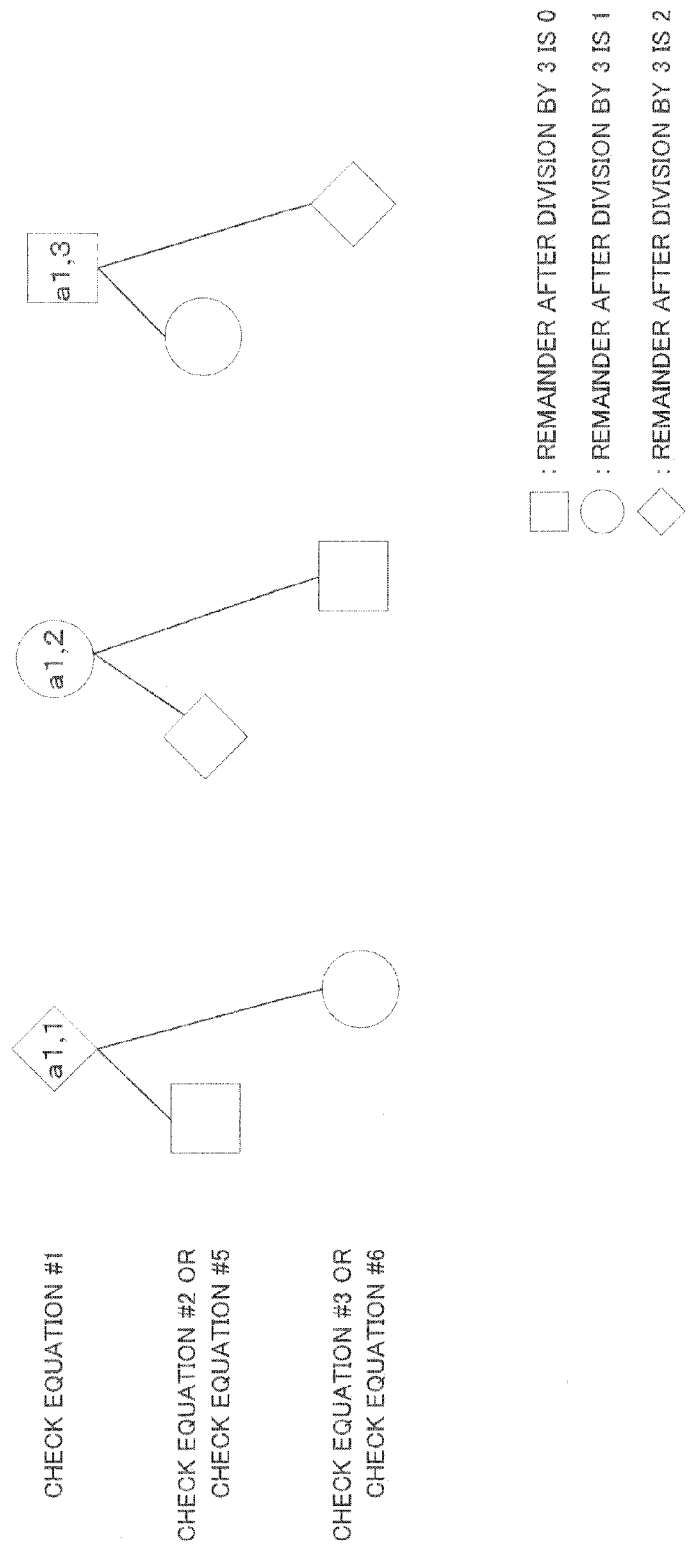
FIG. 4C shows the belief propagation relationship of terms relating to X(D) of "check equation #1" to "check equation #6"

In this regard, belief propagation will be described using FIG. 4C. FIG. 4C shows the belief propagation relationship of terms relating to X(D) of "check equation #1" to "check equation #6." In FIG. 4C, a square indicates a coefficient for which a remainder after division by 3 in ax, y (where x=1, 2, 3, 4, 5, 6, and y=1, 2, 3) is 0.

A circle indicates a coefficient for which a remainder after division by 3 in ax, y (where x=1, 2,3, 4, 5, 6, and y=1, 2, 3) is 1. A diamond-shaped box indicates a coefficient for which a remainder after division by 3 in ax, y (where x=1, 2, 3, 4, 5, 6, and y=1, 2, 3) is 2.

As can be seen from FIG. 4C, if an edge is present when a Tanner graph is drawn, for a1,1 of "check equation #1," belief is propagated from "check equation #2 or #5" and "check equation #3 or #6" for which remainders after division by 3 differ. Similarly, if an edge is present when a Tanner graph is drawn, for a1,2 of "check equation #1," belief is propagated from "check equation #2 or #5" and "check equation #3 or #6" for which remainders after division by 3 differ.

Similarly, if an edge is present when a Tanner graph is drawn, for a1,3 of "check equation #1," belief is propagated from "check equation #2 or #5" and "check equation #3 or #6" for which remainders after division by 3 differ. While FIG. 4C shows the belief propagation relationship of terms relating to X(D) of "check equation #1" to "check equation #6," the same applies to terms relating to P(D).

Thus, belief is propagated to each node in a Tanner graph of "check equation #1" from coefficient nodes of other than "check equation #1." Therefore, beliefs with low correlation are all propagated to "check equation #1," enabling an improvement in error correction capability to be expected.

In FIG. 4C, "check equation #1" has been focused upon, but a Tanner graph can be drawn in a similar way for "check equation #2" to "check equation #6," and belief is propagated to each node in a Tanner graph of "check equation #K" from coefficient nodes of other than "check equation #K." Therefore, beliefs with low correlation are all propagated to "check equation #K" (where K=2, 3, 4, 5, 6), enabling an improvement in error correction capability to be expected.

By providing for the orders of parity check polynomials of equations 5-1 to 5-6 to satisfy the above condition about "remainder" in this way, belief can be propagated efficiently in all check equations, and the possibility of being able to further improve error correction capability is increased.

A case in which the coding rate is 1/2 has been described above for an LDPC-CC of a time varying period of 6, but the coding rate is not limited to 1/2. The possibility of achieving good received quality can be increased when the coding rate is (n−1)/n (where n is an integer equal to or greater than 2) if the above condition about "remainder" holds true for three-coefficient sets in information $X_1(D), X_2(D), \ldots, X_{n-1}(D)$.

A case in which the coding rate is (n−1)/n (where n is an integer equal to or greater than 2) is described below.

Consider equations 7-1 to 7-6 as parity check polynomials of an LDPC-CC having a time varying period of 6.

[7]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 7-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 7-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 7-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+\ldots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 7-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+\ldots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 7-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+\ldots+(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Equation 7-6)}$$

At this time, $X_1(D), X_2(D), \ldots, X_{n-1}(D)$ are polynomial representations of data (information) $X_1, X_2, \ldots, X_n-1$ and P(D) is a polynomial representation of parity. Here, in equations 7-1 to 7-6, parity check polynomials are assumed such that there are three terms in $X_1(D), X_2(D), \ldots, X_{n-1}(D)$ and P(D), respectively. As in the case of the above coding rate of 1/2, and in the case of a time varying period of 3, the possibility of being able to achieve higher error correction capability is increased if the condition below (<Condition #1>) is satisfied in an LDPC-CC of a time varying period of 6 and a coding rate of (n−1)/n (where n is an integer equal to or greater than 2) represented by parity check polynomials of equations 7-1 to 7-6.

In an LDPC-CC of a time varying period of 6 and a coding rate of (n−1)/n (where n is an integer equal to or greater than 2), the parity bit and information bits at point in time i are represented by Pi and $X_{i,1}, X_{i,2}, \ldots, X_{i,n-1}$, respectively. If i %6=k (where k=0, 1, 2, 3, 4, 5) is assumed at this time, a parity check polynomial of equation 7-(k+1) holds true. For example, if i=8, i %6=2 (k=2), equation 8 holds true.

[8]

$$(D^{a\#3,1,1}+D^{a\#3,1,2}+D^{a\#3,1,3})X_{8,1}+(D^{a\#3,2,1}+D^{a\#3,2,2}+a\cdot3,2,3)X_{8,2}+\ldots+(D^{a\#3,n-1,1}+D^{a\#3,n-1,2}+D^{a\#3,n-1,3})X_{8,n-1}+(D^{b\#3,1}+D^{b\#3,2}+D^{b\#3,3})P_8=0 \quad \text{(Equation 8)}$$

<Condition #1>

In equations 7-1 to 7-6, combinations of orders of X1(D), X2(D), Xn−1 (D) and P(D) satisfy the following condition:

$(a_{\#1,1,1}\%3, a_{\#1,1,2}\%3, a_{\#1,1,3}\%3)$,
$(a_{\#1,2,1}\%3, a_{\#1,2,2}\%3, a_{\#1,2,3}\%3), \ldots$,
$(a_{\#1,k,1}\%3, a_{\#1,k,2}\%3, a_{\#1,k,3}\%3), \ldots$,
$(a_{\#1,n-1,1}\%3, a_{\#1,n-1,2}\%3, a_{\#1,k,3}\%3)$ and
$(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0) (where k=1, 2, 3, …, n−1);
$(a_{\#2,1,1}\%3, a_{\#2,1,2}\%3, a_{\#2,1,3}\%3)$,
$(a_{\#2,2,1}\%3, a_{\#2,2,2}\%3, a_{\#2,2,3}\%3), \ldots$,
$(a_{\#2,k,1}\%3, a_{\#2,k,2}\%3, a_{\#2,k,3}\%3), \ldots$,
$(a_{\#2,n-1,1}\%3, a_{\#2,n-1,2}\%3, a_{\#2,n-1,3}\%3)$ and
$(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0) (where k=1, 2, 3, n−1);
$(a_{\#3,1,1}\%3, a_{\#3,1,2}\%3, a_{\#3,1,3}\%3)$,
$(a_{\#3,2,1}\%3, a_{\#3,2,2}\%3, a_{\#3,2,3}\%3), \ldots$,
$(a_{\#3,k,1}\%3, a_{\#3,k,2}\%3, a_{\#3,k,3}\%3), \ldots$,
$(a_{\#3,n-1,1}\%3, a_{\#3,n-1,2}\%3, a_{\#3,n-1,3}\%3)$ and
$(b_{\#3,1}\%3, b_{\#3,2}\%3, b_{\#3,3}\%3)$ are any of (0, 1, 2), (0, 2, 1), (1, 0, 2), (1, 2, 0), (2, 0, 1), or (2, 1, 0) (where k=1, 2, 3, …, n−1);
$(a_{\#4,1,1}\%3, a_{\#4,1,2}\%3, a_{\#4,1,3}\%3)$,
$(a_{\#4,2,1}\%3, a_{\#4,2,2}\%3, a_{\#4,2,3}\%3), \ldots$,
$(a_{4,k,1}\%3, a_{\#4,k,2}\%3, a_{\#4,k,3}\%3), \ldots$,
$(a_{\#4,n-1,1}\%3, a_{\#4,n-1,2}\%3, a_{\#4,1,3}\%3)$ and $(b_{\#4,1}\%3, b_{\#4,2}\%3, b_{\#4,3}\%3)$ are any of (0, 1, 2), (0, 2), (1, 0, 2), (1, 2, 0), (2, 0, 1), or (2, 1, 0) (where k=1, 2, 3, . . . , n−1);

$(a_{\#5,1,1}\%3, a_{\#5,1,2}\%3, a_{\#5,1,3}\%3)$, $(a_{\#5,1,1}\%3, a_{\#5,2,2}\%3, a_{\#5,2,3}\%3)$, . . . , $(a_{\#5,k,1}\%3, a_{\#5,k,2}\%3, a_{\#5,k,3}\%3)$, . . . , $(a_{\#5,n-1,1}\%3, a_{\#5,n-1,2}\%3, a_{\#5,n-1,3}\%3)$ and $(b_{\#5,1}\%3, 5,2\%3, b_{\#5,3}\%3)$ are any of (0, 1, 2), (0, 2, 1), (1, 0, 2), (1, 2, 0), (2, 0, 1), or (2, 1, 0) (where k=1, 2, 3, . . . , n−1); and $(a_{\#6,1,1}\%3, a_{\#6,1,2}\%3, a_{\#6,1,3}\%3)$, $(a_{\#6,2,1}\%3, a_{\#6,2,2}\%3, a_{\#6,2,3}\%3)$, . . . , $(a_{\#6,k,1}\%3, a\neq_{6,k,2}\%3, a_{\#6,k,3}\%3)$, . . . , $(a_{\#6,n-1,1}\%3, a_{\#6,n-1,2}\%3, a_{\#6,n-1,3}\%3)$ and $(b_{\#6,1}\%3, b_{\#6,2}\%3, b_{\#6,3}\%3)$ are any of (0, 1, 2), (0, 2, 1), (1, 0, 2), (1, 2, 0), (2, 0, 1), or (2, 1, 0) (where k=1, 2, 3, . . . , n−1).

In the above description, a code having high error correction capability has been described for an LDPC-CC of a time varying period of 6, but a code having high error correction capability can also be generated when an LDPC-CC of a time varying period of $3g$ (where g=1, 2, 3, 4, . . . ) (that is, an LDPC-CC having a time varying period of a multiple of 3) is created in the same way as with the design method for an LDPC-CC of a time varying period of 3 or 6. A configuration method for this code is described in detail below.

Consider equations 9-1 to 9-3g as parity check polynomials of an LDPC-CC having a time varying period of $3g$ (where g=1, 2, 3, 4, . . . ) and the coding rate is (n−1)/n (where n is an integer equal to or greater than 2).

[9]

$$(D^{a\#1,1,1} + D^{a\#1,1,2} + D^{a\#1,1,3})X_1(D) + \\ (D^{a\#1,2,1} + D^{a\#1,2,2} + D^{a\#1,2,3})X_2(D) + \ldots + \\ (D^{a\#1,n-1,1} + D^{a\#1,n-1,2} + D^{a\#1,n-1,3})X_{n-1}(D) + \\ (D^{b\#1,1} + D^{b\#1,2} + D^{b\#1,3})P(D) = 0$$ (Equation 9-1)

$$(D^{a\#2,1,1} + D^{a\#2,1,2} + D^{a\#2,1,3})X_1(D) + \\ (D^{a\#2,2,1} + D^{a\#2,2,2} + D^{a\#2,2,3})X_2(D) + \ldots + \\ (D^{a\#2,n-1,1} + D^{a\#2,n-1,2} + D^{a\#2,n-1,3})X_{n-1}(D) + \\ (D^{b\#2,1} + D^{b\#2,2} + D^{b\#2,3})P(D) = 0$$ (Equation 9-2)

$$(D^{a\#3,1,1} + D^{a\#3,1,2} + D^{a\#3,1,3})X_1(D) + \\ (D^{a\#3,2,1} + D^{a\#3,2,2} + D^{a\#3,2,3})X_2(D) + \ldots + \\ (D^{a\#3,n-1,1} + D^{a\#3,n-1,2} + D^{a\#3,n-1,3})X_{n-1}(D) + \\ (D^{b\#3,1} + D^{b\#3,2} + D^{b\#3,3})P(D) = 0$$ (Equation 9-3)

$\vdots$ $$(D^{a\#k,1,1} + D^{a\#k,1,2} + D^{a\#k,1,3})X_1(D) + \\ (D^{a\#k,2,1} + D^{a\#k,2,2} + D^{a\#k,2,3})X_2(D) + \ldots + \\ (D^{a\#k,n-1,1} + D^{a\#k,n-1,2} + D^{a\#k,n-1,3})X_{n-1}(D) + \\ (D^{b\#k,1} + D^{b\#k,2} + D^{b\#k,3})P(D) = 0$$ (Equation 9-k)

$\vdots$ $$(D^{a\#3g-2,1,1} + D^{a\#3g-2,1,2} + D^{a\#3g-2,1,3})X_1(D) + \\ (D^{a\#3g-2,2,1} + D^{a\#3g-2,2,2} + D^{a\#3g-2,2,3})X_2(D) + \\ \ldots + (D^{a\#3g-2,n-1,1} + D^{a\#3g-2,n-1,2} + D^{a\#3g-2,n-1,3}) \\ X_{n-1}(D) + \\ (D^{b\#3g-2,1} + D^{b\#3g-2,2} + D^{b\#3g-2,3})P(D) = 0$$ (Equation 9-(3g-2))

$$(D^{a\#3g-1,1,1} + D^{a\#3g-1,1,2} + D^{a\#3g-1,1,3})X_1(D) + \\ (D^{a\#3g-1,2,1} + D^{a\#3g-1,2,2} + D^{a\#3g-1,2,3})X_2(D) + \\ \ldots + (D^{a\#3g-1,n-1,1} + D^{a\#3g-1,n-1,2} + D^{a\#3g-1,n-1,3}) \\ X_{n-1}(D) + \\ (D^{b\#3g-1,1} + D^{b\#3g-1,2} + D^{b\#3g-1,3})P(D) = 0$$ (Equation 9-(3g-1))

-continued $$(D^{a\#3g,1,1} + D^{a\#3g,1,2} + D^{a\#3g,1,3})X_1(D) + \\ (D^{a\#3g,2,1} + D^{a\#3g,2,2} + D^{a\#3g,2,3})X_2(D) + \ldots + \\ (D^{a\#3g,n-1,1} + D^{a\#3g,n-1,2} + D^{a\#3g,n-1,3})X_{n-1}(D) + \\ (D^{b\#3g,1} + D^{b\#3g,2} + D^{b\#3g,3})P(D) = 0$$ (Equation 9-(3g))

At this time, $X_1(D), X_2(D), \ldots, X_{n-1}(D)$ are polynomial representations of data (information) $X_1, X_2, \ldots, X_{n-1}$ and $P(D)$ is a polynomial representation of parity. Here, in equations 9-1 to 9-3g, parity check polynomials are assumed such that there are three terms in $X_1(D), X_2(D), \ldots, X_{n-1}(D)$ and $P(D)$, respectively.

As in the case of an LDPC-CC of a time varying period of 3 and an LDPC-CC of a time varying period of 6, the possibility of being able to achieve higher error correction capability is increased if the condition below (<Condition #2>) is satisfied in an LDPC-CC of a time varying period of $3g$ and a coding rate of (n−1)/n (where n is an integer equal to or greater than 2) represented by parity check polynomials of equations 9-1 to 9-3g.

In an LDPC-CC of a time varying period of $3g$ and a coding rate of (n−1)/n (where n is an integer equal to or greater than 2), the parity bit and information bits at point in time i are represented by P; and $X_{i,1}, X_{i,2}, \ldots, X_{i,n-1}$, respectively. If $i\%3g=k$ (where k=0, 1, 2, . . . , 3g−1) is assumed at this time, a parity check polynomial of equation 9-(k+1) holds true. For example, if i=2, $i\%3g=2$ (k=2), equation 10 holds true.

[10]

$$(D^{a\#3,1,1}+D^{a\#3,1,2}+D^{a\#3,1,3})X_{2,1}+(D^{a\#3,2,1}+D^{a\#3,2,2}+ \\ D^{a\#3,2,3})X_{2,2}+\ldots+(D^{a\#3,n-1,1}+D^{a\#3,n-1,2}+ \\ D^{a\#3,n-1,3})X_{2,n-1}+(D^{b\#3,1}+D^{b\#3,2}+D^{b\#3,3})P_2=0$$ (Equation 10)

In equations 9-1 to 9-3g, it is assumed that $a_{\#k,p,1}, a_{\#k,p,2}$ and $a_{\#k,p,3}$ are integers (where $a_{\#k,p,1}\neq a_{\#k,p,2}\neq a_{\#k,p,3}$) (where k=1, 2, 3, . . . , 3g, and p=1, 2, 3, . . . , n−1). Also, it is assumed that $b_{\#k,1}, b_{\#k,2}$ and $b_{\#k,3}$ are integers (where $b_{\#k,1}\neq b_{\#k,2}\neq b_{\#k,3}$). A parity check polynomial of equation 9-k (where k=1, 2, 3, . . . , 3g) is called "check equation #k," and a sub-matrix based on the parity check polynomial of equation 9-k is designated k-th sub-matrix $H_k$. Next, an LDPC-CC of a time varying period of $3g$ is considered that is generated from first sub-matrix $H_1$, second sub-matrix $H_2$, third sub-matrix $H_3, \ldots$, and 3g-th sub-matrix $H_{3g}$.

<Condition #2>

In equations 9-1 to 9-3g, combinations of orders of $X_1(D), X_2(D), \ldots, X_{n-1}(D)$ and $P(D)$ satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3)$,

. . . , $(a_{\#1,p,1}\%3, a_{\#1,p,2}\%3, a_{\#1,p,3}\%3)$, . . . , $(a_{\#1,n-1,1}\%3, a_{\#1,n-1,2}\%3, a_{\#1,n-1,3}\%3)$ and $(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0) (where p = 1, 2, 3, . . . , n − 1);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3)$,

. . . , $(a_{\#2,p,1}\%3, a_{\#2,p,2}\%3, a_{\#2,p,3}\%3)$, . . . , $(a_{\#2,n-1,1}\%3, a_{\#2,n-1,2}\%3, a_{\#2,n-1,3}\%3)$ and $(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0) (where p = 1, 2, 3, . . . , n − 1);

-continued $(a_{\#3,1,1}\%3, a_{\#3,1,2}\%3, a_{\#3,1,3}\%3), \ldots, (a_{\#3,p,1}\%3, a_{\#3,p,2}\%3, a_{\#3,p,3}\%3),$ $\ldots, (a_{\#3,n-1,1}\%3, a_{\#3,n-1,2}\%3, a_{\#3,n-1,3}\%3)$ and $(b_{\#3,1}\%3, a_{\#3,2}\%3, a_{\#3,3}\%3)$ are any of $(0, 1, 2), (0, 2, 1), (1, 0, 2),$ $(1, 2, 0), (2, 0, 1),$ or $(2, 1, 0)$ (where $p = 1, 2, 3, \ldots, n-1$);

$\vdots$ $(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3),$ $\ldots, (a_{\#k,p,1}\%3, a_{\#k,p,2}\%3, a_{\#k,p,3}\%3), \ldots,$ $(a_{\#k,n-1,1}\%3, a_{\#k,n-1,2}\%3, a_{\#k,n-1,3}\%3)$ and $(b_{\#k,1}\%3, b_{\#k,2}\%3, b_{\#k,3}\%3)$ are any of $(0, 1, 2), (0, 2, 1), (1, 0, 2), (1, 2, 0), (2, 0, 1),$ or $(2, 1, 0)$ (where $p = 1, 2, 3, \ldots, n-1$) (where $k = 1, 2, 3, \ldots, 3g$);

$\vdots$ $(a_{\#3g-2,1,1}\%3, a_{\#3g-2,1,2}\%3, a_{\#3g-2,1,3}\%3),$ $(a_{\#3g-2,2,1}\%3, a_{\#3g-2,2,2}\%3, a_{\#3g-2,2,3}\%3), \ldots,$ $(a_{\#3g-2,p,1}\%3, a_{\#3g-2,p,2}\%3, a_{\#3g-2,p,3}\%3), \ldots,$ $(a_{\#3g-2,n-1,1}\%3, a_{\#3g-2,n-1,2}\%3, a_{\#3g-2,n-1,3}\%3)$ and $(b_{\#3g-2,1}\%3, b_{\#3g-2,2}\%3, b_{\#3g-2,3}\%3)$ are any of $(0, 1, 2), (0, 2, 1),$ $(1, 0, 2), (1, 2, 0), (2, 0, 1),$ or $(2, 1, 0)$ (where $p = 1, 2, 3, \ldots, n-1$);

$(a_{\#3g-1,1,1}\%3, a_{\#3g-1,1,2}\%3, a_{\#3g-1,1,3}\%3),$ $(a_{\#3g-1,2,1}\%3, a_{\#3g-1,2,2}\%3, a_{\#3g-1,2,3}\%3), \ldots,$ $(a_{\#3g-1,p,1}\%3, a_{\#3g-1,p,2}\%3, a_{\#3g-1,p,3}\%3), \ldots,$ $(a_{\#3g-1,n-1,1}\%3, a_{\#3g-1,n-1,2}\%3, a_{\#3g-1,n-1,3}\%3)$ and $(b_{\#3g-1,1}\%3, b_{\#3g-1,2}\%3, b_{\#3g-1,3}\%3)$ are any of $(0, 1, 2), (0, 2, 1),$ $(1, 0, 2), (1, 2, 0), (2, 0, 1),$ or $(2, 1, 0)$ (where $p = 1, 2, 3, \ldots, n-1$);

and $(a_{\#3g,1,1}\%3, a_{\#3g,1,2}\%3, a_{\#3g,1,3}\%3),$ $(a_{\#3g,2,1}\%3, a_{\#3g,2,2}\%3, a_{\#3g,2,3}\%3), \ldots,$ $(a_{\#3g,p,1}\%3, a_{\#3g,p,2}\%3, a_{\#3g,p,3}\%3), \ldots,$ $(a_{\#3g,n-1,1}\%3, a_{\#3g,n-1,2}\%3, a_{\#3g,n-1,3}\%3)$ and $(b_{\#3g,1}\%3, b_{\#3g,2}\%3, b_{\#3g,3}\%3)$ are any of $(0, 1, 2), (0, 2, 1),$ $(1, 0, 2), (1, 2, 0), (2, 0, 1),$ or $(2, 1, 0)$ (where $p = 1, 2, 3, \ldots, n-1$).

Taking ease of performing encoding into consideration, it is desirable for one "0" to be present among the three items $(b_{\#k,1}\%3, b_{\#k,2}\%3, b_{\#k,3}\%3)$ (where k=1, 2, . . . 3g) in equations 9-1 to 9-3g. This is because of a feature that, if $D^0=1$ holds true and $b_{\#k,1}$, $b_{\#k,2}$ and $b_{\#k,3}$ are integers equal to or greater than 0 at this time, parity P can be found sequentially.

Also, in order to provide relevancy between parity bits and data bits of the same point in time, and to facilitate a search for a code having high correction capability, it is desirable for:

one "0" to be present among the three items $(a_{\#k,1,1}\%3, a_{\#k,1,2}\%3, a_{\#k,1,3}\%3)$;

one "0" to be present among the three items $(a_{\#k,2,1}\%3, a_{\#k,2,2}\%3, a_{\#k,2,3}\%3)$;

$\vdots$ one "0" to be present among the three items $(a_{\#k,p,1}\%3, a_{\#k,p,2}\%3, a_{\#k,p,3}\%3)$;

$\vdots$ one "0" to be present among the three items $(a_{\#k,n-1,1}\%3, a_{\#k,n-1,2}\%3, a_{\#k,n-1,3}\%3),$ (where $k = 1, 2, \ldots, 3g$).

Next, an LDPC-CC of a time varying period of 3g (where g=2, 3, 4, 5, . . . ) that takes ease of encoding into account is considered. At this time, if the coding rate is (n−1)/n (where n is an integer equal to or greater than 2), LDPC-CC parity check polynomials can be represented as shown below.

[11]

$$(D^{a\#1,1,1} + D^{a\#1,1,2} + D^{a\#1,1,3})X_1(D) + \qquad \text{(Equation 11-1)}$$
$$(D^{a\#1,2,1} + D^{a\#1,2,2} + D^{a\#1,2,3})X_2(D) + \ldots +$$
$$(D^{a\#1,n-1,1} + D^{a\#1,n-1,2} + D^{a\#1,n-1,3})X_{n-1}(D) +$$
$$(D^{b\#1,1} + D^{b\#1,2} + 1)P(D) = 0$$

$$(D^{a\#2,1,1} + D^{a\#2,1,2} + D^{a\#2,1,3})X_1(D) + \qquad \text{(Equation 11-2)}$$
$$(D^{a\#2,2,1} + D^{a\#2,2,2} + D^{a\#2,2,3})X_2(D) + \ldots +$$
$$(D^{a\#2,n-1,1} + D^{a\#2,n-1,2} + D^{a\#2,n-1,3})X_{n-1}(D) +$$
$$(D^{b\#2,1} + D^{b\#2,2} + 1)P(D) = 0$$

$$(D^{a\#3,1,1} + D^{a\#3,1,2} + D^{a\#3,1,3})X_1(D) + \qquad \text{(Equation 11-3)}$$
$$(D^{a\#3,2,1} + D^{a\#3,2,2} + D^{a\#3,2,3})X_2(D) + \ldots +$$
$$(D^{a\#3,n-1,1} + D^{a\#3,n-1,2} + D^{a\#3,n-1,3})X_{n-1}(D) +$$
$$(D^{b\#3,1} + D^{b\#3,2} + 1)P(D) = 0$$

$$\vdots$$

$$(D^{a\#k,1,1} + D^{a\#k,1,2} + D^{a\#k,1,3})X_1(D) + \qquad \text{(Equation 11-k)}$$
$$(D^{a\#k,2,1} + D^{a\#k,2,2} + D^{a\#k,2,3})X_2(D) + \ldots +$$
$$(D^{a\#k,n-1,1} + D^{a\#k,n-1,2} + D^{a\#k,n-1,3})X_{n-1}(D) +$$
$$(D^{b\#k,1} + D^{b\#k,2} + 1)P(D) = 0$$

$$\vdots$$

$$(D^{a\#3g-2,1,1} + D^{a\#3g-2,1,2} + D^{a\#3g-2,1,3})X_1(D) + \qquad \text{(Equation 11-(3g-2))}$$
$$(D^{a\#3g-2,2,1} + D^{a\#3g-2,2,2} + D^{a\#3g-2,2,3})X_2(D) +$$
$$\ldots +$$
$$(D^{a\#3g-2,n-1,1} + D^{a\#3g-2,n-1,2} + D^{a\#3g-2,n-1,3})$$
$$X_{n-1}(D) + (D^{b\#3g-2,1} + D^{b\#3g-2,2} + 1)P(D) = 0$$

$$(D^{a\#3g-1,1,1} + D^{a\#3g-1,1,2} + D^{a\#3g-1,1,3})X_1(D) + \qquad \text{(Equation 11-(3g-1))}$$
$$(D^{a\#3g-1,2,1} + D^{a\#3g-1,2,2} + D^{a\#3g-1,2,3})X_2(D) +$$
$$\ldots +$$
$$(D^{a\#3g-1,n-1,1} + D^{a\#3g-1,n-1,2} + D^{a\#3g-1,n-1,3})$$
$$X_{n-1}(D) + (D^{b\#3g-1,1} + D^{b\#3g-1,2} + 1)P(D) = 0$$

$$(D^{a\#3g,1,1} + D^{a\#3g,1,2} + D^{a\#3g,1,3})X_1(D) + \qquad \text{(Equation 11-3g)}$$
$$(D^{a\#3g,2,1} + D^{a\#3g,2,2} + D^{a\#3g,2,3})X_2(D) + \ldots +$$
$$(D^{a\#3g,n-1,1} + D^{a\#3g,n-1,2} + D^{a\#3g,n-1,3})X_{n-1}(D) +$$
$$(D^{b\#3g,1} + D^{b\#3g,2} + 1)P(D) = 0$$

At this time, $X_1(D), X_2(D), \ldots, X_{n-1}(D)$ are polynomial representations of data (information) $X_1, X_2, \ldots, X_{n-1}$ and P(D) is a polynomial representation of parity. Here, in equations 11-1 to 11-3g, parity check polynomials are assumed such that there are three terms in $X_1(D), X_2(D), \ldots, X_{n-1}(D)$ and P(D), respectively. In an LDPC-CC of a time varying period of 3g and a coding rate of (n−1)/n (where n is an integer equal to or greater than 2), the parity bit and information bits at point in time i are represented by Pi and $X_{i,1}, X_{i,2}, \ldots, X_{i,n-1}$, respectively. If i %3g=k (where k=0, 1, 2, . . . , 3g−1)

is assumed at this time, a parity check polynomial of equation 11-(k+1) holds true. For example, if i=2, i%3=2 (k=2), equation 12 holds true.

[12]

$$(D^{a\#3,1,1}+D^{a\#3,1,3})X_{2,1}+(D^{a\#3,2,1}+D^{a\#3,2,2}+D^{a\#3,2,3})X_{2,2}+\ldots+(D^{a\#3,n-1,1}+D^{a\#3,n-1,2}+D^{a\#3,n-1,3})X_{2,n-1}+(D^{b\#3,1}+D^{b\#3,2})P_2=0 \quad \text{(Equation 12)}$$

If <Condition #3> and <Condition #4> are satisfied at this time, the possibility of being able to create a code having higher error correction capability is increased.

<Condition #3>

In equations 11-1 to 11-3g, combinations of orders of $X_1(D), X_2(D), \ldots, X_{n-1}(D)$ and $P(D)$ satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3),$ $\ldots, (a_{\#1,p,1}\%3, a_{\#1,p,2}\%3, a_{\#1,p,3}\%3), \ldots,$ and $(a_{\#1,n-1,1}\%3, a_{\#1,n-1,2}\%3, a_{\#1,n-1,3}\%3)$ are any of $(0, 1, 2), (0, 2, 1),$ $(1, 0, 2), (1, 2, 0), (2, 0, 1),$ or $(2, 1, 0)$ (where $p = 1, 2, 3, \ldots, n-1$);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3),$ $\ldots, (a_{\#2,p,1}\%3, a_{\#2,p,2}\%3, a_{\#2,p,3}\%3), \ldots,$ and $(a_{\#2,n-1,1}\%3, a_{\#2,n-1,2}\%3, a_{\#2,n-1,3}\%3)$ are any of $(0, 1, 2), (0, 2, 1),$ $(1, 0, 2), (1, 2, 0), (2, 0, 1),$ or $(2, 1, 0)$ (where $p = 1, 2, 3, \ldots, n-1$);

$(a_{\#3,1,1}\%3, a_{\#3,1,2}\%3, a_{\#3,1,3}\%3), (a_{\#3,2,1}\%3, a_{\#3,2,2}\%3, a_{\#3,2,3}\%3),$ $\ldots, (a_{\#3,p,1}\%3, a_{\#3,p,2}\%3, a_{\#3,p,3}\%3), \ldots,$ and $(a_{\#3,n-1,1}\%3, a_{\#3,n-1,2}\%3, a_{\#3,n-1,3}\%3)$ are any of $(0, 1, 2), (0, 2, 1),$ $(1, 0, 2), (1, 2, 0), (2, 0, 1),$ or $(2, 1, 0)$ (where $p = 1, 2, 3, \ldots, n-1$);

$\vdots$ $(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3),$ $\ldots, (a_{\#k,p,1}\%3, a_{\#k,p,2}\%3, a_{\#k,p,3}\%3), \ldots,$ and $(a_{\#k,n-1,1}\%3, a_{\#k,n-1,2}\%3, a_{\#k,n-1,3}\%3)$ are any of $(0, 1, 2),$ $(0, 2, 1), (1, 0, 2), (1, 2, 0), (2, 0, 1),$ or $(2, 1, 0)$ (where $p = 1, 2, 3, \ldots, n-1$, and $k = 1, 2, 3, \ldots, 3g$);

$\vdots$ $(a_{\#3g-2,1,1}\%3, a_{\#3g-2,1,2}\%3, a_{\#3g-2,1,3}\%3),$ $(a_{\#3g-2,2,1}\%3, a_{\#3g-2,2,2}\%3, a_{\#3g-2,2,3}\%3), \ldots,$ $(a_{\#3g-2,p,1}\%3, a_{\#3g-2,p,2}\%3, a_{\#3g-2,p,3}\%3), \ldots,$ and $(a_{\#3g-2,n-1,1}\%3, a_{\#3g-2,n-1,2}\%3, a_{\#3g-2,n-1,3}\%3)$ are any of $(0, 1, 2),$ $(0, 2, 1), (1, 0, 2), (1, 2, 0), (2, 0, 1),$ or $(2, 1, 0)$ (where $p = 1, 2, 3\ldots, n-1$);

$(a_{\#3g-1,1,1}\%3, a_{\#3g-1,1,2}\%3, a_{\#3g-1,1,3}\%3),$ $(a_{\#3g-1,2,1}\%3, a_{\#3g-1,2,2}\%3, a_{\#3g-1,2,3}\%3), \ldots,$ $(a_{\#3g-1,p,1}\%3, a_{\#3g-1,p,2}\%3, a_{\#3g-1,p,3}\%3), \ldots,$ and $(a_{\#3g-1,n-1,1}\%3, a_{\#3g-1,n-1,2}\%3, a_{\#3g-1,n-1,3}\%3)$ are any of $(0, 1, 2),$ $(0, 2, 1), (1, 0, 2), (1, 2, 0), (2, 0, 1),$ or $(2, 1, 0)$ (where $p = 1, 2, 3\ldots, n-1$); and $(a_{\#3g,1,1}\%3, a_{\#3g,1,2}\%3, a_{\#3g,1,3}\%3),$ $(a_{\#3g,2,1}\%3, a_{\#3g,2,2}\%3, a_{\#3g,2,3}\%3), \ldots,$ $(a_{\#3g,p,1}\%3, a_{\#3g,p,2}\%3, a_{\#3g,p,3}\%3), \ldots,$ and $(a_{\#3g,n-1,1}\%3, a_{\#3g,n-1,2}\%3, a_{\#3g,n-1,3}\%3)$ are any of $(0, 1, 2),$ $(0, 2, 1), (1, 0, 2), (1, 2, 0), (2, 0, 1),$ or $(2, 1, 0)$ (where $p = 1, 2, 3\ldots, n-1$).

In addition, in equations 11-1 to 11-3g, combinations of orders of P(D) satisfy the following condition:

$(b_{\#1,1}\%3, b_{\#1,2}\%3),$ $(b_{\#2,1}\%3, b_{\#2,2}\%3),$ $(b_{\#3,1}\%3, b_{\#3,2}\%3), \ldots,$ $(b_{\#k,1}\%3, b_{\#k,2}\%3), \ldots,$ $(b_{\#3g-2,1}\%3, b_{\#3g-2,2}\%3),$ $(b_{\#3g-1,1}\%3, b_{\#3g-1,2}\%3),$ and $(b_{\#3g,1}\%3, b_{\#3g,2}\%3)$ are either $(1, 2)$ or $(2, 1)$ (where k=1, 2, 3, \ldots, 3g).

<Condition #3> has a similar relationship with respect to equations 11-1 to 11-3g as <Condition #2> has with respect to equations 9-1 to 9-3g. If the condition below (<Condition #4>) is added for equations 11-1 to 11-3g in addition to <Condition #3>, the possibility of being able to create an LDPC-CC having higher error correction capability is increased.

<Condition #4>

Orders of P(D) of equations 11-1 to 11-3g satisfy the following condition: all values other than multiples of 3 (that is, 0, 3, 6, \ldots, 3g−3) from among integers from 0 to 3g−1 (0, 1, 2, 3, 4, \ldots, 3g−2, 3g−1) are present in the values of 6g orders of $(b_{\#1,1}\%3g, b_{1,2}\%3g),$ $(b_{\#2,1}\%3g, b_{\#2,2}\%3g),$ $(b_{\#3,1}\%3g, b_{\#3,2}\%3g), \ldots,$ $(b_{\#k,1}\%3g, b_{\#k,2}\%3g), \ldots,$ $(b_{\#3g-2,1}\%3g, b_{\#3g-2,2}\%3g),$ $(b_{\#3g-1,1}\%3g, b_{\#3g-1,2}\%3g),$ $(b_{\#3g,1}\%3g, b_{\#3g,2}\%3g)$ (in this case, two orders form a pair, and therefore the number of orders forming 3g pairs is 6g).

The possibility of achieving good error correction capability is high if there is also randomness while regularity is maintained for positions at which "1"s are present in a parity check matrix. With an LDPC-CC having a time varying period of $3g$ (where g=2, 3, 4, 5, \ldots) and the coding rate is (n−1)/n (where n is an integer equal to or greater than 2) that has parity check polynomials of equations 11-1 to 11-3g, if a code is created in which <Condition #4> is applied in addition to <Condition #3>, it is possible to provide randomness while maintaining regularity for positions at which "1"s are present in a parity check matrix, and therefore the possibility of achieving good error correction capability is increased.

Next, an LDPC-CC of a time varying period of $3g$ (where g=2, 3, 4, 5, \ldots) is considered that enables encoding to be performed easily and provides relevancy to parity bits and data bits of the same point in time. At this time, if the coding rate is (n−1)/n (where n is an integer equal to or greater than 2), LDPC-CC parity check polynomials can be represented as shown below.

[13]

$$(D^{a\#1,1,1} + D^{a\#1,1,2} + 1)X_1(D) + \quad \text{(Equation 13-1)}$$
$$(D^{a\#1,2,1} + D^{a\#1,2,2} + 1)X_2(D) + \ldots +$$
$$(D^{a\#1,n-1,1} + D^{a\#1,n-1,2} + 1)X_{n-1}(D) +$$
$$(D^{b\#1,1} + D^{b\#1,2} + 1)P(D) = 0$$

$$(D^{a\#2,1,1} + D^{a\#2,1,2} + 1)X_1(D) + \quad \text{(Equation 13-2)}$$
$$(D^{a\#2,2,1} + D^{a\#2,2,2} + 1)X_2(D) + \ldots +$$
$$(D^{a\#2,n-1,1} + D^{a\#2,n-1,2} + 1)X_{n-1}(D) +$$
$$(D^{b\#2,1} + D^{b\#2,2} + 1)P(D) = 0$$

$$(D^{a\#3,1,1} + D^{a\#3,1,2} + 1)X_1(D) + \quad \text{(Equation 13-3)}$$
$$(D^{a\#3,2,1} + D^{a\#3,2,2} + 1)X_2(D) + \ldots +$$
$$(D^{a\#3,n-1,1} + D^{a\#3,n-1,2} + 1)X_{n-1}(D) +$$
$$(D^{b\#3,1} + D^{b\#3,2} + 1)P(D) = 0$$
$$\vdots$$

$$(D^{a\#k,1,1} + D^{a\#k,1,2} + 1)X_1(D) + \quad \text{(Equation 13-k)}$$
$$(D^{a\#k,2,1} + D^{a\#k,2,2} + 1)X_2(D) + \ldots +$$
$$(D^{a\#k,n-1,1} + D^{a\#k,n-1,2} + 1)X_{n-1}(D) +$$
$$(D^{b\#k,1} + D^{b\#k,2} + 1)P(D) = 0$$
$$\vdots$$

$$(D^{a\#3g-2,1,1} + D^{a\#3g-2,1,2} + 1)X_1(D) + \quad \text{(Equation 13-(3g-2))}$$
$$(D^{a\#3g-2,2,1} + D^{a\#3g-2,2,2} + 1)X_2(D) + \ldots +$$
$$(D^{a\#3g-2,n-1,1} + D^{a\#3g-2,n-1,2} + 1)X_{n-1}(D) +$$
$$(D^{b\#3g-2,1} + D^{b\#3g-2,2} + 1)P(D) = 0$$

$$(D^{a\#3g-1,1,1} + D^{a\#3g-1,1,2} + 1)X_1(D) + \quad \text{(Equation 13-(3g-1))}$$
$$(D^{a\#3g-1,2,1} + D^{a\#3g-1,2,2} + 1)X_2(D) + \ldots +$$
$$(D^{a\#3g-1,n-1,1} + D^{a\#3g-1,n-1,2} + 1)X_{n-1}(D) +$$
$$(D^{b\#3g-1,1} + D^{b\#3g-1,2} + 1)P(D) = 0$$

$$(D^{a\#3g,1,1} + D^{a\#3g,1,2} + 1)X_1(D) + \quad \text{(Equation 13-3g)}$$
$$(D^{a\#3g,2,1} + D^{a\#3g,2,2} + 1)X_2(D) + \ldots +$$
$$(D^{a\#3g,n-1,1} + D^{a\#3g,n-1,2} + 1)X_{n-1}(D) +$$
$$(D^{b\#3g,1} + D^{b\#3g,2} + 1)P(D) = 0$$

At this time, $X_1(D), X_2(D), \ldots, X_{n-1}(D)$ are polynomial representations of data (information) $X_1, X_2, \ldots, X_{n-1}$ and $P(D)$ is a polynomial representation of parity. In equations 13-1 to 13-3g, parity check polynomials are assumed such that there are three terms in $X_1(D), X_2(D), \ldots, X_{n-1}(D)$ and $P(D)$, respectively, and term $D^0$ is present in $X_1(D), X_2(D), \ldots, X_{n-1}(D)$ and $P(D)$ (where k=1, 2, 3, . . . , 3g).

In an LDPC-CC of a time varying period of 3g and a coding rate of (n−1)/n (where n is an integer equal to or greater than 2), the parity bit and information bits at point in time i are represented by $P_i$ and $X_{i,1}, X_{i,2}, \ldots, X_{i,n-1}$, respectively. If i %3g=k (where k=0, 1, 2, . . . 3g−1) is assumed at this time, a parity check polynomial of equation 13-(k+1) holds true. For example, if i=2, i %3g=2 (k=2), equation 14 holds true.

[14]

$$(D^{a\#3,1,1}+D^{a\#3,1,2}+1)X_{2,1}+(D^{a\#3,2,1}+D^{a\#3,2,2}+1)X_{2,2}+\ldots+(D^{a\#3,n-1,1}+D^{a\#3,n-1,2}+1)X_{2,n-1}+(D^{b\#3,1}+D^{b\#3,2}+1)P_2=0 \quad \text{(Equation 14)}$$

If following <Condition #5> and <Condition #6> are satisfied at this time, the possibility of being able to create a code having higher error correction capability is increased <Condition #5>

In equations 13-1 to 13-3g, combinations of orders of $X_1(D)$, $X_2(D), \ldots, X_{n-1}(D)$ and $P(D)$ satisfy the following condition:

$(a_{\#1,1,1}\%3, a_{\#1,1,2}\%3), (a_{\#1,2,1}\%3, a_{\#1,2,2}\%3), \ldots, (a_{\#1,p,1}\%3, a_{\#1,p,2}\%3),$ $\ldots,$ and $(a_{\#1,n-1,1}\%3, a_{\#1,n-1,2}\%3)$ are any of (1, 2), $(2, 1), (p = 1, 2, 3, \ldots, n-1);$ $(a_{\#2,1,1}\%3, a_{\#2,1,2}\%3), (a_{\#2,2,1}\%3, a_{\#2,2,2}\%3), \ldots,$ $(a_{\#2,p,1}\%3, a_{\#2,p,2}\%3), \ldots,$ and $(a_{\#2,n-1,1}\%3, a_{\#2,n-1,2}\%3)$ are either (1, 2) or (2, 1) (where $p = 1, 2, 3, \ldots, n-1$);

$(a_{\#3,1,1}\%3, a_{\#3,1,2}\%3), (a_{\#3,2,1}\%3, a_{\#3,2,2}\%3), \ldots,$ $(a_{\#3,p,1}\%3, a_{\#3,p,2}\%3), \ldots,$ and $(a_{\#3,n-1,1}\%3, a_{\#3,n-1,2}\%3)$ are either (1, 2) or (2, 1) (where $p = 1, 2, 3, \ldots, n-1$);

$\vdots$ $(a_{\#k,1,1}\%3, a_{\#k,1,2}\%3),$ $(a_{\#k,2,1}\%3, a_{\#k,2,2}\%3), \ldots,$ $(a_{\#k,p,1}\%3, a_{\#k,p,2}\%3), \ldots,$ and $(a_{\#k,n-1,1}\%3, a_{\#k,n-1,2}\%3)$ are either (1, 2) or (2, 1)

(where $p = 1, 2, 3, \ldots, n-1$)(where $k = 1, 2, 3, \ldots, 3g$)

$\vdots$ $(a_{\#3g-2,1,1}\%3, a_{\#3g-2,1,2}\%3),$ $(a_{\#3g-2,2,1}\%3, a_{\#3g-2,2,2}\%3), \ldots,$ $(a_{\#3g-2,p,1}\%3, a_{\#3g-2,p,2}\%3), \ldots,$ and $(a_{\#3g-2,n-1,1}\%3, a_{\#3g-2,n-1,2}\%3)$ are either $(1, 2)$ or $(2, 1)$ (where $p = 1, 2, 3, \ldots, n-1$);

$(a_{\#3g-1,1,1}\%3, a_{\#3g-1,1,2}\%3),$ $(a_{\#3g-1,2,1}\%3, a_{\#3g-1,2,2}\%3), \ldots,$ $(a_{\#3g-1,p,1}\%3, a_{\#3g-1,p,2}\%3), \ldots,$ and $(a_{\#3g-1,n-1,1}\%3, a_{\#3g-1,n-1,2}\%3)$ are either $(1, 2)$ or $(2, 1)$ (where $p = 1, 2, 3, \ldots, n-1$); and $(a_{\#3g,1,1}\%3, a_{\#3g,1,2}\%3),$ $(a_{\#3g,2,1}\%3, a_{\#3g,2,2}\%3), \ldots,$ $(a_{\#3g,p,1}\%3, a_{\#3g,p,2}\%3), \ldots,$ and $(a_{\#3g,n-1,1}\%3, a_{\#3g,n-1,2}\%3)$ are either $(1, 2)$ or $(2, 1)$ (where $p = 1, 2, 3, \ldots, n-1$).

In addition, in equations 13-1 to 13-3g, combinations of orders of $P(D)$ satisfy the following condition:

$(b_{\#1,1}\%3, b_{\#1,2}\%3),$ $(b_{\#2,1}\%3, b_{\#2,2}\%3),$ $(b_{\#3,1}\%3, b_{\#3,2}\%3), \ldots,$ $(b_{\#k,1}\%3, b_{\#k,2}\%3), \ldots,$ $(b_{\#3g-2,1}\%3, b_{\#3g-2,2}\%3),$ $(b_{\#3g-1,1}\%3, b_{\#3g-1,2}\%3),$ and $(b_{\#3g,1}\%3, b_{\#3g,2}\%3)$ are either (1, 2) or (2, 1) (where k=1, 2, 3, . . . , 3g).

<Condition #5> has a similar relationship with respect to equations 13-1 to 13-3g as <Condition #2> has with respect to equations 9-1 to 9-3g. If the condition below (<Condition #6>) is added for equations 13-1 to 13-3g in addition to <Condition #5>, the possibility of being able to create a code having high error correction capability is increased.

<Condition #6>

Orders of X1(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3g, a_{\#1,1,2}\%3g)$,
$(a_{\#2,1,1}\%3g, a_{\#2,1,2}\%3g)$, . . . ,
$(a_{\#p,1,1}\%3g, a_{\#p,1,2}\%3g)$, . . . , and
$(a_{\#3g,1,1}\%3g, a_{\#3g,1,2}\%3g)$ (where p=1, 2, 3, . . . , 3g);

Orders of X2(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,2,1}\%3g, a_{\#1,2,2}\%3g$,
$(a_{\#2,2,1}\%3g, a_{\#2,2,2}\%3g)$, . . . ,
$(a_{\#p,2,1}\%3g, a_{\#p,2,2}\%3g)$, . . . , and
$(a_{\#3g,2,1}\%3g, a_{\#3g,2,2}\%3g)$ (where p=1, 2, 3, . . . , 3g);

Orders of X3(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,3,1}\%3g, a_{\#1,3,2}\%3g), (a_{\#2,3,1}\%3g, a_{\#2,3,2}\%3g),$ $\ldots, (a_{\#p,3,1}\%3g, a_{\#p,3,2}\%3g), \ldots,$ and $(a_{\#3g,3,1}\%3g, a_{\#3g,3,2}\%3g)$ (where $p = 1, 2, 3, \ldots, 3g$);

⋮

Orders of Xk(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,k,1}\%3g, a_{\#1,k,2}\%3g), (a_{\#2,k,1}\%3g, a_{\#2,k,2}\%3g), \ldots,$ $(a_{\#p,k,1}\%3g, a_{\#p,k,2}\%3g), \ldots,$ and $(a_{\#3g,k,1}\%3g, a_{\#3g,k,2}\%3g)$ (where $p = 1, 2, 3, \ldots, 3g$, and $k = 1, 2, 3, \ldots, n-1$);

⋮

Orders of Xn−1 (D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,n-1,1}\%3g, a_{\#1,n-1,2}\%3g)$,
$(a_{\#2,n-1,1}\%3g, a_{2,n-1,2}\%3g)$, . . . ,
$(a_{\#p,n-1,1}\%3g, a_{\#p,n-1,2}\%3g)$, . . . , and
$(a_{\#3g,n-1,1}\%3g, a_{\#3g,n-1,2}\%3g)$ (where p=1, 2, 3, . . . , 3g); and Orders of P(D) of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, . . . ,
$(b_{\#k,1}\%3g, b_{\#k,2}\%3g)$, . . . ,
$(b_{\#3g-2,1}\%3g, b_{\#3g-2,2}\%3g)$,
$(b_{\#3g-1,1}\%3g, b_{\#3g-1,2}\%3g)$ and
$(b_{\#3g,1}\%3g, b_{\#3g,2}\%3g)$ (where k=1, 2, 3, . . . , n−1).

The possibility of achieving good error correction capability is high if there is also randomness while regularity is maintained for positions at which "1"s are present in a parity check matrix. With an LDPC-CC having a time varying period of 3g (where g=2, 3, 4, 5, . . . ) and the coding rate is (n−1)/n (where n is an integer equal to or greater than 2) that has parity check polynomials of equations 13-1 to 13-3g, if a code is created in which <Condition #6> is applied in addition to <Condition #5>, it is possible to provide randomness while maintaining regularity for positions at which "1"s are present in a parity check matrix, and therefore the possibility of achieving good error correction capability is increased.

The possibility of being able to create an LDPC-CC having higher error correction capability is also increased if a code is created using <Condition #6'> instead of <Condition #6>, that is, using <Condition #6'> in addition to <Condition #5>.

<Condition #6'>

Orders of $X_1(D)$ of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%/3g, a_{\#1,1,2}\%3g)$,
$(a_{\#2,1,1}\%3g, a_{\#2,1,2}\%3g)$, . . . ,
$(a_{\#p,1,1}\%3g, a_{\#p,1,2}\%3g)$, . . . , and
$(a_{\#3g,1,1}\%3g, a_{\#3g,1}\%3g)$ (where p=1, 2, 3, . . . , 3g);

Orders of $X_2(D)$ of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,2,1}\%3g, a_{\#1,2,2}\%3g)$,
$(a_{\#2,2,1}\%3g, a_{\#2,2,2}\%3g)$, . . . ,
$(a_{\#p,2,1}\%3g, a_{\#p,2,2}\%3g)$, . . . , and
$(a_{\#3g,2,1}\%3g, a_{\#3g,2,2}\%3g)$ (where p=1, 2, 3, . . . , 3g);

Orders of $X_3(D)$ of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are Present in the following 6g values of $(a_{\#1,3,1}\%3g, a_{\#1,3,2}\%3g), (a_{\#2,3,1}\%3g, a_{\#2,3,2}\%3g),$ $\ldots, (a_{\#p,3,1}\%3g, a_{\#p,3,2}\%3g), \ldots,$ and $(a_{\#3g,3,1}\%3g, a_{\#3g,3,2}\%3g)$ (where $p = 1, 2, 3, \ldots, 3g$);

⋮

Orders of $X_k(D)$ of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,k,1}\%3g, a_{\#1,k,2}\%3g), (a_{\#2,k,1}\%3g, a_{\#2,k,2}\%3g), \ldots,$ $(a_{\#p,k,1}\%3g, a_{\#p,k,2}\%3g), \ldots, (a_{\#3g,k,1}\%3g, a_{\#3g,k,2}\%3g)$ (where $p = 1, 2, 3, \ldots, 3g$, and $k = 1, 2, 3, \ldots, n-1$);

$\vdots$

Orders of Xn−1(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(a_{\#1,n-1,1}\%3g, a_{\#1,n-1,2}\%3g),$
$(a_{\#2,n-1,1}\%3g, a_{\#2,n-1,2}\%3g), \ldots,$
$(a_{\#p,n-1,1}\%3g, a_{\#p,n-1,2}\%3g), \ldots,$
$(a_{\#3g,n-1,1}\%3g, a_{\#3g,n-1,2}\%3g)$ (where p=1, 2, 3, ..., 3g); or Orders of P(D) of equations 13-1 to 13-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of $(b_{\#1,1}\%3g, b_{\#1,2}\%3g),$
$(b_{\#2,1}\%3g, b_{\#2,2}\%3g),$
$(b_{\#3,1}\%3g, b_{\#3,2}\%3g), \ldots,$
$(b_{\#k,1}\%3g, b_{\#k,2}\%3g), \ldots,$
$(b_{\#3g-2,1}\%3g, b_{\#3g-2,2}\%3g),$
$(b_{\#3g-1,1}\%3g, b_{\#3g-1,2}\%3g),$
$(b_{\#3g,1}\%3g, b_{\#3g,2}\%3g)$ (where k=1, 2, 3, ..., 3g).

The above description relates to an LDPC-CC of a time varying period of 3g and a coding rate of (n−1)/n (where n is an integer equal to or greater than 2). Below, conditions are described for orders of an LDPC-CC of a time varying period of 3g and a coding rate of 1/2 (n=2).

Consider equations 15-1 to 15-3g as parity check polynomials of an LDPC-CC having a time varying period of 3g (where g=1, 2, 3, 4, ... ) and the coding rate is 1/2 (n=2).

[15]

$$(D^{a\#1,1,1} + D^{a\#1,1,2} + D^{a\#1,1,3})X(D) + \\ (D^{b\#1,1} + D^{b\#1,2} + D^{b\#1,3})P(D) = 0 \quad \text{(Equation 15-1)}$$

$$(D^{a\#2,1,1} + D^{a\#2,1,2} + D^{a\#2,1,3})X(D) + \\ (D^{b\#2,1} + D^{b\#2,2} + D^{b\#2,3})P(D) = 0 \quad \text{(Equation 15-2)}$$

$$(D^{a\#3,1,1} + D^{a\#3,1,2} + D^{a\#3,1,3})X(D) + \\ (D^{b\#3,1} + D^{b\#3,2} + D^{b\#3,3})P(D) = 0 \quad \text{(Equation 15-3)}$$

$\vdots$ $$(D^{a\#k,1,1} + D^{a\#k,1,2} + D^{a\#k,1,3})X(D) + \\ (D^{b\#k,1} + D^{b\#k,2} + D^{b\#k,3})P(D) = 0 \quad \text{(Equation 15-k)}$$

$\vdots$ $$(D^{a\#3g-2,1,1} + D^{a\#3g-2,1,2} + D^{a\#3g-2,1,3})X(D) + \\ (D^{b\#3g-2,1} + D^{b\#3g-2,2} + D^{b\#3g-2,3})P(D) = 0 \quad \text{(Equation 15-(3g-2))}$$

$$(D^{a\#3g-1,1,1} + D^{a\#3g-1,1,2} + D^{a\#3g-1,1,3})X(D) + \\ (D^{b\#3g-1,1} + D^{b\#3g-1,2} + D^{b\#3g-1,3})P(D) = 0 \quad \text{(Equation 15-(3g-1))}$$

$$(D^{a\#3g,1,1} + D^{a\#3g,1,2} + D^{a\#3g,1,3})X(D) + \\ (D^{b\#3g,1} + D^{b\#3g,2} + D^{b\#3g,3})P(D) = 0 \quad \text{(Equation 15-3g)}$$

At this time, X(D) is a polynomial representation of data (information) X and P(D) is a polynomial representation of parity. Here, in equations 15-1 to 15-3g, parity check polynomials are assumed such that there are three terms in X(D) and P(D), respectively.

Thinking in the same way as in the case of an LDPC-CC of a time varying period of 3 and an LDPC-CC of a time varying period of 6, the possibility of being able to achieve higher error correction capability is increased if the condition below (<Condition #2-1>) is satisfied in an LDPC-CC of a time varying period of 3g and a coding rate of 1/2 (n=2) represented by parity check polynomials of equations 15-1 to 15-3g.

In an LDPC-CC of a time varying period of 3g and a coding rate of 1/2 (n=2), the parity bit and the information bits at point in time are represented by $P_i$ and $X_{i,1}$, respectively.

If i %3g=k (where k=0, 1, 2, ..., 3g−1) is assumed at this time, a parity check polynomial of equation 15-(k+1) holds true. For example, if i=2, %3g=2 (k=2), equation 16 holds true.

[16]

$$(D^{a\#3,1,1}+D^{a\#3,1,2}+D^{a\#3,1,3})X_{2,1}+(D^{b\#3,1}+D^{b\#3,2}+D^{b\#3,3})P_2=0 \quad \text{(Equation 16)}$$

In equations 15-1 to 15-3g, it is assumed that $a_{\#k,1,1}$, $a_{\#k,1,2}$, and $a_{\#k,1,3}$ are integers (where $a_{\#k,1,1} \neq a_{\#k,1,2} \neq a_{\#k,1,3}$) (where k=1, 2, 3, ..., 3g). Also, it is assumed that $b_{\#k,1}$, $b_{\#k,2}$, and $b_{\#k,3}$ are integers (where $b_{\#k,1} \neq b_{\#k,2} \neq b_{\#k,3}$). A parity check polynomial of equation 15-k (k=1, 2, 3, ..., 3g) is called "check equation #k," and a sub-matrix based on the parity check polynomial of equation 15-k is designated k-th sub-matrix $H_k$. Next, consider an LDPC-CC of a time varying period of 3g generated from first sub-matrix $H_1$, second sub-matrix $H_2$, third sub-matrix $H_3$, ..., 3g-th sub-matrix $H_{3g}$.

<Condition #2-1>

In equations 15-1 to 15-3g, combinations of orders of X(D) and P(D) satisfy the following condition:

$(a_{\#1, 1, 1}\%3, a_{\#1, 1, 2}\%3, a_{\#1, 1, 3}\%3)$ and
$(b_{\#1, 1}\%3, b_{\#1, 2}\%3, b_{\#1, 3}\%3)$ are any of (0, 1, 2), (0, 2, 1), (1, 0, 2), (1, 2, 0), (2, 0, 1), or (2, 1, 0);

$(a_{\#2, 1, 1}\%3, a_{\#2, 1, 2}\%3, a_{\#2, 1, 3}\%3)$ and
$(b_{\#2, 1}\%3, b_{\#2, 2}\%3, b_{\#2, 3}\%3)$ are any of (0, 1, 2), (0, 2, 1), (1, 0, 2), (1, 2, 0), (2, 0, 1), or (2, 1, 0);

$(a_{\#3, 1, 1}\%3, a_{\#3, 1, 2}\%3, a_{\#3, 1, 3}\%3)$ and
$(b_{\#3, 1}\%3, b_{\#3, 2}\%3, b_{\#3, 3}\%3)$ are any of (0, 1, 2), (0, 2, 1), (1, 0, 2), (1, 2, 0), (2, 0, 1), or (2, 1, 0);

•
•
•

$(a_{\#k, 1, 1}\%3, a_{\#k, 1, 2}\%3, a_{\#k, 1, 3}\%3)$ and
$(b_{\#k, 1}\%3, b_{\#k, 2}\%3, b_{\#k, 3}\%3)$ are any of (0, 1, 2), (0, 2, 1), (1, 0, 2), (1, 2, 0), (2, 0, 1), or (2, 1, 0) (where k = 1, 2, 3, ..., 3 g);

•
•
•

$(a_{\#3g-2, 1, 1}\%3, a_{\#3g-2, 1, 2}\%3, a_{\#3g-2, 1, 3}\%3)$ and
$(b_{\#3g-2, 1}\%3, b_{\#3g-2, 2}\%3, b_{\#3g-2, 3}\%3)$ are any of (0, 1, 2), (0, 2, 1), (1, 0, 2), (1, 2, 0), (2, 0, 1), or (2, 1, 0);
$(a_{\#3g-1, 1, 1}\%3, a_{\#3g-1, 1, 2}\%3, a_{\#3g-1, 1, 3}\%3)$ and
$(b_{\#3g-1, 1}\%3, b_{\#3g-1, 2}\%3, b_{\#3g-1, 3}\%3)$ are any of (0, 1, 2), (0, 2, 1), (1, 0, 2), (1, 2, 0), (2, 0, 1), or (2, 1, 0); and
$(a_{\#3g, 1, 1}\%3, a_{\#3g, 1, 2}\%3, a_{\#3g, 1, 3}\%3)$ and
$(b_{\#3g, 1}\%3, b_{\#3g, 2}\%3, b_{\#3g, 3}\%3)$ are any of (0, 1, 2), (0, 2, 1), (1, 0, 2), (1, 2, 0), (2, 0, 1), or (2, 1, 0).

Taking ease of performing encoding into consideration, it is desirable for one "0" to be present among the three items $(b\#k,1\%3, b_{\#k,2}\%3, b_{\#k,3}\%3)$ (where k=1, 2, ..., 3g) in equations 15-1 to 15-3g. This is because of a feature that, if $D^0=1$ holds true and $b_{\#k,1}$, $b_{\#k,2}$ and $b_{\#k,3}$ are integers equal to or greater than 0 at this time, parity P can be found sequentially.

Also, in order to provide relevancy between parity bits and data bits of the same point in time, and to facilitate a search for a code having high correction capability, it is desirable for one "0" to be present among the three items ($a_{\#k,1,1}\%3$, $a_{\#k,1,2}\%3$, $a_{\#k,1,3}\%3$) (where k=1, 2, ..., 3g).

Next, an LDPC-CC of a time varying period of 3g (where g=2, 3, 4, 5, ...) that takes ease of encoding into account is considered. At this time, if the coding rate is 1/2 (n=2), LDPC-CC parity check polynomials can be represented as shown below.

[17]

$$(D^{a\#1,1,1} + D^{a\#1,1,2} + D^{a\#1,1,3})X(D) + \qquad \text{(Equation 17-1)}$$
$$(D^{b\#1,1} + D^{b\#1,2} + 1)P(D) = 0$$

$$(D^{a\#2,1,1} + D^{a\#2,1,2} + D^{a\#2,1,3})X(D) + \qquad \text{(Equation 17-2)}$$
$$(D^{b\#2,1} + D^{b\#2,2} + 1)P(D) = 0$$

$$(D^{a\#3,1,1} + D^{a\#3,1,2} + D^{a\#3,1,3})X(D) + \qquad \text{(Equation 17-3)}$$
$$(D^{b\#3,1} + D^{b\#3,2} + 1)P(D) = 0$$

$$\vdots$$

$$(D^{a\#k,1,1} + D^{a\#k,1,2} + D^{a\#k,1,3})X(D) + \qquad \text{(Equation 17-k)}$$
$$(D^{b\#k,1} + D^{b\#k,2} + 1)P(D) = 0$$

$$\vdots$$

$$(D^{a\#3g-2,1,1} + D^{a\#3g-2,1,2} + D^{a\#3g-2,1,3})X(D) + \qquad \text{(Equation 17-(3g-2))}$$
$$(D^{b\#3g-2,1} + D^{b\#3g-2,2} + 1)P(D) = 0$$

$$(D^{a\#3g-1,1,1} + D^{a\#3g-1,1,2} + D^{a\#3g-1,1,3})X(D) + \qquad \text{(Equation 17-(3g-1))}$$
$$(D^{b\#3g-1,1} + D^{b\#3g-1,2} + 1)P(D) = 0$$

$$(D^{a\#3g,1,1} + D^{a\#3g,1,2} + D^{a\#3g,1,3})X(D) + \qquad \text{(Equation 17-3g)}$$
$$(D^{b\#3g,1} + D^{b\#3g,2} + 1)P(D) = 0$$

At this time, X(D) is a polynomial representation of data (information) X and P(D) is a polynomial representation of parity. Here, in equations 17-1 to 17-3g, parity check polynomials are assumed such that there are three terms in X(D) and P(D), respectively. In an LDPC-CC of a time varying period of 3g and a coding rate of 1/2 (n=2), the parity bit and information bits at point in time i are represented by Pi and Xi,1, respectively. If i %3g=k (where k=0, 1, 2, ..., 3g−1) is assumed at this time, a parity check polynomial of equation 17-(k+1) holds true. For example, if i=2, i %3g=2 (k=2), equation 18 holds true.

[18]

$$(D^{a\#3,1,1} + D^{a\#3,1,2} + D^{a\#3,1,3})X_{2,1} + (D^{b\#3,1} + D^{b\#3,2} + 1)P_2 = 0 \qquad \text{(Equation 18)}$$

If <Condition #3-1> and <Condition #4-1> are satisfied at this time, the possibility of being able to create a code having higher error correction capability is increased.

<Condition #3-1>

In equations 17-1 to 17-3g, combinations of orders of X(D) satisfy the following condition:

($a_{\#1,1,1}\%3$, $a_{\#1,1,2}\%3$, $a_{\#1,1,3}\%3$) are any of (0, 1, 2), (0, 2, 1), (1, 0, 2), (1, 2, 0), (2, 0, 1), or (2, 1, 0);
($a_{\#2,1,1}\%3$, $a_{\#2,1,2}\%3$, $a_{\#2,1,3}\%3$) are any of (0, 1, 2), (0, 2, 1), (1, 0, 2), (1, 2, 0), (2, 0, 1), or (2, 1, 0);
($a_{\#3,1,1}\%3$, $a_{\#3,1,2}\%3$, $a_{\#3,1,3}\%3$) are any of (0, 1, 2), (0, 2, 1), (1, 0, 2), (1, 2, 0), (2, 0, 1), or (2, 1, 0);
•
•
•
($a_{\#k,1,1}\%3$, $a_{\#k,1,2}\%3$, $a_{\#k,1,3}\%3$) are any of (0, 1, 2), (0, 2, 1), (1, 0, 2), (1, 2, 0), (2, 0, 1), or (2, 1, 0) (where k = 1, 2, 3, ..., 3 g);
•
•
•
($a_{\#3g-2,1,1}\%3$, $a_{\#3g-2,1,2}\%3$, $a_{\#3g-2,1,3}\%3$) are any of (0, 1, 2), (0, 2, 1), (1, 0, 2), (1, 2, 0), (2, 0, 1), or (2, 1, 0);
($a_{\#3g-1,1,1}\%3$, $a_{\#3g-1,1,2}\%3$, $a_{\#3g-1,1,3}\%3$) are any of (0, 1, 2), (0, 2, 1), (1, 0, 2), (1, 2, 0), (2, 0, 1), or (2, 1, 0); and
($a_{\#3g,1,1}\%3$, $a_{\#3g,1,2}\%3$, $a_{\#3g,1,3}\%3$) are any of (0, 1, 2), (0, 2, 1), (1, 0, 2), (1, 2, 0), (2, 0, 1), or (2, 1, 0).

In addition, in equations 17-1 to 17-3g, combinations of orders of P(D) satisfy the following condition:
($b_{\#1,1}\%3$, $b_{\#1,2}\%3$),
($b_{\#2,1}\%3$, $b_{\#2,2}\%3$),
($b_{\#3,1}\%3$, $b_{\#3,2}\%3$), ...,
($b_{\#k,1}\%3$, $b_{\#k,2}\%3$), ...,
($b_{\#3g-2,1}\%3$, $b_{\#3g-2,2}\%3$),
($b_{\#3g-1,1}\%3$, $b_{\#3g-1,2}\%3$), and ($b_{\#3g,1}\%3$, $b_{\#3g,2}\%3$) are either (1, 2) or (2, 1) (k=1, 2, 3, ..., 3g).

<Condition #3-1> has a similar relationship with respect to equations 17-1 to 17-3g as <Condition #2-1> has with respect to equations 15-1 to 15-3g. If the condition below (<Condition #4-1>) is added for equations 17-1 to 17-3g in addition to <Condition #3-1>, the possibility of being able to create an LDPC-CC having higher error correction capability is increased.

<Condition #4-1>

Orders of P(D) of equations 17-1 to 17-3g satisfy the following condition: all values other than multiples of 3 (that is, 0, 3, 6, ..., 3g−3) from among integers from 0 to 3g−1 (0, 1, 2, 3, 4, ..., 3g−2, 3g−1) are present in the following 6g values of
($b_{\#1,1}\%3g$, $b_{\#1,2}\%3g$),
($b_{\#2,1}\%3g$, $b_{\#2,2}\%3g$),
($b_{\#3,1}\%3g$, $b_{\#3,2}\%3g$), ...,
($b_{\#k,1}\%3g$, $b_{\#k,2}\%3g$), ...,
($b_{\#3g-12,1}\%3g$, $b_{\#3g-2,2}\%3g$),
($b_{\#3g-1,1}\%3g$, $b_{\#3g-1,2}\%3g$), and ($b_{\#3g,1}\%3g$, $b_{\#3g,2}\%3g$).

The possibility of achieving good error correction capability is high if there is also randomness while regularity is maintained for positions at which "1"s are present in a parity check matrix. With an LDPC-CC having a time varying period of 3g (where g=2, 3, 4, 5, ...) and the coding rate is 1/2 (n=2) that has parity check polynomials of equations 17-1 to 17-3g, if a code is created in which <Condition #4-1> is applied in addition to <Condition #3-1>, it is possible to provide randomness while maintaining regularity for positions at which "1"s are present in a parity check matrix, and therefore the possibility of achieving better error correction capability is increased.

Next, an LDPC-CC of a time varying period of 3g (where g=2, 3, 4, 5, ...) is considered that enables encoding to be performed easily and provides relevancy to parity bits and data bits of the same point in time. At this time, if the coding rate is 1/2 (n=2), LDPC-CC parity check polynomials can be represented as shown below.

[19]

$$(D^{a\#1,1,1} + D^{a\#1,1,2} + 1)X(D) + \qquad \text{(Equation 19-1)}$$
$$(D^{b\#1,1} + D^{b\#1,2} + 1)P(D) = 0$$

$$(D^{a\#2,1,1} + D^{a\#2,1,2} + 1)X(D) + \qquad \text{(Equation 19-2)}$$
$$(D^{b\#2,1} + D^{b\#2,2} + 1)P(D) = 0$$

-continued $$(D^{a\#3,1,1} + D^{a\#3,1,2} + 1)X(D) + \\ (D^{b\#3,1} + D^{b\#3,2} + 1)P(D) = 0 \quad \text{(Equation 19-3)}$$

$$\vdots$$

$$(D^{a\#k,1,1} + D^{a\#k,1,2} + 1)X(D) + \\ (D^{b\#k,1} + D^{b\#k,2} + 1)P(D) = 0 \quad \text{(Equation 19-k)}$$

$$\vdots$$

$$(D^{a\#3g-2,1,1} + D^{a\#3g-2,1,2} + 1)X(D) + \\ (D^{b\#3g-2,1} + D^{b\#3g-2,2} + 1)P(D) = 0 \quad \text{(Equation 19-(3g-2))}$$

$$(D^{a\#3g-1,1,1} + D^{a\#3g-1,1,2} + 1)X(D) + \\ (D^{b\#3g-1,1} + D^{b\#3g-1,2} + 1)P(D) = 0 \quad \text{(Equation 19-(3g-1))}$$

$$(D^{a\#3g,1,1} + D^{a\#3g,1,2} + 1)X(D) + \\ (D^{b\#3g,1} + D^{b\#3g,2} + 1)P(D) = 0 \quad \text{(Equation 19-3g)}$$

At this time, X(D) is a polynomial representation of data (information) X and P(D) is a polynomial representation of parity. In equations 19-1 to 19-3g, parity check polynomials are assumed such that there are three terms in X(D) and P(D), respectively, and a $D^0$ term is present in X(D) and P(D) (where k=1, 2, 3, . . . , 3g).

In an LDPC-CC of a time varying period of 3g and a coding rate of 1/2 (n=2), the parity bit and information bits at point in time i are represented by $P_i$ and $X_{i,1}$, respectively. If i %3g=k (where k=0, 1, 2, . . . , 3g−1) is assumed at this time, a parity check polynomial of equation 19-(k+1) holds true. For example, if i=2, i %3g=2 (k=2), equation 20 holds true.
[20]

$$(D^{a\#3,1,1}+D^{a\#3,1,2}+1)X_{2,1}+(D^{b\#3,1}+D^{b\#3,2}+1)P_2=0 \quad \text{(Equation 20)}$$

If following <Condition #5-1> and <Condition #6-1> are satisfied at this time, the possibility of being able to create a code having higher error correction capability is increased.

<Condition #5-1>

In equations 19-1 to 19-3g, combinations of orders of X(D) satisfy the following condition:

---

$(a_{\#1,1,1}\%3, a_{\#1,1,2}\%3)$ is (1, 2) or (2, 1);
$(a_{\#2,1,1}\%3, a_{\#2,1,2}\%3)$ is (1, 2) or (2, 1);
$(a_{\#3,1,1}\%3, a_{\#3,1,2}\%3)$ is (1, 2) or (2, 1);
•
•
•
$(a_{\#k,1,1}\%3, a_{\#k,1,2}\%3)$ is (1, 2) or (2, 1) (where k = 1, 2, 3, . . . , 3 g);
•
•
•
$(a_{\#3g-2,1,1}\%3, a_{\#3g-2,1,2}\%3)$ is (1, 2) or (2, 1),
$(a_{\#3g-1,1,1}\%3, a_{\#3g-1,1,2}\%3)$ is (1, 2) or (2, 1); and
$(a_{\#3g,1,1}\%3, a_{\#3g,1,2}\%3)$ is (1, 2) or (2, 1).

---

In addition, in equations 19-1 to 19-3g, combinations of orders of P(D) satisfy the following condition:

$(b_{\#1,1}\%3, b_{\#1,2}\%3)$,
$(b_{\#2,1}\%3, b_{\#2,2}\%3)$,
$(b_{\#3,1}\%3, b_{\#3,2}\%3)$, . . . ,
$(b_{\#k,1}\%3, b_{\#k,2}\%3)$, . . . ,
$(b_{\#3g-2,1}\%3, b_{\#3g-2,2}\%3)$,
$(b_{\#3g-1,1}\%3, b_{\#3g-1,2}\%3)$,
and $(b_{\#3g,1}\%3, b_{\#3g,2}\%3)$ are either (1, 2) or (2, 1) (where k=1, 2, 3, . . . , 3g).

<Condition #5-1> has a similar relationship with respect to equations 19-1 to 19-3g as <Condition #2-1> has with respect to equations 15-1 to 15-3g. If the condition below (<Condition #6-1>) is added for equations 19-1 to 19-3g in addition to <Condition #5-1>, the possibility of being able to create an LDPC-CC having higher error correction capability is increased.

<Condition #6-1>

Orders of X(D) of equations 19-1 to 19-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3g, a_{\#1,1,2}\%3g)$,
$(a_{\#2,1,1}\%3g, a_{\#2,1,2}\%3g)$, . . . ,
$(a_{\#p,1,1}\%3g, a_{\#p,1,2}\%3g)$, . . . ,
$(a_{\#3g,1,1}\%3g, a_{\#3g,1,2}\%3g)$ (where p=1, 2, 3, . . . , 3g); and Orders of P(D) of equations 19-1 to 19-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, . . . ,
$(b_{\#k,1}\%3g, b_{\#k,2}\%3g)$, . . . ,
$(b_{\#3g-2,1}\%3g, b_{\#3g-2,2}\%3g)$,
$(b_{\#3g-1,1}\%3g, b_{\#3g-1,2}\%3g)$, and $(b_{\#3g,1}\%3g, b_{\#3g,2}\%3g)$ (where k=1, 2, 3, . . . 3g).

The possibility of achieving good error correction capability is high if there is also randomness while regularity is maintained for positions at which "1"s are present in a parity check matrix. With an LDPC-CC having a time varying period of 3g (where g=2, 3, 4, 5, . . . ) and the coding rate is 1/2 that has parity check polynomials of equations 19-1 to 19-3g, if a code is created in which <Condition #6-1> is applied in addition to <Condition #5-1>, it is possible to provide randomness while maintaining regularity for positions at which "1"s are present in a parity check matrix, so that the possibility of achieving better error correction capability is increased.

The possibility of being able to create a code having higher error correction capability is also increased if a code is created using <Condition #6'-1> instead of <Condition #6-1>, that is, using <Condition #6'-1> in addition to <Condition #5-1>.

<Condition #6'-1>

Orders of X(D) of equations 19-1 to 19-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3g, a_{\#1,1,2}\%3g)$,
$(a_{\#2,1,1}\%3g, a_{\#2,1,2}\%3g)$, . . . ,
$(a_{\#p,1,1}\%3g, a_{\#p,1,2}\%3g)$, . . . , and $(a_{\#3g,1,1}\%3g, a_{\#3g,1,2}\%3g)$ (where p=1, 2, 3, . . . , 3g); or Orders of P(D) of equations 19-1 to 19-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, . . . ,
$(b_{\#k,1}\%3g, b_{\#k,2}\%3g)$, . . . ,
$(b_{\#3g-2,1}\%3g, b_{\#3g-2,2}\%3g)$,
$(b_{\#3g-1,1}\%3g, b_{\#3g-1,2}\%3g)$ and $(b_{\#3g,1}\%3g, b_{\#3g,2}\%3g)$ (where k=1, 2, 3, . . . , 3g).

Examples of LDPC-CCs of a coding rate of 1/2 and a time varying period of 6 having good error correction capability are shown in Table 6.

TABLE 6

| Code | Parity check polynomial |
|---|---|
| LDPC-CC #1 of a time varying period of 6 and a coding rate of ½ | Check polynomial #1: $(D^{328} + D^{317} + 1)X(D) + (D^{589} + D^{434} + 1)P(D) = 0$<br>Check polynomial #2: $(D^{596} + D^{553} + 1)X(D) + (D^{586} + D^{461} + 1)P(D) = 0$<br>Check polynomial #3: $(D^{550} + D^{143} + 1)X(D) + (D^{470} + D^{448} + 1)P(D) = 0$<br>Check polynomial #4: $(D^{470} + D^{223} + 1)X(D) + (D^{256} + D^{41} + 1)P(D) = 0$<br>Check polynomial #5: $(D^{89} + D^{40} + 1)X(D) + (D^{316} + D^{71} + 1)P(D) = 0$<br>Check polynomial #6: $(D^{320} + D^{190} + 1)X(D) + (D^{575} + D^{136} + 1)P(D) = 0$ |
| LDPC-CC #2 of a time varying period of 6 and a coding rate of ½ | Check polynomial #1: $(D^{524} + D^{511} + 1)X(D) + (D^{215} + D^{103} + 1)P(D) = 0$<br>Check polynomial #2: $(D^{547} + D^{287} + 1)X(D) + (D^{467} + D^{1} + 1)P(D) = 0$<br>Check polynomial #3: $(D^{289} + D^{62} + 1)X(D) + (D^{503} + D^{502} + 1)P(D) = 0$<br>Check polynomial #4: $(D^{401} + D^{55} + 1)X(D) + (D^{443} + D^{106} + 1)P(D) = 0$<br>Check polynomial #5: $(D^{433} + D^{395} + 1)X(D) + (D^{404} + D^{100} + 1)P(D) = 0$<br>Check polynomial #6: $(D^{136} + D^{59} + 1)X(D) + (D^{599} + D^{559} + 1)P(D) = 0$ |
| LDPC-CC #3 of a time varying period of 6 and a coding rate of ½ | Check polynomial #1: $(D^{253} + D^{44} + 1)X(D) + (D^{473} + D^{256} + 1)P(D) = 0$<br>Check polynomial #2: $(D^{595} + D^{143} + 1)X(D) + (D^{598} + D^{95} + 1)P(D) = 0$<br>Check polynomial #3: $(D^{97} + D^{11} + 1)X(D) + (D^{592} + D^{491} + 1)P(D) = 0$<br>Check polynomial #4: $(D^{50} + D^{10} + 1)X(D) + (D^{368} + D^{112} + 1)P(D) = 0$<br>Check polynomial #5: $(D^{286} + D^{221} + 1)X(D) + (D^{517} + D^{359} + 1)P(D) = 0$<br>Check polynomial #6: $(D^{407} + D^{322} + 1)X(D) + (D^{283} + D^{257} + 1)P(D) = 0$ |

An LDPC-CC of a time varying period of g with good characteristics has been described above. Also, for an LDPC-CC, it is possible to provide encoded data (codeword) by multiplying information vector n by generator matrix G. That is, encoded data (codeword) c can be represented by c=n×G. Here, generator matrix G is found based on parity check matrix H designed in advance. To be more specific, generator matrix G refers to a matrix satisfying G×H$^T$=0.

For example, a convolutional code of a coding rate of 1/2 and generator polynomial G=[1 G$_1$(D)/G$_0$(D)] will be considered as an example. At this time, G$_1$ represents a feed-forward polynomial and G$_0$ represents a feedback polynomial. If a polynomial representation of an information sequence (data) is X(D), and a polynomial representation of a parity sequence is P(D), a parity check polynomial is represented as shown in equation 21 below.

[21]

$$G_1(D)X(D)+G_0(D)P(D)=0 \quad \text{(Equation 21)}$$

where D is a delay operator.

FIG. 5 shows information relating to a (7, 5) convolutional code. A (7, 5) convolutional code generator polynomial is represented as G=[1(D$^2$+1)/(D$^2$+D+1)]. Therefore, a parity check polynomial is as shown in equation 22 below.

[22]

$$(D^2+1)X(D)+(D^2+D+1)P(D)=0 \quad \text{(Equation 22)}$$

Here, data at point in time i is represented by Xi, and parity bit by P$_i$, and transmission sequence Wi is represented as Wi=(X$_i$, P$_i$). Then transmission vector w is represented as w=(X$_1$, P$_1$, X$_2$, P$_2$, ..., X$_i$, P$_i$ ...)$^T$. Thus, from equation 22, parity check matrix H can be represented as shown in FIG. 5. At this time, the relational equation in equation 23 below holds true.

[23]

$$Hw=0 \quad \text{(Equation 23)}$$

Therefore, with parity check matrix H, the decoding side can perform decoding using belief propagation (BP) decoding, min-sum decoding similar to BP decoding, offset BP decoding, normalized BP decoding, shuffled BP decoding, or suchlike belief propagation, as shown in Non-Patent Literature 4, Non-Patent Literature 5 and Non-Patent Literature 6.

[Time-Invariant/Time-Varying LDPC-CC (Coding Rate of (n−1)/n) (n: Natural Number) Based on Convolutional Code]

An overview of time-invariant/time-varying LDPC-CCs based on a convolutional code is given below.

A parity check polynomial represented as shown in equation 24 will be considered, with polynomial representations of coding rate of R=(n−1)/n as information X$_1$, X$_2$, ..., X$_{n-1}$ as X$_1$(D), ..., X$_2$(D), ..., X$_{n-1}$(D), and a polynomial representation of parity P as P(D).

(Equation 24)

$$(D^{a_{1,1}} + D^{a_{1,2}} + \ldots + D^{a_{1,r1}} + 1)X_1(D) + \\ (D^{a_{2,1}} + D^{a_{2,2}} + \ldots + D^{a_{2,r2}} + 1)X_2(D) + \ldots + \\ (D^{a_{n-1,1}} + D^{a_{n-1,2}} + \ldots + D^{a_{n-1,r_{n-1}}} + 1)X_{n-1}(D) + \\ (D^{b_1} + D^{b_2} + \ldots + D^{b_s} + 1)P(D) = 0 \quad [24]$$

In equation 24, at this time, a$_{p,p}$ (where p=1, 2, ..., n−1 and q=1, 2, ..., rp) is, for example, a natural number, and satisfies the condition a$_{p,1}$≠a$_{p,2}$≠ ... ≠a$_{p,rp}$. Also, b$_q$ (where q=1, 2, ..., s) is a natural number, and satisfies the condition b$_1$≠b$_2$≠ ... ≠b$_s$. A code defined by a parity check matrix based on a parity check polynomial of equation 24 at this time is called a time-invariant LDPC-CC here.

Here, in different parity check polynomials based on equation 24 are provided (where m is an integer equal to or greater than 2). These parity check polynomials are represented as shown below.

[25]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Equation 25)}$$

Here, i=0, 1, ..., m−1.

Then information X$_1$, X$_2$, ..., X$_{n-1}$ at point in time j is represented as X$_{1,j}$, X$_{2,j}$, ..., X$_{n-1,j}$, parity P$_j$ at point in time j is represented as P$_j$, and u$_j$=(X$_{1,j}$, X$_{2,j}$, X$_{n-1,j}$, P$_j$)$^T$.

At this time, information X$_{1,j}$, X$_{2,j}$, ..., X$_{n-1,j}$, and parity P$_j$ at point in time j satisfy a parity check polynomial of equation 26.

[26]

$$A_{X1,k}(D)X_1(D)+A_{X2,k}(D)X_2(D)+\ldots+A_{Xn-1,k}(D)X_{n-1}(D)+B_k(D)P(D)=0(k=j \bmod m) \quad \text{(Equation 26)}$$

Here, "j mod m" is a remainder after dividing j by in.

A code defined by a parity check matrix based on a parity check polynomial of equation 26 is called a time-varying LDPC-CC here. At this time, a time-invariant LDPC-CC defined by a parity check polynomial of equation 24 and a time-varying LDPC-CC defined by a parity check polynomial of equation 26 have a characteristic of enabling parity bits easily to be found sequentially by means of a register and exclusive OR.

Figure 6:
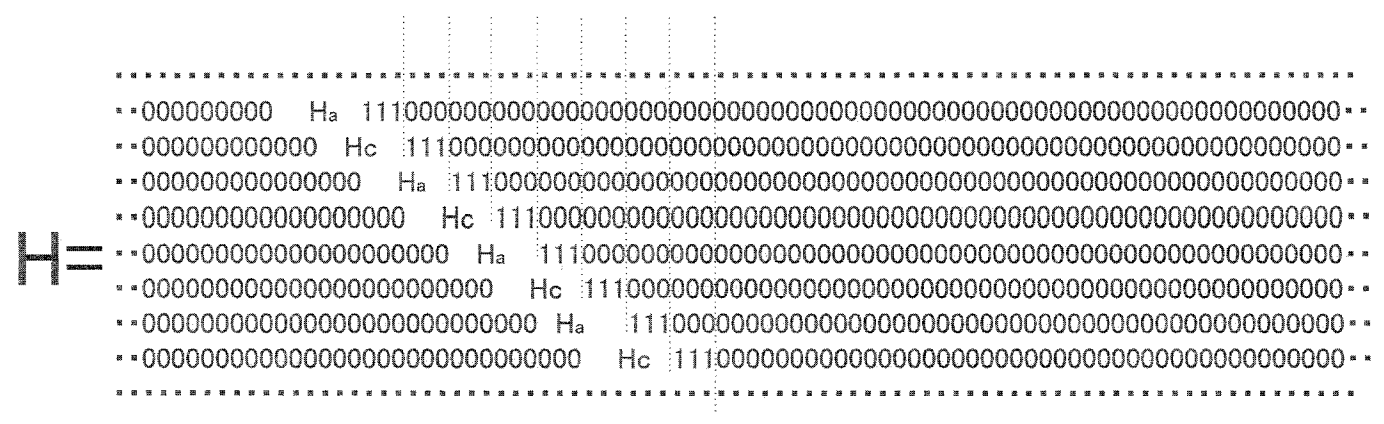

For example, the configuration of LDPC-CC check matrix H of a time varying period of 2 and a coding rate of 2/3 based on equation 24 to equation 26 is shown in FIG. 6. Two different check polynomials of a time varying period of 2 based on equation 26 are designed "check equation #1" and "check equation #2." In FIG. 6, (Ha, 111) is a part corresponding to "check equation #1," and (Hc, 111) is a part corresponding to "check equation #2." Below, (Ha, 111) and (Hc, 111) are defined as sub-matrices.

Thus, LDPC-CC check matrix H of a time varying period of 2 of this proposal can be defined by a first sub-matrix representing a parity check polynomial of "check equation #1," and by a second sub-matrix representing a parity check polynomial of "check equation #2." Specifically, in parity check matrix H, a first sub-matrix and second sub-matrix are arranged alternately in the row direction. When the coding rate is 2/3, a configuration is employed in which a sub-matrix is shifted three columns to the right between an i' th row and (i+1)-th row, as shown in FIG. 6.

In the case of a time-varying LDPC-CC of a time varying period of 2, an i' th row sub-matrix and an (i+1)-th row sub-matrix are different sub-matrices. That is to say, either sub-matrix (Ha, 11) or sub-matrix (Hc, 11) is a first sub-matrix, and the other is a second sub-matrix. If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true (see equation 23).

Next, an LDPC-CC having a time varying period of m is considered in the case of a coding rate of 2/3. In the same way as when the time varying period is 2, m parity check polynomials represented by equation 24 are provided. Then "check equation #1" represented by equation 24 is provided. "Check equation #2" to "check equation #m" represented by equation 24 are provided in a similar way. Data X and parity P of point in time mi+1 are represented by $X_{mi+1}$ and $P_{mi+1}$ respectively, data X and parity P of point in time mi+2 are represented by $X_{mi+2}$ and $P_{mi+2}$ respectively, . . . , and data X and parity P of point in time mi+m are represented by $X_{mi+m}$ and $P_{mi+m}$, respectively (where i is an integer).

Consider an LDPC-CC for which parity $P_{mi+1}$ of point in time mi+1 is found using "check equation #1," parity $P_{mi+2}$ of point in time mi+2 is found using "check equation #2," . . . , and parity $P_{mi+m}$ of point in time mi+m is found using "check equation #m." An LDPC-CC code of this kind provides the following advantages:

An encoder can be configured easily, and parity bits can be found sequentially.

Termination bit reduction and received quality improvement in puncturing upon termination can be expected.

Figure 7:
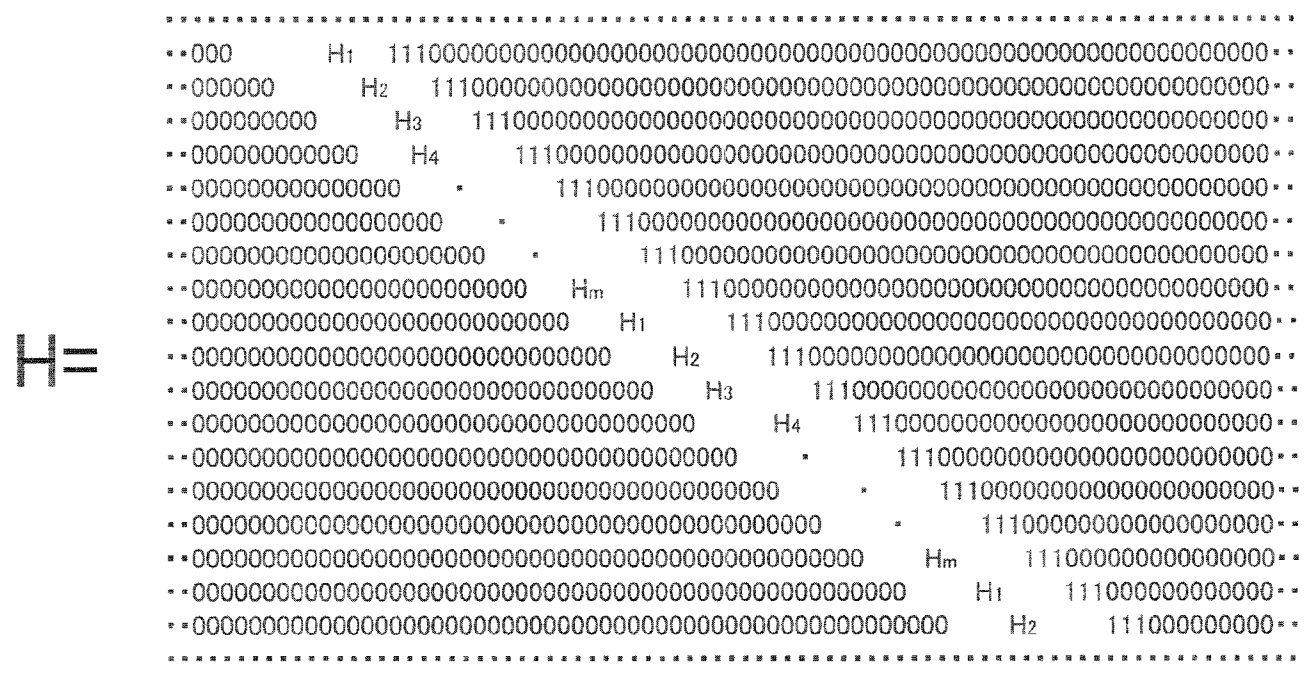

FIG. 7 shows the configuration of the above LDPC-CC check matrix of a coding rate of 2/3 and a time varying period of m. In FIG. 7, (H1, 111) is a part corresponding to "check equation #1," ($H_2$, 111) is a part corresponding to "check equation #2," and ($H_m$, 111) is a part corresponding to "check equation #m." Below, ($H_1$, 111) is defined as a first sub-matrix, ($H_2$, 111) is defined as a second sub-matrix, . . . , and ($H_m$, 111) is defined as an m-th sub-matrix.

Thus, LDPC-CC check matrix H of a time varying period of m of this proposal can be defined by a first sub-matrix representing a parity check polynomial of "check equation #1," a second sub-matrix representing a parity check polynomial of "check equation #2," . . . , and an m-th sub-matrix representing a parity check polynomial of "check equation #m." Specifically, in parity check matrix H, a first sub-matrix to m-th sub-matrix are arranged periodically in the row direction (see FIG. 7). When the coding rate is 2/3, a configuration is employed in which a sub-matrix is shifted three columns to the right between an i-th row and (i+1)-th row (see FIG. 7).

If transmission vector u is represented as $U=(X_{1,0}, X_{2,0}, P_0, X_{1,1}, X_{2,1}, P_1, \ldots, X_{1,k}, X_{2,k}, P_k, \ldots)^T$, the relationship Hu=0 holds true (see equation 23).

In the above description, a case of a coding rate of 2/3 has been described as an example of a time-invariant/time-varying LDPC-CC based on a convolutional code of a coding rate of (n−1)/n, but a time-invariant/time-varying LDPC-CC check matrix based on a convolutional code of a coding rate of (n−1)/n can be created by thinking in a similar way.

Figure 8:
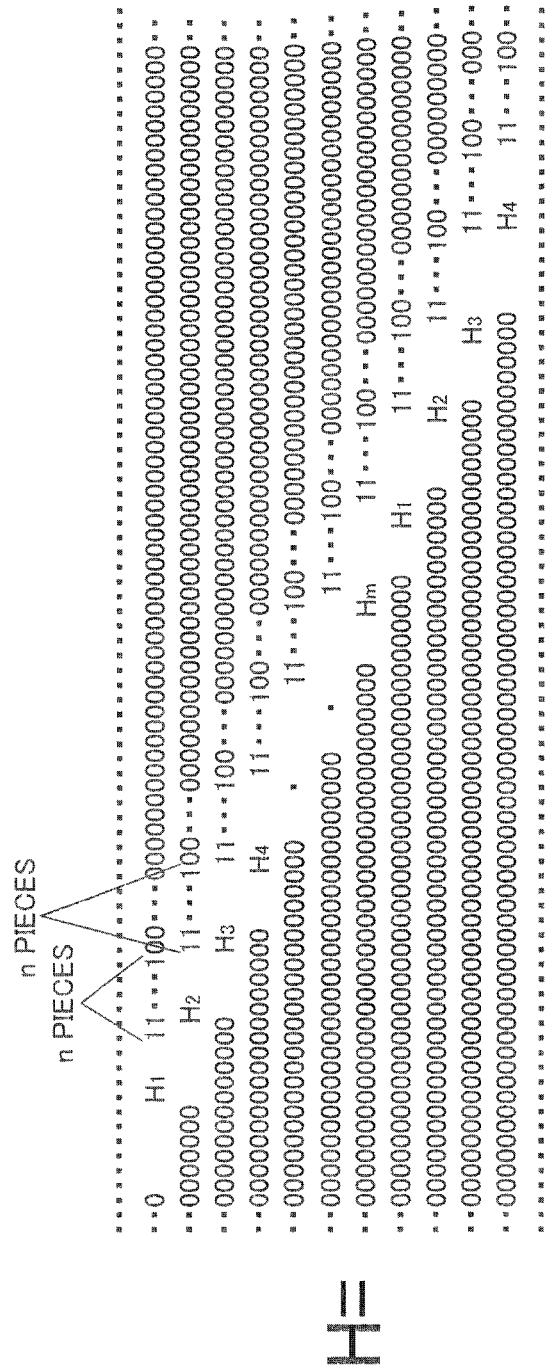

That is to say, in the case of a coding rate of 2/3, in FIG. 7, ($H_1$, 111) is a part (first sub-matrix) corresponding to "check equation #1," ($H_2$, 111) is a part (second sub-matrix) corresponding to "check equation #2,"., and ($H_m$, 111) is a part (m-th sub-matrix) corresponding to "check equation #m," while, in the case of a coding rate of (n−1)/n, the situation is as shown in FIG. 8. That is to say, a part (first sub-matrix) corresponding to "check equation #1" is represented by ($H_1$, 11 . . . 1), and a part (k-th sub-matrix) corresponding to "check equation #k" (where k=2, 3, . . . , m) is represented by ($H_k$, 11 . . . 1). At this time, the number of "1"s of the portion except $H_k$ of the k-th sub-matrix is n. In check matrix H, a configuration is employed in which a sub-matrix is shifted n columns to the right between an i-th row and (i+1)-th row (see FIG. 8).

If transmission vector u is represented as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, the relationship Hu=0 holds true (see equation 23)

Figure 9:
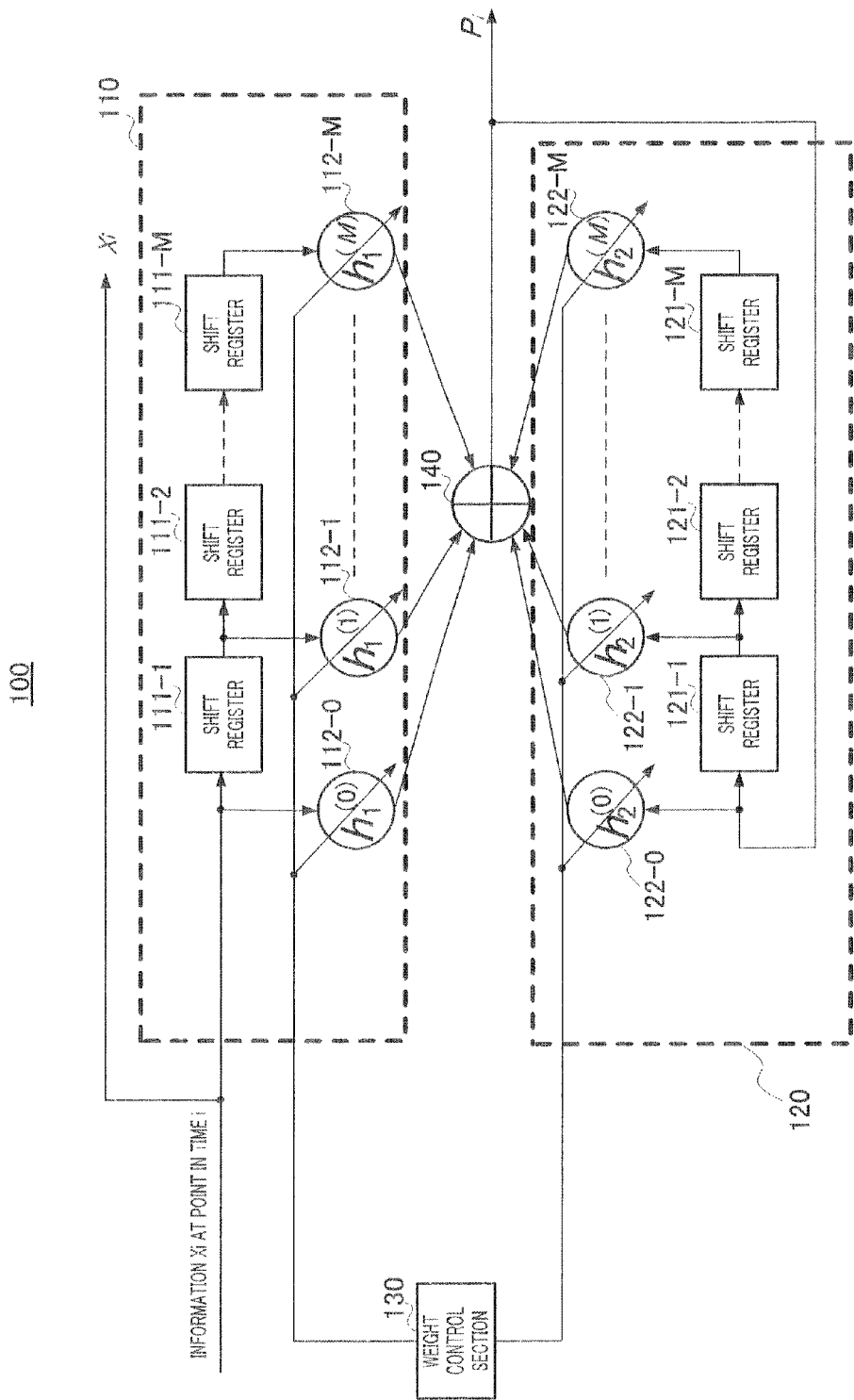
FIG. 9 shows an example of the configuration of an LDPC-CC encoding section.

FIG. 9 shows an example of the configuration of an LDPC-CC encoder when the coding rate is R=1/2. As shown in FIG. 9, LDPC-CC encoder 100 is provided mainly with data computing section 110, parity computing section 120, weight control section 130, and modulo 2 adder (exclusive OR computer) 140.

Data computing section 110 is provided with shift registers 111-1 to 111-M and weight multipliers 112-0 to 112-M.

Parity computing section 120 is provided with shift registers 121-1 to 121-M and weight multipliers 122-0 to 122-M.

Shift registers 111-1 to 111-M and 121-1 to 121-M are registers storing $v_{1,t-1}$ and $v_{2,t-i}$ (where i=0, . . . , M), respectively, and, at a timing at which the next input comes in, send a stored value to the adjacent shift register to the right, and store a new value sent from the adjacent shift register to the left. The initial state of the shift registers is all-zeros.

Weight multipliers 112-0 to 112-M and 122-0 to 122-M switch values of $h_1^{(m)}$ and $h_2(m)$ to 0 or 1 in accordance with a control signal outputted from weight control section 130.

Based on a parity check matrix stored internally, weight control section 130 outputs values of $h_1^{(m)}$ and $h_2^{(m)}$ at that timing, and supplies them to weight multipliers 112-0 to 112-M and 122-0 to 122-M.

Modulo 2 adder 140 adds all modulo 2 calculation results to the outputs of weight multipliers 112-0 to 112-M and 122-0 to 122-M, and calculates $v_{2,1}$.

By employing this kind of configuration, LDPC-CC encoder 100 can perform LDPC-CC encoding in accordance with a parity check matrix.

If the arrangement of rows of a parity check matrix stored by weight control section 130 differs on a row-by-row basis, LDPC-CC encoder 100 is a time varying convolutional encoder. Also, in the case of an LDPC-CC of a coding rate of (q−1)/q, a configuration needs to be employed in which (q−1) data computing sections 110 are provided and modulo 2 adder 140 performs modulo 2 addition (exclusive OR computation) of the outputs of weight multipliers.

(Embodiment 1)

The present embodiment will describe a code configuration method of an LDPC-CC based on a parity check polynomial of a time varying period greater than 3 having excellent error correction capability.

[Time Varying Period of 6]

First, an LDPC-CC of a time varying period of 6 will be described as an example.

Consider Equations 27-0 to 27-5 as parity check polynomials (that satisfy 0) of an LDPC-CC of a coding rate of (n−1)/n (n is an integer equal to or greater than 2) and a time varying period of 6.

[27]

$$(D^{a\#0,1,1}+D^{a\#0,1,2}+D^{a\#0,1,3})X_1(D)+(D^{a\#0,2,1}+D^{\#0,2,2}+D^{\#0,2,3})X_2(D)+\ldots+(D^{a\#0,n-1,1}+D^{a\#0,n-1,2}+D^{a\#0,n-1,3})X_{n-1}(D)+(D^{b\#0,1}+D^{b\#0,2}+D^{b\#0,3})P(D)=0 \quad \text{(Equation 27-0)}$$

$$(D^{a\#1,1,1}+D^{a\#1,1,2}+D^{a\#1,1,3})X_1(D)+(D^{a\#1,2,1}+D^{\#1,2,2}+D^{\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 27-1)}$$

$$(D^{a\#2,1,1}+D^{a\#2,1,2}+D^{a\#2,1,3})X_1(D)+(D^{a\#2,2,1}+D^{\#2,2,2}+D^{\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 27-2)}$$

$$(D^{a\#3,1,1}+D^{a\#3,1,2}+D^{a\#3,1,3})X_1(D)+(D^{a\#3,2,1}+D^{3,2,2}+D^{\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 27-3)}$$

$$(D^{a\#4,1,1}+D^{a\#4,1,2}+D^{a\#4,1,3})X_1(D)+(D^{a\#4,2,1}+D^{4,2,2}+D^{\#4,2,3})X_2(D)+\ldots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 27-4)}$$

$$(D^{a\#5,1,1}+D^{a\#5,1,2}+D^{a\#5,1,3})X_1(D)+(D^{a\#5,2,1}+D^{\#5,2,2}+D^{\#5,2,3})X_2(D)+\ldots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 27-5)}$$

At this time, $X_1(D), X_2(D), \ldots, X_{n-1}(D)$ are polynomial representations of data (information) $X_1, X_2, X_{n-1}$ and $P(D)$ is a polynomial representation of parity. In equations 27-0 to 27-5, when, for example, the coding rate is 1/2, only the terms of $X_1(D)$ and $P(D)$ are present and the terms of $X_2(D), \ldots, X_{n-1}(D)$ are not present. Similarly, when the coding rate is 2/3, only the terms of $X_1(D), X_2(D)$ and $P(D)$ are present and the terms of $X_3(D), \ldots, X_{n-1}(D)$ are not present. The other coding rates may also be considered in a similar manner.

Here, equations 27-0 to 27-5 are assumed to have such parity check polynomials that three terms are present in each of $X_1(D), X_2(D), \ldots, X_{n-1}(D)$ and $P(D)$.

Furthermore, in equations 27-0 to 27-5, it is assumed that the following holds true for $X_1(D), X_2(D), \ldots, X_{n-1}(D)$ and $P(D)$.

In equation 27-q, it is assumed that $a_{\#q,p,1}, a_{\#q,p,2}$ and $a_{\#q,p,3}$ are natural numbers and $a_{\#q,p,1} \neq a_{\#q,p,2}$, $a_{\#q,p,1} \neq a_{\#q,p,3}$ and $a_{\#q,p,2} \neq a_{\#q,p,3}$ hold true. Furthermore, it is assumed that $b_{\#q,1}$, $b_{\#q,2}$ and $b_{\#q,3}$ are natural numbers and $b_{\#q,1} \neq b_{\#q,2}$, $b_{\#q,3}$ and $b_{\#q,1} \neq b_{\#q,3}$ hold true (q=0, 1, 2, 3, 4, 5; p=1, 2, . . . , n−1).

The parity check polynomial of equation 27-q is called "check equation #q" and the sub-matrix based on the parity check polynomial of equation 27-q is called q-th sub-matrix $H_q$. Next, consider an LDPC-CC of a time varying period of 6 generated from 0-th sub-matrix $H_0$, first sub-matrix $H_1$, second sub-matrix $H_2$, third sub-matrix $H_3$, fourth sub-matrix $H_4$ and fifth sub-matrix $H_5$.

In an LDPC-CC of a time varying period of 6 and a coding rate of (n−1)/n (where n is an integer equal to or greater than 2), the parity bit and information bits at point in time i are represented by Pi and $X_{i,1}, X_{i,2}, \ldots$, respectively.

If i %6=k (where k=0, 1, 2, 3, 4, 5) is assumed at this time, a parity check polynomial of equation 27-(k) holds true. For example, if i=8, i %6=2 (k=2), equation 28 holds true.

[28]

$$(D^{a\#2,1,1}+D^{a\#2,1,2}+D^{a\#2,1,3})X_{8,1}+(D^{a\#2,2,1}+D^{\#2,2,2}+D^{a\#2,2,3})X_{8,2}+\ldots+(D^{a\#2,n-1,1}+D^{a\#2,n-1,2}+D^{a\#2,n-1,3})X_{8,n-1}+(D^{b\#2,1}+D^{b\#2,2}+D^{b\#2,3})P_8 0 \quad \text{(Equation 28)}$$

Furthermore, when the sub-matrix (vector) of equation 27-g is assumed to be $H_g$, the parity check matrix can be created using the method described in [LDPC-CC based on parity check polynomial].

It is assumed that $a_{\#q,1,3}=0$ and $b_{\#q,3}=0$ (q=0, 1, 2, 3, 4, 5) so as to simplify the relationship between the parity bits and information bits in equations 27-0 to 27-5 and sequentially find the parity bits. Therefore, the parity check polynomials (that satisfy 0) of equations 27-0 to 27-5 are represented as shown in equations 29-0 to 29-5.

[29]

$$(D^{a\#0,1,1}+D^{a\#0,1,2}+1)X_1(D)+(D^{a\#0,2,1}+D^{\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \quad \text{(Equation 29-0)}$$

$$(D^{a\#1,1,1}+D^{a\#1,1,2}+1)X_1(D)+(D^{a\#1,2,1}+D^{\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \quad \text{(Equation 29-1)}$$

$$(D^{a\#2,1,1}+D^{a\#2,1,2}+1)X_1(D)+(D^{a\#2,2,1}+D^{\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad \text{(Equation 29-2)}$$

$$(D^{a\#3,1,1}+D^{a\#3,1,2}+1)X_1(D)+(D^{a\#3,2,1}+D^{\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad \text{(Equation 29-3)}$$

$$(D^{a\#4,1,1}+D^{a\#4,1,2}+1)X_1(D)+(D^{a\#4,2,1}+D^{\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad \text{(Equation 29-4)}$$

$$(D^{a\#5,1,1}+D^{a\#5,1,2}+1)X_1(D)+(D^{a\#5,2,1}+D^{\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad \text{(Equation 29-5)}$$

Furthermore, it is assumed that 0-th sub-matrix $H_0$, first sub-matrix $H_1$, second sub-matrix $H_2$, third sub-matrix $H_3$, fourth sub-matrix $H_4$ and fifth sub-matrix $H_5$ are represented as shown in equations 30-0 to 30-5.

[30]

$$H_0 = \{H'_0, \underbrace{1 1 \ldots 1}_{n}\} \quad \text{(Equation 30-0)}$$

$$H_1 = \{H'_1, \underbrace{1 1 \ldots 1}_{n}\} \quad \text{(Equation 30-1)}$$

$$H_2 = \{H'_2, \underbrace{1 1 \ldots 1}_{n}\} \quad \text{(Equation 30-2)}$$

$$H_3 = \{H'_3, \underbrace{1 1 \ldots 1}_{n}\} \quad \text{(Equation 30-3)}$$

-continued $$H_4 = \{H'_4, \underbrace{1 1 \ldots 1}_{n}\} \quad \text{(Equation 30-4)}$$

$$H_5 = \{H'_5, \underbrace{1 1 \ldots 1}_{n}\} \quad \text{(Equation 30-5)}$$

In equations 30-0 to 30-5, n continuous "1"s correspond to the terms of $X_1(D), X_2(D), \ldots, X_1(D)$ and $P(D)$ in each of equations 29-0 to 29-5.

Figure 10:
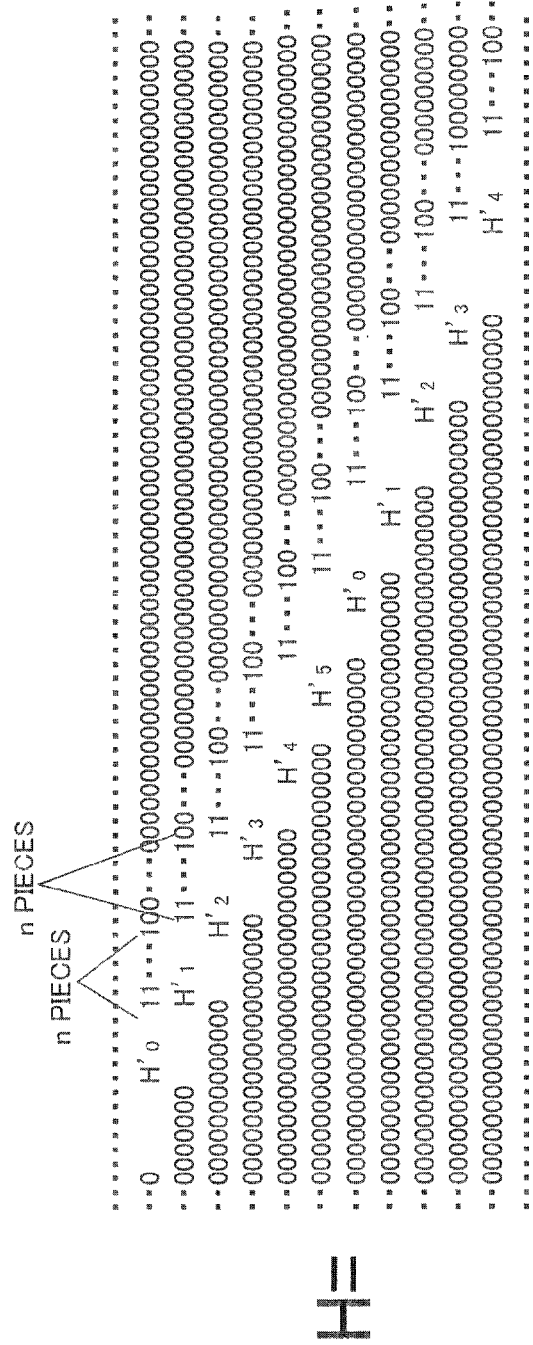
FIG. 10 is a block diagram showing an example of parity check matrix.

At this time, parity check matrix H can be represented as shown in FIG. 10. As shown in FIG. 10, a configuration is employed in which a sub-matrix is shifted n columns to the right between an i-th row and (i+1)-th row in parity check matrix H (see FIG. 10). Assuming transmission vector u as $u = (X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, $Hu=0$ holds true.

Here, conditions for the parity check polynomials in equations 29-0 to 29-5 are proposed under which high error correction capability can be achieved.

<Condition #1-1> and <condition #1-2> below are important for the terms relating to $X_1(D), X_2(D), \ldots, X_{n-1}(D)$. In the following conditions, "%" means a modulo, and for example, "α%6" represents a remainder after dividing a by 6.

Next, other important constraint conditions will be described.

<Condition #2-1>

In <condition #1-1>, $v_{p=1}, v_{p=2}, v_{p=3}, v_{p=4}, \ldots, v_{p=k}, \ldots, v_{p=n-2}, v_{p=n-2}, v_{p=n-1}$, and w are set to "1," "4" and "5." That is, $v_{p=k}$ (k=1, 2, ..., n–1) and w are set to "1" and "natural numbers other than divisors of a time varying period of 6."

<Condition #2-2>

In <condition #1-2>, $y_{p=1}, y_{p=2}, y_{p=3}, y_{p=4}, \ldots, y_{p=k}, \ldots, y_{p=n-2}, y_{p=n-1}$ and z are set to "1," "4" and "5." That is, $Y_{p=k}$ (k=1, 2, ..., n–1) and z are set to "1" and "natural numbers other than divisors of a time varying period of 6."

By adding the constraint conditions of <condition #2-1> and <condition #2-2> or the constraint conditions of <condition #2-1> or <condition #2-2>, it is possible to clearly provide an effect of increasing the time varying period compared to a case where the time varying period is small such as a time varying period of 2 or 3. This will be described in detail using the attached drawings.

For simplicity of explanation, a case will be considered where $X_1(D)$ in parity check polynomials 29-0 to 29-5 of an

---

<Condition #1-1>

"$a_{\#0,1,1}\%6 = a_{\#1,1,1}\%6 = a_{\#2,1,1}\%6 = a_{\#3,1,1}\%6 = a_{\#4,1,1}\%6 = a_{\#5,1,1}\%6 = v_{p-1}$ ($v_{p-1}$: fixed-value)"
"$a_{\#0,2,1}\%6 = a_{\#1,2,1}\%6 = a_{\#2,2,1}\%6 = a_{\#3,2,1}\%6 = a_{\#4,2,1}\%6 = a_{\#5,2,1}\%6 = v_{p-2}$ ($v_{p-2}$: fixed-value)"
"$a_{\#0,3,1}\%6 = a_{\#1,3,1}\%6 = a_{\#2,3,1}\%6 = a_{\#3,3,1}\%6 = a_{\#4,3,1}\%6 = a_{\#5,3,1}\%6 = v_{p-3}$ ($v_{p-3}$: fixed-value)"
"$a_{\#0,4,1}\%6 = a_{\#1,4,1}\%6 = a_{\#2,4,1}\%6 = a_{\#3,4,1}\%6 = a_{\#4,4,1}\%6 = a_{\#5,4,1}\%6 = v_{p-4}$ ($v_{p-4}$: fixed-value)"
•
•
•
"$a_{\#0,k,1}\%6 = a_{\#1,k,1}\%6 = a_{\#2,k,1}\%6 = a_{\#3,k,1}\%6 = a_{\#4,k,1}\%6 = a_{\#5,k,1}\%6 = v_{p-k}$ ($v_{p-k}$: fixed-value)
(therefore, k = 1, 2, . . . , n – 1)"
•
•
•
"$a_{\#0,n-2,1}\%6 = a_{\#1,n-2,1}\%6 = a_{\#2,n-2,1}\%6 = a_{\#3,n-2,1}\%6 = a_{\#4,n-2,1}\%6 = a_{\#5,n-2,1}\%6 = v_{p-n-2}$ ($v_{p-n-2}$: fixed-value)"
"$a_{\#0,n-1,1}\%6 = a_{\#1,n-1,1}\%6 = a_{\#2,n-1,1}\%6 = a_{\#3,n-1,1}\%6 = a_{\#4,n-1,1}\%6 = a_{\#5,n-1,1}\%6 = v_{p-n-1}$ ($v_{p-n-1}$: fixed-value)" and
"$b_{\#0,1}\%6 = b_{\#1,1}\%6 = b_{\#2,1}\%6 = b_{\#3,1}\%6 = b_{\#4,1}\%6 = b_{\#5,1}\%6 = w$ (w: fixed-value)"

<Condition #1-2>

"$a_{\#0,1,2}\%6 = a_{\#1,1,2}\%6 = a_{\#2,1,2}\%6 = a_{\#3,1,2}\%6 = a_{\#4,1,2}\%6 = a_{\#5,1,2}\%6 = y_{p-1}$ ($y_{p-1}$: fixed-value)"
"$a_{\#0,2,2}\%6 = a_{\#1,2,2}\%6 = a_{\#2,2,2}\%6 = a_{\#3,2,2}\%6 = a_{\#4,2,2}\%6 = a_{\#5,2,2}\%6 = y_{p-2}$ ($y_{p-2}$: fixed-value)"
"$a_{\#0,3,2}\%6 = a_{\#1,3,2}\%6 = a_{\#2,3,2}\%6 = a_{\#3,3,2}\%6 = a_{\#4,3,2}\%6 = a_{\#5,3,2}\%6 = y_{p-3}$ ($y_{p-3}$: fixed-value)"
"$a_{\#0,4,2}\%6 = a_{\#1,4,2}\%6 = a_{\#2,4,2}\%6 = a_{\#3,4,2}\%6 = a_{\#4,4,2}\%6 = a_{\#5,4,2}\%6 = y_{p-4}$ ($y_{p-4}$: fixed-value)"
•
•
•
"$a_{\#0,k,2}\%6 = a_{\#1,k,2}\%6 = a_{\#2,k,2}\%6 = a_{\#3,k,2}\%6 = a_{\#4,k,2}\%6 = a_{\#5,k,2}\%6 = y_{p-k}$ ($y_{p-k}$: fixed-value)
(therefore, k = 1, 2, . . . , n – 1)"
•
•
•
"$a_{\#0,n-2,2}\%6 = a_{\#1,n-2,2}\%6 = a_{\#2,n-2,2}\%6 = a_{\#3,n-2,2}\%6 = a_{\#4,n-2,2}\%6 = a_{\#5,n-2,2}\%6 = y_{p-n-2}$ ($y_{p-n-2}$: fixed-value)"
"$a_{\#0,n-1,2}\%6 = a_{\#1,n-1,2}\%6 = a_{\#2,n-1,2}\%6 = a_{\#3,n-1,2}\%6 = a_{\#4,n-1,2}\%6 = a_{\#5,n-1,2}\%6 = y_{p-n-1}$ ($y_{p-n-1}$: fixed-value)" and
"$b_{\#0,2}\%6 = b_{\#1,2}\%6 = b_{\#2,2}\%6 = b_{\#3,2}\%6 = b_{\#4,2}\%6 = b_{\#5,2}\%6 = z$ (z: fixed-value)"

---

By designating <condition #1-1> and <condition #1-2> constraint conditions, the LDPC-CC that satisfies the constraint conditions becomes a regular LDPC code, and can thereby achieve high error correction capability.

LDPC-CC of a time varying period of 6 and a coding rate of (n–1)/n based on parity check polynomials has two terms. At this time, the parity check polynomials are represented as shown in equations 31-0 to 31-5.

[31]

$$(D^{a\#0,1,1}+1)X_1(D)+(D^{a\#0,2,1}+D^{a\#0,2,2}+1)$$
$$X_2(D)+\ldots+(D^{a\#0,n-1,1}+D^{a\#0,n-1,2}+1)X_{n-1}(D)+$$
$$(D^{b\#0,1}+D^{b\#0,2}+1)P(D)=0 \quad \text{(Equation 31-0)}$$

$$(D^{a\#1,1,1}+1)X_1(D)+(D^{a\#1,2,1}+D^{a\#1,2,2}+1)$$
$$X_2(D)+\ldots+(D^{a\#1,n-1,1}+D^{a\#1,n-1,2}+1)X_{n-1}(D)+$$
$$(D^{b\#1,1}+D^{b\#1,2}+1)P(D)=0 \quad \text{(Equation 31-1)}$$

$$(D^{a\#2,1,1}+1)X_1(D)+(D^{a\#2,2,1}+D^{a\#2,2,2}+1)$$
$$X_2(D)+\ldots+(D^{a\#2,n-1,1}+D^{a\#2,n-1,2}+1)X_{n-1}(D)+$$
$$(D^{b\#0,1}+D^{b\#2,2}+1)P(D)=0 \quad \text{(Equation 31-2)}$$

$$(D^{a\#30,1,1}+1)X_1(D)+(D^{a\#3,2,1}+D^{a\#3,2,2}+1)$$
$$X_2(D)+\ldots+(D^{a\#3,n-1,1}+D^{a\#3,n-1,2}+1)X_{n-1}(D)+$$
$$(D^{b\#3,1}+D^{b\#3,2}+1)P(D)=0 \quad \text{(Equation 31-3)}$$

$$(D^{a\#4,1,1}+1)X_1(D)+(D^{a\#4,2,1}+D^{a\#4,2,2}+1)$$
$$X_2(D)+\ldots+(D^{a\#4,n-1,1}+D^{a\#4,n-1,2}+1)X_{n-1}(D)+$$
$$(D^{b\#4,1}+D^{b\#4,2}+1)P(D)=0 \quad \text{(Equation 31-4)}$$

$$(D^{a\#5,1,1}+1)X_1(D)+(D^{a\#5,2,1}+D^{a\#5,2,2}+1)$$
$$X_2(D)+\ldots+(D^{a\#5,n-1,1}+D^{a\#5,n-1,2}+1)X_{n-1}(D)+$$
$$(D^{b\#5,1}+D^{b\#5,2}+1)P(D)=0 \quad \text{(Equation 31-5)}$$

Here, a case will be considered where $v_{p=k}$ ($k=1, 2, \ldots, n-1$) and w are set to "3." "3" is a divisor of a time varying period of 6.

Figure 11:
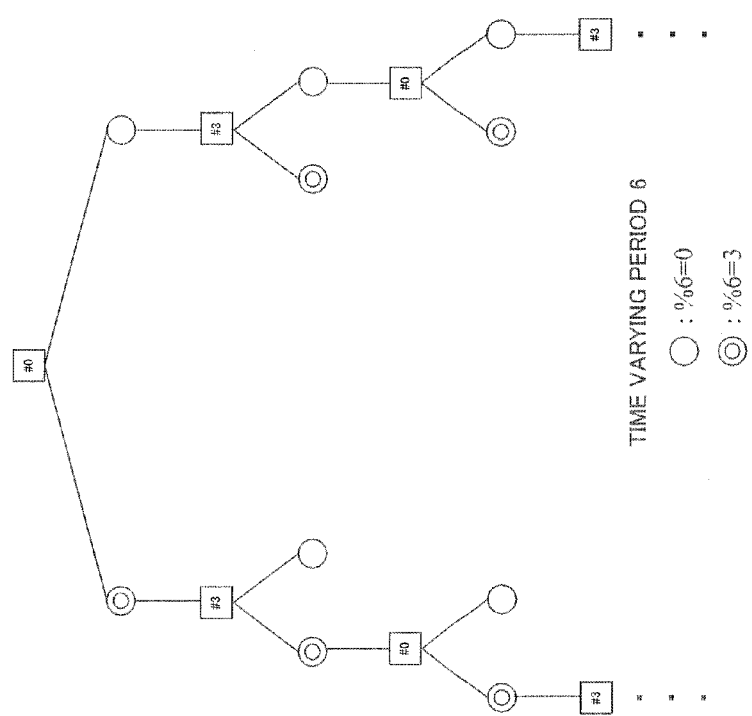
FIG. 11 shows an example of an LDPC-CC tree of a time varying period of 6.

FIG. 11 shows a tree of check nodes and variable nodes when only information $X_1$ is focused upon when it is assumed that $v_{p=1}$ and w are set to "3" and ($a_{\#0,1,1}\%6=a_{1,1,1}\%6=a_{\#2,1,1}\%6=a_{\#3,1,1}\%6=a_{\#5,1,1}\%6=3$).

The parity check polynomial of equation 31-q is called "check equation #q." In FIG. 11, a tree is drawn from "check equation #0." In FIG. 11, the symbols "○" (single circle) and "⊙" (double circle) represent variable nodes, and the symbol "□" (square) represents a check node. The symbol "○" (single circle) represents a variable node relating to $X_1(D)$ and the symbol "⊙" (double circle) represents a variable node relating to $D^{a\#q,1,1}X_1(D)$). Furthermore, the symbol "□" (square) described as #Y (Y=0, 1, 2, 3, 4, 5) means a check node corresponding to a parity check polynomial of equation 31-Y.

In FIG. 11, values that do not satisfy <condition #2-1>, that is, $v_{p=1}, v_{p=2}, v_{p=3}, v_{p=4}, \ldots, v_{p=k}, \ldots, v_{p=n-2}, v=p=n-1$ ($k=1, 2, \ldots, n-1$) and w are set to a divisor other than 1 among divisors of time varying period of 6 (w=3).

At this time, as shown in FIG. 11, #Y only have limited values such as 0 or 3 at check nodes. That is, even if the time varying period is increased, belief is propagated only from a specific parity check polynomial, which means that the effect of having increased the time varying period is not achieved.

In other words, the condition for #Y to have only limited values is to "set $v_{p=1}, v_{p=2}, v_{p=3}, v_{p=4}, \ldots, v_{p=k}, \ldots, v_{p=n-2}, v_{p=n-1}$ ($k=1, 2, \ldots, n-1$) and w to a divisor other than 1 among divisors of a time varying period of 6."

Figure 12:
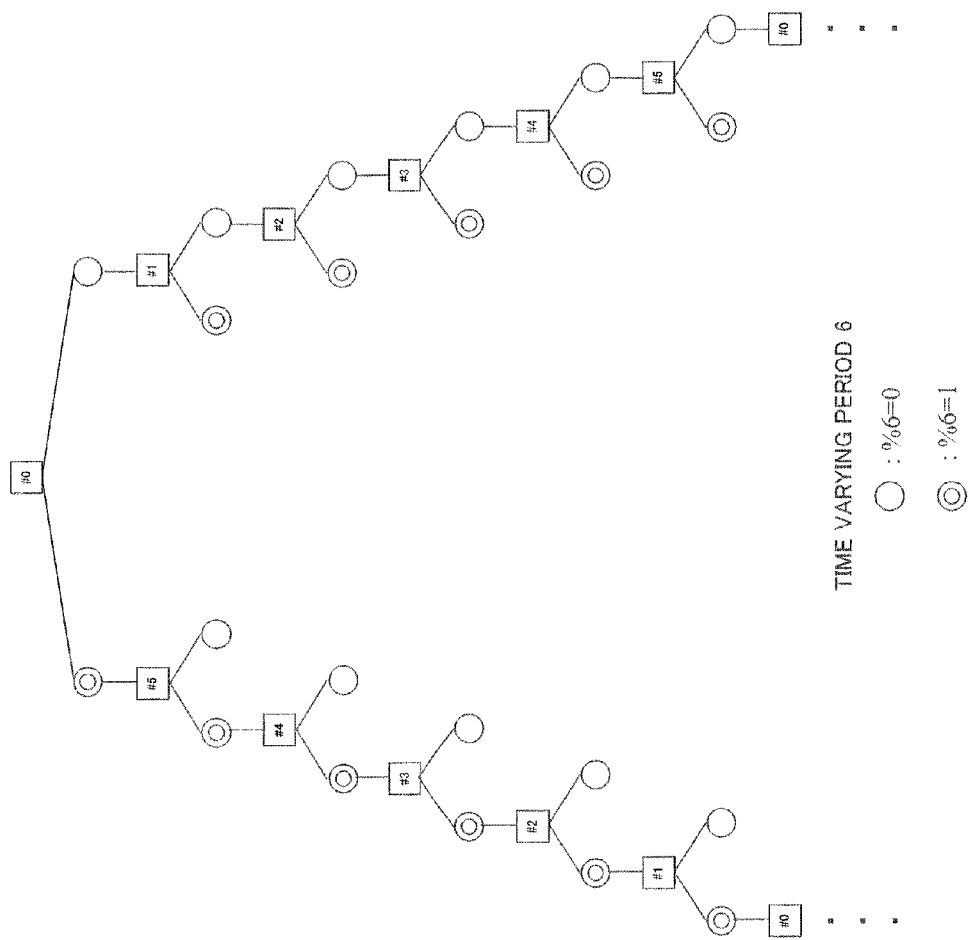
FIG. 12 shows an example of an LDPC-CC tree of a time varying period of 6.

By contrast, FIG. 12 shows a tree when $v_{p=k}$ ($k=1, 2, \ldots, n-1$) and w are set to "1" in the parity check polynomial. When $v_{p=k}$ ($k=1, 2, \ldots, n-1$) and w are set to "1," the condition of <condition #2-1> is satisfied.

As shown in FIG. 12, when the condition of <condition #2-1> is satisfied, #Y takes all values from 0 to 5 at check nodes. That is, when the condition of <condition #2-1> is satisfied, belief is propagated by all parity check polynomials corresponding to the values of #Y. As a result, even when the time varying period is increased, belief is propagated from a wide range and the effect of having increased the time varying period can be achieved. That is, it is clear that <condition #2-1> is an important condition to achieve the effect of having increased the time varying period. Similarly, <condition #2-2> becomes an important condition to achieve the effect of having increased the time varying period.

[Time Varying Period of 7]

When the above description is taken into consideration, the time varying period being a prime number is an important condition to achieve the effect of having increased the time varying period. This will be described in detail below.

First, consider equations 32-0 to 32-6 as parity check polynomials (that satisfy 0) of an LDPC-CC of a coding rate of $(n-1)/n$ (n is an integer equal to or greater than 2) and a time varying period of 7.

[32]

$$(D^{a\#0,1,1}+D^{a\#0,1,2}+1)X_1(D)+(D^{a\#0,2,1}+D^{a\#0,2,2}+1)X_2$$
$$(D)+\ldots+(D^{a\#0,n-1,1}+D^{a\#0,n-1,2}+1)X_{n-1}(D)+$$
$$(D^{b\#0,1}+D^{b\#0,2}+1)P(D)=0 \quad \text{(Equation 32-0)}$$

$$(D^{a\#1,1,1}+D^{a\#1,1,2}+1)X_1(D)+(D^{a\#1,2,1}+D^{a\#1,2,2}+1)X_2$$
$$(D)+\ldots+(D^{a\#1,n-1,1}+D^{a\#1,n-1,2}+1)X_{n-1}(D)+$$
$$(D^{b\#1,1}+D^{b\#1,2}+1)P(D)=0 \quad \text{(Equation 32-1)}$$

$$(D^{a\#2,1,1}+D^{a\#2,1,2}+1)X_1(D)+(D^{a\#2,2,1}+D^{a\#2,2,2}+1)X_2$$
$$(D)+\ldots+(D^{a\#2,n-1,1}+D^{a\#2,n-1,2}+1)X_{n-1}(D)+$$
$$(D^{b\#2,1}+D^{b\#2,2}+1)P(D)=0 \quad \text{(Equation 32-2)}$$

$$(D^{a\#3,1,1}+D^{a\#3,1,2}+1)X_1(D)+(D^{a\#3,2,1}+D^{a\#3,2,2}+1)X_2$$
$$(D)+\ldots+(D^{a\#3,n-1,1}+D^{a\#3,n-1,2}+1)X_{n-1}(D)+$$
$$(D^{b\#3,1}+D^{b\#3,2}+1)P(D)=0 \quad \text{(Equation 32-3)}$$

$$(D^{a\#4,1,1}+D^{a\#4,1,2}+1)X_1(D)+(D^{a\#4,2,1}+D^{a\#4,2,2}+1)X_2$$
$$(D)+\ldots+(D^{a\#4,n-1,1}+D^{a\#4,n-1,2}+1)X_{n-1}(D)+$$
$$(D^{b\#4,1}+D^{b\#4,2}+1)P(D)=0 \quad \text{(Equation 32-4)}$$

$$(D^{a\#5,1,1}+D^{a\#5,1,2}+1)X_1(D)+(D^{a\#5,2,1}+D^{a\#5,2,2}+1)X_2$$
$$(D)+\ldots+(D^{a\#5,n-1,1}+D^{a\#5,n-1,2}+1)X_{n-1}(D)+$$
$$(D^{b\#5,1}+D^{b\#5,2}+1)P(D)=0 \quad \text{(Equation 32-5)}$$

$$(D^{a\#6,1,1}+D^{a\#6,1,2}+1)X_1(D)+(D^{a\#6,2,1}+D^{a\#6,2,2}+1)X_2$$
$$(D)+\ldots+(D^{a\#6,n-1,1}+D^{a\#6,n-1,2}+1)X_{n-1}(D)+$$
$$(D^{b\#6,1}+D^{b\#6,2}+1)P(D)=0 \quad \text{(Equation 32-6)}$$

In equation 32-q, it is assumed that $a_{\#q,p,1}$ and $a_{\#q,p,2}$ are natural numbers equal to or greater than 1, and $a_{\#q,p,1} \neq a_{\#q,p,2}$ holds true. Furthermore, it is assumed that $N_{\#q,1}$ and $b_{q,2}$ are natural numbers equal to or greater than 1, and $b_{\#q,1} \neq b_{\#q,2}$ holds true ($q=0, 1, 2, 3, 4, 5, 6$; $p=1, 2, \ldots, n-1$).

In an LDPC-CC of a time varying period of 7 and a coding rate of $(n-1)/n$ (n is an integer equal to or greater than 2), the parity bit and information bits at point in time i are represented by $P_i$ and $X_{i,1}, X_{i,2}, \ldots, X_{i,n-1}$, respectively. At this time, if $i \%7=k$ ($k=0, 1, 2, 3, 4, 5, 6$), the parity check polynomial of equation 32-(k) holds true.

For example, if i=8, i %7=1 (k=1), equation 33 holds true.
[33]

$$(D^{a\#1,1,1}+D^{a\#1,1,2}+1)X_{8,1}+(D^{a\#1,2,1}+D^{a\#1,2,2}+1)$$
$$X_{8,2}+\ldots+(D^{a\#1,n-1,1}+D^{a\#1,n-1,2}+1)X_{8,n-1}+$$
$$(D^{b\#1,1}+D^{b\#1,2}+1)P_8=0 \quad \text{(Equation 33)}$$

Furthermore, when the sub-matrix (vector) of equation 32-g is assumed to be $H_g$, the parity check matrix can be created using the method described in [LDPC-CC based on parity check polynomial]. Here, the 0-th sub-matrix, first sub-matrix, second sub-matrix, third sub-matrix, fourth sub-matrix, fifth sub-matrix and sixth sub-matrix are represented as shown in equations 34-0 to 34-6.

[34]

$$H_0 = \{H'_0, \underbrace{1 1 \ldots 1}_{n}\} \quad \text{(Equation 34-0)}$$

$$H_1 = \{H'_1, \underbrace{1 1 \ldots 1}_{n}\} \quad \text{(Equation 34-1)}$$

-continued $$H_2 = \{H'_2, \underbrace{1 1 \ldots 1}_{n}\} \quad \text{(Equation 34-2)}$$

$$H_3 = \{H'_3, \underbrace{1 1 \ldots 1}_{n}\} \quad \text{(Equation 34-3)}$$

$$H_4 = \{H'_4, \underbrace{1 1 \ldots 1}_{n}\} \quad \text{(Equation 34-4)}$$

$$H_5 = \{H'_5, \underbrace{1 1 \ldots 1}_{n}\} \quad \text{(Equation 34-5)}$$

$$H_6 = \{H'_6, \underbrace{1 1 \ldots 1}_{n}\} \quad \text{(Equation 34-6)}$$

In equations 34-0 to 34-6, n continuous "1"s correspond to the terms of $X_1(D), X_2(D), \ldots, X_{n-1}(D)$ and $P(D)$ in each of equations 32-0 to 32-6.

Figure 13:
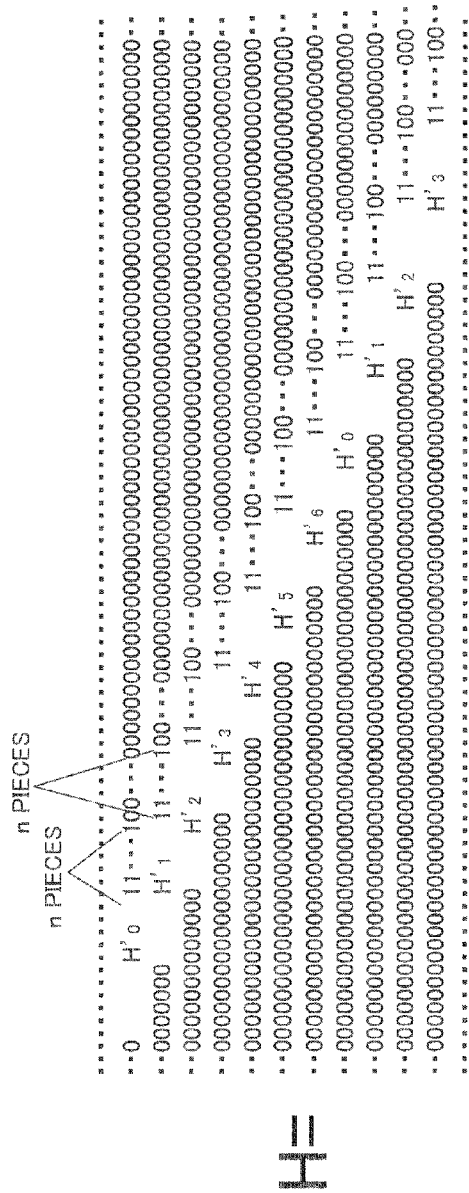
FIG. 13 shows an example of the configuration of an LDPC-CC check matrix of a coding rate of (n−1)/n and a time varying period of 6.

At this time, parity check matrix H can be represented as shown in FIG. 13. As shown in FIG. 13, a configuration is employed in which a sub-matrix is shifted n columns to the right between an i-th row and (i+1)-th row in parity check matrix H (see FIG. 13). When transmission vector u is assumed to be $u=(X_{1,0}, X_{2,0}, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true.

Here, the condition for the parity check polynomials in equation 32-0 to equation 32-6 to achieve high error correction capability is as follows as in the case of the time varying period of 6. In the following conditions, "%" means a modulo, and, for example, "α %7" represents a remainder after dividing a by 7.

By designating <condition #1-1'> and <condition #1-2'> constraint conditions, the LDPC-CC that satisfies the constraint conditions becomes a regular LDPC code, and can thereby achieve high error correction capability.

In the case of a time varying period of 6, achieving high error correction capability further requires <condition #2-1> and <condition #2-2>, or <condition #2-1> or <condition #2-2>. By contrast, when the time varying period is a prime number as in the case of a time varying period of 7, the condition corresponding to <condition #2-1> and <condition #2-2>, or <condition #2-1> or <condition #2-2> required in the case of the time varying period of 6 is unnecessary.

That is to say, in <condition #1-1'>, values of $v_{p=1}$, $v_{p=2}$, $v_{p=3}, V_{p=4}, \ldots, v_{p=k}, \ldots, v_{p=n-2}, v_{p=n-1}$ (k=1, 2, ..., n−1) and w may be one of values "0, 1, 2, 3, 4, 5 and 6."

Also, in <condition #1-2'>, values of $y_{p=1}$, $y_{p=2}$, $y_{p=3}$, $y_{p=4}, \ldots, y_{p=k}, \ldots, y_{p=n-2}, y_{p=n-10}$ (k=1, 2, ..., n−1) and z may be one of values "0, 1, 2, 3, 4, 5 and 6."

The reason will be described below.

For simplicity of explanation, a case will be considered where $X_1(D)$ in the parity check polynomials 32-0 to 32-6 of an LDPC-CC of a time varying period of 7 and a coding rate of (n−1)/n based on the parity check polynomials has two terms. In this case, the parity check polynomials are represented as shown in equations 35-0 to 35-6.

[35]

$$(D^{a\#0,1,1}+1)X_1(D)+(D^{a\#0,2,1}+D^{a\#0,2,2}+1)$$
$$X_2(D)+ \ldots +(D^{a\#0,n-1,1}+D^{a\#0,n-1,2}+1)X_{n-1}(D)+$$
$$(D^{b\#0,1}+D^{b\#0,2}+1)P)(D)=0 \quad \text{(Equation 35-0)}$$

<Condition #1-1>

"$a_{\#0, 1, 1}\%7 = a_{\#1, 1, 1}\%7 = a_{\#2, 1, 1}\%7 = a_{\#3, 1, 1}\%7 = a_{\#4, 1, 1}\%7 = a_{\#5, 1, 1}\%7 = v_{p-1}$ ($v_{p-1}$: fixed-value)"
"$a_{\#0, 2, 1}\%7 = a_{\#1, 2, 1}\%7 = a_{\#2, 2, 1}\%7 = a_{\#3, 2, 1}\%7 = a_{\#4, 2, 1}\%7 = a_{\#5, 2, 1}\%7 = v_{p-2}$ ($v_{p-2}$: fixed-value)"
"$a_{\#0, 3, 1}\%7 = a_{\#1, 3, 1}\%7 = a_{\#2, 3, 1}\%7 = a_{\#3, 3, 1}\%7 = a_{\#4, 3, 1}\%7 = a_{\#5, 3, 1}\%7 = v_{p-3}$ ($v_{p-3}$: fixed-value)"
"$a_{\#0, 4, 1}\%7 = a_{\#1, 4, 1}\%7 = a_{\#2, 4, 1}\%7 = a_{\#3, 4, 1}\%7 = a_{\#4, 4, 1}\%7 = a_{\#5, 4, 1}\%7 = v_{p-4}$ ($v_{p-4}$: fixed-value)"
•
•
•
"$a_{\#0, k, 1}\%7 = a_{\#1, k, 1}\%7 = a_{\#2, k, 1}\%7 = a_{\#3, k, 1}\%7 = a_{\#4, k, 1}\%7 = a_{\#5, k, 1}\%7 = v_{p-k}$ ($v_{p-k}$: fixed-value)
(therefore, k = 1, 2, ..., n − 1)"
•
•
•
"$a_{\#0, n-2, 1}\%7 = a_{\#1, n-2, 1}\%7 = a_{\#2, n-2, 1}\%7 = a_{\#3, n-2, 1}\%7 = a_{\#4, n-2, 1}\%7 = a_{\#5, n-2, 1}\%7 = v_{p-n-2}$ ($v_{p-n-2}$: fixed-value)"
"$a_{\#0, n-1, 1}\%7 = a_{\#1, n-1, 1}\%7 = a_{\#2, n-1, 1}\%7 = a_{\#3, n-1, 1}\%7 = a_{\#4, n-1, 1}\%7 = a_{\#5, n-1, 1}\%7 = v_{p-n-1}$ ($v_{p-n-1}$: fixed-value)" and
"$b_{\#0, 1}\%7 = b_{\#1, 1}\%7 = b_{\#2, 1}\%7 = b_{\#3, 1}\%7 = b_{\#4, 1}\%7 = b_{\#5, 1}\%6 = w$ (w: fixed-value)"

<Condition #1-2>

"$a_{\#0, 1, 2}\%7 = a_{\#1, 1, 2}\%7 = a_{\#2, 1, 2}\%7 = a_{\#3, 1, 2}\%7 = a_{\#4, 1, 2}\%7 = a_{\#5, 1, 2}\%7 = y_{p-1}$ ($y_{p-1}$: fixed-value)"
"$a_{\#0, 2, 2}\%7 = a_{\#1, 2, 2}\%7 = a_{\#2, 2, 2}\%7 = a_{\#3, 2, 2}\%7 = a_{\#4, 2, 2}\%7 = a_{\#5, 2, 2}\%7 = y_{p-2}$ ($y_{p-2}$: fixed-value)"
"$a_{\#0, 3, 2}\%7 = a_{\#1, 3, 2}\%7 = a_{\#2, 3, 2}\%7 = a_{\#3, 3, 2}\%7 = a_{\#4, 3, 2}\%7 = a_{\#5, 3, 2}\%7 = y_{p-3}$ ($y_{p-3}$: fixed-value)"
"$a_{\#0, 4, 2}\%7 = a_{\#1, 4, 2}\%7 = a_{\#2, 4, 2}\%7 = a_{\#3, 4, 2}\%7 = a_{\#4, 4, 2}\%7 = a_{\#5, 4, 2}\%7 = y_{p-4}$ ($y_{p-4}$: fixed-value)"
•
•
•
"$a_{\#0, k, 2}\%7 = a_{\#1, k, 2}\%7 = a_{\#2, k, 2}\%7 = a_{\#3, k, 2}\%7 = a_{\#4, k, 2}\%7 = a_{\#5, k, 2}\%7 = y_{p-k}$ ($y_{p-k}$: fixed-value)

(therefore, k = 1, 2, ..., n − 1)"
•
•
•
"$a_{\#0, n-2, 2}\%7 = a_{\#1, n-2, 2}\%7 = a_{\#2, n-2, 2}\%7 = a_{\#3, n-2, 2}\%7 = a_{\#4, n-2, 2}\%7 = a_{\#5, n-2, 2}\%7 = y_{p-n-2}$ ($y_{p-n-2}$: fixed-value)"
"$a_{\#0, n-1, 2}\%7 = a_{\#1, n-1, 2}\%7 = a_{\#2, n-1, 2}\%7 = a_{\#3, n-1, 2}\%7 = a_{\#4, n-1, 2}\%7 = a_{\#5, n-1, 2}\%7 = y_{p-n-1}$ ($y_{p-n-1}$: fixed-value)" and
"$b_{\#0, 2}\%7 = b_{\#1, 2}\%7 = b_{\#2, 2}\%7 = b_{\#3, 2}\%7 = b_{\#4, 2}\%7 = b_{\#5, 2}\%7 = z$ (z: fixed-value)"

$$(D^{a\#1,1,1}+1)X_1(D)+(D^{a\#1,2,1}+D^{a\#1,2,2}+1)$$
$$X_2(D)+\ldots+(D^{a\#1,n-1,1}+D^{a\#1,n-1,2}+1)X_{n-1}(D)+$$
$$(D^{b\#1,1}+D^{b\#1,2}+1)P)(D)=0 \quad \text{(Equation 35-1)}$$

$$(D^{a\#2,1,1}+1)X_1(D)+(D^{a\#2,2,1}+D^{a\#2,2,2}+1)$$
$$X_2(D)+\ldots+(D^{a\#2,n-1,1}+D^{a\#2,n-1,2}+1)X_{n-1}(D)+$$
$$(D^{b\#2,1}+D^{b\#2,2}+1)P)(D)=0 \quad \text{(Equation 35-2)}$$

$$(D^{a\#3,1,1}+1)X_1(D)+(D^{a\#3,2,1}+D^{a\#3,2,2}+1)$$
$$X_2(D)+\ldots+(D^{a\#3,n-1,1}+D^{a\#3,n-1,2}+1)X_{n-1}(D)+$$
$$(D^{b\#3,1}+D^{b\#3,2}+1)P)(D)=0 \quad \text{(Equation 35-3)}$$

$$(D^{a\#4,1,1}+1)X_1(D)+(D^{a\#4,2,1}+D^{a\#4,2,2}+1)$$
$$X_2(D)+\ldots+(D^{a\#4,n-1,1}+D^{a\#4,n-1,2}+1)X_{n-1}(D)+$$
$$(D^{b\#4,1}+D^{b\#4,2}+1)P)(D)=0 \quad \text{(Equation 35-4)}$$

$$(D^{a\#5,1,1}+1)X_1(D)+(D^{a\#5,2,1}+D^{a\#5,2,2}+1)$$
$$X_2(D)+\ldots+(D^{a\#5,n-1,1}+D^{a\#5,n-1,2}+1)X_{n-1}(D)+$$
$$(D^{b\#5,1}+D^{b\#5,2}+1)P)(D)=0 \quad \text{(Equation 35-5)}$$

$$(D^{a\#6,1,1}+1)X_1(D)+(D^{a\#6,2,1}+D^{a\#6,2,2}+1)$$
$$X_2(D)+\ldots+(D^{a\#6,n-1,1}+D^{a\#6,n-1,2}+1)X_{n-1}(D)+$$
$$(D^{b\#6,1}+D^{b\#6,2}+1)P)(D)=0 \quad \text{(Equation 35-6)}$$

Here, a case will be considered where $v_{p=k}$ (k=1, 2, ..., n-1) and w are set to "2."

Figure 14:
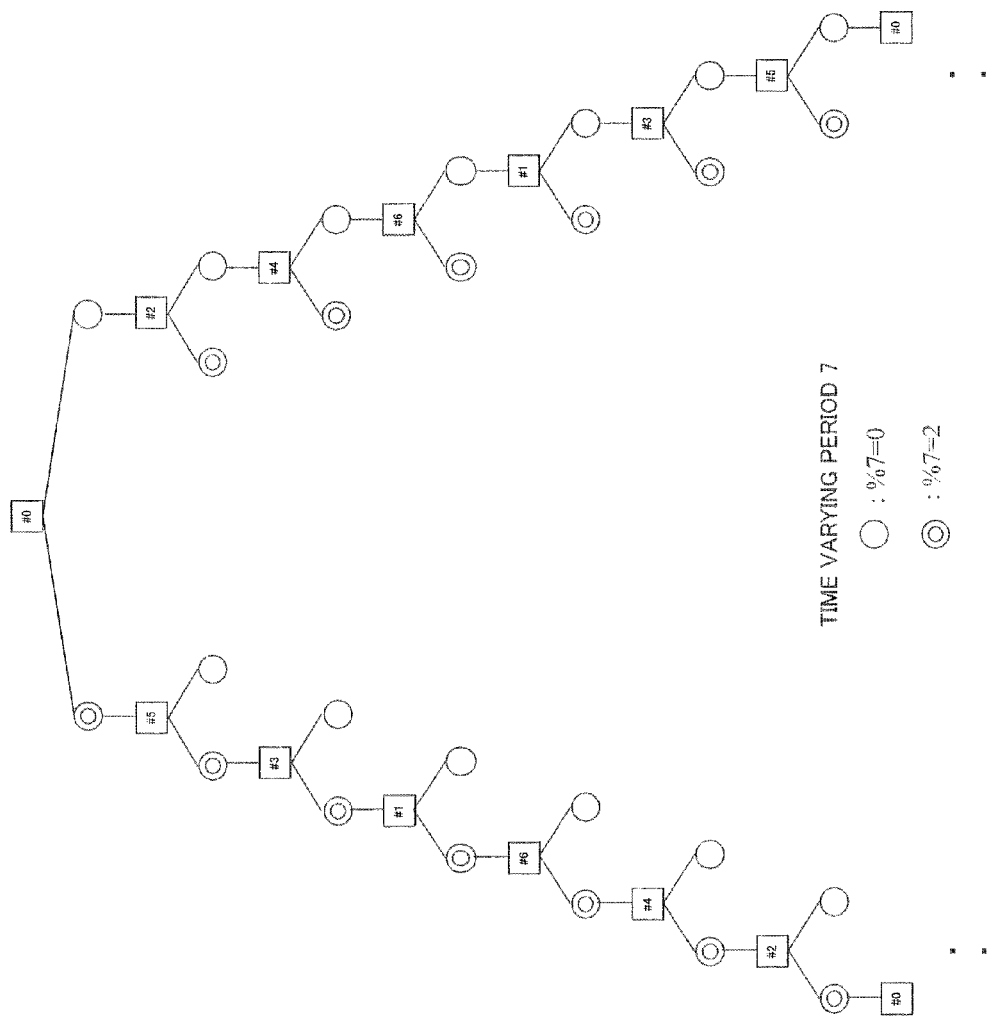
FIG. 14 shows an example of an LDPC-CC tree of a time varying period of 7.

FIG. 14 shows a tree of check nodes and variable nodes when only information $X_1$ is focused upon when $v_{p=1}$ and w are set to "2" and $a_{\#0,1,1}\%7=a_{\#1,1,1}\%7=a_{\#2,1,1}\%7=a_{\#3,1,1}\%7=a_{\#4,1,1}\%7=a_{\#5,1,1}\%7=a_{\#6,1,1}\%7=2$.

The parity check polynomial of equation 35-q is called "check equation #q." In FIG. 14, a tree is drawn from "check equation #0." In FIG. 14, the symbols "○" (single circle) and "⊙" (double circle) represent variable nodes, and the symbol "□" (square) represents a check node. The symbol "○" (single circle) represents a variable node relating to $X_1(D)$ and the symbol "⊙" (double circle) represents a variable node relating to $D^{a\#q,1,1}X_1(D)$. Furthermore, the symbol "□" (square) described as #Y (Y=0, 1, 2, 3, 4, 5, 6) means a check node corresponding to a parity check polynomial of equation 35-Y.

In the case of a time varying period of 6, for example, as shown in FIG. 11, there may be cases where #Y only has a limited value and check nodes are only connected to limited parity check polynomials. By contrast, when the time varying period is 7 (prime number) such as a time varying period of 7, as shown in FIG. 14, #Y have all values from 0 to 6 and check nodes are connected to all parity check polynomials. Thus, belief is propagated by all parity check polynomials corresponding to the values of #Y. As a result, even when the time varying period is increased, belief is propagated from a wide range and it is possible to achieve the effect of having increased the time varying period. Although FIG. 14 shows the tree when $a_{\#q,1,1}\%7$ (q=0, 1, 2, 3, 4, 5, 6) is set to "2," check nodes can be connected to all the appliable parity check polynomials if $a\#_{q,1,1}\%7$ is set to any value other than "0."

Thus, it is clear that if the time varying period is set to a prime number in this way, constraint conditions relating to parameter settings for achieving high error correction capability are drastically relaxed compared to a case where the time varying period is not a prime number. When the constraint conditions are relaxed, adding another constraint condition enables higher error correction capability to be achieved. Such a code configuration method will be described in detail below.

[Time Varying Period of q (q is a Prime Number Greater than 3): Equation 36] First, a case will be considered where a g-th (g=0, 1, ..., q-1) parity check polynomial of a coding rate of (n-1)/n and a time varying period of q (q is a prime number greater than 3) is represented as shown in equation 36.

[36]

$$(D^{a\#g,1,1}+D^{a\#g,1,2}+1)X_1(D)+(D^{a\#g,2,1}+D^{a\#g,2,2}+1)+\ldots+(D^{a\#g,n-1,1}+D^{a\#g,n-1,2}+1)X_{n-1}(D)+(D^{b\#g,1}+D^{b\#g,2}+1)P(D) \quad \text{(Equation 36)}$$

In equation 36, it is also assumed that $a_{\#g,p,1}$ and $a_{\#g,p,2}$ are natural numbers equal to or greater than 1 and $a_{\#g,p,1} \neq a_{\#g,p,2}$ holds true. Furthermore, it is also assumed that $b_{\#g,1}$ and $b_{\#g,2}$ are natural numbers equal to or greater than 1 and $b_{\#g,1} \neq b_{\#g,2}$ holds true (g=0, 1, 2, ..., q-2, q-1; p=1, 2, ..., n-1).

In the same way as the above description, <condition #3-1> and <condition #3-2> described below are one of important requirements for an LDPC-CC to achieve high error correction capability. In the following conditions, "%" means a modulo, and, for example, "a % q" represents a remainder after dividing a by q.

<Condition #3-1>

"$a_{\#0, 1, 1}\%q = a_{\#1, 1, 1}\%q = a_{\#2, 1, 1}\%q = a_{\#3, 1, 1}\%q = \ldots = a_{\#g, 1, 1}\%q = \ldots = a_{\#q-2, 1, 1}\%q = a_{\#q-1, 1, 1}\%q = v_{p-1}$ ($v_{p-1}$: fixed-value)"

"$a_{\#0, 2, 1}\%q = a_{\#1, 2, 1}\%q = a_{\#2, 2, 1}\%q = a_{\#3, 2, 1}\%q = \ldots = a_{\#g, 2, 1}\%q = \ldots = a_{\#q-2, 2, 1}\%q = a_{\#q-1, 2, 1}\%q = v_{p-2}$ ($v_{p-2}$: fixed-value)"

"$a_{\#0, 3, 1}\%q = a_{\#1, 3, 1}\%q = a_{\#2, 3, 1}\%q = a_{\#3, 3, 1}\%q = \ldots = a_{\#g, 3, 1}\%q = \ldots = a_{\#q-2, 3, 1}\%q = a_{\#q-1, 3, 1}\%q = v_{p-3}$ ($v_{p-3}$: fixed-value)"

"$a_{\#0, 4, 1}\%q = a_{\#1, 4, 1}\%q = a_{\#2, 4, 1}\%q = a_{\#3, 4, 1}\%q = \ldots = a_{\#g, 4, 1}\%q = \ldots = a_{\#q-2, 4, 1}\%q = a_{\#q-1, 4, 1}\%q = v_{p-4}$ ($v_{p-4}$: fixed-value)"

●
●
●

"$a_{\#0, k, 1}\%q = a_{\#1, k, 1}\%q = a_{\#2, k, 1}\%q = a_{\#3, k, 1}\%q = \ldots = a_{\#g, k, 1}\%q = \ldots = a_{\#q-2, k, 1}\%q = a_{\#q-1, k, 1}\%q = v_{p-k}$ ($v_{p-k}$: fixed-value)
●(therefore, k = 1, 2, ..., n - 1)"
●
●

"$a_{\#0, n-2, 1}\%q = a_{\#1, n-2, 1}\%q = a_{\#2, n-2, 1}\%q = a_{\#3, n-2, 1}\%q = \ldots = a_{\#g, n-2, 1}\%q = \ldots = a_{\#q-2, n-2, 1}\%q = a_{\#q-1, n-2, 1}\%q = v_{p-n-2}$
($v_{p-n-2}$: fixed-value)"

"$a_{\#0, n-1, 1}\%q = a_{\#1, n-1, 1}\%q = a_{\#2, n-1, 1}\%q = a_{\#3, n-1, 1}\%q = \ldots = a_{\#g, n-1, 1}\%q = \ldots = a_{\#q-2, n-1, 1}\%q = a_{\#q-1, n-1, 1}\%q = v_{p-n-1}$
($v_{p-n-1}$: fixed-value)" and "$b_{\#0, 1}\%q = b_{\#1, 1}\%q = b_{\#2, 1}\%q = b_{\#3, 1}\%q = \ldots = b_{\#g, 1}\%q = \ldots = b_{\#q-2, 1}\%q = b_{\#q-1, 1}\%q = w$ (w: fixed-value)"

-continued

<Condition #3-2>

"$a_{\#0,1,2}\%q = a_{\#1,1,2}\%q = a_{\#2,1,2}\%q = a_{\#3,1,2}\%q = \ldots = a_{\#g,1,2}\%q = \ldots = a_{\#q-2,1,2}\%q = a_{\#q-1,1,2}\%q = y_{p=1}$ ($y_{p=1}$: fixed-value)"
"$a_{\#0,2,2}\%q = a_{\#1,2,2}\%q = a_{\#2,2,2}\%q = a_{\#3,2,2}\%q = \ldots = a_{\#g,2,2}\%q = \ldots = a_{\#q-2,2,2}\%q = a_{\#q-1,2,2}\%q = y_{p=2}$ ($y_{p=2}$: fixed-value)"
"$a_{\#0,3,2}\%q = a_{\#1,3,2}\%q = a_{\#2,3,2}\%q = a_{\#3,3,2}\%q = \ldots = a_{\#g,3,2}\%q = \ldots = a_{\#q-2,3,2}\%q = a_{\#q-1,3,2}\%q = y_{p=3}$ ($y_{p=3}$: fixed-value)"
"$a_{\#0,4,2}\%q = a_{\#1,4,2}\%q = a_{\#2,4,2}\%q = a_{\#3,4,2}\%q = \ldots = a_{\#g,4,2}\%q = \ldots = a_{\#q-2,4,2}\%q = a_{\#q-1,4,2}\%q = y_{p=4}$ ($y_{p=4}$: fixed-value)"

●
●
●

"$a_{\#0,k,2}\%q = a_{\#1,k,2}\%q = a_{\#2,k,2}\%q = a_{\#3,k,2}\%q = \ldots = a_{\#g,k,2}\%q = \ldots = a_{\#q-2,k,2}\%q = a_{\#q-1,k,2}\%q = y_{p=k}$ ($y_{p=k}$: fixed-value)
(therefore, k = 1, 2, …, n − 1)"

●
●
●

"$a_{\#0,n-2,2}\%q = a_{\#1,n-2,2}\%q = a_{\#2,n-2,2}\%q = a_{\#3,n-2,2}\%q = \ldots = a_{\#g,n-2,1}\%q = \ldots = a_{\#q-2,n-2,1}\%q = a_{\#q-1,n-2,1}\%q = y_{p=n-2}$ ($y_{p=n-2}$: fixed-value)"
"$a_{\#0,n-1,2}\%q = a_{\#1,n-1,2}\%q = a_{\#2,n-1,2}\%q = a_{\#3,n-1,2}\%q = \ldots = a_{\#g,n-1,2}\%q = \ldots = a_{\#q-2,n-1,2}\%q = a_{\#q-1,n-1,2}\%q = y_{p=n-1}$ ($y_{p=n-1}$: fixed-value)" and
"$b_{\#0,2}\%q = b_{\#1,2}\%q = b_{\#2,2}\%q = b_{\#3,2}\%q = \ldots = a_{\#g,2}\%q = \ldots = a_{\#q-2,2}\%q = a_{\#q-1,2}\%q = z$ (z: fixed-value)"

In addition, when <condition #4-1> or <condition #4-2> holds true for a set of ($v_{p=1}$, $y_{p=1}$), ($v_{p=2}$, $y_{p=2}$), ($v_{p=3}$, $y_{p=3}$), …, ($v_{p=k}$, $y_{p=k}$), …, ($v_{p=n-2}$, $y_{p=n-2}$), ($v_{p=n-1}$, $y_{p=n-1}$), and (w, z), high error correction capability can be achieved. Here, k=1, 2, …, n−1.

<Condition #4-1>

Consider ($v_{p=i}$, $y_{p=i}$) and ($v_{p=j}$, $y_{p=j}$), where it is assumed that i=1, 2, …, n−1, j=1, 2, …, n−1, and i≠j. At this time, i and j (i≠j) are present where ($v_{p=i}$, $y_{p=i}$)≠($v_{p=j}$, $y_{p=j}$) and ($v_{p=i}$, $y_{p=i}$)≠($y_{p=j}$, $v_{p=j}$) hold true.

<Condition #4-2>

Consider ($v_{p=i}$, $y_{p=i}$) and (w, z), where it is assumed that i=1, 2, …, n−1. At this time, i is present where ($v_{p=i}$, $y_{p=i}$)≠(w, z) and ($v_{p=i}$, $y_{p=i}$)≠(z, w) hold true.

Table 7 shows parity check polynomials of an LDPC-CC of a time varying period of 7 and coding rates of 1/2 and 2/3.

In Table 7, with the code of a coding rate of 1/2,
"$a_{\#0,1,1}\%7 = a_{\#1,1,1}\%7 = a_{\#2,1,1}\%7 = a_{\#3,1,1}\%7 = a_{\#4,1,1}\%7 = a_{\#5,1,1}\%7 = a_{\#6,1,1}\%7 = v_{p=1} = 3$"
"$b_{\#0,1}\%7 = b_{\#1,1}\%7 = b_{\#2,1}\%7 = b_{\#3,1}\%7 = b_{\#4,1}\%7 = b_{\#5,1}\%7 = b_{\#6,1}\%7 = w = 1$"
"$a_{\#0,1,2}\%7 = a_{\#1,1,2}\%7 = a_{\#2,1,2}\%7 = a_{\#3,1,2}\%7 = a_{\#4,1,2}\%7 = a_{\#5,1,2}\%7 = a_{\#6,1,2}\%7 = y_{p=1} = 6$"
"$b_{\#0,2}\%7 = b_{\#1,2}\%7 = b_{\#2,2}\%7 = b_{\#3,2}\%7 = b_{\#4,2}\%7 = b_{\#5,2}\%7 = b_{\#6,2}\%7 = z = 5$" hold.

At this time, since ($v_{p=1}$, $y_{p=1}$)=(3, 6), (w, z)=(1, 5), <condition #4-2> holds true.

Similarly, in Table 7, with the code of a coding rate of 2/3,
"$a_{\#0,1,1}\%7 a_{\#1,1,1}\%7 = a_{\#2,1,1}\%7 = a_{\#3,1,1}\%7 = a_{\#4,1,1}\%7 = a_{\#5,1,1}\%7 a_{\#6,1,1}\%7 = v_{p=1} = 1$"
"$a_{\#0,2,1}\%7 a_{\#1,2,1}\%7 = a_{\#2,2,1}\%7 = a_{\#3,2,1}\%7 = a_{\#4,2,1}\%7 = a_{\#5,2,1}\%7 a_{\#6,2,1}\%7 = v_{p=2} = 2$"

TABLE 7

| Code | Parity check polynomial |
| --- | --- |
| LDPC-CC of a time varying period of 7 and a coding rate of ½ | Check polynomial #0: $(D^{577} + D^{580} + 1)X_1(D) + (D^{204} + D^{579} + 1)P(D) = 0$ |
| | Check polynomial #1: $(D^{577} + D^{426} + 1)X_1(D) + (D^{477} + D^{488} + 1)P(D) = 0$ |
| | Check polynomial #2: $(D^{500} + D^{370} + 1)X_1(D) + (D^{407} + D^{502} + 1)P(D) = 0$ |
| | Check polynomial #3: $(D^{563} + D^{230} + 1)X_1(D) + (D^{197} + D^{411} + 1)P(D) = 0$ |
| | Check polynomial #4: $(D^{542} + D^{76} + 1)X_1(D) + (D^{1} + D^{33} + 1)P(D) = 0$ |
| | Check polynomial #5: $(D^{535} + D^{517} + 1)X_1(D) + (D^{344} + D^{75} + 1)P(D) = 0$ |
| | Check polynomial #6: $(D^{570} + D^{538} + 1)X_1(D) + (D^{512} + D^{572} + 1)P(D) = 0$ |
| LDPC-CC of a time varying period of 7 and a coding rate of ⅔ | Check polynomial #0: $(D^{575} + D^{81} + 1)X_1(D) + (D^{597} + D^{402} + 1)X_2(D) + (D^{558} + D^{118} + 1)P(D) = 0$ |
| | Check polynomial #1: $(D^{526} + D^{186} + 1)X_1(D) + (D^{576} + D^{157} + 1)X_2(D) + (D^{586} + D^{174} + 1)P(D) = 0$ |
| | Check polynomial #2: $(D^{533} + D^{410} + 1)X_1(D) + (D^{534} + D^{535} + 1)X_2(D) + (D^{411} + D^{272} + 1)P(D) = 0$ |
| | Check polynomial #3: $(D^{554} + D^{473} + 1)X_1(D) + (D^{590} + D^{38} + 1)X_2(D) + (D^{243} + D^{230} + 1)P(D) = 0$ |
| | Check polynomial #4: $(D^{582} + D^{137} + 1)X_1(D) + (D^{527} + D^{570} + 1)X_2(D) + (D^{474} + D^{55} + 1)P(D) = 0$ |
| | Check polynomial #5: $(D^{547} + D^{375} + 1)X_1(D) + (D^{590} + D^{402} + 1)X_2(D) + (D^{117} + D^{363} + 1)P(D) = 0$ |
| | Check polynomial #6: $(D^{533} + D^{592} + 1)X_1(D) + (D^{590} + D^{150} + 1)X_2(D) + (D^{523} + D^{580} + 1)P(D) = 0$ |

"$b_{\#0,1}\%7b_{\#1,1}\%7=b_{\#2,1}\%7=b_{\#3,1}\%7=b_{\#4,1}\%7=b_{\#5,1}\%7b_{\#6,1}\%7=w=5$"

"$a_{\#0,1,2}\%7a_{\#1,1,2}\%7=a_{\#2,1,2}\%7=a_{\#3,1,2}\%7=a_{\#4,1,2}\%7=a_{\#5,1,2}\%7a_{\#6,1,2}\%7=y_{p=1}=4$"

"$a_{\#0,2,2}\%7a_{\#1,2,2}\%7=a_{\#2,2,2}\%7=a_{\#3,2,2}\%7=a_{\#4,2,2}\%7=a_{\#5,2,2}\%7a_{\#6,2,2}\%7=y_{p=2}=3$"

"$b_{\#0,2}\%7b_{\#1,2}\%7=b_{\#2,2}\%7=b_{\#3,2}\%7=b_{\#4,2}\%7=b_{\#5,2}\%7b_{\#6,2}\%7=z=6$" hold.

At this time, since $(v_{p=1}, y_{p=1})=(1, 4)$, $(v_{p=2}, y_{p=2})=(2, 3)$ and $(w, z)=(5, 6)$, <condition #4-1> and <condition #4-2> hold true.

Furthermore, Table 8 shows parity check polynomials of an LDPC-CC of a coding rate of 4/5 when the time varying period is 11 as an example.

TABLE 8

| Code | Parity check polynomial |
|---|---|
| LDPC-CC of a time varying period of 11 and a coding rate of 4/5 | Check polynomial #0: $(D^{200} + D^9 + 1)X_1(D) + (D^{234} + D^{204} + 1)X_2(D) + (D^{158} + D^{63} + 1)X_3(D) + (D^{181} + D^{73} + 1)X_4(D) + (D^{232} + D^{98} + 1)P(D) = 0$<br>Check polynomial #1: $(D^{200} + D^{240} + 1)X_1(D) + (D^{223} + D^{83} + 1)X_2(D) + (D^{235} + D^{52} + 1)X_3(D) + (D^{159} + D^{128} + 1)X_4(D) + (D^{166} + D^{230} + 1)P(D) = 0$<br>Check polynomial #2: $(D^{211} + D^{75} + 1)X_1(D) + (D^{234} + D^{171} + 1)X_2(D) + (D^{235} + D^{96} + 1)X_3(D) + (D^{159} + D^{128} + 1)X_4(D) + (D^1 + D^{43} + 1)P(D) = 0$<br>Check polynomial #3: $(D^{145} + D^{97} + 1)X_1(D) + (D^{223} + D^{61} + 1)X_2(D) + (D^{235} + D^{206} + 1)X_3(D) + (D^{203} + D^{73} + 1)X_4(D) + (D^{78} + D^{175} + 1)P(D) = 0$<br>Check polynomial #4: $(D^{145} + D^{119} + 1)X_1(D) + (D^{212} + D^{160} + 1)X_2(D) + (D^{202} + D^{30} + 1)X_3(D) + (D^{214} + D^{194} + 1)X_4(D) + (D^{210} + D^{230} + 1)P(D) = 0$<br>Check polynomial #5: $(D^{167} + D^{174} + 1)X_1(D) + (D^{223} + D^{94} + 1)X_2(D) + (D^{235} + D^8 + 1)X_3(D) + (D^{225} + D^{95} + 1)X_4(D) + (D^{56} + D^{10} + 1)P(D) = 0$<br>Check polynomial #6: $(D^{222} + D^{185} + 1)X_1(D) + (D^{234} + D^{193} + 1)X_2(D) + (D^{202} + D^{74} + 1)X_3(D) + (D^{236} + D^{205} + 1)X_4(D) + (D^{122} + D^{153} + 1)P(D) = 0$<br>Check polynomial #7: $(D^{178} + D^{64} + 1)X_1(D) + (D^{201} + D^{160} + 1)X_2(D) + (D^{224} + D^{206} + 1)X_3(D) + (D^{159} + D^7 + 1)X_4(D) + (D^{45} + D^{142} + 1)P(D) = 0$<br>Check polynomial #8: $(D^{189} + D^9 + 1)X_1(D) + (D^{179} + D^{182} + 1)X_2(D) + (D^{235} + D^{118} + 1)X_3(D) + (D^{236} + D^{106} + 1)X_4(D) + (D^{78} + D^{131} + 1)P(D) = 0$<br>Check polynomial #9: $(D^{200} + D^{163} + 1)X_1(D) + (D^{223} + D^{61} + 1)X_2(D) + (D^{235} + D^8 + 1)X_3(D) + (D^{148} + D^{238} + 1)X_4(D) + (D^{177} + D^{131} + 1)P(D) = 0$<br>Check polynomial #10: $(D^{222} + D^{218} + 1)X_1(D) + (D^{190} + D^{226} + 1)X_2(D) + (D^{213} + D^{195} + 1)X_3(D) + (D^{214} + D^{172} + 1)X_4(D) + (D^1 + D^{43} + 1)P(D) = 0$ |

By making more severe the constraint conditions of <condition #4-1, condition #4-2>, it is more likely to be able to generate an LDPC-CC of a time varying period of q (q is a prime number equal to or greater than 3) with higher error correction capability. The condition is that <condition #5-1> and <condition #5-2>, or <condition #5-1> or <condition #5-2> should hold true.

<Condition #5-1>

Consider $(v_{p=i}, y_{p=i})$ and $(v_{p=j}, y_{p=j})$, where it is assumed that $i=1, 2, \ldots, n-1$, $j=1, 2, \ldots, n-1$, and $i \neq j$. At this time, $(v_{p=i}, y_{p=i}) \neq (v_{p=j}, y_{p=j})$ and $(v_{p=i}, y_{p=i}) \neq (y_{p=j}, v_{p=j})$ hold true for all i's and j's $(i \neq j)$.

<Condition #5-2>

Consider $(v_{p=i}, y_{p=i})$ and $(w, z)$, where it is assumed that $i=1, 2, \ldots, n-1$. At this time, $(v_{p=i}, y_{p=i}) \neq (w, z)$ and $(v_{p=i}, y_{p=i}) \neq (z, w)$ hold true for all i's.

Furthermore, when $v_{p=i} \neq y_{p=i}$ ($i=1, 2, \ldots, n-1$) and $w \neq z$ hold true, it is possible to suppress the occurrence of short loops in a Tanner graph.

In addition, when $2n < q$, if $(v_{p=i}, y_{p=i})$ and $(z, w)$ are different values, it is more likely to be able to generate an LDPC-CC of a time varying period of q (q is a prime number greater than 3) with higher error correction capability.

Furthermore, when $2n \geq q$, if $(v_{p=i}, y_{p=i})$ and $(z, w)$ are set so that all values of $0, 1, 2, \ldots, q-1$ are present, it is more likely to be able to generate an LDPC-CC of a time varying period of q (q is a prime number greater than 3) with higher error correction capability.

In the above description, equation 36 having three terms in $X_1(D), X_2(D), \ldots, X_{n-1}(D)$ and $P(D)$ has been handled as the g-th parity check polynomial of an LDPC-CC of a time varying period of q (q is a prime number greater than 3). In equation 36, it is also likely to be able to achieve high error correction capability when the number of terms of any of $X_1(D), X_2(D), \ldots, X_{n-1}(D)$ and $P(D)$ is 1 or 2. For example, the following method is available as the method of setting the number of terms of $X_1(D)$ to 1 or 2. In the case of a time varying period of q, there are q parity check polynomials that satisfy 0 and the number of terms of $X_1(D)$ is set to 1 or 2 for all the q parity check polynomials that satisfy 0. Alternatively, instead of setting the number of terms of $X_1(D)$ to 1 or 2 for all the q parity check polynomials that satisfy 0, the number of terms of $X_1(D)$ may be set to 1 or 2 for any number (equal to or less than q-1) of parity check polynomials that satisfy 0. The same applies to $X_2(D), \ldots, X_{n-1}(D)$ and $P(D)$. In this case, satisfying the above-described condition constitutes an important condition in achieving high error correction capability. However, the condition relating to the deleted terms is unnecessary.

Even when the number of terms of any of $X_1(D), X_2(D), \ldots, X_{n-1}(D)$ and $P(D)$ is 4 or more, it is also likely to be able to achieve high error correction capability. For example, the following method is available as the method of setting the number of terms of $X_1(D)$ to 4 or more. In the case of a time varying period of q, there are q parity check polynomials that satisfy 0, and the number of terms of $X_1(D)$ is set to 4 or more for all the q parity check polynomials that satisfy 0. Alternatively, instead of setting the number of terms of $X_1(D)$ to 4 or more for all the q parity check polynomials that satisfy 0, the number of terms of $X_1(D)$ may be set to 4 or more for any number (equal to or less than q−1) of the parity check polynomials that satisfy 0. The same applies to $X_2(D), \ldots, X_{n-1}(D)$ and $P(D)$. At this time, the above-described condition is excluded for the added terms.

By the way, equation 36 is the g-th parity check polynomial of an LDPC-CC of a coding rate of (n−1)/n and a time varying period of q (q is a prime number greater than 3). In this equation, in the case of, for example, a coding rate of 1/2, the g-th parity check polynomial is represented as shown in equation 37-1. Furthermore, in the case of a coding rate of 2/3, the g-th parity check polynomial is represented as shown in equation 37-2. Furthermore, in the case of a coding rate of 3/4, the g-th parity check polynomial is represented as shown in equation 37-3, Furthermore, in the case of a coding rate of 4/5, the g-th parity check polynomial is represented as shown in equation 37-4. Furthermore, in the case of a coding rate of 5/6, the g-th parity check polynomial is represented as shown in equation 37-5.

[37]

$$(D^{a\#g,1,1}+D^{a\#g,1,2}+1)X_1(D)+(D^{b\#g,1}+D^{b\#g,2}+1)P(D)=0 \quad \text{(Equation 37-1)}$$

$$(D^{a\#g,1,1}+D^{a\#g,1,2}+1)X_1(D)+(D^{a\#g,2,1}+D^{a\#g,2,2}+1)X_2(D)+(D^{b\#g,1}+D^{b\#g,2}+1)P(D)=0 \quad \text{(Equation 37-2)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{b\#g,1}+D^{b\#g,2}+1)P(D)=0 \quad \text{(Equation 37-3)}$$

$$(D^{a\#g,1,1}+D^{a\#g,1,2}+1)X_1(D)+(D^{a\#g,2,1}+D^{a\#g,2,2}+1)X_2(D)+(D^{b\#g,1}+D^{b\#g,2}+1)P(D)=0 \quad \text{(Equation 37-4)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{a\#g,5,1}+D^{a\#g,5,2}+1)X_5(D)+(D^{b\#g,1}+D^{b\#g,2}+1)P(D)=0 \quad \text{(Equation 37-5)}$$

[Time Varying Period of q (q is a Prime Number Greater than 3): equation 38]

Next, a case will be considered where the g-th (g=0, 1, ..., q−1) parity check polynomial of a coding rate of (n−1)/n and a time varying period of q (q is a prime number greater than 3) is represented as shown in equation 38.

[38]

$$(D^{a\#g,1,1}+D^{a\#g,1,2}+1)X_1(D)+(D^{b\#g,2,1}+D^{b\#g,2,2}+D^{a\#g,2,3})X_2(D)+ \ldots +(D^{a\#g,n-1,1}+D^{a\#g,n-1,2}+D^{a\#g,n-1,3})X_{n-1}(D)+(D^{b\#g,1}+D^{b\#g,2}+1)P(D)=0 \quad \text{(Equation 38)}$$

In equation 38, it is assumed that $a_{\#g,p,1}$, $a_{\#g,p,2}$ and $a_{\#g,p,3}$ are natural numbers equal to or greater than 1 and $a_{\#g,p,1} \neq a_{\#g,p,2}$, $a_{\#g,p,1} \neq a_{\#g,p,3}$ and $a_{\#g,p,2} \neq a_{\#g,p,3}$ hold true. Furthermore, it is assumed that $b_{\#g,1}$ and $b_{\#g,2}$ are natural numbers equal to or greater than 1 and $b_{\#g,1} \neq b_{\#g,2}$ holds true (g=0, 1, 2, ..., q−2, q−1; p=1, 2, ..., n−1).

In the same way as in the above description, <condition #6-1>, <condition #6-2> and <condition #6-3> described below are one of important requirements for an LDPC-CC to achieve high error correction capability. In the following conditions, "%" means a modulo and, for example, "a % q" represents a remainder after dividing a by q.

---

<Condition #6-1>

"$a_{\#0,1,1}\%q = a_{\#1,1,1}\%q = a_{\#2,1,1}\%q = a_{\#3,1,1}\%q = \ldots = a_{\#g,1,1}\%q = \ldots = a_{\#q-2,1,1}\%q = a_{\#q-1,1,1}\%q = v_{p-1}$ ($v_{p-1}$: fixed-value)"

"$a_{\#0,2,1}\%q = a_{\#1,2,1}\%q = a_{\#2,2,1}\%q = a_{\#3,2,1}\%q = \ldots = a_{\#g,2,1}\%q = \ldots = a_{\#q-2,2,1}\%q = a_{\#q-1,2,1}\%q = v_{p-2}$ ($v_{p-2}$: fixed-value)"

"$a_{\#0,3,1}\%q = a_{\#1,3,1}\%q = a_{\#2,3,1}\%q = a_{\#3,3,1}\%q = \ldots = a_{\#g,3,1}\%q = \ldots = a_{\#q-2,3,1}\%q = a_{\#q-1,3,1}\%q = v_{p-3}$ ($v_{p-3}$: fixed-value)"

"$a_{\#0,4,1}\%q = a_{\#1,4,1}\%q = a_{\#2,4,1}\%q = a_{\#3,4,1}\%q = \ldots = a_{\#g,4,1}\%q = \ldots = a_{\#q-2,4,1}\%q = a_{\#q-1,4,1}\%q = v_{p-4}$ ($v_{p-4}$: fixed-value)"

●
●
●

"$a_{\#0,k,1}\%q = a_{\#1,k,1}\%q = a_{\#2,k,1}\%q = a_{\#3,k,1}\%q = \ldots = a_{\#g,k,1}\%q = \ldots = a_{\#q-2,k,1}\%q = a_{\#q-1,k,1}\%q = v_{p-k}$ ($v_{p-k}$: fixed-value)
(therefore, k = 1, 2, ..., n − 1)"

●
●
●

"$a_{\#0,n-2,1}\%q = a_{\#1,n-2,1}\%q = a_{\#2,n-2,1}\%q = a_{\#3,n-2,1}\%q = \ldots = a_{\#g,n-2,1}\%q = \ldots = a_{\#q-2,n-2,1}\%q = a_{\#q-1,n-2,1}\%q = v_{p-n-2}$
($v_{p-n-2}$: fixed-value)"

"$a_{\#0,n-1,1}\%q = a_{\#1,n-1,1}\%q = a_{\#2,n-1,1}\%q = a_{\#3,n-1,1}\%q = \ldots = a_{\#g,n-1,1}\%q = \ldots = a_{\#q-2,n-1,1}\%q = a_{\#q-1,n-1,1}\%q = v_{p-n-1}$
($v_{p-n-1}$: fixed-value)" and "$b_{\#0,1}\%q = b_{\#1,1}\%q = b_{\#2,1}\%q = b_{\#3,1}\%q = \ldots = b_{\#g,1}\%q = \ldots = b_{\#q-2,1}\%q = b_{\#q-1,1}\%q = w$ (w: fixed-value)"

---

<Condition #6-2>

"$a_{\#0,1,2}\%q = a_{\#1,1,2}\%q = a_{\#2,1,2}\%q = a_{\#3,1,2}\%q = \ldots = a_{\#g,1,2}\%q = \ldots = a_{\#q-2,1,2}\%q = a_{\#q-1,1,2}\%q = y_{p-1}$ ($y_{p-1}$: fixed-value)"

"$a_{\#0,2,2}\%q = a_{\#1,2,2}\%q = a_{\#2,2,2}\%q = a_{\#3,2,2}\%q = \ldots = a_{\#g,2,2}\%q = \ldots = a_{\#q-2,2,2}\%q = a_{\#q-1,2,2}\%q = y_{p-2}$ ($y_{p-2}$: fixed-value)"

"$a_{\#0,3,2}\%q = a_{\#1,3,2}\%q = a_{\#2,3,2}\%q = a_{\#3,3,2}\%q = \ldots = a_{\#g,3,2}\%q = \ldots = a_{\#q-2,3,2}\%q = a_{\#q-1,3,2}\%q = y_{p-3}$ ($y_{p-3}$: fixed-value)"

"$a_{\#0,4,2}\%q = a_{\#1,4,2}\%q = a_{\#2,4,2}\%q = a_{\#3,4,2}\%q = \ldots = a_{\#g,4,2}\%q = \ldots = a_{\#q-2,4,2}\%q = a_{\#q-1,4,2}\%q = y_{p-4}$ ($y_{p-4}$: fixed-value)"

●
●
●

-continued

"$a_{\#0,k},2\%q = a_{\#1,k},2\%q = a_{\#2,k},2\%q = a_{\#3,k},2\%q = \ldots = a_{\#g,k},2\%q = \ldots = a_{\#q-2,k},2\%q = a_{\#q-1,k},2\%q = y_{p-k}$ ($y_{p-k}$: fixed-value)
(therefore, k = 1, 2, ..., n − 1)"

●
●
●

"$a_{\#0,n-2},2\%q = a_{\#1,n-2},2\%q = a_{\#2,n-2},2\%q = a_{\#3,n-2},2\%q = \ldots = a_{\#g,n-2},2\%q = \ldots = a_{\#q-2,n-2},2\%q = a_{\#q-1,n-2},2\%q = y_{p-n-2}$
($y_{p-n-2}$: fixed-value)"
"$a_{\#0,n-1},2\%q = a_{\#1,n-1},2\%q = a_{\#2,n-1},2\%q = a_{\#3,n-1},2\%q = \ldots = a_{\#g,n-1},2\%q = \ldots = a_{\#q-2,n-1},2\%q = a_{\#q-1,n-1},2\%q = y_{p-n-1}$
($y_{p-n-1}$: fixed-value)" and
"$b_{\#0},2\%q = b_{\#1},2\%q = b_{\#2},2\%q = b_{\#3},2\%q = \ldots = b_{\#g},2\%q = \ldots = b_{\#q-2},2\%q = b_{\#q-1},2\%q = z$ (z: fixed-value)"

<Condition #6-3>

"$a_{\#0,1},3\%q = a_{\#1,1},3\%q = a_{\#2,1},3\%q = a_{\#3,1},3\%q = \ldots = a_{\#g,1},3\%q = \ldots = a_{\#q-2,1},3\%q = a_{\#q-1,1},3\%q = s_{p-1}$ ($s_{p-1}$: fixed-value)"
"$a_{\#0,2},3\%q = a_{\#1,2},3\%q = a_{\#2,2},3\%q = a_{\#3,2},3\%q = \ldots = a_{\#g,2},3\%q = \ldots = a_{\#q-2,2},3\%q = a_{\#q-1,2},3\%q = s_{p-2}$ ($s_{p-2}$: fixed-value)"
"$a_{\#0,3},3\%q = a_{\#1,3},3\%q = a_{\#2,3},3\%q = a_{\#3,3},3\%q = \ldots = a_{\#g,3},3\%q = \ldots = a_{\#q-2,3},3\%q = a_{\#q-1,3},3\%q = s_{p-3}$ ($s_{p-3}$: fixed-value)"
"$a_{\#0,4},3\%q = a_{\#1,4},3\%q = a_{\#2,4},3\%q = a_{\#3,4},3\%q = \ldots = a_{\#g,4},3\%q = \ldots = a_{\#q-2,4},3\%q = a_{\#q-1,4},3\%q = s_{p-4}$ ($s_{p-4}$: fixed-value)"

●
●
●

"$a_{\#0,k},3\%q = a_{\#1,k},3\%q = a_{\#2,k},3\%q = a_{\#3,k},3\%q = \ldots = a_{\#g,k},3\%q = \ldots = a_{\#q-2,k},3\%q = a_{\#q-1,k},3\%q = s_{p-k}$ ($s_{p-k}$: fixed-value)
(therefore, k = 1, 2, ..., n − 1)"

●
●
●

"$a_{\#0,n-2},3\%q = a_{\#1,n-2},3\%q = a_{\#2,n-2},3\%q = a_{\#3,n-2},3\%q = \ldots = a_{\#g,n-2},3\%q = \ldots = a_{\#q-2,n-2},3\%q = a_{\#q-1,n-2},3\%q = s_{p-n-2}$
($s_{p-n-2}$: fixed-value)"
"$a_{\#0,n-1},3\%q = a_{\#1,n-1},3\%q = a_{\#2,n-1},3\%q = a_{\#3,n-1},3\%q = \ldots = a_{\#g,n-1},3\%q = \ldots = a_{\#q-2,n-1},3\%q = a_{\#q-1,n-1},3\%q = s_{p-n-1}$
($s_{p-n-1}$: fixed-value)"

In addition, consider a set of $(v_{p=1}, y_{p=1}, s_{p=1})$, $(v_{p=2}, y_{p=2}, s_{p=2})$, $(v_{p=3}, y_{p=3}, s_{p=3})$, ..., $(v_{p=k}, y_{p=k}, s_{p=k})$, ..., $(v_{p=n-2}, y_{p=n-2}, s_{p=n-2})$, $(v_{p=n-1}, y_{p=n-1}, s_{p=n-1})$, and (w, z, 0). Here, it is assumed that k=1, 2, ..., n−1. When <condition #7-1> or <condition #7-2> holds true, high error correction capability can be achieved.

<Condition #7-1>

Consider $(v_{p=i}, y_{p=i}, s_{p=i})$ and $(v_{p=j}, y_{p=j}, s_{p=j})$, where i=1, 2, ..., n−1, j=1, 2, ..., n−1, and i≠j. At this time, it is assumed that a set of $v_{p=i}, y_{p=i}$ and $s_{p=i}$ arranged in descending order is $(\alpha_{p=i}, \beta_{p=i}, \gamma_{p=i})$, where $\alpha_{p=i} \geq \beta_{p=i}$ and $\beta_{p=i} \geq \gamma_{p=i}$. Furthermore, it is assumed that a set of $v_{p=j}, y_{p=j}$ and $s_{p=j}$ arranged in descending order is $(\alpha_{p=j}, \beta_{p=j}, \gamma_{p=j})$, where $\alpha_{p=j} \geq \beta_{p=j}$ and $\beta_{p=j} \geq \gamma_{p=j}$. At this time, there are i and j (i≠j) for which $(\alpha_{p=i}, \beta_{p=i}, \gamma_{p=i}) \neq (\alpha_{p=j}, \beta_{p=j}, \gamma_{p=j})$ holds true.

<Condition #7-2>

Consider $(v_{p=i}, y_{p=i}, s_{p=i})$ and (w, z, 0), where it is assumed that i=1, 2, ..., n−1. At this time, it is assumed that a set of $v_{p=i}, y_{p=i}$ and $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of w, z and 0 arranged in descending order is $(\alpha_{p=i}, \beta_{p=i}, 0)$, where it is assumed that $\alpha_{p=i} \geq \beta_{p=i}$. At this time, there is i for which $(v_{p=i}, y_{p=i}, s_{p=i}) \neq (w, z, 0)$ holds true.

By making more severe the constraint conditions of <condition #7-1, condition #7-2>, it is more likely to be able to generate an LDPC-CC of a time varying period of q (q is a prime number equal to or greater than 3) with higher error correction capability. The condition is that <condition #8-1> and <condition #8-2>, or <condition #8-1> or <condition #8-2> should hold true.

<Condition #8-1>

Consider $(v_{p=i}, y_{p=i}, s_{p=i})$ and $(v_{p=j}, y_{p=j}, s_{p=j})$, where it is assumed that i=1, 2, ..., n−1, j=1, 2, ..., n−1, and i≠j. At this time, it is assumed that a set of $v_{p=i}, y_{p=i}$ and $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of $v_{p=j}, y_{p=j}$ and $s_{p=j}$ arranged in descending order is $(\alpha_{p=j}, \beta_{p=j}, \gamma_{p=j})$, where it is assumed that $\alpha_{p=j} \geq \beta_{p=j}$ and $\beta_{p=j} \geq \gamma_{p=j}$. At this time, $(\alpha_{p=i}, \beta_{p=i}, \gamma_{p=i}) \neq (\alpha_{p=j}, \beta_{p=j}, \gamma_{p=j})$ holds true for all i's and j's (i≠j).

<Condition #8-2>

Consider $(v_{p=i}, y_{p=i}, s_{p=i})$ and (w, z, 0), where it is assumed that i=1, 2, ..., n−1. At this time, it is assumed that a set of $v_{p=i}, y_{p=i}$ and $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of w, z and 0 arranged in descending order is $(\alpha_{p=i}, y=p=i, 0)$, where it is assumed that $\alpha_{p=i} \geq \beta_{p=i}$. At this time, $(v_{p=i}, y_{p=i}, s_{p=i}) \neq (w, z, 0)$ holds true for all i's.

Furthermore, when $v_{p=i} \neq y_{p=i}$, $v_{p=i} \neq s_{p=i}$, $y_{p=i} \neq s_{p=1}$ (i=1, 2, ..., n−1), and w≠z hold true, it is possible to suppress the occurrence of short loops in a Tanner graph.

In the above description, equation 38 having three terms in $X_1(D), X_2(D), \ldots, X_{n-1}(D)$ and P(D) has been handled as the g-th parity check polynomial of an LDPC-CC of a time varying period of q (q is a prime number greater than 3). In equation 38, it is also likely to be able to achieve high error correction capability when the number of terms of any of $X_1(D), X_2(D), \ldots, X_{n-1}(D)$ and P(D) is 1 or 2. For example, the following method is available as the method of setting the number of terms of $X_1(D)$ to 1 or 2. In the case of a time varying period of q, there are q parity check polynomials that satisfy 0 and the number of terms of $X_1(D)$ is set to 1 or 2 for all the q parity check polynomials that satisfy 0. Alternatively, instead of setting the number of terms of $X_1(D)$ to 1 or 2 for all the q parity check polynomials that satisfy 0, the number of terms of $X_1(D)$ may be set to 1 or 2 for any number (equal to or less than q−1) of parity check polynomials that satisfy 0. The same applies to $X_2(D), \ldots, X_{n-1}(D)$ and $P(D)$. In this case, satisfying the above-described condition constitutes an important condition in achieving high error correction capability. However, the condition relating to the deleted terms is unnecessary.

Furthermore, high error correction capability may also be likely to be achieved even when the number of terms of any of $X_1(D), X_2(D), \ldots, X_{n-1}(D)$ and $P(D)$ is 4 or more. For example, the following method is available as the method of setting the number of terms of $X_1(D)$ to 4 or more. In the case of a time varying period of q, there are q parity check polynomials that satisfy 0 and the number of terms of $X_1(D)$ is set to 4 or more for all the q parity check polynomials that satisfy 0. Alternatively, instead of setting the number of terms of $X_1(D)$ to 4 or more for all the q parity check polynomials that satisfy 0, the number of terms of $X_1(D)$ may be set to 4 or more for any number (equal to or less than q−1) of parity check polynomials that satisfy 0. The same applies to $X_2(D), \ldots, X_{n-1}(D)$ and $P(D)$. At this time, the above-described condition is excluded for the added terms.

[Time Varying Period of h (h is an Integer Other than Prime Numbers Greater than 3): Equation 39)]

Next, a code configuration method when time varying period h is an integer other than prime numbers greater than 3 will be considered.

First, a case will be considered where the g-th (g=0, 1, ..., h−1) parity check polynomial of a coding rate of (n−1)/n and a time varying period of h (h is an integer other than prime numbers greater than 3) is represented as shown in equation 39.

[39]

$$(D^{a_{\#g,1,1}}+D^{a_{\#g,1,2}}+1)X_1(D)+(D^{a_{\#g,2,1}}+D^{a_{\#g,2,2}}+1)X_2(D)+\ldots+(D^{a_{\#g,n-1,1}}+D^{a_{\#g,n-1,2}}+1)X_{n-1}(D)+(D^{b_{\#g,1}}+D^{b_{\#g,2}}+1)P(D)=0 \quad \text{(Equation 39)}$$

In equation 39, it is assumed that $a_{\#g,p,1}$ and $a_{\#g,p,2}$ are natural numbers equal to or greater than 1 and $a_{\#g,p,1} \neq a_{\#g,p,2}$ holds true. Furthermore, it is assumed that $b_{\#g,1}$ and $b_{\#g,2}$ are natural numbers equal to or greater than 1 and $b_{\#g,1} \neq b_{\#g,2}$ holds true (g=0, 1, 2, ..., h−2, h−1; p=1, 2, ..., n−1).

In the same way as in the above description, <condition #9-1> and <condition #9-2> described below are one of important requirements for an LDPC-CC to achieve high error correction capability. In the following conditions, "%" means a modulo and, for example, "a % h" represents a remainder after dividing a by h.

<Condition #9-1>

"$a_{\#0,1,1}\%h = a_{\#1,1,1}\%h = a_{\#2,1,1}\%h = a_{\#3,1,1}\%h = \ldots = a_{\#g,1,1}\%h = \ldots = a_{\#h-2,1,1}\%h = a_{\#h-1,1,1}\%h = v_{p=1}$ ($v_{p=1}$: fixed-value)"

"$a_{\#0,2,1}\%h = a_{\#1,2,1}\%h = a_{\#2,2,1}\%h = a_{\#3,2,1}\%h = \ldots = a_{\#g,2,1}\%h = \ldots = a_{\#h-2,2,1}\%h = a_{\#h-1,2,1}\%h = v_{p=2}$ ($v_{p=2}$: fixed-value)"

"$a_{\#0,3,1}\%h = a_{\#1,3,1}\%h = a_{\#2,3,1}\%h = a_{\#3,3,1}\%h = \ldots = a_{\#g,3,1}\%h = \ldots = a_{\#h-2,3,1}\%h = a_{\#h-1,3,1}\%h = v_{p=3}$ ($v_{p=3}$: fixed-value)"

"$a_{\#0,4,1}\%h = a_{\#1,4,1}\%h = a_{\#2,4,1}\%h = a_{\#3,4,1}\%h = \ldots = a_{\#g,4,1}\%h = \ldots = a_{\#h-2,4,1}\%h = a_{\#h-1,4,1}\%h = v_{p=4}$ ($v_{p=4}$: fixed-value)"

•
•
•

"$a_{\#0,k,1}\%h = a_{\#1,k,1}\%h = a_{\#2,k,1}\%h = a_{\#3,k,1}\%h = \ldots = a_{\#g,k,1}\%h = \ldots = a_{\#h-2,k,1}\%h = a_{\#h-1,k,1}\%h = v_{p=k}$ ($v_{p=k}$: fixed-value)
(therefore, k = 1, 2, ..., n − 1)"

•
•
•

"$a_{\#0,n-2,1}\%h = a_{\#1,n-2,1}\%h = a_{\#2,n-2,1}\%h = a_{\#3,n-2,1}\%h = \ldots = a_{\#g,n-2,1}\%h = \ldots = a_{\#h-2,n-2,1}\%h = a_{\#h-1,n-2,1}\%q = v_{p=n-2}$
($v_{p=n-2}$: fixed-value)"

"$a_{\#0,n-1,1}\%h = a_{\#1,n-1,1}\%h = a_{\#2,n-1,1}\%h = a_{\#3,n-1,1}\%h = \ldots = a_{\#g,n-1,1}\%h = \ldots = a_{\#h-2,n-1,1}\%h = a_{\#h-1,n-1,1}\%q = v_{p=n-1}$
($v_{p=n-1}$: fixed-value)" and "$b_{\#0,1}\%h = b_{\#1,1}\%h = b_{\#2,1}\%h = b_{\#3,1}\%h = \ldots = b_{\#g,1}\%h = \ldots = b_{\#h-2,1}\%h = b_{\#h-1,1}\%h = w$ (w: fixed-value)"

<Condition #9-1>

"$a_{\#0,1,2}\%h = a_{\#1,1,2}\%h = a_{\#2,1,2}\%h = a_{\#3,1,2}\%h = \ldots = a_{\#g,1,2}\%h = \ldots = a_{\#h-2,1,2}\%h = a_{\#h-1,1,2}\%h = y_{p=1}$ ($y_{p=1}$: fixed-value)"

"$a_{\#0,2,2}\%h = a_{\#1,2,2}\%h = a_{\#2,2,2}\%h = a_{\#3,2,2}\%h = \ldots = a_{\#g,2,2}\%h = \ldots = a_{\#h-2,2,2}\%h = a_{\#h-1,2,2}\%h = y_{p=2}$ ($y_{p=2}$: fixed-value)"

"$a_{\#0,3,2}\%h = a_{\#1,3,2}\%h = a_{\#2,3,2}\%h = a_{\#3,3,2}\%h = \ldots = a_{\#g,3,2}\%h = \ldots = a_{\#h-2\,3,2}\%h = a_{\#h-1,3,2}\%h = y_{p=3}$ ($y_{p=3}$: fixed-value)"

"$a_{\#0,4,2}\%h = a_{\#1,4,2}\%h = a_{\#2,4,2}\%h = a_{\#3,4,2}\%h = \ldots = a_{\#g,4,2}\%h = \ldots = a_{\#h-2,4,2}\%h = a_{\#h-1,4,2}\%h = y_{p=4}$ ($y_{p=4}$: fixed-value)"

•
•
•

"$a_{\#0,k,2}\%h = a_{\#1,k,2}\%h = a_{\#2,k,2}\%h = a_{\#3,k,2}\%h = \ldots = a_{\#g,k,2}\%h = \ldots = a_{\#h-2,k,2}\%h = a_{\#h-1,k,2}\%h = y_{p=k}$ ($y_{p=k}$: fixed-value)
(therefore, k = 1, 2, ..., n − 1)"

•
•
•

"$a_{\#0,n-2,2}\%h = a_{\#1,n-2,2}\%h = a_{\#2,n-2,2}\%h = a_{\#3,n-2,2}\%h = \ldots = a_{\#g,n-2,1}\%h = \ldots = a_{\#h-2,n-2,1}\%h = a_{\#h-1,n-2,1}\%h = y_{p-n-2}$ ($y_{p-n-2}$: fixed-value)"

"$a_{\#0,n-1,2}\%h = a_{\#1,n-1,2}\%h = a_{\#2,n-1,2}\%h = a_{\#3,n-1,2}\%h = \ldots = a_{\#g,n-1,2}\%h = \ldots = a_{\#h-2,n-1,2}\%h = a_{\#h-1,n-1,2}\%h = y_{p-n-1}$ ($y_{p-n-1}$: fixed-value)" and "$b_{\#0,2}\%h = b_{\#1,2}\%h = b_{\#2,2}\%h = b_{\#3,2}\%h = \ldots = b_{\#g,2}\%h = \ldots = b_{\#h-2,2}\%h = b_{\#h-1,2}\%h = z$ (z: fixed-value)"

In addition, as described above, high error correction capability can be achieved by adding <condition #10-1> or <condition #10-2>.

<Condition #10-1>

In <condition #9-1>, $v_{p=1}, v_{p=2}, v_{p=3}, v_{p=4}, \ldots, v_{p=k}, v_{p=n-2}, V_{p=n-1}$ (k=1, 2, ..., n-1) and w are set to "1" and "natural numbers other than divisors of a time varying period of h."

<Condition #10-2>

In <condition #9-2>, $y_{p=1}, y_{p=2}, y_{p=3}, y_{p=4}, y_{p=k}, \ldots, v_{p=n-2}, v_{p=n-1}$ (k=1, 2, ..., n-1) and z are set to "1" and "natural numbers other than divisors of a time varying period of h."

Then, consider a set of $(v_{p=1}, y_{p=1}), (v_{p=2}, y_{p=2}), (v_{p=3}, y_{p=3}), \ldots, (v_{p=k}, y_{p=k}), \ldots, (v_{p=n-2}, y_{p=n-2}), (v_{p=n-1}, y_{p=n-1})$ and (w, z). Here, it is assumed that k=1, 2, ..., n-1. If <condition #11-1> or <condition #11-2> holds true, higher error correction capability can be achieved.

<Condition #11-1>

Consider $(v_{p=i}, y_{p=i})$ and $(v_{p=j}, y_{p=j})$, where it is assumed that i=1, 2, ..., n-1, j=1, 2, ..., n-1 and i≠j. At this time, there are i and j (i≠j) for which $(v_{p=i}, y_{p=i}) \ne (v_{p=j}, y_{p=j})$ and $(v_{p=i}, y_{p=i}) \ne (y_{p=j}, v_{p=j})$ hold true.

<Condition #11-2>

Consider $(v_{p=i}, y_{p=i})$ and (w, z), where it is assumed that i=1, 2, ..., n-1. At this time, there is i for which $(v_{p=i}, y_{p=i}) \ne (w, z)$ and $(v_{p=i}, y_{p=i}) \ne (z, w)$ hold true.

Furthermore, by making more severe the constraint conditions of <condition #11-1, condition #11-2>, it is more likely to be able to generate an LDPC-CC of a time varying period of h (h is an integer other than prime numbers greater than 3) with higher error correction capability. The condition is that <condition #12-1> and <condition #12-2>, or <condition #12-1> or <condition #12-2> should hold true.

<Condition #12-1>

Consider $(v_{p=i}, y_{p=i})$ and $(v_{p=j}, y_{p=j})$, where it is assumed that i=1, 2, ..., n-1, j=1, 2, ..., n-1 and i≠j. At this time, $(v_{p=i}, y_{p=i}) \ne (v_{p=j}, y_{p=j})$ and $(v_{p=i}, v_{p=i}) \ne (v_{p=j}, v_{p=j})$ hold true for all i's and j's (i≠j).

<Condition #12-2>

Consider $(v_{p=i}, y_{p=i})$ and (w, z), where it is assumed that i=1, 2, ..., n-1. At this time, $(v_{p=i}, y_{p=i}) \ne (w, z)$ and $(v_{p=i}, y_{p=i}) \ne (z, w)$ hold true for all i's.

Furthermore, when $_{p=i} \ne y_{p=i}$ (i=1, 2, ..., n-1) and w≠z hold true, it is possible to suppress the occurrence of short loops in a Tanner graph.

In the above description, equation 39 having three terms in $X_1(D), X_2(D), \ldots, X_{n-1}(D)$ and P(D) has been handled as the g-th parity check polynomial of an LDPC-CC of a time varying period of h (h is an integer other than prime numbers greater than 3). In equation 39, it is also likely to be able to achieve high error correction capability when the number of terms of any of $X_1(D), X_2(D), \ldots, X_{n-1}(D)$ and P(D) is 1 or 2. For example, the following method is available as the method of setting the number of terms of $X_1(D)$ to 1 or 2. In the case of a time varying period of h, there are h parity check polynomials that satisfy 0 and the number of terms of $X_1(D)$ is set to 1 or 2 for all the h parity check polynomials that satisfy 0. Alternatively, instead of setting the number of terms of $X_1(D)$ to 1 or 2 for all the h parity check polynomials that satisfy 0, the number of terms of $X_1(D)$ may be set to 1 or 2 for any number (equal to or less than 11-1) of parity check polynomials that satisfy 0. The same applies to $X_2(D)$, and P(D). In this case, satisfying the above-described condition constitutes an important condition in achieving high error correction capability. However, the condition relating to the deleted terms is unnecessary.

Moreover, even when the number of terms of any of $X_1(D), X_2(D), \ldots, X_{n-L}(D)$ and P(D) is 4 or more, it is also likely to be able to achieve high error correction capability. For example, the following method is available as the method of setting the number of terms of $X_1(1)$ to 4 or more. In the case of a time varying period of h, there are h parity check polynomials that satisfy 0, and the number of terms of $X_1(D)$ is set to 4 or more for all the h parity check polynomials that satisfy 0. Alternatively, instead of setting the number of terms of $X_1(D)$ to 4 or more for all the h parity check polynomials that satisfy 0, the number of terms of $X_1(D)$ may be set to 4 or more for any number (equal to or less than h–1) of parity check polynomials that satisfy 0. The same applies to $X_2(D), \ldots, X_{n-1}(D)$ and P(D). At this time, the above-described condition is excluded for the added terms.

By the way, equation 39 is the g-th parity check polynomial of an LDPC-CC of a coding rate of (n–1)/n and a time varying period of h (h is an integer other than prime numbers greater than 3). In this equation, in the case of, for example, a coding rate of 1/2, the g-th parity check polynomial is represented as shown in equation 40-1. Furthermore, in the case of a coding rate of 2/3, the g-th parity check polynomial is represented as shown in equation 40-2. Furthermore, in the case of a coding rate of 3/4, the g-th parity check polynomial is represented as shown in equation 40-3. Furthermore, in the case of a coding rate of 4/5, the g-th parity check polynomial is represented as shown in equation 40-4. Furthermore, in the case of a coding rate of 5/6, the g-th parity cheek polynomial is represented as shown in equation 40-5.

[40]

$$(D^{a\#g,1,1}+D^{a\#g,1,2}+1)X_1(D)+(D^{b\#g,1}+D^{b\#g,2}+1)P(D)=0 \quad \text{Equation 40-1}$$

$$(D^{a\#g,1,1}+D^{a\#g,1,2}+1)X_1(D)+(D^{a\#g,2,1}+D^{a\#g,2,2}+1)X_2(D)+(D^{b\#g,1}+D^{b\#g,2}+1)P(D)=0 \quad \text{Equation 40-2}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{b\#g,1}+D^{b\#g,2}+1)P(D)=0 \quad \text{Equation 40-3}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{b\#g,1}+D^{b\#g,2}+1)P(D)=0 \quad \text{Equation 40-4}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{a\#g,5,1}+D^{a\#g,5,2}+1)X_5(D)(D^{b\#g,1}+D^{b\#g,2}+1)P(D)=0 \quad \text{Equation 40-4}$$

[Time Varying Period h (h is an Integer Other than Prime Numbers Greater than 3): Equation 41)]

Next, a case will be considered where the g-th (g=0, 1, ..., h−1) parity check polynomial (that satisfies 0) of a time varying period of h (h is an integer other than prime numbers greater than 3) is represented as shown in equation 41.

[41]

$$(D^{a_{\#g,1,1}}+D^{a_{\#g,1,2}}+D^{a_{\#g,1,3}})X_1(D)+(D^{a_{\#g,2,1}}+D^{a_{\#g,2,2}}+D^{a_{\#g,2,3}})X_2(D)+\ldots+(D^{a_{\#g,n-1,1}}+D^{a_{\#g,n-1,2}}+D^{a_{\#g,n-1,3}})X_{n-1}(D)+(D^{b_{\#g,1}}+D^{b_{\#g,2}}+1)P(D)=0 \quad \text{(Equation 41)}$$

In equation 41, it is assumed that $a_{\#g,p,1}$, $a_{\#g,p,2}$ and $a_{\#g,p,3}$ are natural numbers equal to or greater than 1 and $a_{\#g,p,1} \neq a_{\#g,p,2}$, $a_{\#g,p,1} \neq a_{\#g,p,3}$ and $a_{\#g,p,2} \neq a_{\#g,p,3}$ hold true. Furthermore, it is assumed that $b_{\#g,1}$ and $b_{\#g,2}$ are natural numbers equal to or greater than 1 and $b_{\#g,1} \neq b_{\#g,2}$ holds true (g=0, 1, 2, ..., h−2, h−1; p=1, 2, ..., n−1).

As in the case of the above description, <condition #13-1>, <condition #13-2> and <condition #13-3> described below are one of important requirements for an LDPC-CC to achieve high error correction capability. In the following conditions, "%" means a modulo and, for example, "α % h" represents a remainder after dividing a by q.

<Condition #13-1>

"$a_{\#0,1,1}\%h = a_{\#1,1,1}\%h = a_{\#2,1,1}\%h = a_{\#3,1,1}\%h = \ldots = a_{\#g,1,1}\%h = \ldots = a_{\#h-2,1,1}\%h = a_{\#h-1,1,1}\%h = v_{p-1}$ ($v_{p-1}$: fixed-value)"

"$a_{\#0,2,1}\%h = a_{\#1,2,1}\%h = a_{\#2,2,1}\%h = a_{\#3,2,1}\%h = \ldots = a_{\#g,2,1}\%h = \ldots = a_{\#h-2,2,1}\%h = a_{\#h-1,2,1}\%h = v_{p-2}$ ($v_{p-2}$: fixed-value)"

"$a_{\#0,3,1}\%h = a_{\#1,3,1}\%h = a_{\#2,3,1}\%h = a_{\#3,3,1}\%h = \ldots = a_{\#g,3,1}\%h = \ldots = a_{\#h-2,3,1}\%h = a_{\#h-1,3,1}\%h = v_{p-3}$ ($v_{p-3}$: fixed-value)"

"$a_{\#0,4,1}\%h = a_{\#1,4,1}\%h = a_{\#2,4,1}\%h = a_{\#3,4,1}\%h = \ldots = a_{\#g,4,1}\%h = \ldots = a_{\#h-2,4,1}\%h = a_{\#h-1,4,1}\%h = v_{p-4}$ ($v_{p-4}$: fixed-value)"

•
•
•

"$a_{\#0,k,1}\%h = a_{\#1,k,1}\%h = a_{\#2,k,1}\%h = a_{\#3,k,1}\%h = \ldots = a_{\#g,k,1}\%h = \ldots = a_{\#h-2,k,1}\%h = a_{\#h-1,k,1}\%h = v_{p-k}$ ($v_{p-k}$: fixed-value)
(therefore, k = 1, 2, ..., n − 1)"

•
•
•

"$a_{\#0,n-2,1}\%h = a_{\#1,n-2,1}\%h = a_{\#2,n-2,1}\%h = a_{\#3,n-2,1}\%h = \ldots = a_{\#g,n-2,1}\%h = \ldots = a_{\#h-2,n-2,1}\%h = a_{\#h-1,n-2,1}\%q = v_{p-n-2}$
($v_{p-n-2}$: fixed-value)"

"$a_{\#0,n-1,1}\%h = a_{\#1,n-1,1}\%h = a_{\#2,n-1,1}\%h = a_{\#3,n-1,1}\%h = \ldots = a_{\#g,n-1,1}\%h = \ldots = a_{\#h-2,n-1,1}\%h = a_{\#h-1,n-1,1}\%q = v_{p-n-1}$
($v_{p-n-1}$: fixed-value)" and "$b_{\#0,1}\%h = b_{\#1,1}\%h = b_{\#2,1}\%h = b_{\#3,1}\%h = \ldots = b_{\#g,1}\%h = \ldots = b_{\#h-2,1}\%h = b_{\#h-1,1}\%h = w$ (w: fixed-value)"

<Condition #13-2>

"$a_{\#0,1,2}\%h = a_{\#1,1,2}\%h = a_{\#2,1,2}\%h = a_{\#3,1,2}\%h = \ldots = a_{\#g,1,2}\%h = \ldots = a_{\#h-2,1,2}\%h = a_{\#h-1,1,2}\%h = y_{p-1}$ ($y_{p-1}$: fixed-value)"

"$a_{\#0,2,2}\%h = a_{\#1,2,2}\%h = a_{\#2,2,2}\%h = a_{\#3,2,2}\%h = \ldots = a_{\#g,2,2}\%h = \ldots = a_{\#h-2,2,2}\%h = a_{\#h-1,2,2}\%h = y_{p-2}$ ($y_{p-2}$: fixed-value)"

"$a_{\#0,3,2}\%h = a_{\#1,3,2}\%h = a_{\#2,3,2}\%h = a_{\#3,3,2}\%h = \ldots = a_{\#g,3,2}\%h = \ldots = a_{\#h-2,3,2}\%h = a_{\#h-1,3,2}\%h = y_{p-3}$ ($y_{p-3}$: fixed-value)"

"$a_{\#0,4,2}\%h = a_{\#1,4,2}\%h = a_{\#2,4,2}\%h = a_{\#3,4,2}\%h = \ldots = a_{\#g,4,2}\%h = \ldots = a_{\#h-2,4,2}\%h = a_{\#h-1,4,2}\%h = y_{p-4}$ ($y_{p-4}$: fixed-value)"

•
•
•

"$a_{\#0,k,2}\%h = a_{\#1,k,2}\%h = a_{\#2,k,2}\%h = a_{\#3,k,2}\%h = \ldots = a_{\#g,k,2}\%h = \ldots = a_{\#h-2,k,2}\%h = a_{\#h-1,k,2}\%h = y_{p-k}$ ($y_{p-k}$: fixed-value)
(therefore, k = 1, 2, ..., n − 1)"

•
•
•

"$a_{\#0,n-2,2}\%h = a_{\#1,n-2,2}\%h = a_{\#2,n-2,2}\%h = a_{\#3,n-2,2}\%h = \ldots = a_{\#g,n-2,1}\%h = \ldots = a_{\#h-2,n-2,1}\%h = a_{\#h-1,n-2,1}\%h = y_{p-n-2}$
($y_{p-n-2}$: fixed-value)"

"$a_{\#0,n-1,2}\%h = a_{\#1,n-1,2}\%h = a_{\#2,n-1,2}\%h = a_{\#3,n-1,2}\%h = \ldots = a_{\#g,n-1,2}\%h = \ldots = a_{\#h-2,n-1,2}\%h = a_{\#h-1,n-1,2}\%h = y_{p-n-1}$
($y_{p-n-1}$: fixed-value)" and "$b_{\#0,2}\%h = b_{\#1,2}\%h = b_{\#2,2}\%h = b_{\#3,2}\%h = \ldots = b_{\#g,2}\%h = \ldots = b_{\#h-2,2}\%h = b_{\#h-1,2}\%h = z$ (z: fixed-value)"

<Condition #13-3>

"$a_{\#0,1,3}\%h = a_{\#1,1,3}\%h = a_{\#2,1,3}\%h = a_{\#3,1,3}\%h = \ldots = a_{\#g,1,3}\%h = \ldots = a_{\#h-2,1,3}\%h = a_{\#h-1,1,3}\%h = s_{p-1}$ ($s_{p-1}$: fixed-value)"

"$a_{\#0,2,3}\%h = a_{\#1,2,3}\%h = a_{\#2,2,3}\%h = a_{\#3,2,3}\%h = \ldots = a_{\#g,2,3}\%h = \ldots = a_{\#h-2,2,3}\%h = a_{\#h-1,2,3}\%h = s_{p-2}$ ($s_{p-2}$: fixed-value)"

"$a_{\#0,3,3}\%h = a_{\#1,3,3}\%h = a_{\#2,3,3}\%h = a_{\#3,3,3}\%h = \ldots = a_{\#g,3,3}\%h = \ldots = a_{\#h-2,3,3}\%h = a_{\#h-1,3,3}\%h = s_{p-3}$ ($s_{p-3}$: fixed-value)"

"$a_{\#0,4,3}\%h = a_{\#1,4,3}\%h = a_{\#2,4,3}\%h = a_{\#3,4,3}\%h = \ldots = a_{\#g,4,3}\%h = \ldots = a_{\#h-2,4,3}\%h = a_{\#h-1,4,3}\%h = s_{p-4}$ ($s_{p-4}$: fixed-value)"

•
•
•

-continued

"$a_{\#0,k,3\%h} = a_{\#1,k,3\%h} = a_{\#2,k,3\%h} = a_{\#3,k,3\%h} = \ldots = a_{\#g,k,3\%h} = \ldots = a_{\#h-2,k,3\%h} = a_{\#h-1,k,3\%h} = s_{p-k}$ ($s_{p-k}$: fixed-value)
(therefore, $k = 1, 2, \ldots, n-1$)"

●
●
●

"$a_{\#0,n-2,3\%h} = a_{\#1,n-2,3\%h} = a_{\#2,n-2,3\%h} = a_{\#3,n-2,3\%h} = \ldots = a_{\#g,n-2,3\%h} = \ldots = a_{\#h-2,n-2,3\%h} = a_{\#h-1,n-2,3\%h} = s_{p-n-2}$
($s_{p-n-2}$: fixed-value)"

"$a_{\#0,n-1,3\%h} = a_{\#1,n-1,3\%h} = a_{\#2,n-1,3\%h} = a_{\#3,n-1,3\%h} = \ldots = a_{\#g,n-1,3\%h} = \ldots = a_{\#h-2,n-1,3\%q} = a_{\#h-1,n-1,3\%h} = s_{p-n-1}$
($s_{p-n-1}$: fixed-value)"

In addition, consider a set of $(v_{p=1}, y_{p=1}, s_{p=1})$, $(v_{p=2}, y_{p=2}, s_{p=2})$, $(v_{p=3}, y_{p=3}, s_{p=3})$, ..., $(v_{p=k}, y_{p=k}, s_{p=k})$, ..., $(v_{p=n-2}, y_{p=n-2}, s_{p=n-2})$, $(v_{p=n-1}, y_{p=n-1}, s_{p=n-1})$ and $(w, z, 0)$. Here, it is assumed that $k = 1, 2, \ldots, n-1$. When <condition #14-1> or <condition #14-2> holds true, high error correction capability can be achieved.

<Condition #14-1>

Consider $(v_{p=i}, y_{p=i}, s_{p=i})$ and $(v_{p=j}, y_{p=j}, s_{p=j})$, where $i = 1, 2, \ldots, n-1$, $j = 1, 2, \ldots, n-1$, and $i \neq j$. At this time, it is assumed that a set of $v_{p=i}, y_{p=i}, s_{p=i}$ arranged in descending order is $(\alpha_{p=i}, \beta_{p=i}, \gamma_{p=i})$, where $\alpha_{p=i} \geq \beta_{p=i}$, $\beta_{p=i} \geq \gamma_{p=i}$. Furthermore, it is assumed that a set of $v_{p=j}, y_{p=j}, s_{p=j}$ arranged in descending order is $(\alpha_{p=j}, \beta_{p=j}, \gamma_{p=j})$, where $\alpha_{p=j} \geq \beta_{p=j}$, $\beta_{p=j} \geq \gamma_{p=j}$. At this time, there are i and j ($i \neq j$) for which $(\alpha_{p=i}, \beta_{p=i}, \gamma_{p=i}) \neq (\alpha_{p=j}, \beta_{p=j}, \gamma_{p=j})$ holds true.

<Condition #14-2>

Consider $(v_{p=i}, y_{p=i}, s_{p=i})$ and $(w, z, 0)$, where it is assumed that $i = 1, 2, \ldots, n-1$. At this time, it is assumed that a set of $v_{p=i}, y_{p=i}, s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of w, z and 0 arranged in descending order is $(\alpha_{p=i}, \beta_{p=i}, 0)$, where it is assumed that $\alpha_{p=i} \geq \beta_{p=i}$. At this time, there is i for which $(v_{p=i}, y_{p=i}, s_{p=i}) \neq (w, z, 0)$ holds true.

Furthermore, by making more severe the constraint conditions of <condition #14-1, condition #14-2>, it is more likely to be able to generate an LDPC-CC of a time varying period of h (h is an integer other than prime numbers equal to or greater than 3) with higher error correction capability. The condition is that <condition #15-1> and <condition #15-2>, or <condition #15-1> or <condition #15-2> should hold true.

<Condition #15-1>

Consider $(v_{p=i}, y_{p=i}, s_{p=i})$ and $(v_{p=j}, y_{p=j}, s_{p=j})$, where it is assumed that $i = 1, 2, \ldots, n-1$, $j = 1, 2, \ldots, n-1$, and $i \neq j$. At this time, it is assumed that a set of $v_{p=i}, y_{p=i}, s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of $v_{p=j}, s_{p=j}$ arranged in descending order is $(\alpha_{p=j}, \beta_{p=j}, \gamma_{p=j})$, where $\alpha_{p=j} \geq \beta_{p=j}$ and $\beta_{p=j} \geq \gamma_{p=j}$. At this time, $(\alpha_{p=i}, \beta_{p=i}, \gamma_{p=i}) \neq (\alpha_{p=j}, \beta_{p=j}, \gamma_{p=j})$ holds true for all i's and j's ($i \neq j$).

<Condition #15-2>

Consider $(v_{p=i}, y_{p=i}, s_{p=i})$ and $(w, z, 0)$, where it is assumed that $2, \ldots, n-1$. At this time, it is assumed that a set of $v_{p=i}, y_{p=i}, s_{p=i}$ arranged in descending order is $(a_{p=i}, y_{p=i})$, where it is assumed that $\alpha_{p=i} \geq \beta_{p=i}$ and $\beta_{p=i} \geq \gamma_{p=i}$. Furthermore, it is assumed that a set of w, z and 0 arranged in descending order is $(\alpha_{p=i}, \beta_{p=i}, 0)$, where it is assumed that $\alpha_{p=i} \geq \beta_{p=i}$. At this time, $(v_{p=i}, y_{p=i}, s_{p=i}) \neq (w, z, 0)$ holds true for all i's.

Furthermore, when $v_{p=i} \neq y_{p=i}$, $v_{p=i} \neq s_{p=i}$, $v_{p=i} \neq s_{p=i}$, ($i = 1, 2, \ldots, n-1$), and $w \neq z$ hold true, it is possible to suppress the occurrence of short loops in a Tanner graph.

In the above description, equation 41 having three terms in $X_1(D), X_2(D), \ldots, X_{n-1}(D)$ and $P(D)$ has been handled as the g-th parity check polynomial of an LDPC-CC of a time varying period of h (h is an integer other than prime numbers greater than 3). In equation 41, it is also likely to be able to achieve high error correction capability when the number of terms of any of $X_1(D), X_2(D), \ldots, X_{n-1}(D)$ and $P(D)$ is 1 or 2. For example, the following method is available as the method of setting the number of terms of $X_1(D)$ to 1 or 2. In the case of a time varying period of h, there are h parity check polynomials that satisfy 0 and the number of terms of $X_1(D)$ is set to 1 or 2 for all the h parity check polynomials that satisfy 0. Alternatively, instead of setting the number of terms of $X_1(D)$ to 1 or 2 for all the h parity check polynomials that satisfy 0, the number of terms of $X_1(D)$ may be set to 1 or 2 for any number (equal to or less than h−1) of parity check polynomials that satisfy 0. The same applies to $X_2(D), \ldots, X_{n-1}(D)$ and $P(D)$. In this case, satisfying the above-described condition constitutes an important condition in achieving high error correction capability. However, the condition relating to the deleted terms is unnecessary.

Furthermore, it is likely to be able to achieve high error correction capability also when the number of terms of any of $X_1(D), X_2(D), \ldots, X_{n-1}(D)$ and $P(D)$ is 4 or more. For example, the following method is available as the method of setting the number of terms of $X_1(D)$ to 4 or more. In the case of a time varying period of h, there are h parity check polynomials that satisfy 0 and the number of terms of $X_1(D)$ is set to 4 or more for all the h parity check polynomials that satisfy 0. Alternatively, instead of setting the number of terms of $X_1(D)$ to 4 or more for all the h parity check polynomials that satisfy 0, the number of terms of $X_1(D)$ may be set to 4 or more for any number (equal to or less than h−1) of parity check polynomials that satisfy 0. The same applies to $X_2(D), \ldots, X_{n-1}(D)$ and $P(D)$. At this time, the above-described condition is excluded for the added terms.

As described above, the present embodiment has described an LDPC-CC based on parity check polynomials of a time varying period greater than 3, and more particularly, the code configuration method of an LDPC-CC based on parity check polynomials of a time varying period of a prime number greater than 3. As described in the present embodiment, it is possible to achieve higher error correction capability by forming parity check polynomials and performing encoding of an LDPC-CC based on the parity check polynomials.

(Embodiment 2)

The present embodiment will describe, in detail, an LDPC-CC encoding method and the configuration of an encoder based on the parity check polynomials described in Embodiment 1.

First, consider an LDPC-CC of a coding rate of 1/2 and a time varying period of 3 as an example. Parity check polynomials of a time varying period of 3 are provided below.

[42]

$$(D^2+D^1+1)X_1(D)++(D^3+D^1+1)P(D)=0 \quad \text{(Equation 42-0)}$$

$$(D^3+D^1+1)X_1(D)+(D^3+D^1+1)P(D)=0 \quad \text{(Equation 42-1)}$$

$$(D^3+D^2+1)X_1(D)+(D^3+D^2+1)P(D)=0 \quad \text{(Equation 42-2)}$$

At this time, P(D) is obtained as shown in the equations below.

[43]

$$P(D)=(D^2+D^1+1)X_1(D)+(D^3+D^1)P(D) \quad \text{(Equation 43-0)}$$

$$P(D)=(D^3+D^1+1)X_1(D)+(D^2+D^1)P(D) \quad \text{(Equation 43-1)}$$

$$P(D)=(D^3+D^2+1)X_1(D)+(D^3+D^2)P(D) \quad \text{(Equation 43-3)}$$

Equations 43-0 to 43-2 are then represented as follows:

[44]

$$P[i]=X_1[i]\oplus X_1[i-1]\oplus X_1[i-2]\oplus P[i-1]\oplus P[i-3] \quad \text{(Equation 44-0)}$$

$$P[i]=X_1[i]\oplus X_1[i-1]\oplus X_1[i-3]\oplus P[i-1]\oplus P[i-2] \quad \text{(Equation 44-1)}$$

$$P[i]=X_1[i]\oplus X_1[i-2]\oplus X_1[i-3]\oplus P[i-2]\oplus P[i-3] \quad \text{(Equation 44-2)}$$

where the symbol "$\oplus$" represents the exclusive OR.

Figure 15A:
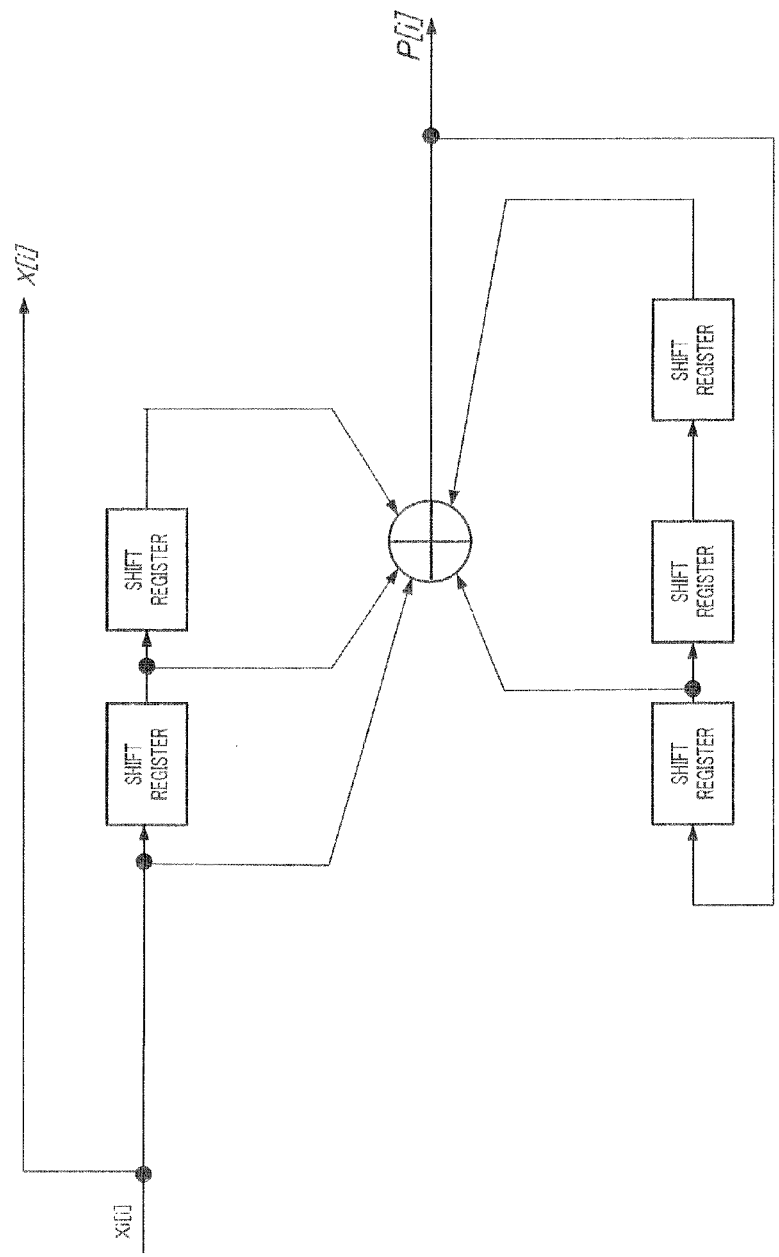
FIG. 15A shows a circuit example of encoder of a coding rate of 1/2.
Figure 15B:
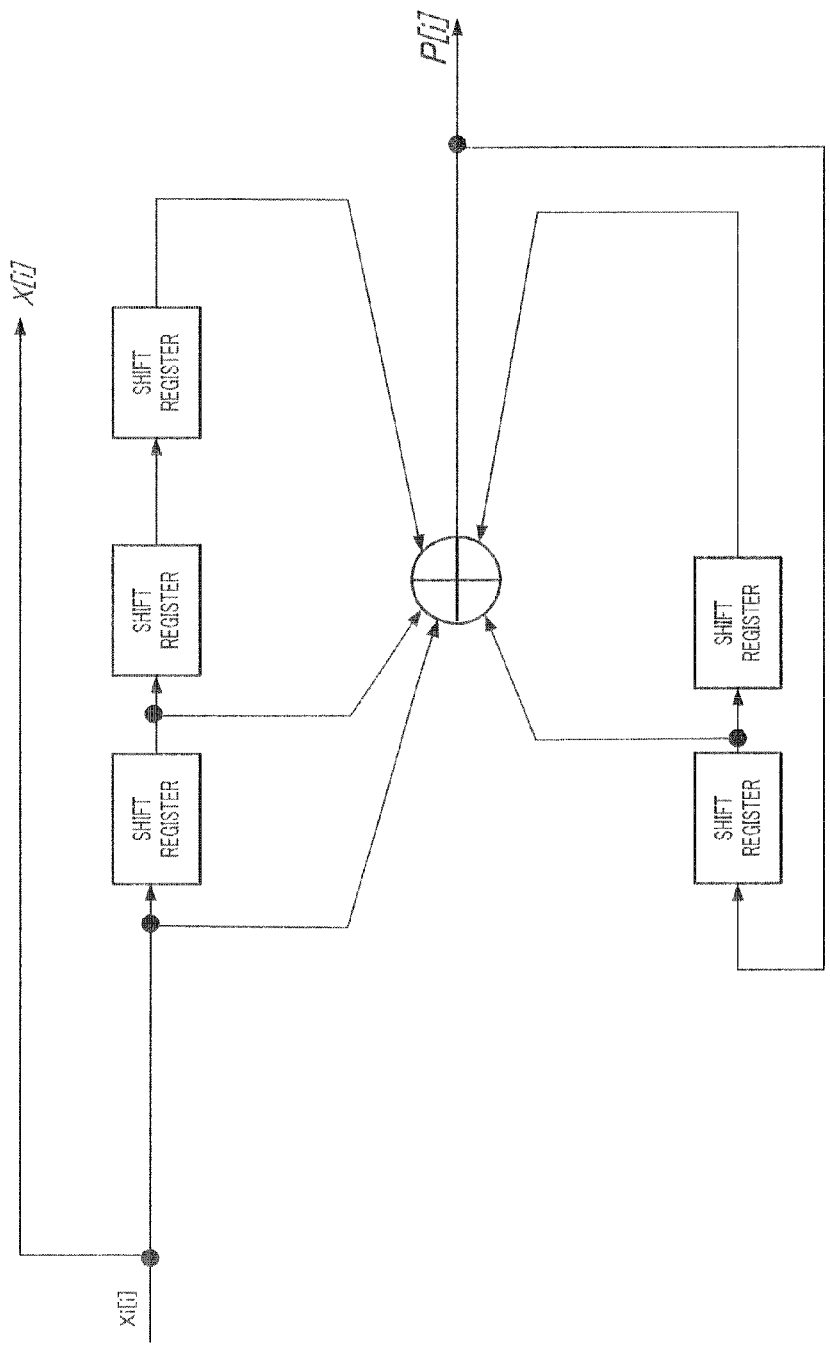
FIG. 15B shows a circuit example of encoder of a coding rate of 1/2.
Figure 15C:
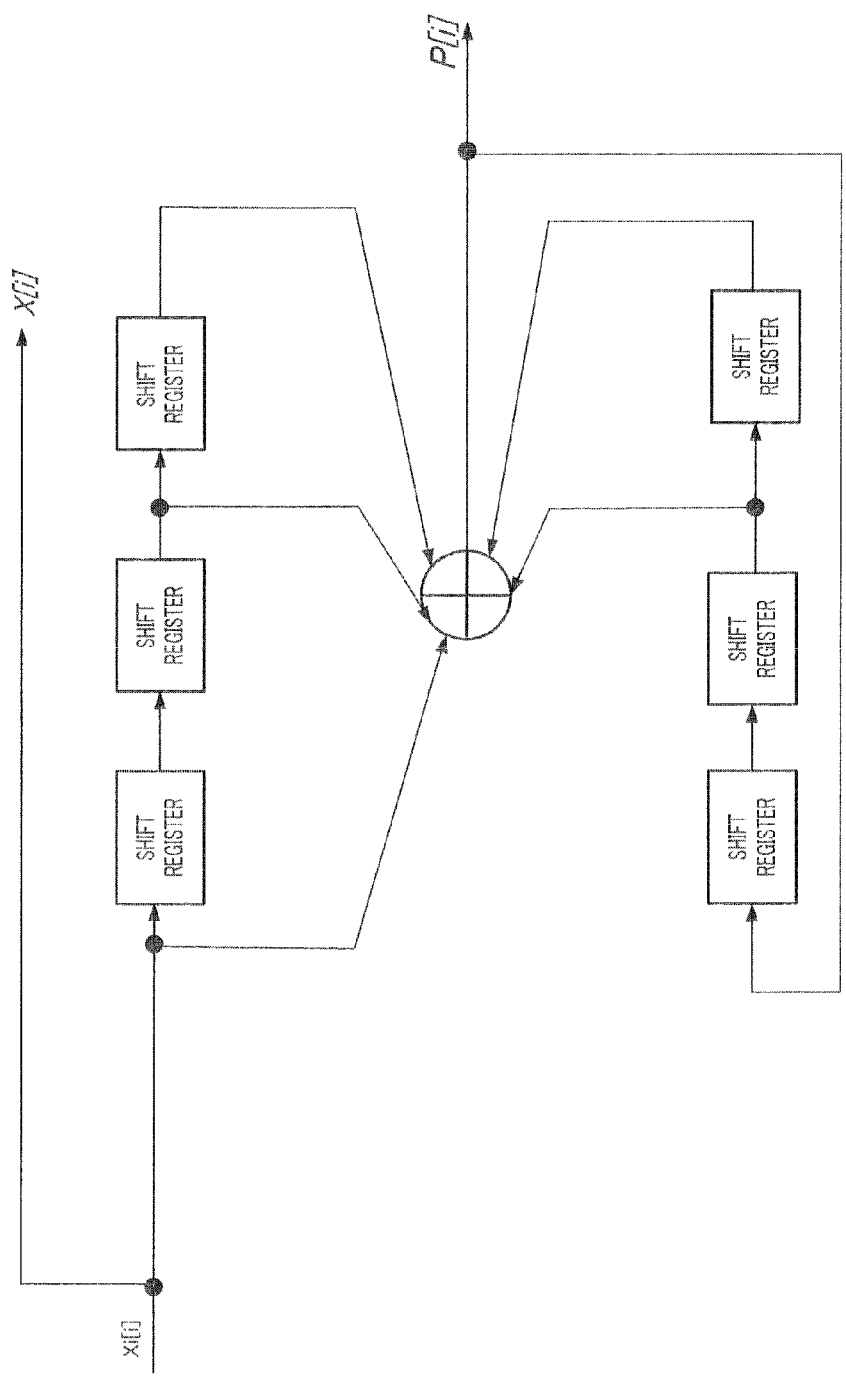
FIG. 15C shows a circuit example of encoder of a coding rate of 1/2.

At this time, FIG. 15A shows the circuit corresponding to equation 44-0, FIG. 15B shows the circuit corresponding to equation 44-1 and FIG. 15C shows the circuit corresponding to equation 44-2.

At point in time i=3k, the parity bit at point in time i is obtained through the circuit shown in FIG. 15A corresponding to equation 43-0, that is, equation 44-0. At point in time i=3k+1, the parity bit at point in time i is obtained through the circuit shown in FIG. 15B corresponding to equation 43-1, that is, equation 44-1. At point in time i=3k+2, the parity bit at point in time i is obtained through the circuit shown in FIG. 15C corresponding to equation 43-2, that is, equation 44-2. Therefore, the encoder can adopt a configuration similar to that of FIG. 9.

Encoding can be performed also when the time varying period is other than 3 and the coding rate is (n−1)/n in the same way as that described above. For example, the g-th (g=0, 1, ..., q−1) parity check polynomial of an LDPC-CC of a time varying period of q and a coding rate of (n−1)/n is represented as shown in equation 36, and therefore P(D) is represented as follows, where q is not limited to a prime number.

[45]

$$P(D)=(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2})P(D) \quad \text{(Equation 45)}$$

When expressed in the same way as equations 44-0 to 44-2, equation 45 is represented as follows:

[46]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus \ldots \oplus X_{n-1}[i]\oplus X_{n-1}[i-a_{\#g,n-1,1}]\oplus X_{n-1}[i-a_{\#g,n-1,2}]\oplus P[i-b_{\#g,1}]\oplus P[i-b_{\#g,2}] \quad \text{(Equation 46)}$$

where the symbol "$\oplus$" represents the exclusive OR.

Here, $X_r[i]$ (r=1, 2, ..., n−1) represents an information bit at point in time i and P[i] represents a parity bit at point in time i.

Therefore, when i % q=k at point in time i, the parity bit at point in time i in equation 45 and equation 46 can be achieved using an equation resulting from substituting k for g in equation 45 and equation 46.

Since the LDPC-CC according to the invention of the present application is a kind of convolutional code, securing belief in decoding of information bits requires termination or tail-biting. The present embodiment will consider a case where termination is performed (hereinafter "information-zero-termination" or simply "zero-termination").

Figure 16:
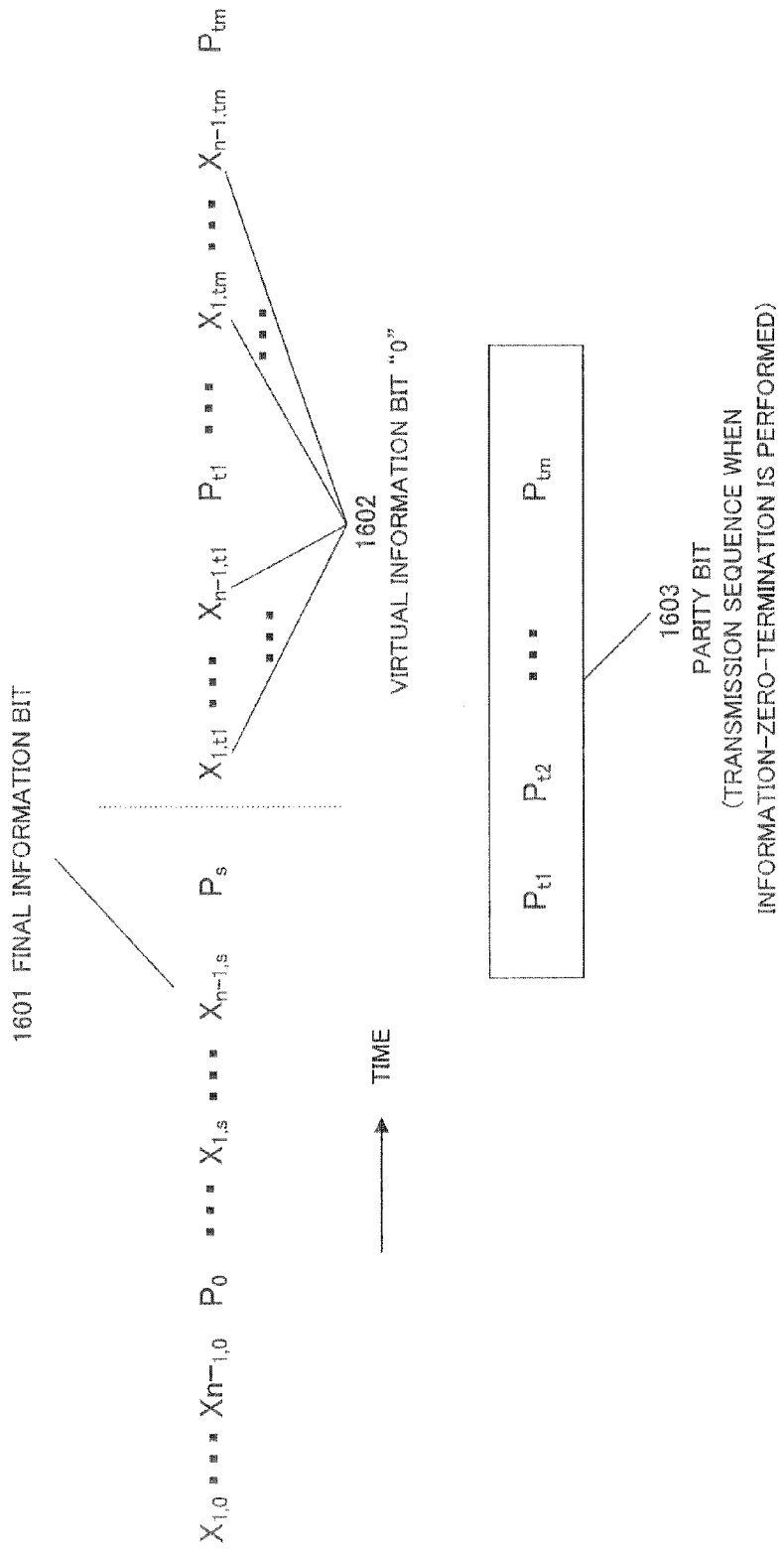
FIG. 16 shows a zero-termination method.

FIG. 16 is a diagram illustrating "information-zero-termination" in an LDPC-CC of a coding rate of (n−1)/n. It is assumed that information bits $X_1, X_2, \ldots, X_{n-1}$ and parity bit P at point in time i (i=0, 1, 2, 3, ..., s) are represented by $X_{1,i}, X_{2,i}, \ldots, X_{n-1,i}$, and parity bit $P_i$, respectively. As shown in FIG. 16, $X_{n-1,s}$ is assumed to be the final bit of the information to transmit.

If the encoder performs encoding only until point in time s and the transmitting apparatus on the encoding side performs transmission only up to $P_s$ to the receiving apparatus on the decoding side, receiving quality of information bits of the decoder considerably deteriorates. To solve this problem, encoding is performed assuming information bits from final information bit $X_{n-1,s}$ onward (hereinafter "virtual information bits") to be "0" and a parity bit (1603) is generated.

To be more specific, as shown in FIG. 16, the encoder performs encoding assuming $X_{1,k}, X_{2,k}, X_{n-1,k}$ (k=t1, t2, ..., tm) to be "0" and obtains $P_{t1}, P_{t2}, \ldots, P_{tm}$. After transmitting $X_{1,s}, X_{2,s}, X_{n-1,s}$, and $P_s$ at point in time s, the transmitting apparatus on the encoding side transmits $P_{t1}, P_{t2}, \ldots, P_{tm}$. The decoder performs decoding taking advantage of knowing that virtual information bits are "0"s from point in time s onward.

In termination such as "information-zero-termination," for example, LDPC-CC encoder 100 in FIG. 9 performs encoding assuming the initial state of the register is "0." As another interpretation, when encoding is performed from point in time i=0, if, for example, z is smaller than 0 in equation 46, encoding is performed assuming $X_1[z], X_2[z], \ldots, X_{n-1}[z]$, and P[z] to be "0."

Assuming a sub-matrix (vector) in equation 36 to be $H_g$, a g-th sub-matrix can be represented as the equation below.

$$H_g = \left\{ H'_g, \underbrace{1 1 \ldots 1}_{n} \right\} \quad \text{(Equation 47)}$$

Here, n continuous "1"s correspond to the terms of $X_1(D), X_2(D), \ldots X_{n-1}(D)$ and P(D) in equation 36.

Figure 17:
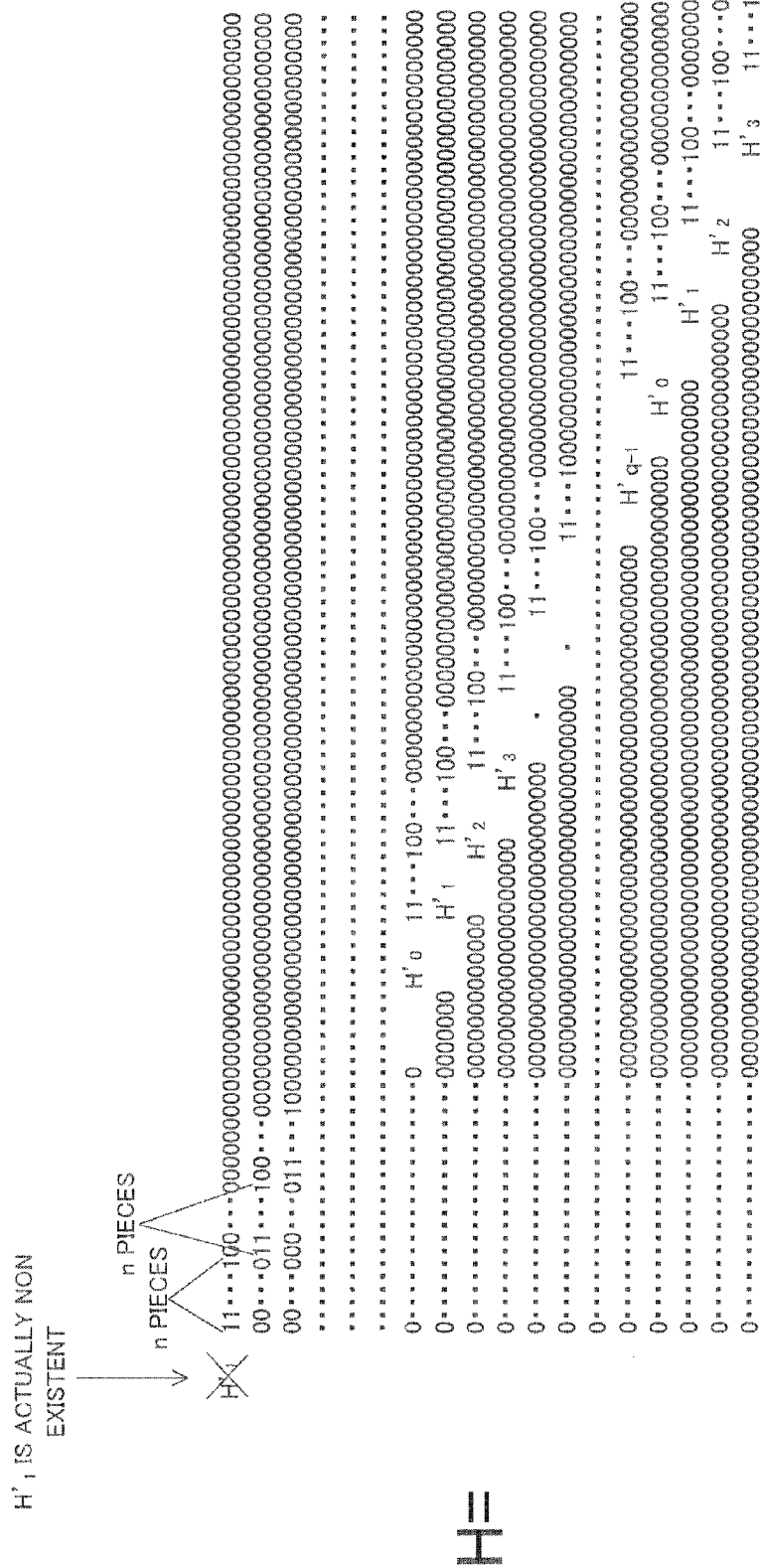
FIG. 17 shows an example of check matrix when zero-termination is performed.

Therefore, when termination is used, the LDPC-CC check matrix of a coding rate of (n−1)/n and a time varying period of q represented by equation 36 is represented as shown in FIG. 17. FIG. 17 has a configuration similar to that of FIG. 5. Embodiment 3 which will be described later will describe a detailed configuration of a tail-biting check matrix.

As shown in FIG. 17, a configuration is employed in which a sub-matrix is shifted n columns to the right between an i-th row and (i+1)-th row in parity check matrix H (see FIG. 17). However, an element to the left of the first column ($H'_1$ in the example of FIG. 17) is not reflected in the check matrix (see FIG. 5 and FIG. 17). When transmission vector u is assumed as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true.

As described above, the encoder receives information bits $X_r[i]$ (r=1, 2, ..., n−1) at point in time i as input, generates parity bit P[i] at point in time i using equation 46, outputs parity bit [i], and can thereby perform encoding of the LDPC-CC described in Embodiment 1.

(Embodiment 3)

The present embodiment will specifically describe a code configuration method for achieving higher error correction capability when simple tail-biting described in Non-Patent Literatures 10 and 11 is performed for an LDPC-CC based on the parity check polynomials described in Embodiment 1.

A case has been described in Embodiment 1 where a g-th (g=0, 1, ..., q−1) parity check polynomial of an LDPC-CC of a time varying period of q (q is a prime number greater than 3) and a coding rate of (n−1)/n is represented as shown in equation 36. The number of terms of each of $X_1(D), X_2(D), \ldots, X_{n-1}(D)$ and P(D) in equation 36 is 3 and in this case, Embodiment 1 has specifically described the code configuration method (constraint condition) for achieving high error correction capability. Moreover, Embodiment 1 has pointed out that even when the number of terms of one of $X_1(D), X_2(D), \ldots, X_{n-1}(D)$ and P(D) is 1 or 2, high error correction capability may be likely to be achieved.

Here, when the term of P(D) is assumed to be 1, the code is a feed forward convolutional code (LDPC-CC), and therefore tail-biting can be performed easily based on Non-Patent Literatures 10 and 11. The present embodiment will describe this aspect more specifically.

When the term of P(D) of g-th (g=0, 1, ..., q−1) parity check polynomial (36) of an LDPC-CC of a time varying period of q and a coding rate of (n−1)/n is 1, the g-th parity check polynomial is represented as shown in equation 48.

[48]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+P(D)=0 \quad \text{(Equation 48)}$$

According to the present embodiment, time varying period q is not limited to a prime number equal to or greater than 3. However, it is assumed that the constraint condition described in Embodiment 1 will be observed. However, it is assumed that the condition relating to the deleted terms of P(D) will be excluded.

From equation 48, P(D) is represented as shown below.
[49]

$$P(D)=(D^{a\#g,1,1}+D^{a\#g,1,2}+1)X_1(D)+(D^{a\#g,2,1}+D^{a\#g,2,2}+1)X_2(D)+\ldots\alpha(D^{a\#g,n-1,1}+D^{a\#g,n-1,2}+1)X_{n-1}(D) \quad \text{(Equation 49)}$$

When represented in the same way as equations 44-0 to 44-2, equation 49 is represented as follows:
[50]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus\ldots\oplus X_{n-1}[i]\oplus X_{n-1}[i-a_{\#g,n-1,1}]\oplus X_{n-1}[i-a_{\#g,n-1,2}] \quad \text{Equation 50}$$

where "$\oplus$" represents the exclusive OR.

Therefore, when i % q=k at point in time i, the parity bit at point in time i can be achieved in equation 49 and equation 50 using an equation resulting from substituting k for g in equation 49 and equation 50. However, details of operation when performing tail-biting will be described later.

Next, the configuration and block size of the check matrix when performing tail-biting on the LDPC-CC of a time varying period of q and a coding rate of (n−1)/n defined in equation 49 will be described in detail.

Non-Patent Literature 12 describes a general equation of a parity check matrix when performing tail-biting on a time-varying LDPC-CC. Equation 51 is a parity check matrix when performing tail-biting described in Non-Patent Literature 12.

$$H^T = \begin{bmatrix} H_0^T(0) & H_1^T(1) & \ldots & H_{Ms}^T(Ms) & 0 & \ldots & 0 \\ 0 & H_0^T(1) & \ldots & H_{Ms-1}^T(Ms) & H_{Ms}^T(Ms+1) & 0 & \ldots & 0 \\ & & \ddots & & \ddots & \ddots & \\ H_{Ms}^T(N) & 0 & \ldots & & H_{Ms-2}^T(N-2) & H_{Ms-1}^T(N-1) \\ H_{Ms-1}^T(N) & H_{Ms}^T(N+1) & 0 & & H_{Ms-3}^T(N-2) & H_{Ms-2}^T(N-1) \\ \vdots & & & \ldots & \vdots & \vdots \\ H_1^T(N) & H_2^T(N+1) & \ldots & 0 & \ldots & 0 & H_0^T(N-1) \end{bmatrix} \quad \text{(Equation 51)}$$

In equation 51, H represents a parity check matrix and $H^T$ represents a syndrome former. Furthermore, $H^T_i(t)$ (i=0, 1, ..., $M_s$) represents a sub-matrix of c·(c−b) and $M_s$ represents a memory size.

However, Non-Patent Literature 12 does not show any specific code of the parity check matrix nor does it describe any code configuration method (constraint condition) for achieving high error correction capability.

Hereinafter, the code configuration method (constraint condition) will be described in detail for achieving high error correction capability even when performing tail-biting on an LDPC-CC of a time varying period of q and a coding rate of (n−1)/n defined in equation 49.

To achieve high error correction capability in an LDPC-CC of a time varying period of q and a coding rate of (n−1)/n defined in equation 49, the following condition becomes important in parity check matrix H considered necessary in decoding.

<Condition #16>

The number of rows of the parity check matrix is a multiple of q.

Therefore, the number of columns of the parity check matrix is a multiple of n×q. That is, (e.g.) a log likelihood ratio required in decoding corresponds to bits of a multiple of n×q.

However, the parity check polynomial of an LDPC-CC of a time varying period of q and a coding rate of (n−1)/n required in above <condition #16> is not limited to equation 48, but may be a parity check polynomial such as equation 36 or equation 38. Furthermore, the number of terms of each of $X_1(D), X_2(D), \ldots, X_{n-1}(D)$ and P(D) in equation 38 is 3, but the number of terms is not limited to 3. Furthermore, the time varying period of q may be any value equal to or greater than 2.

Here, <condition #16> will be discussed.

When information bits $X_1, X_2, \ldots, X_{n-1}$, and parity bit P at point in time i are represented by $X_{1,i}, X_{2,i}, \ldots, X_{n-1,i}$, and $P_i$ respectively, tail-biting is performed as i=1, 2, 3, ..., q, ..., q×(N−1)+1, q×(N−1)+2, q×(N−1)+3, ..., q×N to satisfy <condition #16>.

At this time, transmission sequence u becomes $u=(X_{1,1}, X_{2,1}, \ldots, X_{n-1,1}, P_0, X_{1,2}, X_{2,2}, \ldots, X_{n-1,2}, P_2, \ldots, X_{1,k}, X_{2,k}, \ldots, X_{n-1,k}, P_k, \ldots, X_{1,q\times N}, X_{2,q\times N}, \ldots, X_{n-1,q\times N}, P_{q\times N})^T$ and Hu=0 holds true. The configuration of the parity check matrix at this time will be described using FIG. 18A and FIG. 18B.

Assuming the sub-matrix (vector) of equation 48 to be $H_g$, the g-th sub-matrix can be represented as shown in the equation below.

$$H_g = \left\{ H'_g, \underbrace{1 1 \ldots 1}_{n} \right\}$$ (Equation 52)

Here, n continuous "1"s correspond to the terms of $X_1(D)$, $X_2(D), \ldots, X_{n-1}(D)$ and $P(D)$ in equation 48.

Figure 18A:
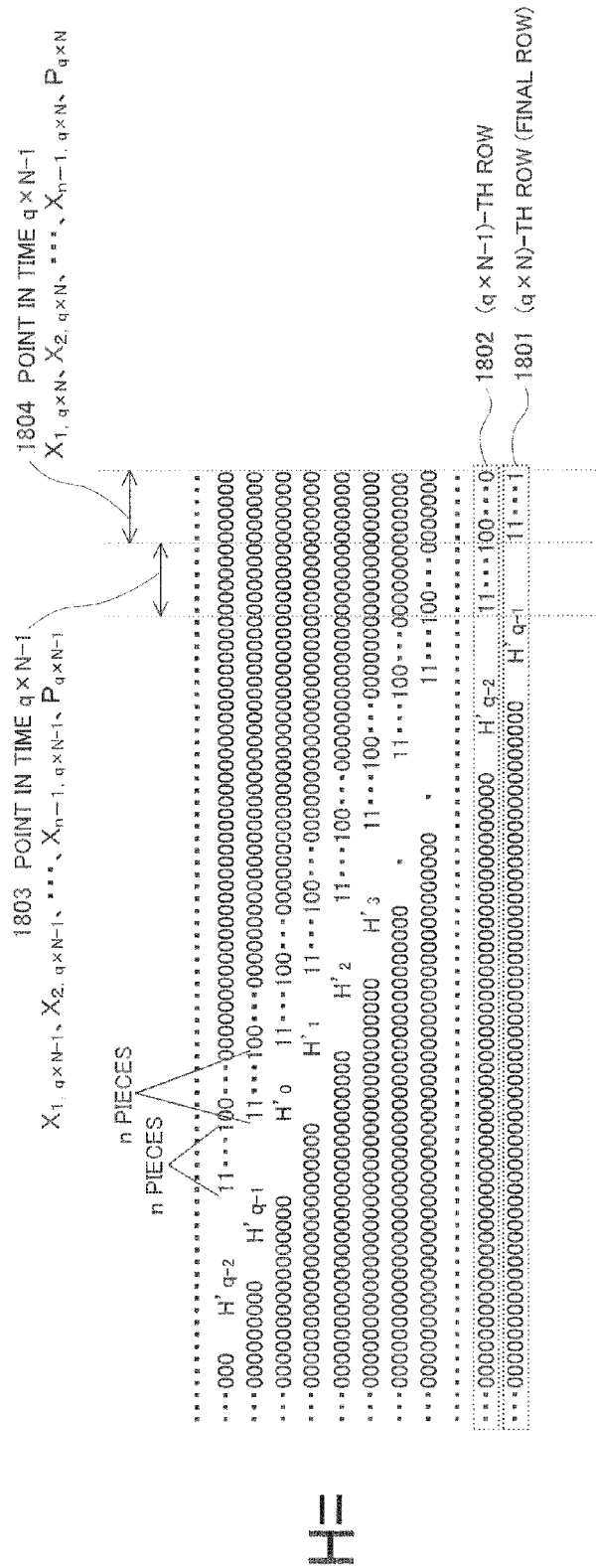
FIG. 18A shows an example of check matrix when tail-biting is performed.

Of the parity check matrix corresponding to transmission sequence u defined above, FIG. 18A shows the parity check matrix in the vicinity of point in time q×N−1 (1803) and point in time q×N (1804). As shown in FIG. 18A, a configuration is employed in which a sub-matrix is shifted n columns to the right between an i-th row and (i+1)-th row in parity check matrix H (see FIG. 18A).

In FIG. 18A, row 1801 shows a (q×N)-th row (last row) of the parity check matrix. When <condition #16> is satisfied, row 1801 corresponds to a (q−1)-th parity check polynomial. Furthermore, row 1802 shows a (q×N−1)-th row of the parity check matrix. When <condition #16> is satisfied, row 1802 corresponds to a (q−2)-th parity check polynomial.

Furthermore, column group 1804 represents a column group corresponding to point in time q×N. In column group 1804, a transmission sequence is arranged in order of $X_{1,q \times N}$, $X_{2,q \times N}, \ldots, X_{n-1,q \times N}$, and $P_{q \times N}$. Column group 1803 represents a column group corresponding to point in time q×N−1. In column group 1803, a transmission sequence is arranged in order of $X_{1,q \times N-1}, X_{2,q \times N-1}, \ldots, X_{n-1,q \times N-1}$ and $P_{q \times N-1}$.

Next, the order of the transmission sequence is changed to u=( . . . , $X_{1,q \times N-1}, X_{2,q \times N-1}, \ldots, X_{n-1,q \times N-1}, P_{q \times N-1}, X_{1,q \times N}$, $X_{2,q \times N}, \ldots, X_{n-1,q \times N}, P_{q \times N}, X_{1,0}, X_{2,1}, \ldots, X_{n-1,1}, P_1, X_{1,2}$, $X_{2,2}, \ldots, X_{n-1,2}, P_2 \ldots$ $)^T$. Of the parity check matrix corresponding to transmission sequence u, FIG. 18B shows the parity check matrix in the vicinity of point in time q×N−1 (1803), point in time q×N (1804), point in time 1 (1807) and point in time 2 (1808).

Figure 18B:
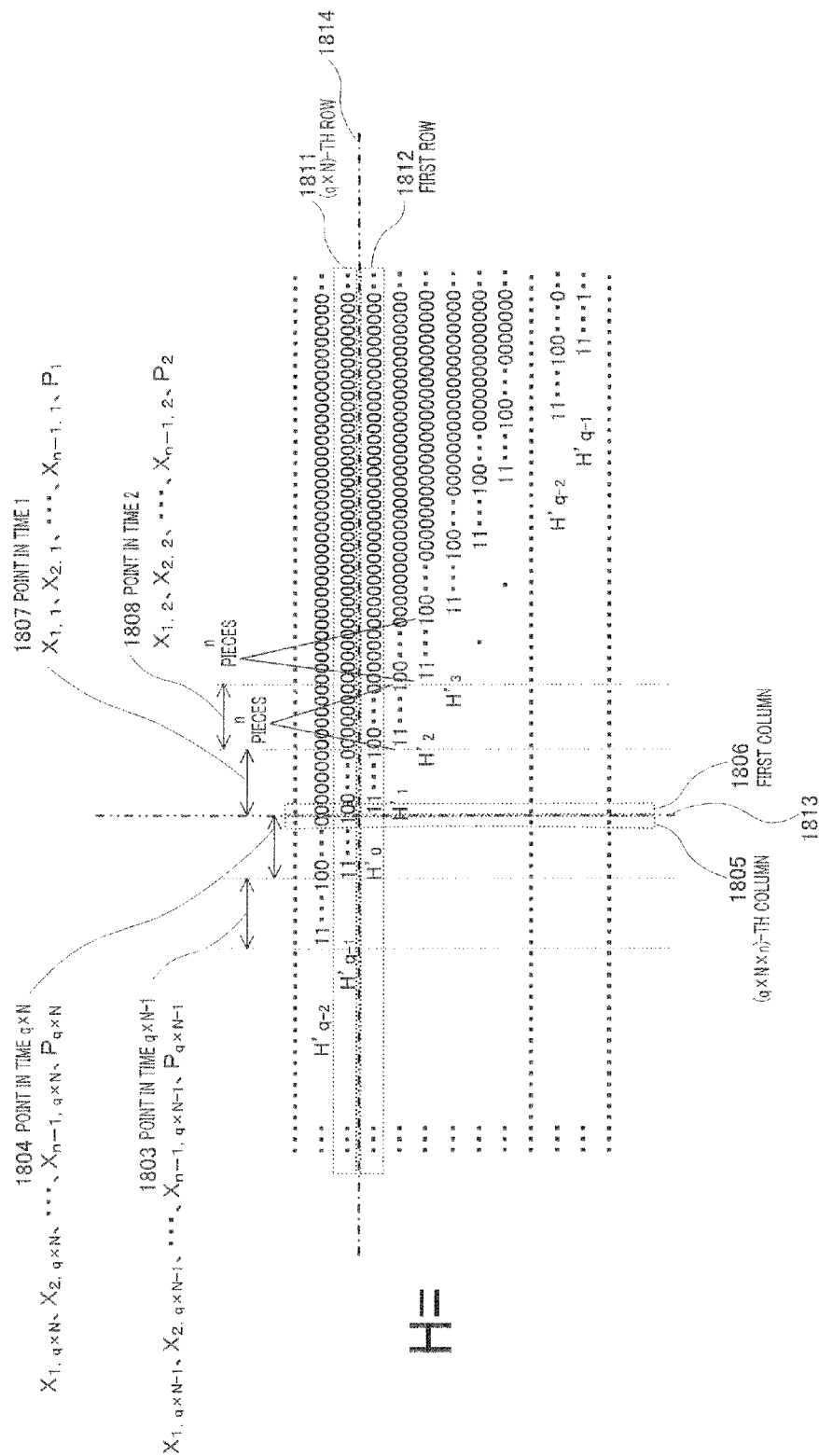
FIG. 18B shows an example of check matrix when tail-biting is performed.

As shown in FIG. 18B, a configuration is employed in which a sub-matrix is shifted n columns to the right between an i-th row and (i+1)-th row in parity check matrix H. Furthermore, as shown in FIG. 18A, when the parity check matrix in the vicinity of point in time q×N−1 (1803) and point in time q×N (1804), column 1805 is a column corresponding to a (q×N×n)-th column and column 1806 is a column corresponding to a first column.

Column group 1803 represents a column group corresponding to point in time q×N−1 and column group 1803 is arranged in order of $X_{1,q \times N-1}, X_{2,q \times N-1}, \ldots, X_{n-1,q \times N-1}$, and $P_{q \times N-1}$. Column group 1804 represents a column group corresponding to point in time q×N and column group 1804 is arranged in order of $X_{1,q \times N}, X_{2,q \times N}, \ldots, X_{n-1,q \times N}$, and $P_{q \times N}$. Column group 1807 represents a column group corresponding to point in time 1 and column group 1807 is arranged in order of $X_{1,1}, X_{2,1}, \ldots, X_{n-1,1}$, and $P_1$. Column group 1808 represents a column group corresponding to point in time 2 and column group 1808 is arranged in order of $X_{1,2}$, $X_{2,2}, \ldots, X_{n-1,2}$, and $P_2$.

When the parity check matrix in the vicinity of point in time q×N−1 (1803) or point in time q×N (1804) is represented as shown in FIG. 18A, row 1811 is a row corresponding to a (q×N)-th row and row 1812 is a row corresponding to a first row.

At this time, a portion of the parity check matrix shown in FIG. 18B, that is, the portion to the left of column boundary 1813 and below row boundary 1814 constitutes a characteristic portion when tail-biting is performed. It is clear that this characteristic portion has a configuration similar to that of equation 51.

When the parity check matrix satisfies <condition #16>, if the parity check matrix is represented as shown in FIG. 18A, the parity check matrix starts from a row corresponding to the 0-th parity check polynomial that satisfies 0 and ends at a row corresponding to the (q−1)-th parity check polynomial that satisfies 0. This is important in achieving higher error correction capability.

The time-varying LDPC-CC described in Embodiment 1 is such a code that the number of short cycles (cycles of length) in a Tanner graph is reduced. Embodiment 1 has shown the condition to generate such a code that the number of short cycles in a Tanner graph is reduced. Here, when tail-biting is performed, it is important that the number of rows of the parity check matrix be a multiple of q (<condition #16>) to reduce the number of short cycles in a Tanner graph. In this case, if the number of rows of the parity check matrix is a multiple of q, all parity check polynomials of a time varying period of q are used. Thus, as described in Embodiment 1, by adopting a code in which the number of short cycles in a Tanner graph is reduced for the parity check polynomial, it is possible to reduce the number of short cycles in a Tanner graph also when performing tail-biting. Thus, <condition #16> is an important requirement in reducing the number of short cycles in a Tanner graph also when performing tail-biting.

However, the communication system may require some contrivance to satisfy <condition #16> for a block length (or information length) required in the communication system when performing tail-biting. This will be described by taking an example.

Figure 19:
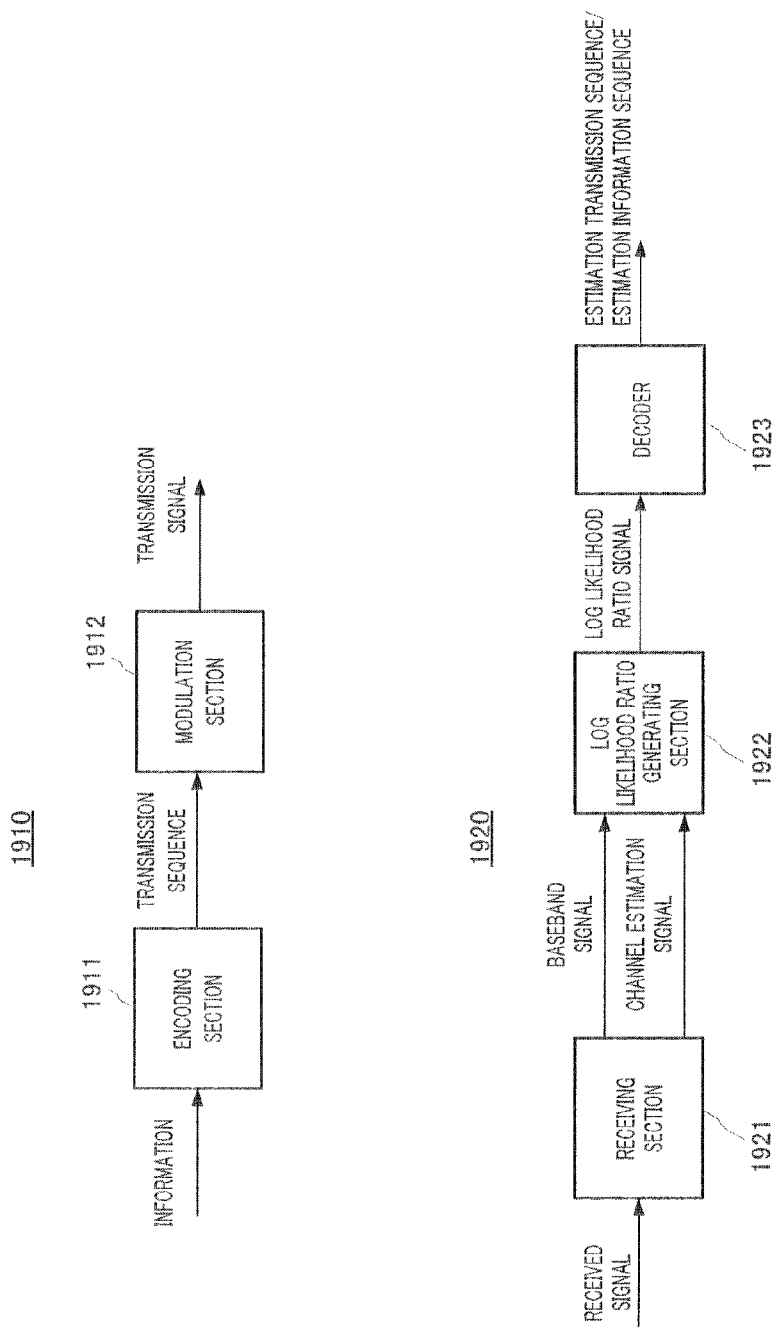
FIG. 19 shows an overview of a communication system.

FIG. 19 is a schematic diagram of the communication system. The communication system in FIG. 19 has transmitting apparatus 1910 on the encoding side and receiving apparatus 1920 on the decoding side.

Encoder 1911 receives information as input, performs encoding, and generates and outputs a transmission sequence. Modulation section 1912 receives a transmission sequences as input, performs predetermined processing such as mapping, quadrature modulation, frequency conversion and amplification, and outputs a transmission signal. The transmission signal arrives at receiving section 1921 of receiving apparatus 1920 via a communication medium (radio, power line, light or the like).

Receiving section 1921 receives a received signal as input, performs processing such as amplification, frequency conversion, quadrature demodulation, channel estimation and demapping and outputs a baseband signal and a channel estimation signal.

Log likelihood ratio generating section 1922 receives the baseband signal and the channel estimation signal as input, generates a log likelihood ratio in bit units and outputs a log likelihood ratio signal.

Decoder 1923 receives the log likelihood ratio signal as input, performs iterative decoding using BP decoding in particular here and outputs an estimation transmission sequence and/or an estimation information sequence.

For example, consider an LDPC-CC of a coding rate 1/2 and a time varying period of 11. Assuming that tail-biting is performed at this time, the set information length is designated 16384. The information bits are designated $X_{1,1}, X_{1,2}$, $X_{1,3}, \ldots, X_{1,16384}$. If parity bits are determined without any contrivance, $P_1, P_2, P_3, \ldots, P_{16384}$ are determined.

However, even when a parity check matrix is created for transmission sequence u=($X_{1,1}, P_1, X_{1,2}, P_2, \ldots X_{1,16384}$, $P_{16384}$), <condition #16> is not satisfied. Therefore, $X_{1,16385}$, $X_{1,16386}$, $X_{1,16387}$, $X_{1,16388}$ and $X_{1,16389}$ may be added as the transmission sequence so that encoder 1911 determines $P_{16385}$, $P_{16386}$, $P_{16387}$, $P_{16388}$ and $P_{16389}$.

At this time, encoder 1911 sets, for example, $X_{1,16385}=0$, $X_{1,16386}=0$, $X_{1,16387}=0$, $X_{1,16388}=0$ and $X_{1,16389}=0$, performs encoding and determines $P_{16385}$, $P_{16386}$, $P_{16387}$, $P_{16388}$ and $P_{16389}$. However, if a promise that $X_{1,16385}=0$, $X_{1,16386}=0$, $X_{1,16387}=0$, $X_{1,16388}=0$ and $X_{1,16389}=0$ are set is shared between encoder 1911 and decoder 1923, $X_{1,16385}$, $X_{1,16386}$, $X_{1,16387}$, $X_{1,16388}$ and $X_{1,16389}$ need not be transmitted.

Therefore, encoder 1911 receives information sequence= $(X_{1,1}, X_{1,2}, X_{1,3}, \ldots, X_{1,16384}, X_{1,16385}, X_{1,16386}, X_{1,16387}, X_{1,16388}, X_{1,16389})=(X_{1,1}, X_{1,2}, X_{1,3}, \ldots, X_{1,16384}, 0, 0, 0, 0, 0)$ as input and obtains sequence $(X_{1,1}, P_1, X_{1,2}, P_2, \ldots X_{1,16384}, P_{16384}, X_{1,16385}, P_{16385}, X_{1,16386}, P_{16386}, X_{1,16387}, P_{16387}, X_{1,16388}, P_{16388}, X_{1,16389}, P_{16389})=(X_{1,1}, P_1, X_{1,2}, P_2, \ldots, X_{1,16384}, P_{16384}, 0, P_{16385}, 0, P_{16386}, 0, P_{16387}, 0, P_{16388}, 0, P_{16389})$ Transmitting apparatus 1910 then deletes "0"s known between encoder 1911 and decoder 1923, and transmits $(X_{1,1}, P_1, X_{1,2}, P_2, \ldots, X_{1,16384}, P_{16384}, P_{16385}, P_{16386}, P_{16387}, P_{16388}, P_{16389})$ as a transmission sequence.

Receiving apparatus 1920 obtains, for example, log likelihood ratios for each transmission sequence as $LLR(X_{1,1})$, $LLR(P_1)$, $LLR(X_{1,2})$, $LLR(P_2)$, ... $LLR(X_{1,16384})$, $LLR(P_{16384})$, $LLR(P_{16385})$, $LLR(P_{16386})$, $LLR(P_{16387})$, $LLR(P_{16388})$ and $LLR(P_{16389})$.

Receiving apparatus 1920 then generates log likelihood ratios $LLR(X_{1,16385})=LLR(0)$, $LLR(X_{1,16386})=LLR(0)$, $LLR(X_{1,16387})=LLR(0)$, $LLR(X_{1,16388})=LLR(0)$ and $LLR(X_{1,16389})=LLR(0)$ of $X_{1,16385}$, $X_{1,16386}$, $X_{1,16387}$, $X_{1,16388}$ and $X_{1,16389}$ of values of "0"s not transmitted from transmitting apparatus 1910. Receiving apparatus 1920 obtains $LLR(X_{1,1})$, $LLR(P_1)$, $LLR(X_{1,2})$, $LLR(P_2)$, ... $LLR(X_{1,16384})$, $LLR(P_{16384})$, $LLR(X_{1,16385})=LLR(0)$, $LLR(P_{16385})$, $LLR(X_{1,16386})=LLR(0)$, $LLR(P_{16386})$, $LLR(X_{1,16387})=LLR(0)$, $LLR(P_{16387})$, $LLR(X_{1,16388})=LLR(0)$, $LLR(P_{16388})$, and $LLR(X_{1,16389})=LLR(0)$, $LLR(P_{16389})$, and thereby performs decoding using these log likelihood ratios and the parity check matrix of 16389×32778 of an LDPC-CC of a coding rate of 1/2 and a time varying period of 11, and thereby obtains an estimation transmission sequence and/or estimation information sequence. As the decoding method, belief propagation such as BP (belief propagation) decoding, min-sum decoding which is an approximation of BP decoding, offset BP decoding, normalized BP decoding, shuffled BP decoding can be used as shown in Non-Patent Literature 4, Non-Patent Literature 5 and Non-Patent Literature 6.

As is clear from this example, when tail-biting is performed in an LDPC-CC of a coding rate of (n−1)/n and a time varying period of q, receiving apparatus 1920 performs decoding using such a parity check matrix that satisfies <condition #16>. Therefore, this means that decoder 1923 possesses a parity check matrix of (rows)×(columns)=(q×M)×(q×n×M) as the parity check matrix (M is a natural number).

In encoder 1911 corresponding to this, the number of information bits necessary for encoding is q×(n−1)×M. Using these information bits, q×M parity bits are obtained.

At this time, if the number of information bits inputted to encoder 1911 is smaller than q×(n−1)×M, bits (e.g. "0"s (may also be "1"s)) known between transmitting and receiving apparatuses (encoder 1911 and decoder 1923) are inserted so that the number of information bits is q×(n−1)×M in encoder 1911. Encoder 1911 then obtains q×M parity bits. At this time, transmitting apparatus 1910 transmits information bits excluding the inserted known bits and the parity bits obtained.

Here, known bits may be transmitted and q×(n−1)×M information bits and q×M parity bits may always be transmitted, which, however, would cause the transmission rate to deteriorate by an amount corresponding to the known bits transmitted.

Next, an encoding method will be described in an LDPC-CC of a coding rate of (n−1)/n and a time varying period of q defined by the parity check polynomial of equation 48 when tail-biting is performed. The LDPC-CC of a coding rate of (n−1)/n and a time varying period of q defined by the parity check polynomial of equation 48 is a kind of feed forward convolutional code. Therefore, the tail-biting described in Non-Patent Literature 10 and Non-Patent Literature 11 can be performed. Hereinafter, an overview of a procedure for the encoding method when performing tail-biting described in Non-Patent Literature 10 and Non-Patent Literature 11 will be described.

The procedure is as shown below.

<Procedure 1>

For example, when encoder 1911 adopts a configuration similar to that in FIG. 9, the initial value of each register (reference numerals are omitted) is assumed to be "0." That is, in equation 50, assuming g=k when (i−1) % q=k at point in time i (i=1, 2, ... ), the parity bit at point in time i is determined. When z in $X_1[z]$, $X_2[z]$, ..., $X_{n-1}[z]$, and P[z] in equation 50 is less than 1, encoding is performed assuming these values are "0"s. Encoder 1911 then determines up to the last parity bit. The state of each register of encoder 1911 at this time is stored.

<Procedure 2>

In procedure 1, encoding is performed again to determine parity bits from point in time i=1 from the state of each register stored in encoder 1911 (therefore, the values obtained in <procedure 1> are used when z in $X_1[z]$, $X_2[z]$, ..., $X_{n-1}[z]$, and P[z] in equation 50 is smaller than 1).

The parity bit and information bits obtained at this time constitute an encoded sequence when tail-biting is performed.

The present embodiment has described an LDPC-CC of a time varying period of q and a coding rate of (n−1)/n defined by equation 48 as an example. In equation 48, the number of terms of $X_1(D)$, $X_2(D)$, ... and $X_{n-1}(D)$ is 3. However, the number of terms is not limited to 3, but high error correction capability may also be likely to be achieved even when the number of terms of one of $X_1(D)$, $X_2(D)$, ... and $X_{n-1}(D)$ in equation 48 is 1 or 2. For example, the following method is available as the method of setting the number of terms of $X_1(D)$ to 1 or 2. In the case of a time varying period of q, there are q parity check polynomials that satisfy 0, and the number of terms of $X_1(D)$ is set to 1 or 2 for all the q parity check polynomials that satisfy 0. Alternatively, instead of setting the number of terms of $X_1(D)$ to 1 or 2 for all the q parity check polynomials that satisfy 0, the number of terms of $X_1(D)$ may be set to 1 or 2 for any number (equal to or less than q−1) of parity check polynomials that satisfy 0. The same applies to $X_2(D)$, ... and $X_{n-1}(D)$ as well. In this case, satisfying the condition described in Embodiment 1 constitutes an important condition in achieving high error correction capability. However, the condition relating to the deleted terms is unnecessary.

Furthermore, even when the number of terms of one of $X_1(D)$, $X_2(D)$, ... and $X_{n-1}(D)$ is 4 or more, high error correction capability may be likely to be achieved. For example, the following method is available as the method of setting the number of terms of $X_1(D)$ to 4 or more. In the case of a time varying period of q, there are q parity check polynomials that satisfy 0, and the number of terms of $X_1(D)$ is set to 4 or more for all the q parity check polynomials that satisfy 0. Alternatively, instead of setting the number of terms of $X_1(D)$ to 4 or more for all the q parity check polynomials that satisfy 0, the number of terms of $X_1(D)$ may be set to 4 or more for any number (equal to or less than q−1) of parity check polynomials that satisfy 0. The same applies to $X_2(D), \ldots$ and $X_{n-1}(D)$ as well. At this time, the above-described condition is excluded for the added terms.

Furthermore, tail-biting according to the present embodiment can also be performed on a code for which a g-th (g=0, 1, . . . , q−1) parity check polynomial of an LDPC-CC of a time varying period of q and a coding rate of (n−1)/n is represented as shown in equation 53.
[53]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+ \ldots +(D^{a\#g,n-1,1}+D^{a\#g,n-1,2}+D^{a\#g,n-1,3})X_{n-1}(D)+P(D)=0 \qquad \text{(Equation 53)}$$

However, it is assumed that the constraint condition described in Embodiment 1 is observed. However, the condition relating to the deleted terms in P(D) will be excluded.

From equation 53, P(D) is represented as shown below.
[54]

$$P(D)=(D^{a\#g,1,1}+D^{a\#g,1,2}+D^{\#g,1,3})X_1(D)+(D^{a\#g,2,1}+D^{a\#g,2,2}+D^{a\#g,2,3})X_2(D)+ \ldots +(D^{a\#g,n-1,1}+D^{a\#g,n-1,2}+D^{a\#g,n-1,3})X_{n-1}(D) \qquad \text{(Equation 54)}$$

When represented in the same way as equations 44-0 to 44-2, equation 54 is represented as shown below.
[55]

$$P[i]=X_1[i-a_{\#g,1,1}]\oplus X_1[i-a_{\#g,1,3}]\oplus X_2[i-a\#_{\#g,2,1}]\oplus X_2[i-a_{\#g,2,2}]\oplus X_2[i-a_{\#g,2,3}]\oplus \ldots \oplus X_{n-1}[i-a_{\#g,n-1,1}]\oplus X_{n-1}[i-a_{\#g,n-1,2}]\oplus X_{n-1}[i-a_{\#g,n-1,3}] \qquad \text{(Equation 55)}$$

where the symbol "$\oplus$" represents the exclusive OR.

High error correction capability may be likely to be achieved even when the number of terms of one of $X_1(D)$, $X_2(D), \ldots$ and $X_{n-1}(D)$ in equation 53 is 1 or 2. For example, the following method is available as the method of setting the number of terms of $X_1(D)$ to 1 or 2. In the case of a time varying period of q, there are q parity check polynomials that satisfy 0, and the number of terms of $X_1(D)$ is set to 1 or 2 for all the q parity check polynomials that satisfy 0. Alternatively, instead of setting the number of terms of $X_1(D)$ to 1 or 2 for all the q parity check polynomials that satisfy 0, the number of terms of $X_1(D)$ may be set to 1 or 2 for any number (equal to or less than q−1) of parity check polynomials that satisfy 0. The same applies to $X_2(D), \ldots$ and $X_{n-1}(D)$ as well. In this case, satisfying the condition described in Embodiment 1 constitutes an important condition in achieving high error correction capability. However, the condition relating to the deleted terms is unnecessary.

Furthermore, high error correction capability may also be likely to be achieved even when the number of terms of one of $X_1(D), X_2(D), \ldots$ and $X_{n-1}(D)$ is 4 or more, For example, the following method is available as the method of setting the number of terms of $X_1(D)$ to 4 or more. In the case of a time varying period of q, there are q parity check polynomials that satisfy 0 and the number of terms of $X_1(D)$ is set to 4 or more for all the q parity check polynomials that satisfy 0. Alternatively, instead of setting the number of terms of $X_1(D)$ to 4 or more for all the q parity check polynomials that satisfy 0, the number of terms of $X_1(D)$ may be set to 4 or more for any number (equal to or less than q−1) of parity check polynomials that satisfy 0. The same applies to $X_2(D), \ldots$ and $X_{n-1}(D)$. At this time, the above-described condition is excluded for the added terms. Furthermore, the encoded sequence when tail-biting is performed can be achieved using the above-described procedure also for the LDPC-CC defined in equation 53.

As described above, encoder 1911 and decoder 1923 use the parity check matrix of the LDPC-CC described in Embodiment 1 whose number of rows is a multiple of time varying period q, and can thereby achieve high error correction capability even when simple tail-biting is performed.

(Embodiment 4)

The present embodiment will describe a time-varying LDPC-CC of a coding rate of R=(n−1)/n based on a parity check polynomial again. Information bits of $X_1, X_2, \ldots$ and $X_{n-1}$ and parity hit P at point in time j are represented by $X_{1,j}$, $X_{2,j}, \ldots, X_{n-1,j}$, and $P_j$, respectively. Vector $u_j$ at point in time j is represented by $u_j=(X_{1,j}, X_{2,j}, \ldots, X_{n-1,j}, P_j)$. Furthermore, the encoded sequence is represented by $u=(u_0, u_1, \ldots, u_j, \ldots)^T$. Assuming D to be a delay operator, the polynomial of information bits $X_1, X_2, \ldots, X_{n-1}$ is represented by $X_1(D)$, $X_2(D), \ldots, X_{n-1}(D)$ and the polynomial of parity bit P is represented by P(D). At this time, consider a parity check polynomial that satisfies 0 represented as shown in equation 56.

(Equation 56)

$$(D^{a1,1}+D^{a1,2}+\ldots+D^{a1,r1}+1)X_1(D)+ \\ (D^{a2,1}+D^{a2,2}+\ldots+D^{a2,r2}+1)X_2(D)+\ldots+ \\ (D^{an-1,1}+D^{an-1,2}+\ldots+D^{an-1,r_{n-1}}+1)X_{n-1}(D)+ \\ (D^{b1}+D^{b2}+\ldots+B^{\varepsilon}+1)P(D)=0 \qquad [56]$$

equation 56, it is assumed that $a_{p,q}$ (p=1, 2, . . . , n−1; q=1, 2, . . . , $r_p$) and $b_s$ (s=1, 2, . . . , ϵ) are natural numbers. Furthermore, $a_{p,y}\neq a_{p,z}$ is satisfied for $\forall(y, z)$ of y, z=1, 2, . . . , $r_p$, y≠z. Furthermore, $b_y\neq b_z$ is satisfied for $\forall(y, z)$ of y, z=1, 2, . . . , ϵ, y≠z. Here, $\forall$ is a universal quantifier.

To create an LDPC-CC of a coding rate of R=(n−1)/n and a time varying period of in, a parity check polynomial based on equation 56 is provided. At this time, an i-th (i=0, 1, . . . , m−1) parity check polynomial is represented as shown in equation 57.
[57]

$$A_{X1,i}(D)X_1(D)+A_{X2,i}(D)X_2(D)+\ldots+A_{Xn-1,i}(D)X_{n-1}(D)+B_i(D)P(D)=0 \qquad \text{(Equation 57)}$$

In equation 57, maximum orders of D's of $A_{X\delta,i}(D)$ (δ=1, 2, . . . , n−1) and $B_i(D)$ are represented by $\Gamma_{X\delta,i}$ and $\Gamma_{P,i}$, respectively. A maximum value of $\Gamma_{X\delta,i}$ and $\Gamma_{P,i}$ is assumed to be $\Gamma_i$. A maximum value of $\Gamma_i$ (i=0, 1, . . . , m−1) is assumed to be $\Gamma$. When encoded sequence u is taken into consideration, using $\Gamma$, vector $h_i$ corresponding to an i-th parity check matrix is represented as shown in equation 58.
[58]

$$h_i=[h_{i,\Gamma}, h_{i,\Gamma-1}, \ldots, h_{i,1}, h_{i,0}] \qquad \text{(Equation 58)}$$

In equation 58, $h_{i,v}$ (v=0, 1, . . . , $\Gamma$) is a vector of 1×n and represented as shown in equation 59.
[59]

$$h_{i,v}=[\alpha_{iv,X1}, \alpha_{i,v,X2}, \ldots, \alpha_{i,v,Xn-1}, \beta_{i,v}] \qquad \text{(Equation 59)}$$

This is because the parity check polynomial of equation 57 has $\alpha_{i,v,Xw}D^vX_w(D)$ and $\beta_{i,v}D^vP(D)$ (w=1, 2, . . . , n−1, and $\alpha_{i,v,Xw}, \beta_{i,v} \subset [0, 1]$). At this time, the parity check polynomial that satisfies 0 of equation 57 has $D^0X_1(D), D^0X_2(D), \ldots, D^0X_{n-1}(D)$ and $D^0P(D)$, and therefore satisfies equation 60.

(Equation 60)

$$h_{i,0} = [\underbrace{1 \ldots 1}_{n}] \quad [60]$$

In equation 60, $\Lambda(k)=\Lambda(k+m)$ is satisfied for $\forall k$, where $\Lambda(k)$ corresponds to $h_i$ on a k-th row of the parity check matrix.

Using equation 58, equation 59 and equation 60, an LDPC-CC check matrix based on the parity check polynomial of a coding rate of $R=(n-1)/n$ and a time varying period of m is represented as shown in equation 61.

(Equation 61)

$$H = \begin{bmatrix} \ddots & & & & & & & \ddots & & & & \\ & h_{0,\Gamma} & h_{0,\Gamma-1} & \ldots & \ldots & \ldots & \ldots & \ldots & h_{0,0} & & & \\ & & h_{1,\Gamma} & \ldots & \ldots & \ldots & \ldots & \ldots & h_{1,1} & h_{1,0} & & \\ & & & \ddots & & & & & & & \ddots & \\ & & & h_{m-1,\Gamma} & h_{m-1,\Gamma-1} & \ldots & \ldots & \ldots & \ldots & \ldots & h_{m-1,0} & \\ & & & & h_{0,\Gamma} & \ldots & \ldots & \ldots & \ldots & \ldots & h_{0,1} & h_{0,0} \\ & & & & & \ddots & & & & & & \ddots \\ & & & & & h_{m-1,\Gamma} & \ldots & \ldots & \ldots & \ldots & \ldots & \ldots & h_{m-1,0} \\ & & & & & & \ddots & & & & & & \ddots \end{bmatrix} \quad [61]$$

(Embodiment 5)

The present embodiment will describe a case where the time-varying LDPC-CC described in Embodiment 1 is applied to an erasure correction scheme. However, the time varying period of the LDPC-CC may also be a time varying period of 2, 3 or 4.

Figure 20:
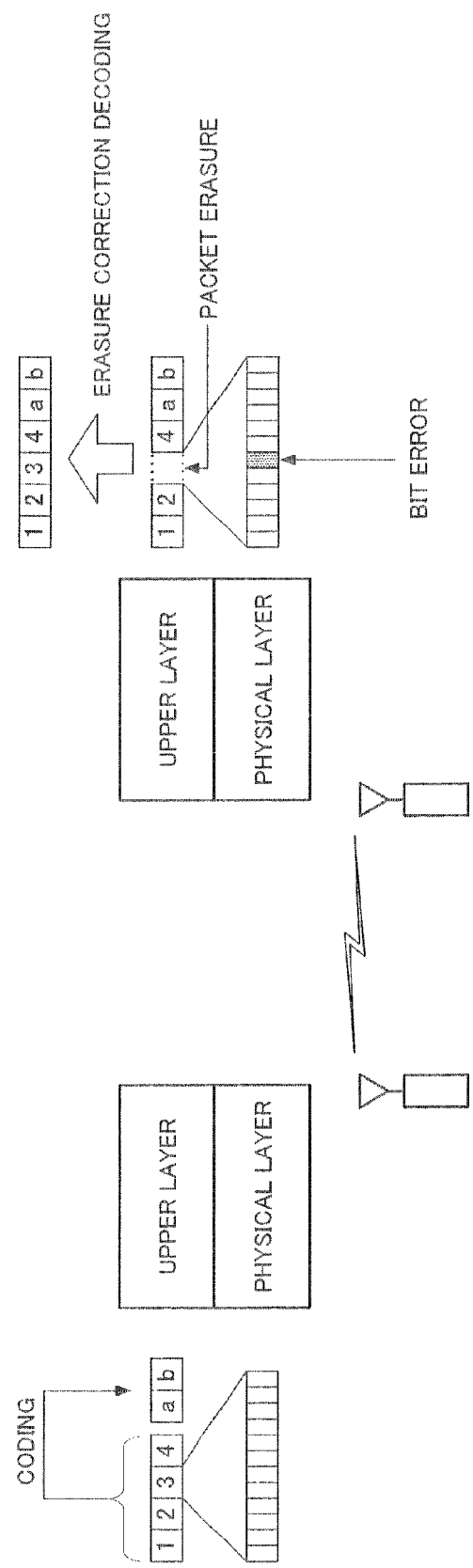
FIG. 20 is a conceptual diagram of a communication system using erasure correction coding using an LDPC code.

For example, FIG. 20 shows a conceptual diagram of a communication system using erasure correction coding using an LDPC code. In FIG. 20, a communication apparatus on the encoding side performs LDPC encoding on information packets 1 to 4 to transmit and generates parity packets a and b. A upper layer processing section outputs an encoded packet which is a parity packet added to an information packet to a lower layer (physical layer (PINY) in the example of FIG. 20) and a physical layer processing section of the lower layer transforms the encoded packet into one that can be transmitted through a communication channel and outputs the encoded packet to the communication channel. FIG. 20 shows an example of a case where the communication channel is a wireless communication channel.

In a communication apparatus on the decoding side, a physical layer processing section in a lower layer performs reception processing. At this time, it is assumed that a bit error has occurred in a lower layer. There may be a case where due to this bit error, a packet including the corresponding bit may not be decoded correctly in the upper layer, the packet may be lost. The example in FIG. 20 shows a case where information packet 3 is lost. The upper layer processing section applies LDPC decoding processing to the received packet column and thereby decodes lost information packet 3. For LDPC decoding, sum-product decoding that performs decoding using belief propagation (BP) or Gaussian erasure method or the like is used.

Figure 21:
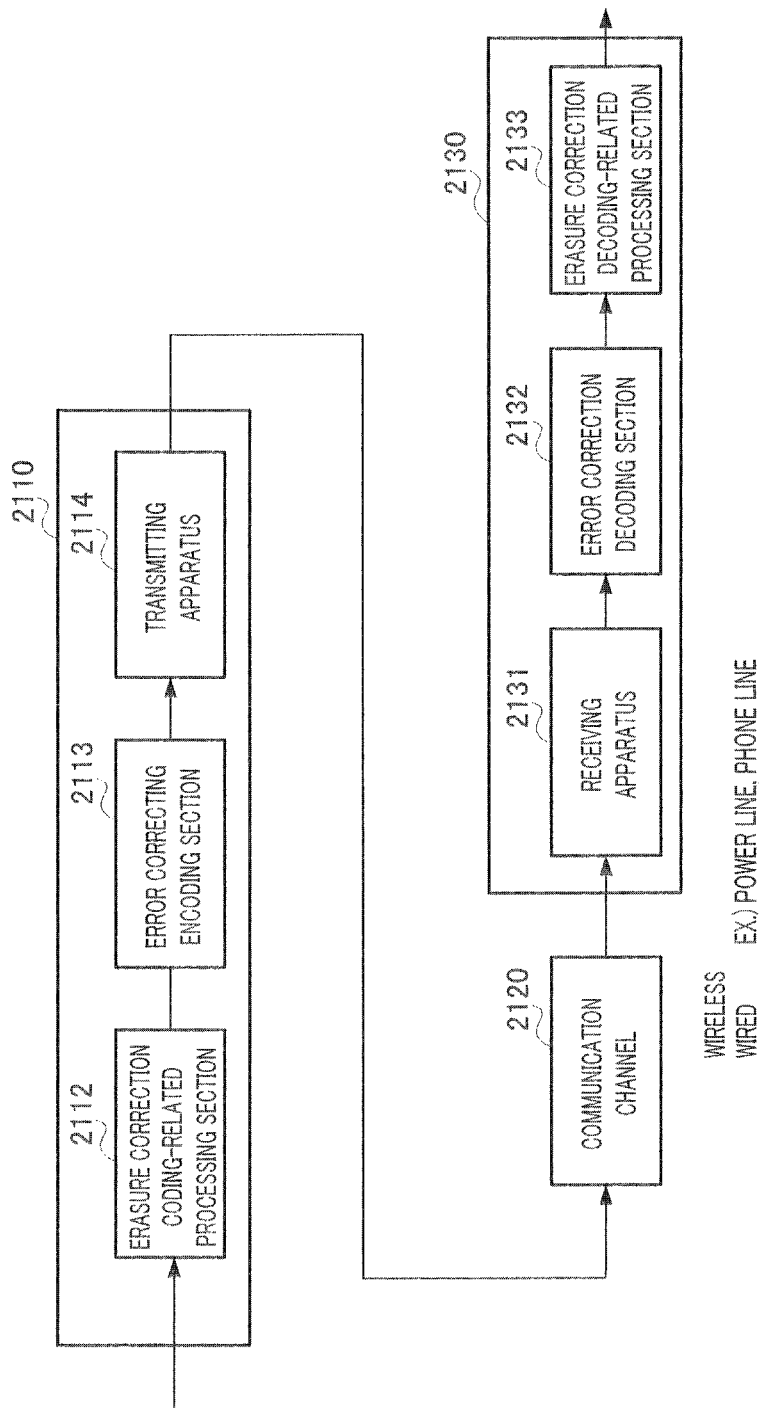
FIG. 21 is an overall configuration diagram of the communication system.

FIG. 21 is an overall configuration diagram of the above-described communication system. In FIG. 21, the communication system includes communication apparatus 2110 on the encoding side, communication channel 2120 and communication apparatus 2130 on the decoding side.

Communication apparatus 2110 on the encoding side includes erasure correction coding-related processing section 2112, error correction encoding section 2113 and transmitting apparatus 2114.

Communication apparatus 2130 on the decoding side includes receiving apparatus 2131, error correction decoding section 2132 and erasure correction decoding-related processing section 2133.

Communication channel 2120 represents a channel through which a signal transmitted from transmitting apparatus 2114 of communication apparatus 2110 on the encoding side passes until it is received by receiving apparatus 2131 of communication apparatus 2130 on the decoding side. As communication channel 2120, Ethernet (registered trademark), power line, metal cable, optical fiber, wireless, light (visible light, infrared or the like) or a combination thereof can be used.

Error, correction encoding section 2113 introduces an error correction code in the physical layer besides an erasure correction code to correct errors produced in communication channel 2120. Therefore, error correction decoding section 2132 decodes the error correction code in the physical layer. Therefore, the layer to which erasure correction coding/decoding is applied is different from the layer (that is, physical layer) to which error correction coding is applied, and soft decision decoding is performed in error correction decoding in the physical layer, while operation of reconstructing lost bits is performed in erasure correction decoding.

Figure 22:
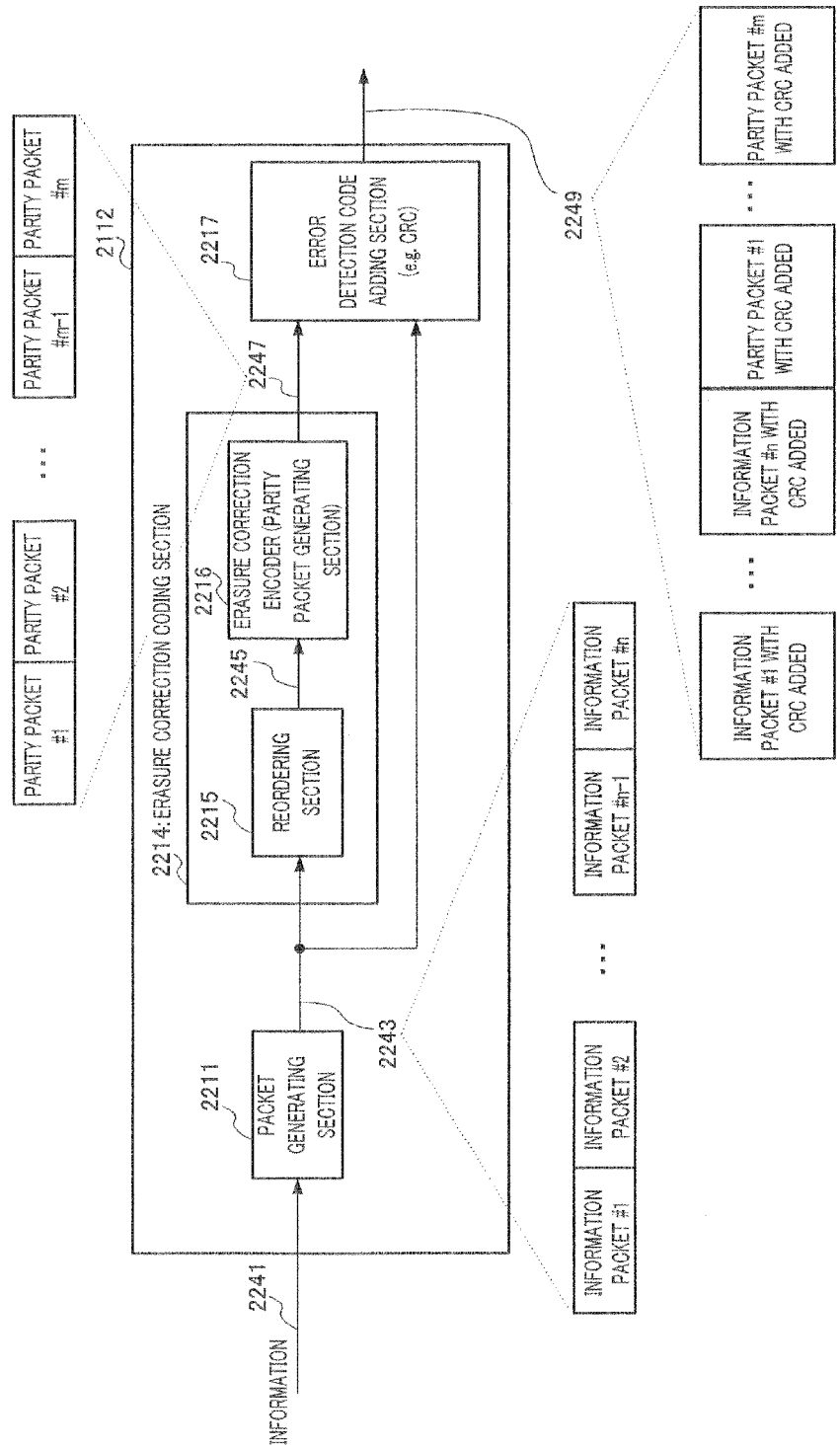
FIG. 22 shows an example of the configuration of an erasure correction coding-related processing section.

FIG. 22 shows an internal configuration of erasure correction coding-related processing section 2112. The erasure correction coding method by erasure correction coding-related processing section 2112 will be described using FIG. 22.

Packet generating section 2211 receives information 2241 as input, generates information packet 2243 and outputs information packet 2243 to reordering section 2215. Hereinafter, a case will be described as an example where information packet 2243 is formed with information packets #1 to #n.

Reordering section 2215 receives information packet 2243 (here, information packets #1 to #n) as input, reorders the information and outputs reordered information 2245.

Erasure correction encoder (parity packet generating section) 2216 receives reordered information 2245 as input, performs encoding of, for example, an LDPC-CC (low-density parity-check convolutional code) on information 2245 and generates parity. Erasure correction encoder (parity packet generating section) 2216 extracts only the parity portion generated, generates and outputs parity packet 2247 (by storing and reordering parity) from the extracted parity portion. At this time, when parity packets #1 to #m are generated for information packets #1 to #n, parity packet 2247 is formed with parity packets #1 to #m.

Error detection code adding section 2217 receives information packet 2243 (information packets #1 to #n), and parity packet 2247 (parity packets #1 to #m) as input. Error detection code adding section 2217 adds an error detection code, for example, CRC to information packet 2243 (information packets #1 to #n) and parity packet 2247 (parity packets #1 to #m). Error detection code adding section 2217 outputs information packet and parity packet 2249 with CRC added. Therefore, information packet and parity packet 2249 with CRC added is formed with information packets #1 to #n and parity packets #1 to #m with CRC added.

Figure 23:
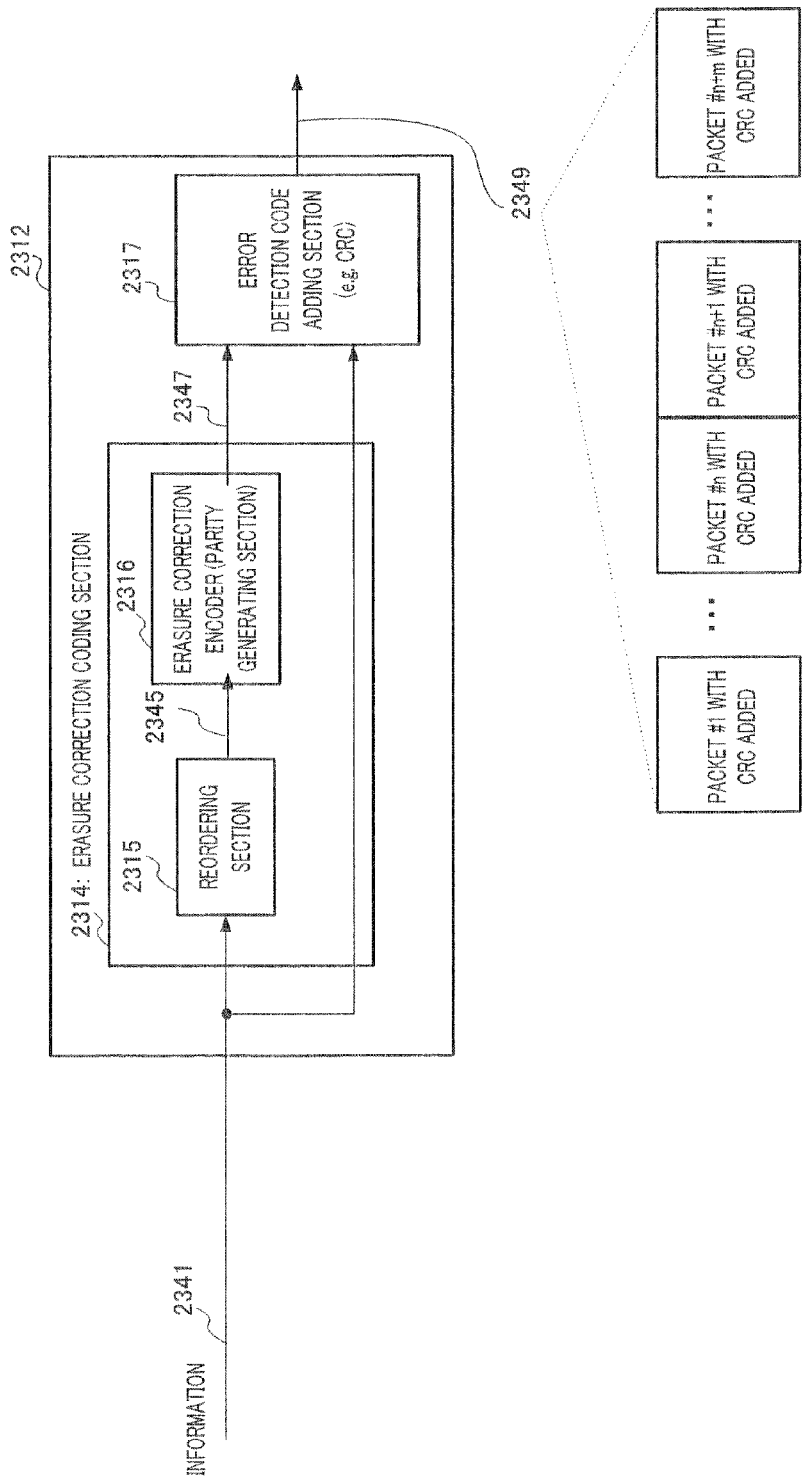
FIG. 23 shows an example of the configuration of the erasure correction coding-related processing section.

Furthermore, FIG. 23 shows another internal configuration of erasure correction coding-related processing section 2112. Erasure correction coding-related processing section 2312 shown in FIG. 23 performs an erasure correction coding method different from erasure correction coding-related processing section 2112 shown in FIG. 22. Erasure correction coding section 2314 configures packets #1 to #n+m assuming information bits and parity bits as data without making any distinction between information packets and parity packets. However, when configuring packets, erasure correction coding section 2314 temporarily stores information and parity in an internal memory (not shown), then performs reordering and configures packets. Error detection code adding section 2317 then adds an error detection code, for example, CRC to these packets and outputs packets #1 to #n+m with CRC added.

Figure 24:
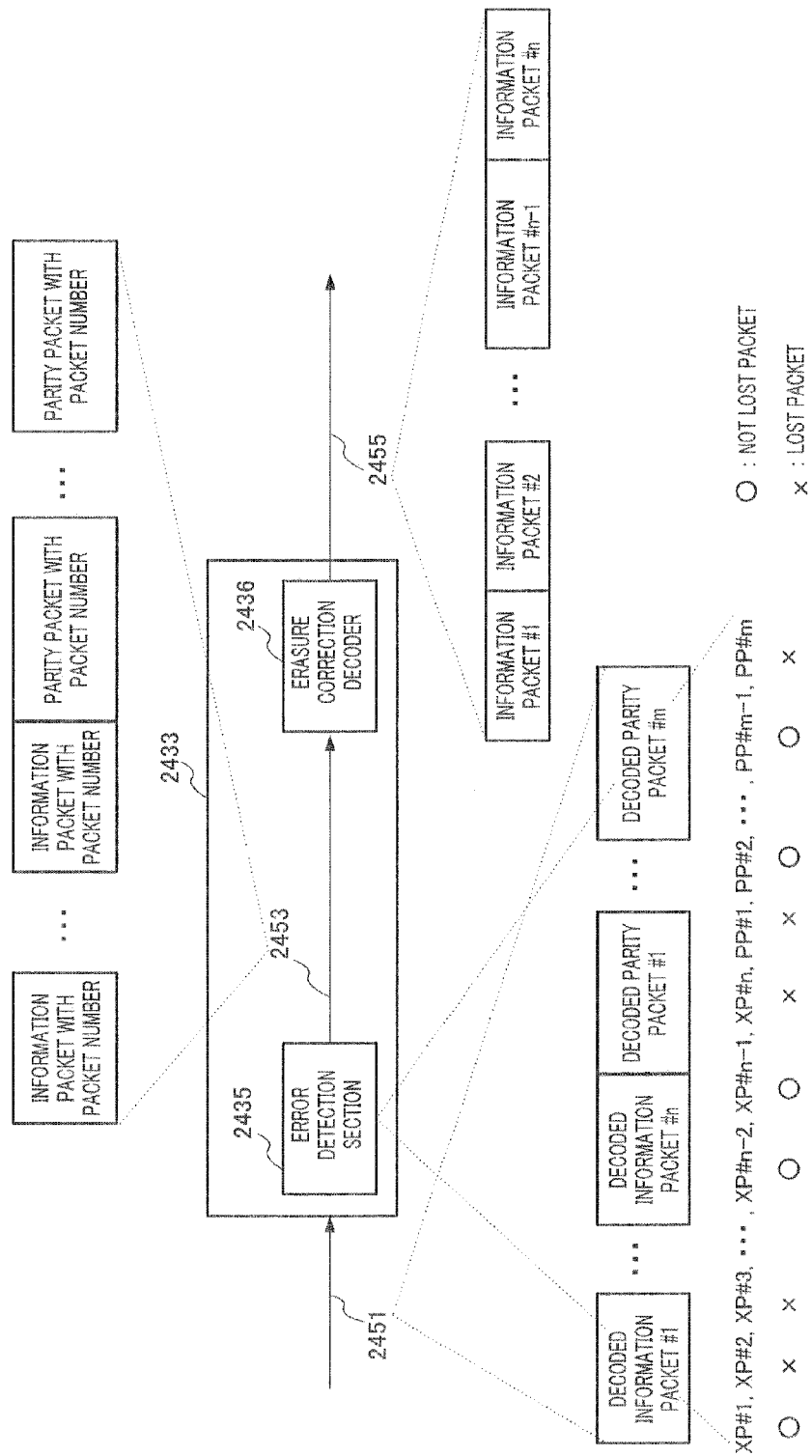
FIG. 24 shows an example of the configuration of the erasure correction coding-related processing section.

FIG. 24 shows an internal configuration of erasure correction decoding-related processing section 2433. The erasure correction decoding method by erasure correction decoding-related processing section 2433 will be described using FIG. 24.

Error detection section 2435 receives packet 2451 after the decoding of an error correction code in the physical layer as input and performs error detection using, for example, CRC. At this time, packet 2451 after the decoding of an error correction code in the physical layer is formed with decoded information packets #1 to #n and decoded parity packets #1 to #m. When there are lost packets in the decoded information packets and decoded parity packets as a result of the error detection as shown, for example, in FIG. 24, error detection section 2435 assigns packet numbers to the information packets and parity packets in which packet loss has not occurred and outputs these packets as packet 2453.

Erasure correction decoder 2436 receives packet 2453 (information packets (with packet numbers) in which packet loss has not occurred and parity packets (with packet numbers)) as input. Erasure correction decoder 2436 performs (reordering and then) erasure correction code decoding on packet 2453 and decodes information packet 2455 (information packets #1 to #n). When encoding is performed by erasure correction encoding-related processing section 2312 shown in FIG. 23, packets with no distinction between information packets and parity packets are inputted to erasure correction decoder 2436 and erasure correction decoding is performed.

Figure 25:
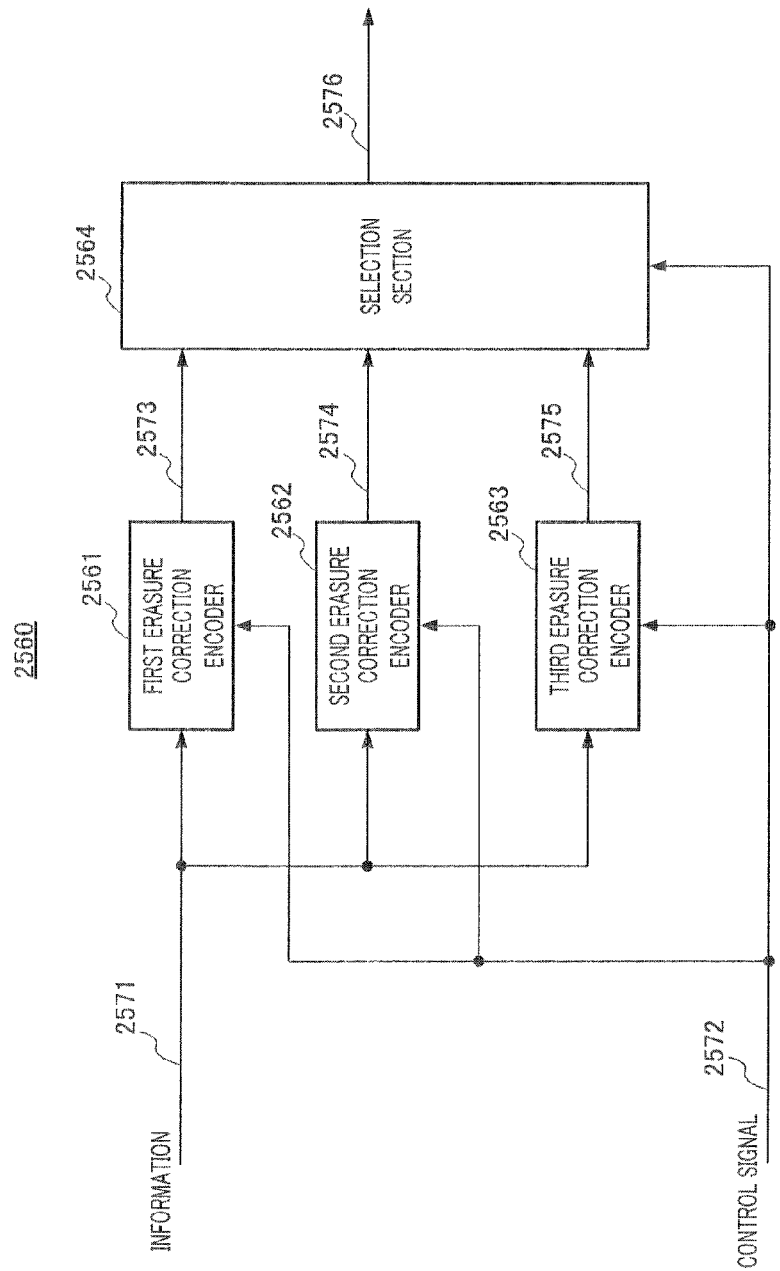
FIG. 25 shows an example of the configuration of the erasure correction encoder.

When compatibility between the improvement of transmission efficiency and the improvement of erasure correction capability is considered, it is desirable to be able to change the coding rate with an erasure correction code according to communication quality. FIG. 25 shows a configuration example of erasure correction encoder 2560 that can change the coding rate of an erasure correction code according to communication quality.

First erasure correction encoder 2561 is an encoder for an erasure correction code of a coding rate of 1/2. Furthermore, second erasure correction encoder 2562 is an encoder for an erasure correction code of a coding rate of 2/3. Furthermore, third erasure correction encoder 2563 is an encoder for an erasure correction code of a coding rate of 3/4.

First erasure correction encoder 2561 receives information 2571 and control signal 2572 as input, performs encoding when control signal 2572 designates a coding rate of 1/2 and outputs data 2573 after the erasure correction coding to selection section 2564. Similarly, second erasure correction encoder 2562 receives information 2571 and control signal 2572 as input, performs encoding when control signal 2572 designates a coding rate of 2/3 and outputs data 2574 after the erasure correction coding to selection section 2564. Similarly, third erasure correction encoder 2563 receives information 2571 and control signal 2572 as input, performs encoding when control signal 2572 designates a coding rate of 3/4 and outputs data 2575 after the erasure correction coding to selection section 2564.

Selection section 2564 receives data 2573, 2574 and 2575 after the erasure correction coding and control signal 2572 as input, and outputs data 2576 after the erasure correction coding corresponding to the coding rate designated by control signal 2572.

By changing the coding rate of an erasure correction code according to the communication situation and setting an appropriate coding rate in this way, it is possible to realize compatibility between the improvement of receiving quality of the communicating party and the improvement of the transmission rate of data (information).

At this time, the encoder is required to realize a plurality of coding rates with a small circuit scale and achieve high erasure correction capability simultaneously. Hereinafter, an encoding method (encoder) and decoding method for realizing this compatibility will be described in detail.

The encoding/decoding method which will be described hereinafter uses the LDPC-CC described in Embodiments 1 to 3 as a code for erasure correction. If erasure correction capability is focused upon at this time, when, for example, an LDPC-CC of a coding rate greater than 3/4 is used, high erasure correction capability can be achieved. On the other hand, when an LDPC-CC of a lower coding rate than 2/3 is used, there is a problem that it is difficult to achieve high erasure correction capability. Hereinafter, an encoding method that can solve this problem and realize a plurality of coding rates with a small circuit scale will be described.

Figure 26:
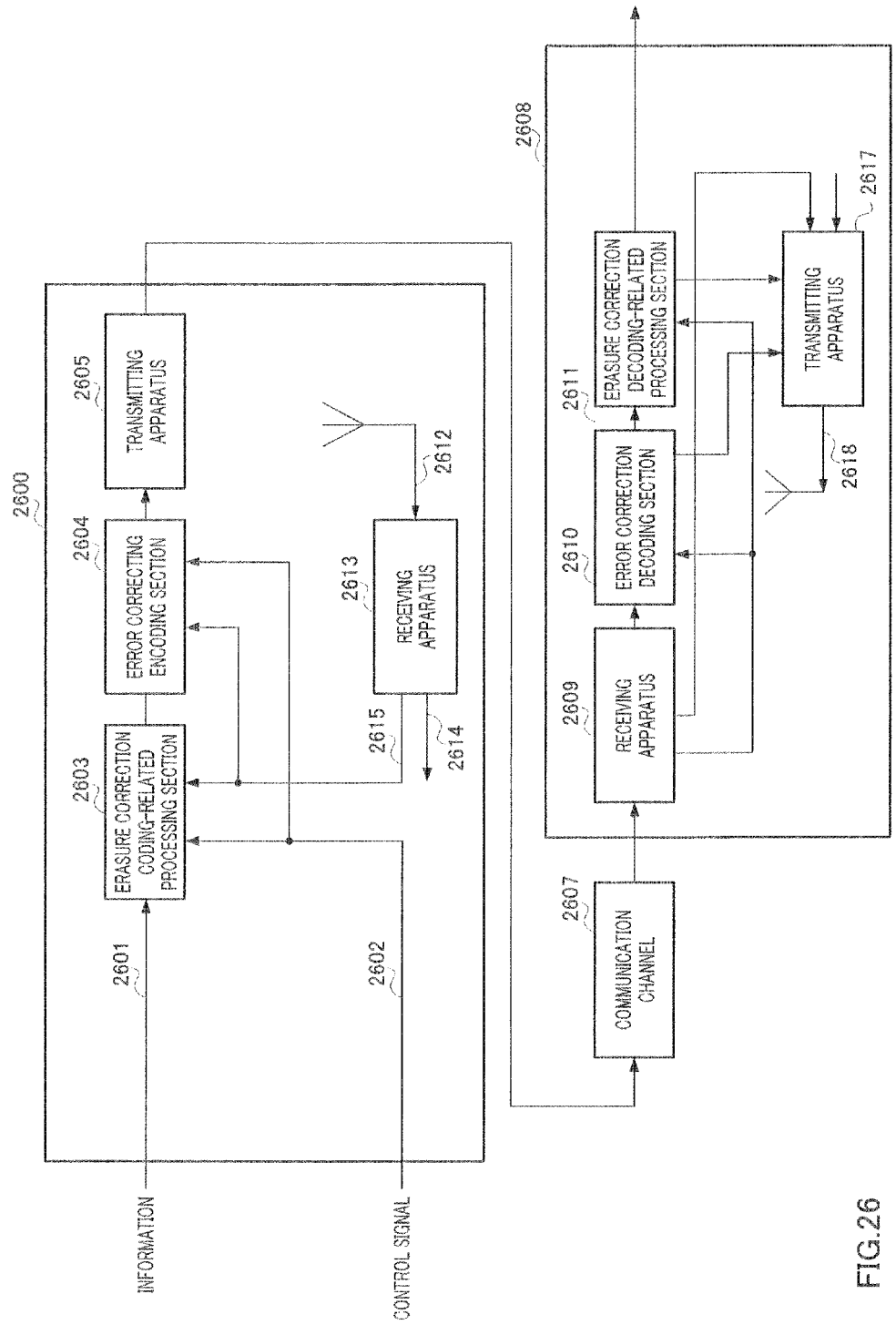
FIG. 26 is an overall configuration diagram of the communication system.

FIG. 26 is an overall configuration diagram of a communication system. In FIG. 26, the communication system includes communication apparatus 2600 on the encoding side, communication channel 2607 and communication apparatus 2608 on the decoding side.

Communication channel 2607 represents a path through which a signal transmitted from transmitting apparatus 2605 of communication apparatus 2600 on the encoding side passes until it is received by receiving apparatus 2609 of communication apparatus 2608 on the decoding side.

Receiving apparatus 2613 receives received signal 2612 as input and obtains information (feedback information) 2615 fed back from communication apparatus 2608 and received data 2614.

Erasure correction coding-related processing section 2603 receives information 2601, control signal 2602 and information 2615 fed back from communication apparatus 2608 as input. Erasure correction coding-related processing section 2603 determines the coding rate of an erasure correction code based on control signal 2602 or feedback information 2615 from communication apparatus 2608, performs encoding and outputs a packet after the erasure correction encoding.

Error correction encoding section 2604 receives packets after the erasure correction coding, control signal 2602 and feedback information 2615 from communication apparatus 2608 as input. Error correction encoding section 2604 determines the coding rate of an error correction code in the physical layer based on control signal 2602 or feedback information 2615 from communication apparatus 2608, performs error correcting coding in the physical layer and outputs encoded data.

Transmitting apparatus 2605 receives the encoded data as input, performs processing such as quadrature modulation, frequency conversion and amplification, and outputs a transmission signal. Here, it is assumed that the transmission signal includes symbols such as symbols for transmitting control information, known symbols in addition to data. Furthermore, it is assumed that the transmission signal includes control information such as information on the coding rate of an error correction code in the physical layer and the coding rate of an erasure correction code.

Receiving apparatus 2609 receives a received signal as input, applies processing such as amplification, frequency conversion, quadrature demodulation, outputs a received log likelihood ratio, estimates an environment of the communication channel such as propagation environment, reception electric field intensity from known symbols included in the transmission signal and outputs an estimation signal. Furthermore, receiving apparatus 2609 demodulates symbols for the control information included in the received signal, thereby obtains information on the coding rate of the error correction code and the coding rate of the erasure correction code in the physical layer set by transmitting apparatus 2605 and outputs the information as a control signal.

Error correction decoding section 2610 receives the received log likelihood ratio and a control signal as input and performs appropriate error correction decoding in the physical layer using the coding rate of the error correction code in the physical layer included in the control signal. Error correction decoding section 2610 outputs the decoded data and outputs information on whether or not error correction has been successfully performed in the physical layer (error correction success/failure information (e.g. ACK/NACK)).

Erasure correction decoding-related processing section 2611 receives decoded data and a control signal as input and performs erasure correction decoding using the coding rate of the erasure correction code included in the control signal. Erasure correction decoding-related processing section 2611 then outputs the erasure correction decoded data and outputs information on whether or not error correction has been successfully performed in erasure correction (erasure correction success/failure information (e.g. ACK/NACK)).

Transmitting apparatus 2617 receives estimation information (RSSI: Received Signal Strength Indicator, or CSI: Channel State Information) that is estimation of the environment of the communication channel such as propagation environment, reception electric field intensity, error correction success/failure information in the physical layer and feedback information based on the erasure correction success/failure information in erasure correction, and transmission data as input. Transmitting apparatus 2617 applies processing such as encoding, mapping, quadrature modulation, frequency conversion, amplification and outputs transmission signal 2618. Transmission signal 2618 is transmitted to communication apparatus 2600.

Figure 27:
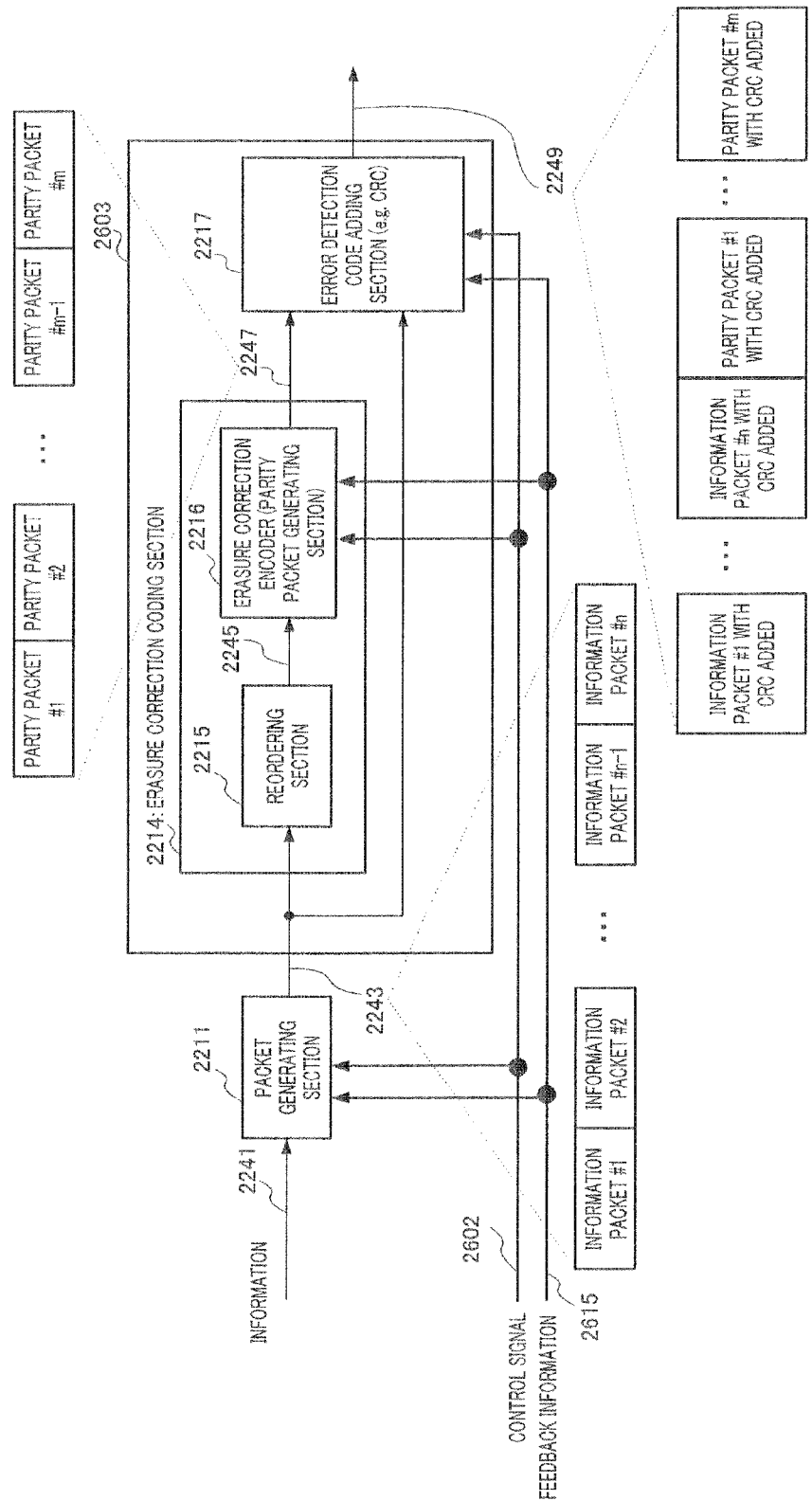
FIG. 27 shows an example of the configuration of the erasure correction coding-related processing section.

The method of changing the coding rate of an erasure correction code in erasure correction coding-related processing section 2603 will be described using FIG. 27. In FIG. 27, parts operating in the same way as those in FIG. 22 are assigned the same reference numerals. FIG. 27 is different from FIG. 22 in that control signal 2602 and feedback information 2615 are inputted to packet generating section 2211 and erasure correction encoder (parity packet generating section) 2216. Erasure correction encoding-related processing section 2603 changes the packet size and the coding rate of the erasure correction code based on control signal 2602 and feedback information 2615.

Figure 28:
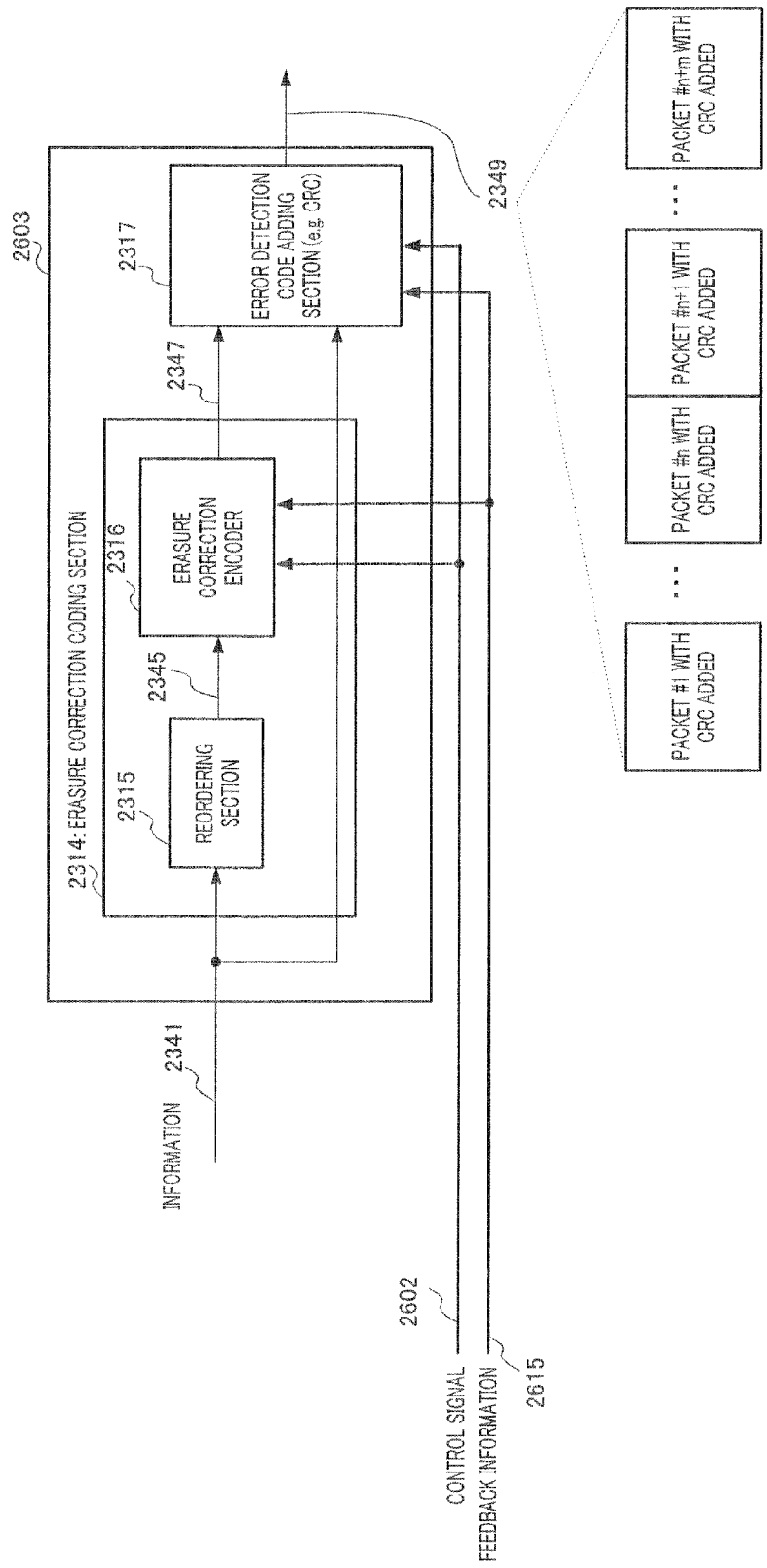
FIG. 28 shows an example of the configuration of the erasure correction coding-related processing section.

Furthermore, FIG. 28 shows another internal configuration of erasure correction encoding-related processing section 2603. Erasure correction encoding-related processing section 2603 shown in FIG. 28 changes the coding rate of the erasure correction code using a method different from that of erasure correction coding-related processing section 2603 shown in FIG. 27. In FIG. 28, parts operating in the same way as those in FIG. 23 are assigned the same reference numerals.

FIG. 28 is different from FIG. 23 in that control signal 2602 and feedback information 2615 are inputted to erasure correction encoder 2316 and error detection code adding section 2317. Erasure correction coding-related processing section 2603 then changes the packet size and the coding rate of the erasure correction code based on control signal 2602 and feedback information 2615.

Figure 29:
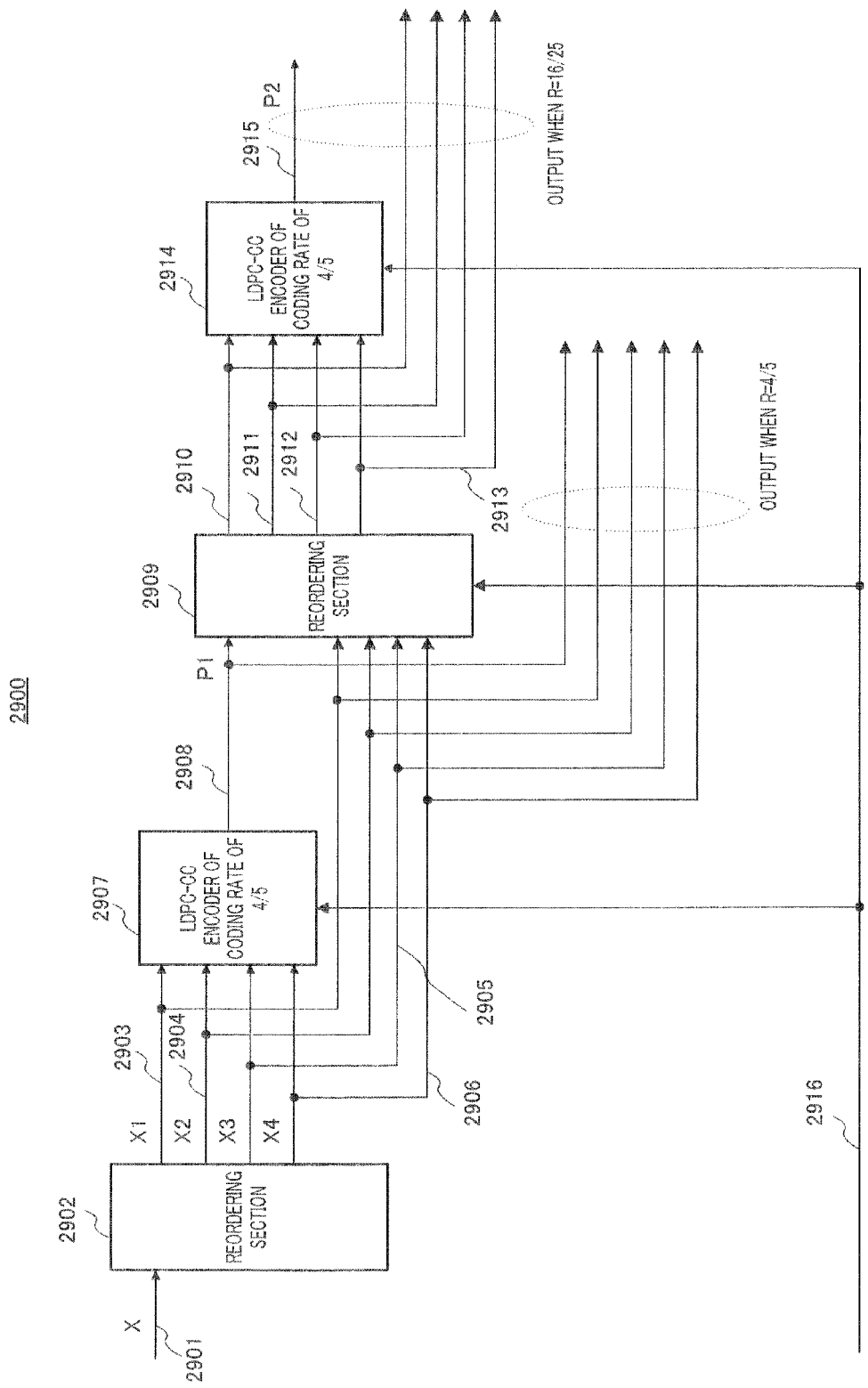
FIG. 29 shows an example of the configuration of the erasure correction coding section supporting a plurality of coding rates.

FIG. 29 shows an example of configuration of the encoding section according to the present embodiment. Encoder 2900 in FIG. 29 is an LDPC-CC encoding section supporting a plurality of coding rates. Hereinafter, a case will be described where encoder 2900 shown in FIG. 29 supports a coding rate of 4/5 and a coding rate of 16/25.

Reordering section 2902 receives information X as input and stores information bits X. When four information bits X are stored, reordering section 2902 reorders information bits X and outputs information bits X1, X2, X3 and X4 in parallel in four lines of information. However, this configuration is merely an example. Operations of reordering section 2902 will be described later.

LDPC-CC encoder 2907 supports a coding rate of 4/5. LDPC-CC encoder 2907 receives information bits X1, X2, X3 and X4, and control signal 2916 as input. LDPC-CC encoder 2907 performs the LDPC-CC encoding shown in Embodiment 1 to Embodiment 3 and outputs parity bit (P1) 2908. When control signal 2916 indicates a coding rate of 4/5, information X1, X2, X3 and X4 and parity (P1) become the outputs of encoder 2900.

Reordering section 2902 receives information bits X1, X2, X3, X4, parity bit P1, and control signal 2916 as input. When control signal 2916 indicates a coding rate of 4/5, reordering section 2909 does not operate. On the other hand, when control signal 2916 indicates a coding rate of 16/25, reordering section 2909 stores information bits X1, X2, X3 and X4 and parity bit P1. Reordering section 2909 then reorders stored information bits X1, X2, X3 and X4 and parity bit P1, outputs reordered data #1 (2910), reordered data #2 (2911), reordered data #3 (2912) and reordered data #4 (2913). The reordering method in reordering section 2909 will be described later.

As with LDPC-CC encoder 2907, LDPC-CC encoder 2914 supports a coding rate of 4/5. LDPC-CC encoder 2914 receives reordered data #1 (2910), reordered data #2 (2911), reordered data #3 (2912), reordered data #4 (2913), and control signal 2916 as input. When control signal 2916 indicates a coding rate of 16/25, LDPC-CC encoder 2914 performs encoding and outputs parity bit (P2) 2915. When control signal 2916 indicates a coding rate of 4/5, reordered data #1 (2910), reordered data #2 (2911), reordered data #3 (2912), reordered data #4 (2913), and parity bit (P2) (2915) become the outputs of encoder 2900.

Figure 30:
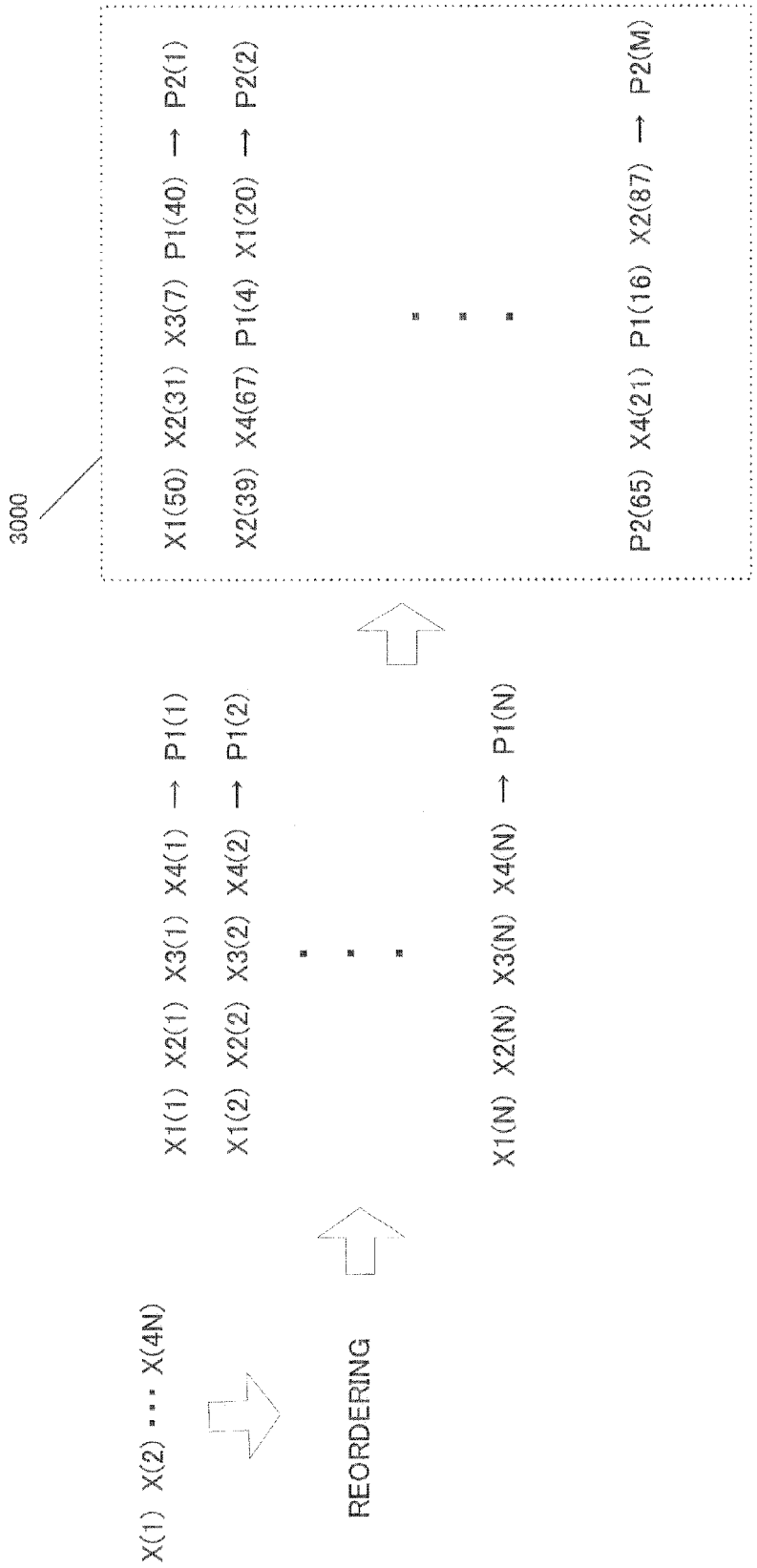
FIG. 30 shows an overview of encoding by the encoder.

FIG. 30 shows an overview of the encoding method by encoder 2900. Reordering section 2902 receives information bit X(4N) as input from information bit X(1) and reordering section 2902 reorders information bits X. Reordering section 2902 then outputs the reordered information bits in four parallel lines. Therefore, reordering section 2902 outputs [X1(1), X2(1), X3(1), X4(1)] first and then outputs [X1(2), X2(2), X3(2), X4(2)]. Reordering section 2902 finally outputs [X1(N), X2(N), X3(N), X4(N)].

LDPC-CC encoder 2907 of a coding rate of 4/5 encodes [X1(1), X2(1), X3(1), X4(1)] and outputs parity bit P1 (1). LDPC-CC encoder 2907 likewise performs encoding, generates and outputs parity bits P1(2), P1(3), ..., P1(N) hereinafter.

Reordering section 2909 receives [X1(1), X2(1), X3(1), X4(1), P1(1)], [X1(2), X2(2), X3(2), X4(2), P1(2)], ..., [X1(N), X2(N), X3(N), X4(N), P1(N)] as input. Reordering section 2909 performs reordering including parity bits in addition to information bits.

For example, in the example shown in FIG. 30, reordering section 2909 outputs reordered [X1(50), X2(31), X3(7), P1(40)], [X2(39), X4(67), P1(4), X1(20)], ..., [P2 (65), X4(21), P1(16), X2(87)].

LDPC-CC encoder 2914 of a coding rate of 4/5 performs encoding on [X1(50), X2(31), X3(7), P1(40)] as shown by frame 3000 in FIG. 30 and generates parity bit P2(1). LDPC-CC encoder 2914 likewise generates and outputs parity bits P2(1), P2(2), ..., P2(M) hereinafter.

When control signal 2916 indicates a coding rate of 4/5, encoder 2900 generates packets using [X1(1),X2(1),X3(1),X4(1),P1(1)], [X1(2),X2(2),X3(2),X4(2),P1(2)], ..., [X1(N),X2(N),X3(N),X4(N),P1(N)].

Furthermore, when control signal 2916 indicates a coding rate of 16/25, encoder 2900 generates packets using [X1(50), X2(31), X3(7), P1(40), P2(1)], [X2(39), X4(67), P1(4), X1(20), P2(2)], ..., [P2(65), X4(21), P1(16), X2(87), P2(M)].

As described above, according to the present embodiment, encoder 2900 adopts a configuration of connecting LDPC-CC encoders 2907 and 2914 of a coding rate as high as 4/5 and arranging reordering sections 2902 and 2909 before LDPC-CC encoders 2907 and 2914, respectively. Encoder 2900 then changes data to be outputted according to the designated coding rate. Thus, it is possible to support a plurality of coding rates with a small circuit scale and achieve an effect of achieving high erasure correction capability at each coding rate.

Figure 31:
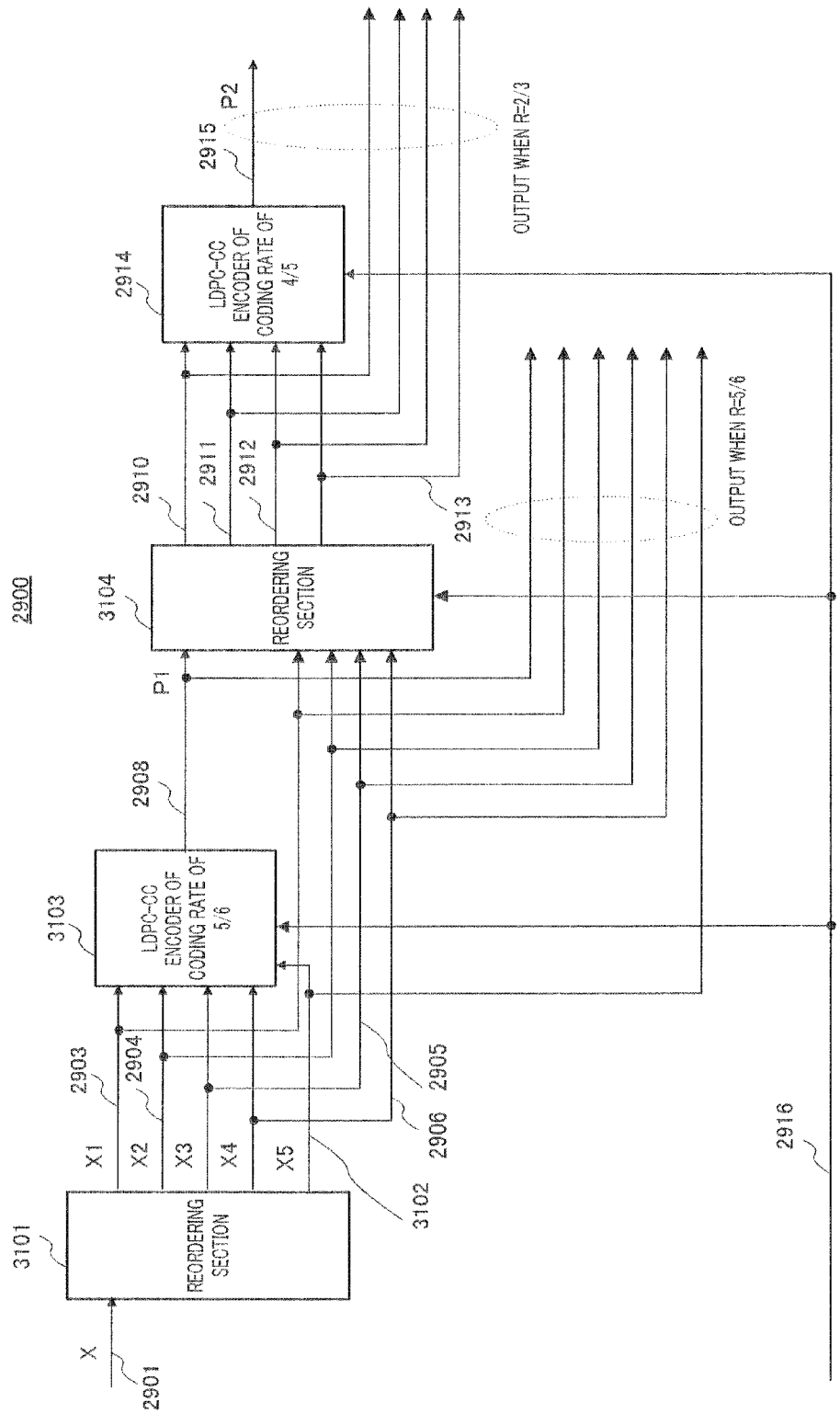
FIG. 31 shows an example of the configuration of the erasure correction coding section supporting a plurality of coding rates.

FIG. 29 describes a configuration of encoder 2900 in which two LDPC-CC encoders 2907 and 2914 of a coding rate of 4/5 are connected, but the configuration is not limited to this. For example, as shown in FIG. 31, encoder 2900 may also have a configuration in which LDPC-CC encoders 3102 and 2914 of different coding rates are connected. In FIG. 31, parts operating in the same way as those in FIG. 29 are assigned the same reference numerals.

Reordering section 3101 receives information bits X as input and stores information bits X. When five information bits X are stored, reordering section 3101 reorders information bits X and outputs information bits X1, X2, X3, X4 and X5 in five parallel lines.

LDPC-CC encoder 3103 supports a coding rate of 5/6. LDPC-CC encoder 3103 receives information bits X1, X2, X3, X4, X5, and control signal 2916 as input, performs encoding on information bits X1, X2, X3, X4 and X5 and outputs parity bit (P1) 2908. When control signal 2916 indicates a coding rate of 5/6, information bits X1, X2, X3, X4, X5, and parity bit (P1) 2908 become the outputs of encoder 2900.

Reordering section 3104 receives information bits X1, X2, X3, X4, X5, parity bit (P1) 2908, and control signal 2916 as input. When control signal 2916 indicates a coding rate of 2/3, reordering section 3104 stores information bits X1, X2, X3, X4, X5, and parity bit (P1) 2908, Reordering section 3104 reorders stored information bits X1, X2, X3, X4, X5, and parity bit (P1) 2908 and outputs the reordered data in lour parallel lines. At this time, the four lines include information bits X1, X2, X3, X4, X5, and parity bit (P1).

LDPC-CC encoder 2914 supports a coding rate of 4/5. LDPC-CC encoder 2914 receives four lines of data and control signal 2916 as input. When control signal 2916 indicates a coding rate of 2/3, LDPC-CC encoder 2914 performs encoding on the four lines of data and outputs parity bit (P2). Therefore, LDPC-CC, encoder 2914 performs encoding using information bits X1, X2, X3, X4, X5, and parity bit P1.

Encoder 2900 may set a coding rate to any value. Furthermore, when encoders of the same coding rate are connected, these may be encoders of the same code or encoders of different codes.

Figure 32:
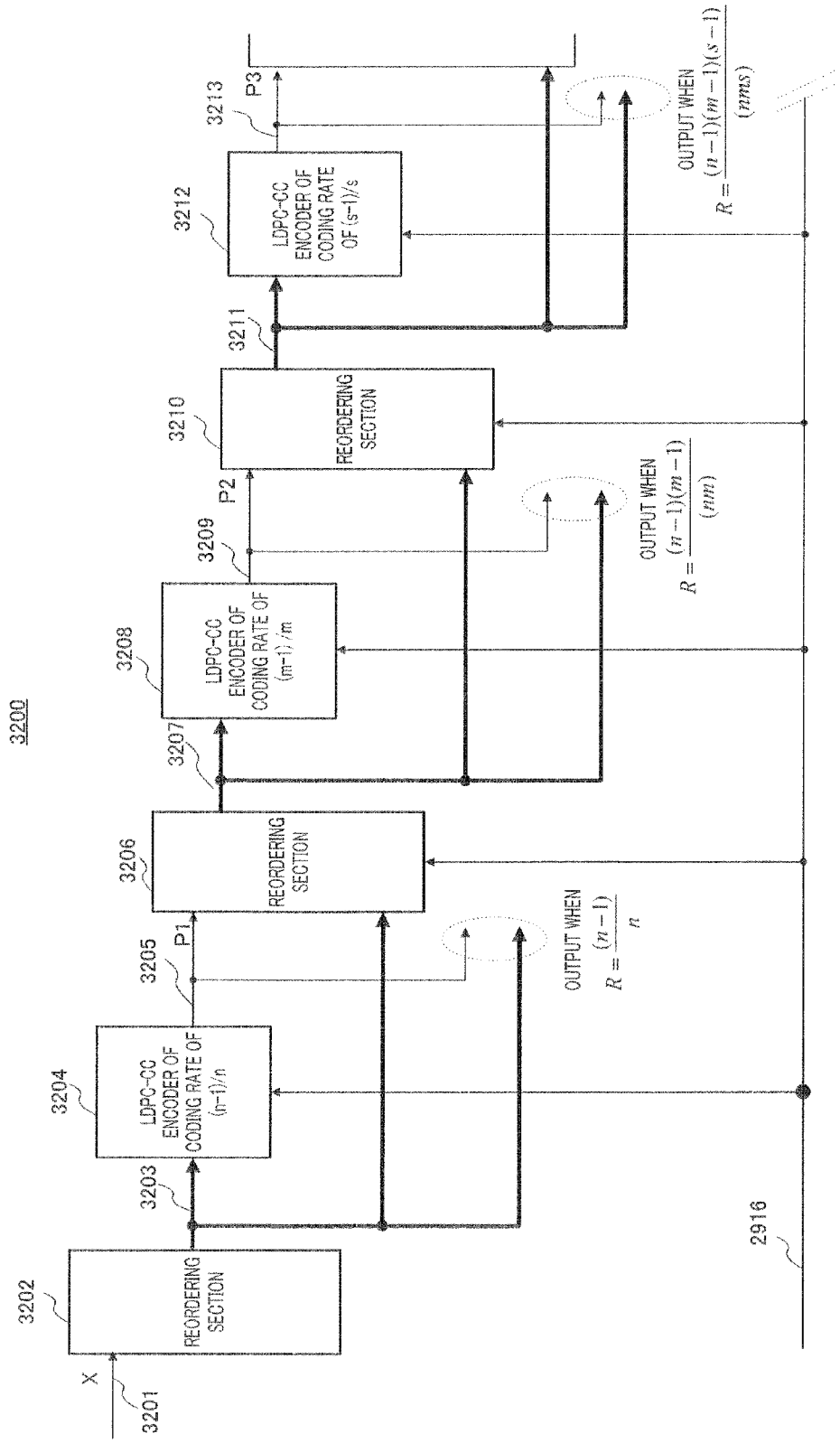
FIG. 32 shows an example of the configuration of the erasure correction coding section supporting a plurality of coding rates.

Furthermore, although FIG. 29 and FIG. 31 show configuration examples of encoder 2900 supporting two coding rates, encoder 2900 may support three or more coding rates. FIG. 32 shows an example of configuration of encoder 3200 supporting three or more coding rates.

Reordering section 3202 receives information bits X as input and stores information bit sX. Reordering section 3202 reorders stored information bits X and outputs reordered information bits X as first data 3203 to be encoded by next LDPC-CC encoder 3204.

LDPC-CC encoder 3204 supports a coding rate of $(n-1)/n$. LDPC-CC encoder 3204 receives first data 3203 and control signal 2916 as input, performs encoding on first data 3203 and control signal 2916 and outputs parity bit (P1) 3205. When control signal 2916 indicates a coding rate of $(n-1)/n$, first data 3203 and parity bit (P1) 3205 become the outputs of encoder 3200.

Reordering section 3206 receives first data 3203, parity bit (P1) 3205 and control signal 2916 as input. When control signal 2916 indicates a coding rate of $\{(n-1)(m^{-1})\}(nm)$ or less, reordering section 3206 stores first data 3203 and bit parity (P1) 3205. Reordering section 3206 reorders stored first data 3203 and parity bit (P1) 3205 and outputs reordered first data 3203 and parity bit (P1) 3205 as second data 3207 to be encoded by next LDPC-CC encoder 3208.

LDPC-CC encoder 3208 supports a coding rate of $(m-1)/m$. LDPC-CC encoder 3208 receives second data 3207 and control signal 2916 as input. When control signal 2916 indicates a coding rate of $\{(n-1)\}(m-1))/(nm)$ or less, LDPC-CC encoder 3208 performs encoding on second data 3207 and outputs parity (P2) 3209. When control signal 2916 indicates a coding rate of $\{(n-1)(m-1)\}/(nm)$, second data 3207 and parity bit (P2) 3209 become the output of encoder 3200.

Reordering section 3210 receives second data 3207, parity bit (P2) 3209 and control signal 2916 as input. When control signal 2916 indicates a coding rate of $\{(n-1)(m^{-1})(s-1)\}/(nms)$ or less, reordering section 3210 stores second data 3209 and parity bit (P2) 3207. Reordering section 3210 reorders stored second data 3209 and parity bit (P2) 3207 and outputs reordered second data 3209 and parity (P2) 3207 as third data 3211 to be encoded by next LDPC-CC encoder 3212.

LDPC-CC encoder 3212 supports a coding rate of $(s-1)/s$. LDPC-CC encoder 3212 receives third data 3211 and control signal 2916 as input. When control signal 2916 indicates a coding rate of $\{(n-1)(m-1)(s-1)\}/(nms)$ or less, LDPC-CC encoder 3212 performs encoding on third data 3211 and outputs parity bit (P3) 3213. When control signal 2916 indicates a coding rate of {(n−1)(m−1)(s−1)}/(nms), third data 3211 and parity bit (P3) 3213 become the outputs of encoder 3200.

By further connecting multiple LDPC-CC encoders, it is possible to realize more coding rates. This makes it possible to realize a plurality of coding rates with a small circuit scale and achieve an effect of being able to achieve high erasure correction capability at each coding rate.

In FIG. 29, FIG. 31 and FIG. 32, reordering (initial-stage reordering) of information bits X is not always necessary. Furthermore, although the reordering section has been described as having a configuration in which reordered information bits X are outputted in parallel, the reordering section is not limited to this configuration, but reordered information bits X may also be serially outputted.

Figure 33:
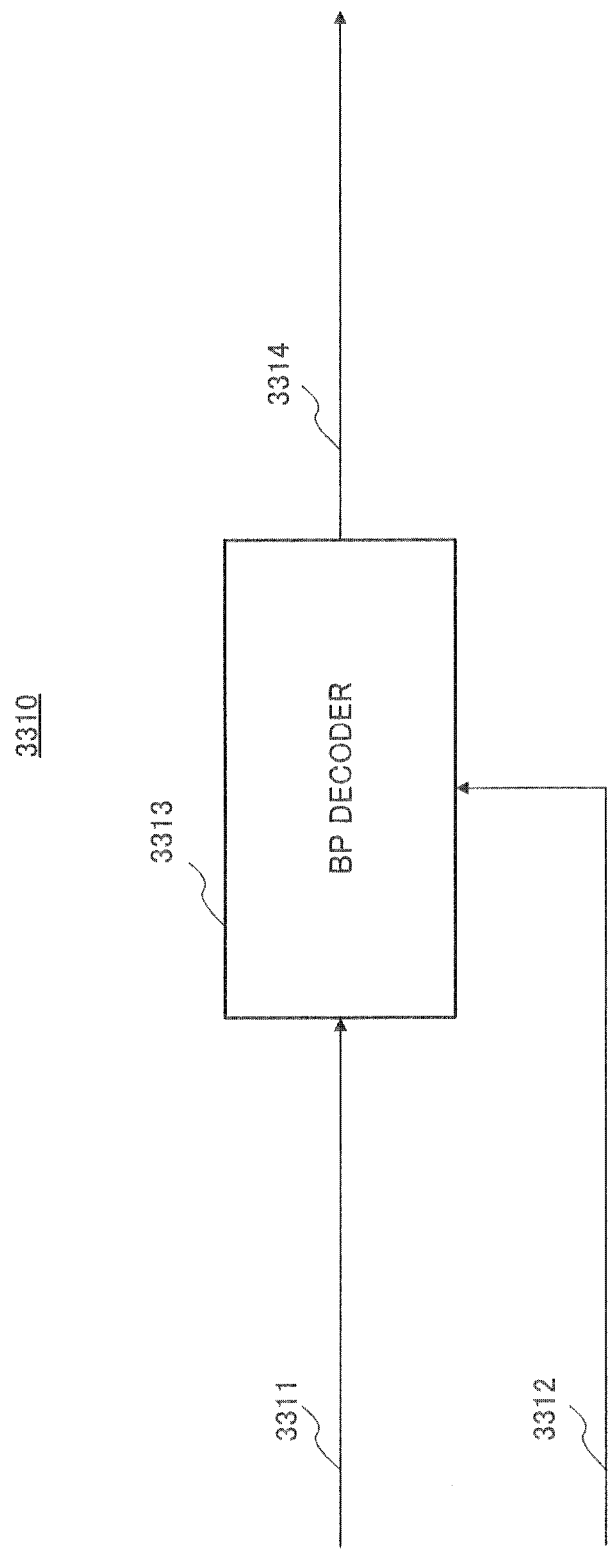
FIG. 33 shows an example of the configuration of the decoder supporting a plurality of coding rates.

FIG. 33 shows an example of configuration of decoder 3310 corresponding to encoder 3200 in FIG. 32.

When transmission sequence $u_i$ at point in time i is assumed as $u_i=(X_{1,i}, X_{2,i}, \ldots, X_{n-1,i}, P_{1,i}, P_{2,i}, P_{3,i} \ldots)$, transmission sequence u is represented as $u=(u_0, u_1, \ldots, u_i, \ldots)^T$.

Figure 34:
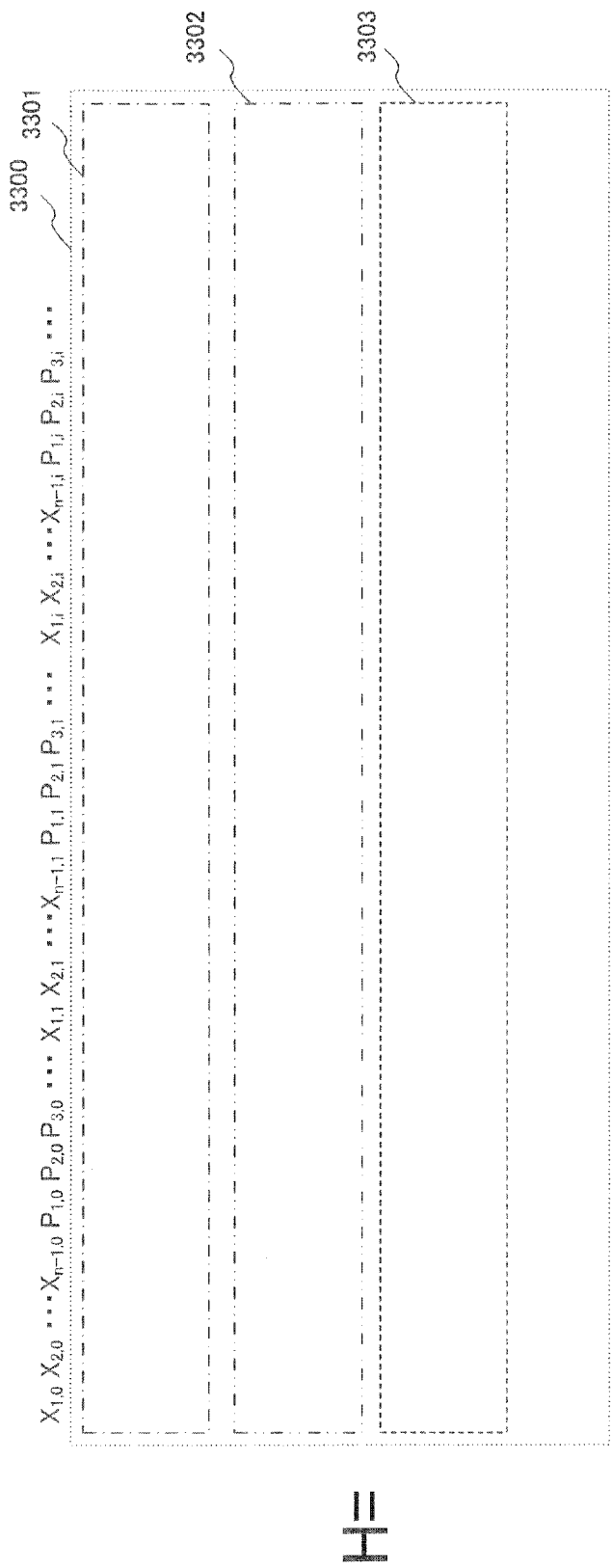
FIG. 34 shows an example of the configuration of a parity check matrix used by a decoder supporting a plurality of coding rates.

In FIG. 34, matrix 3300 represents parity check matrix H used by decoder 3310. Furthermore, matrix 3301 represents a sub-matrix corresponding to LDPC-CC encoder 3204, matrix 3302 represents a sub-matrix corresponding to LDPC-CC encoder 3208 and matrix 3303 represents a sub-matrix corresponding to LDPC-CC encoder 3212. Sub-matrices in parity check matrix H continue likewise hereinafter. Decoder 3310 is designed to possess a parity check matrix of the lowest coding rate.

In decoder 3310 shown in FIG. 33, BP decoder 3313 is a BP decoder based on a parity check matrix of the lowest coding rate among coding rates supported. BP decoder 3313 receives lost data 3311 and control signal 3312 as input. Here, lost data 3311 is comprised of bits which have already been determined to be "0" or "1" and bits which have not yet been determined to be "0" or "1." BP decoder 3313 performs BP decoding based on the coding rate designated by control signal 3312 and thereby performs erasure correction, and outputs data 3314 after the erasure correction.

Hereinafter, operations of decoder 3310 will be described.

For example, when the coding rate is (n−1)/n, data corresponding to P2, P3, . . . are not present in lost data 3311. However, in this case, BP decoder 3313 performs decoding operation assuming data corresponding to P2, P3, to be "0" and can thereby realize erasure correction.

Similarly, when the coding rate is {(n−1)(m−1)}/(nm), data corresponding to P2, P3, . . . are not present in lost data 3311. However, in this case, BP decoder 3313 performs decoding operation assuming data corresponding to P3, to be "0" and can thereby realize erasure correction. BP decoder 3313 may operate similarly for other coding rates.

Thus, decoder 3310 possesses a parity check matrix of the lowest coding rate among the supported coding rates and supports BP decoding at a plurality of coding rates using this parity check matrix. This makes it possible to support a plurality of coding rates with a small circuit scale and achieve an effect of achieving high erasure correction capability at each coding rate.

Hereinafter, a case will be described where erasure correction coding is actually performed using an LDPC-CC. Since an LDPC-CC is a kind of convolutional code, the LDPC-CC requires termination or tail-biting to achieve high erasure correction capability.

A case will be studied below as an example where zero-termination described in Embodiment 2 is used. Particularly, a method of inserting a termination sequence will be described.

It is assumed that the number of information bits is 16384 and the number of bits constituting one packet is 512. Here, a case where encoding is performed using an LDPC-CC of a coding rate of 4/5 will be considered. At this time, if information bits are encoded at a coding rate of 4/5 without performing termination, since the number of information bits is 16384, the number of parity bits is 4096 (16384/4). Therefore, when one packet is formed with 512 bits (where 512 bits do not include bits other than information such as error detection code), 40 packets are generated.

However, if encoding is performed without performing termination in this way, the erasure correction capability deteriorates significantly. To solve this problem, a termination sequence needs to be inserted.

Thus, a termination sequence insertion method will be proposed below taking the number of bits constituting a packet into consideration.

To be more specific, the proposed method inserts a termination sequence in such a way that the sum of the number of information bits (not including the termination sequence), the number of parity bits and the number of bits of the termination sequence becomes an integer multiple of the number of bits constituting a packet. However, the bits constituting a packet do not include control information such as the error detection code and the number of bits constituting a packet means the number of bits of data relating to erasure correction coding.

Therefore, in the above example, a termination sequence of 512×h bits (h is a natural number) is added. By so doing, it is possible to provide an effect of inserting a termination sequence, and thereby achieve high erasure correction capability and efficiently configure a packet.

As described above, an LDPC-CC of a coding rate of (n−1)/n is used and when the number of information bits is (n−1)×c bits, c parity bits are obtained. Next, a relationship between the number of bits of zero-termination d and the number of bits constituting one packet z will be considered. However, the number of bits constituting a packet z does not include control information such as error detection code, and the number of bits constituting a packet z means the number of bits of data relating to erasure correction coding.

At this time, if the number of bits of zero-termination d is determined in such a way that equation 62 holds true, it is possible to provide an effect of inserting a termination sequence, achieve high erasure correction capability and efficiently configure a packet.

[62]

$$(n-1) \times c + c + d = nc + d = Az \qquad \text{(Equation 62)}$$

where A is an integer.

However, (n−1)×c information bits may include padded dummy data (not original information bits but known bits (e.g. "0") added to information bits to facilitate encoding). Padding will be described later.

When erasure correction encoding is performed, there is a reordering section (2215) as is clear from FIG. 22. The reordering section is generally constructed using RAM. For this reason, it is difficult for reordering section 2215 to realize hardware that supports reordering of all sizes of information bits (information size). Therefore, making the reordering section support reordering of several types of information size is important in suppressing an increase in the hardware scale.

Figure 35:
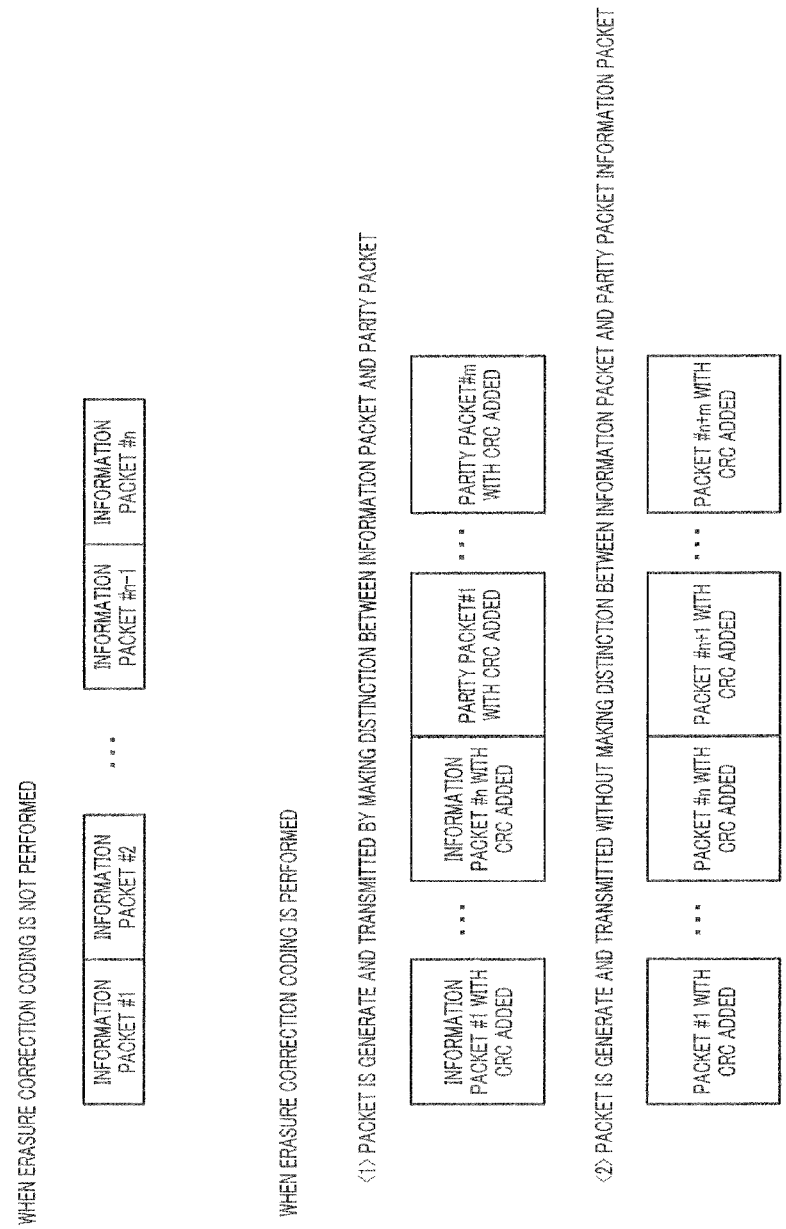
FIG. 35 shows an example of the packet configuration when erasure correction coding is performed and when erasure correction coding is not performed.

It is possible to easily support both the aforementioned case where erasure correction coding is performed and the case where erasure correction encoding is not performed. FIG. 35 shows packet configurations in these cases.

When erasure correction encoding is not performed, only information packets are transmitted.

When erasure correction encoding is performed, consider a case where packets are transmitted using one of the following methods:

<1> Packets are generated and transmitted by making distinction between information packets and parity packets.
<2> Packets are generated and transmitted without making distinction between information packets and parity packets.

In this case, to suppress an increase in the hardware circuit scale, it is desirable to equalize the number of bits constituting a packet z regardless of whether or not erasure correction encoding is performed.

Therefore, when the number of information bits used for erasure correction encoding is assumed to be I, equation 63 needs to hold true. However, depending on the number of information bits, padding needs to be performed.

[63]

$$I = \alpha \times z \quad \text{(Equation 63)}$$

Here, α is assumed to be an integer. Furthermore, z is the number of bits constituting a packet, bits constituting a packet do not include control information such as error detection code and the number of bits constituting a packet z means the number of bits of data relating to erasure correction encoding.

In the above case, the number of bits of information required for erasure correction encoding is α×z. However, information of all α×z bits is not always actually available for erasure correction encoding but only information of fewer than α×z bits may be available. In this case, a method of inserting dummy data is employed so that the number of bits becomes α×z. Therefore, when the number of bits of information for erasure correction encoding is smaller than α×z, known data (e.g. "0") is inserted so that the number of bits becomes α×z. Erasure correction encoding is performed on the information of α×z bits generated in this way.

Parity bits are obtained by performing erasure correction encoding. It is then assumed that zero-termination is performed to achieve high erasure correction capability. At this time, assuming that the number of bits of parity obtained through erasure correction encoding is C and the number of bits of zero-termination is D, packets are efficiently configured when equation 64 holds true.

[64]

$$C + D = \beta z \quad \text{(Equation 64)}$$

Here, β is assumed to be an integer. Furthermore, z is the number of bits constituting a packet, bits constituting a packet does not include control information such as error detection code and the number of bits constituting a packet z means the number of bits of data relating to erasure correction encoding.

Here, the bits constituting a packet z is often configured in byte units. Therefore, when the coding rate of an LDPC-CC is (n−1)/n, if equation 65 holds true, it is possible to avoid such a situation that padding bits are always necessary when erasure correction encoding is performed.

[65]

$$(n-1) = 2^k \quad \text{(Equation 65)}$$

where K is an integer equal to or greater than 0.

Therefore, when an erasure correction encoder that realizes a plurality of coding rates is configured, if the coding rates to be supported are assumed to be $R=(n_0-1)/n_0, (n_1-1)/n_1, (n_2-1)/n_2, \ldots, (n_i-1)/n_i, \ldots, (n_v-1)/n_v$ (i=0, 1, 2, \ldots, v−1, v; v is an integer equal to or greater than 1) and equation 66 holds true, it is possible to avoid such a situation that padding bits are always required when erasure correction encoding is performed.

[66]

$$(n_i - 1) = 2^k \quad \text{(Equation 64)}$$

where K is an integer equal to or greater than 0.

When the condition corresponding to this condition is considered about, for example, a coding rate of the erasure correction encoder in FIG. 32, if it is assumed that equations 67-1 to 67-3 hold true, it is possible to avoid such a situation that padding bits are always necessary when erasure correction encoding is performed.

[67]

$$(n-1) = 2^{k1} \quad \text{(Equation 67-1)}$$

$$(n-1)(m-1) = 2^{k2} \quad \text{(Equation 67-2)}$$

$$(n-1)(m-1)(s-1) = 2^{k3} \quad \text{(Equation 67-3)}$$

where $k_1$, $k_2$, and $k_3$ are integers equal to or greater than 0.

Although a case with an LDPC-CC has been described above, the same may be likewise considered about a QC-LDPC code, LDPC code (LDPC block code) such as random LDPC code as shown in Non-Patent Literature 1, Non-Patent Literature 2, Non-Patent Literature 3 and Non-Patent Literature 7. For example, consider an erasure correction encoder that uses an LDPC block code as an erasure correction code and supports a plurality of coding rates of $R=b_0/a_0, b_1/a_1, b_2/a_2, \ldots, b_i/a_i, \ldots, b_{v-1}/a_{v-1}, b_v/a_v$ (i=0, 1, 2, \ldots, v−1, v; v is an integer equal to or greater than 1; $a_i$ is an integer equal to or greater than 1, $b_i$ is an integer equal to or greater than 1, $a_i \geq b_i$). At this time, if equation 68 holds true, it is possible to avoid such a situation that padding bits are always required when erasure correction encoding is performed.

[68]

$$b_i = 2^{ki} \quad \text{(Equation 68)}$$

where $k_i$ is an integer equal to or greater than 0.

Furthermore, with regard to the relationship between the number of information bits, the number of parity bits and the number of bits constituting a packet, a case will be considered where an LDPC block code is used as the erasure correction code. At this time, assuming that the number of information bits used for erasure correction encoding is I, equation 69 may hold true. However, depending on the number of information bits, padding needs to be performed.

[69]

$$I = \alpha \times z \quad \text{(Equation 69)}$$

Here, α is assumed to be an integer. It is also the number of bits constituting a packet and bits constituting a packet do not include control information such as error detection code, and the number of bits constituting a packet z means the number of bits of data relating to erasure correction encoding.

In the above-described case, the number of bits of information necessary to perform erasure correction coding is a z. However, all information of α×z bits is not always actually available for erasure correction encoding, but only information of bits fewer than α×z bits may be available. In this case, a method of inserting dummy data is employed so that the number of bits becomes α×z. Therefore, when the number of bits of information for erasure correction encoding is smaller than α×z, known data (e.g. "0") is inserted so that the number of bits becomes α×z. Erasure correction encoding is performed on the information of α×z bits generated in this way.

Parity bits are obtained by performing erasure correction encoding. At this time, assuming that the number of bits of parity obtained through erasure correction encoding is C, packets are efficiently configured when equation 70 holds true.

[70]

$$C = \beta z \qquad \text{(Equation 70)}$$

where β is assumed to be an integer.

Since the block length is determined when tail-biting is performed, this case can be handled in the same way as when an LDPC block code is applied to an erasure correction code.

Embodiment 6

The present embodiment will describe important items relating to an "LDPC-CC based on a parity check polynomial of a time varying period greater than 3" described in Embodiment 1.

1: LDPC-CC

An LDPC-CC is a code defined by a low density parity check matrix as in the case of an LDPC-BC, can be defined by a time varying parity check matrix of an infinite length, but can actually be considered with a periodically time varying parity check matrix.

Assuming that a parity check matrix is H and a syndrome former is $H^T$, $H^T$ of an LDPC-CC of a coding rate of R=d/c (d<c) can be represented as shown in equation 71.

(Equation 71)

$$H^T = \begin{bmatrix} \ddots & \vdots & \vdots & \ddots & & & \\ & H_0^T(t-M_s) & H_1^T(t-M_s+1) & \ldots & H_{M_s}^T(t) & & \\ & & H_0^T(t-M_s+1) & \ldots & H_{M_s-1}^T & H_{M_s}^T(t+1) & \\ & & & \ddots & \vdots & \vdots & \ddots \\ & & & & H_0^T(t) & H_1^T(t+1) & \ldots & H_{M_s}^T(t+M_s) \\ & & & & & \ddots & \vdots & \vdots & \ddots \end{bmatrix}$$

In equation 71, $H^T_i(t)$ (i=0, 1, ..., $m_s$) is a c×(c−d) periodic sub-matrix and if the period is assumed to be $T_s$, $H^T_i(t) = H^T_i(t+T_s)$ holds true for ∀i and ∀t. Furthermore, $M_s$ is a memory size.

The LDPC-CC defined by equation 71 is a time varying convolutional code and this code is called "time-varying LDPC-CC." As for decoding, BP decoding is performed using parity check matrix H. When encoded sequence vector u is assumed, the following relational expression holds true.

[72]

$$Hu = 0 \qquad \text{(Equation 72)}$$

An information sequence is obtained by performing BP decoding using the relational expression in equation 72.

2: LDPC-CC Based on Parity Check Polynomial

Consider a systematic convolutional code of a coding rate of R-1/2 of generator matrix G=[1 $G_1(D)/G_0(D)$]. At this time, $G_1$ represents a feed forward polynomial and $G_0$ represents a feedback polynomial.

Assuming a polynomial representation of an information sequence is X(D) and a polynomial representation of a parity sequence is P(D), a parity check polynomial that satisfies 0 can be represented as shown below.

[73]

$$G_1(D)X(D) + G_0(D)P(D) = 0 \qquad \text{(Equation 73)}$$

Here, the parity check polynomial is provided as equation 74 that satisfies equation 73.

[74]

$$(D^{a1} + D^{a2} + \ldots + D^{ar} + 1)X(D) + (D^{b1} + D^{b2} + \ldots + D^{bs} + 1)P(D) = 0 \qquad \text{(Equation 74)}$$

In equation 74, $a_p$ and $b_q$ are integers equal to or greater than 1 (p=1, 2, ..., r; q=1, 2, ..., s), terms of $D^0$ are present in X(D) and P(D). The code defined by a parity check matrix based on the parity check polynomial that satisfies 0 of equation 74 becomes a time-invariant LDPC-CC.

M (in is an integer equal to or greater than 2) different parity check polynomials based on equation 74 are provided. The parity check polynomial that satisfies 0 is represented as shown below

[75]

$$A_i(D)X(D) + B_i(D)P(D) = 0 \qquad \text{(Equation 75)}$$

At this time, i=0, 1, ..., m−1.

The data and parity at point in time j are represented by $X_j$ and $P_j$ as $u_j = (X_j, P_j)$. It is then assumed that the parity check polynomial that satisfies 0 of equation 76 holds true.

[76]

$$A_k(D)X(D) + B_k(D)P(D) = 0 \ (k = j \bmod m) \qquad \text{(Equation 76)}$$

Parity $P_j$ at point in time j can then be determined from equation 76. The code defined by the parity check matrix generated based on the parity check polynomial that satisfies 0 of equation 76 becomes an LDPC-CC of a time varying period of m (TV-m-LDPC-CC: Time-Varying LDPC-CC with a time period of m).

At this time, there are terms of $D^0$ in P(D) of the time-invariant LDPC-CC defined in equation 74 and TV-m-LDPC-CC defined in equation 76, where $b_j$ is an integer equal to or greater than 1. Therefore, there is a characteristic that parity can be easily found sequentially by means of a register and exclusive OR.

The decoding section creates parity check matrix H from equation 74 using the time-invariant LDPC-CC and creates parity check matrix H from equation 76 using the TV-m-LDPC-CC. The decoding section performs BP decoding on encoded sequence $u = (u_0, u_1, \ldots, u_j, \ldots)^T$ using equation 72 and obtains an information sequence.

Next, consider a time-invariant LDPC-CC and TV-m-LDPC-CC of a coding rate of (n−1)/n. It is assumed that information sequence $X_1, X_2, \ldots, X_{n-1}$ and parity P at point in time j are represented by $X_{2,j}, \ldots, X_{n-1,j}$, and $P_j$ respectively, and $u_j = (X_{1,j}, X_{2,j}, \ldots, X_{n-1,j}, P_j)$. When it is assumed that a polynomial representation of information sequence $X_1, X_2, \ldots, X_{n-1}$ is $X_1(D), X_2(D), \ldots, X_{n-1}(D)$, the parity check polynomial that satisfies 0 is represented as shown below.

(Equation 77)

$$(D^{a1,1} + D^{a1,2} + \ldots + D^{a1,r1} + 1)X_1(D) + \qquad [77]$$
$$(D^{a2,1} + D^{a2,2} + \ldots + D^{a2,r2} + 1)X_2(D) + \ldots +$$
$$(D^{an-1,1} + D^{an-1,2} + \ldots + D^{an-1,rn-1} + 1)X_{n-1}(D) +$$
$$(D^{b1} + D^{b2} + \ldots + D^{bs} + 1)P(D) = 0$$

In equation 77, $a_{p,i}$ is an integer equal to or greater than 1 (p=1, 2, ..., n−1; i=1, 2, ... $r_p$), and satisfies $a_{p,y} \neq a_{p,z}$ ($\forall$(y, z)|y, z=1, 2, ..., $r_p$, y≠z) and $b \neq b_z$ ($\forall$(y, z)|y, z=1, 2, ..., ∈, y≠z).

m (in is an integer equal to or greater than 2) different parity check polynomials based on equation 77 are provided. A parity check polynomial that satisfies 0 is represented as shown below.
[78]

$$A_{X1,i}(D)X_1(D) + A_{X2,i}(D)X_2(D) + \ldots + A_{Xn-1,i}(D)X_{n-1}(D) + B_i(D)P(D) = 0 \qquad \text{(Equation 78)}$$

where i=0, 1, ..., m−1.

It is then assumed that equation 79 holds true for $X_{1,j}$, $X_{2,j}$, $X_{n-1,j}$, and $P_j$ of information $X_1, X_2, \ldots, X_{n-1}$ parity P at point in time j.
[79]

$$A_{X1,k}(D)X_1(D) + A_{X2,k}(D)X_{2,k}(D)X_2(D) + \ldots + A_{Xn-1,k}(D)X_{n-1}(D) + B_k(D)P(D) = 0 (k \equiv j \bmod m) \qquad \text{(Equation 79)}$$

At this time, the codes based on equation 77 and equation 79 become time-invariant LDPC-CC and TV-m-LDPC-CC of a coding rate of (n−1)/n.

3: Regular TV-m-LDPC-CC

First, a regular TV-m-LDPC-CC handled in the present study will be described.

It is known that when the constraint length is substantially the same, a TV3-LDPC-CC can obtain better error correction capability than an LDPC-CC (TV2-LDPC-CC) of a time varying period of 2. It is also known that good error correction capability can be achieved by employing a regular LDPC code for the TV3-LDPC-CC. The present study attempts to create a regular LDPC-CC of a time varying period of m (m>3).

A #q-th parity check polynomial of a TV-m-LDPC-CC of a coding rate of (n−1)/n that satisfies 0 is provided as shown below (q=0, 1, ..., m−1).
[80]

$$(D^{a\#q,1,1} + D^{a\#q,1,2} + \ldots + D^{a\#q,1,r1})X_1(D) + (D^{a\#q,2,1} + D^{a\#q,2,2} + \ldots + D^{a\#q,2,r2})X_2(D) + \ldots +$$
$$(D^{a\#q,n-1,1} + D^{a\#q,n-1,2} + \ldots + D^{a\#q,n-1,rn-1})X_{n-1}(D) + (D^{b\#q,1} + D^{b\#q,2} + \ldots + D^{b\#q,s})P(D) = 0 \qquad \text{(Equation 80)}$$

In equation 80, $a_{\#q,p,i}$ is an integer equal to or greater than 0 (p=1, 2, ..., n−1; i=1, 2, ..., $r_p$) and satisfies $a_{\#q,p,y} \neq a_{\#q,p,z}$ ($\forall$(y,z)|y, z=1, 2, ..., $r_p$, y≠z) and $b_{\#q,y} \neq b_{q,z}$ ($\forall$(y,z)|y, z=1, 2, ..., ∈, y≠z).

The following features are then provided.

Feature 1:

There is a relationship as shown below between the term of $D^{a\#\alpha,p,i}X_p(D)$ of parity check polynomial #α, the term of $D^{a\#\beta,p,j}X_p(D)$ of parity cheek polynomial #β (α, β=0, 1, ..., m−1; p=1, 2, ..., n−1, i, j=1, 2, ..., $r_p$) between the term of $D^{b\#\alpha,i}P(D)$ of parity check polynomial #α and the term of $D^{b\#\beta,j}P(D)$) of parity check polynomial #β (α, β=0, 1, ..., m−1 (β≥α); i, j=1, 2, ..., $r_p$).

Figure 36:
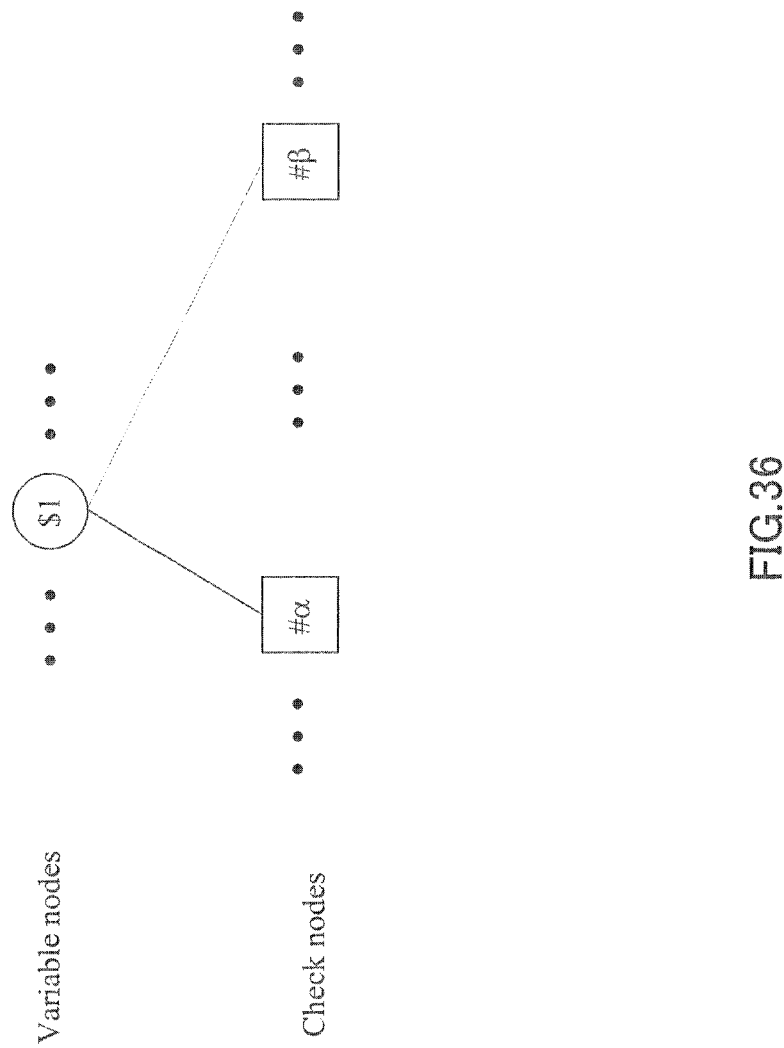
FIG. 36 shows a relationship between check nodes corresponding to parity check polynomials #α and #β, and a variable node.

<1> When β=α:

When $\{a_{\#\alpha,p,i} \bmod m = a_{\#\beta,p,j} \bmod m\} \cap \{i \neq j\}$ holds true, variable node $1 is present which forms edges of both a cheek node corresponding to parity check polynomial #α and a check node corresponding to parity check polynomial #13 as shown in FIG. 36. When $\{b_{\#\alpha,i} \bmod m = b_{\#\beta,j} \bmod m\} \cap \{i \neq j\}$ holds true, variable node $1 is present which forms edges of both a check node corresponding to parity check polynomial #α and a check node corresponding to parity check polynomial #β as shown in FIG. 36.

<2> When β≠α:

It is assumed that β−α=L.

1) When $a_{\#\alpha,p,i} \bmod m < a_{\#\beta,p,j} \bmod m$

When $(a_{\#\beta,p,j} \bmod m) - (a_{\#\alpha,p,i} \bmod m) = L$, variable node $1 is present which forms edges of both a check node corresponding to parity check polynomial #α and a check node corresponding to parity check polynomial #β as shown in FIG. 36.

2) When $a_{\#\alpha,p,i} \bmod m > a_{\#\beta,p,j} \bmod m$

When $(a_{\#\beta,p,j} \bmod m) - (a_{\#\alpha,p,i} \bmod m) = L + m$, variable node $1 is present which forms edges of both a check node corresponding to parity check polynomial #α and a check node corresponding to parity check polynomial #β as shown in FIG. 36.

3) When $b_{\#\alpha,i} \bmod m < b_{\#\beta,j} \bmod m$

When $(b_{\#\beta,j} \bmod m) - (b_{\#\alpha,i} \bmod m) = L$, variable node $1 is present which forms edges of both a check node corresponding to parity check polynomial #α and a check node corresponding to parity check polynomial #β as shown in FIG. 36.

4) When $b_{\#\alpha,i} \bmod m > b_{\#\beta,j} \bmod m$

When $(b_{\#\beta,j} \bmod m) - (b_{\#\alpha,i} \bmod m) = L + m$, variable node $1 is present which forms edges of both a check node corresponding to parity check polynomial #α and a check node corresponding to parity check polynomial #β as shown in FIG. 36.

Theorem 1 holds true for cycle length 6 (CL6: cycle length of 6) of a TV-m-LDPC-CC.

Theorem 1: The following two conditions are provided for a parity check polynomial that satisfies 0 of the TV-m-LDPC-CC:

There are p and q that satisfy C#1.1: $a_{\#\#q,p,i} \bmod m = a_{\#q,p,j} \bmod m = a_{\#q,p,k} \bmod m$, where i≠j, i≠k and j≠k. There is q that satisfies C#1.2: $b_{\#q,i} \bmod m = b_{\#q,j} \bmod m = b_{\#q,k} \bmod m$, where i≠j, i≠k and j≠k. There is at least one CL6 when C#1.1 or C#1.2 is satisfied.

Proof:

If it is possible to prove that at least one CL6 is present when $a_{\#0,1,i} \bmod m = a_{\#0,1,j} \bmod m = a_{\#0,1,k} \bmod m$ when p=1 and q=0, it is possible to prove that at least one CL6 is present also for $X_2(D), \ldots, X_{n-1}(D)$, P(D) by substituting $X_2(D), \ldots, X_{n-1}(D)$, P(D) for $X_1(D)$, if C#1.1 and C#1.2 hold true when q=0

Furthermore, when q=0 if the above description can be proved, it is possible to prove that "at least one CL6 is present also when "q=1, ..., m−1 if C#1.1 and C#1.2 hold true" in the same way of thinking.

Therefore, when p=1, q=0, if $a_{\#0,1,i} \bmod m = a_{\#0,1,j} \bmod m = a_{\#0,1,k} \bmod m$ holds true, it is possible to prove that at least one CL6 is present.

In $X_1(D)$ when q=0 is assumed for a parity check polynomial that satisfies 0 of the TV-m-LDPC-CC in equation 80, if two or fewer terms are present, C#1.1 is never satisfied.

In $X_1(D)$ when q=0 is assumed for a parity check polynomial that satisfies 0 of the TV-m-LDPC-CC in equation 80, if three terms are present and $a_{\#q,p,i} \bmod m = a_{\#q,p,j} \bmod m = a_{\#q,p,k} \bmod m$ is satisfied, the parity check polynomial that satisfies 0 of q=0 can be represented as shown in equation 81.

(Equation 81)

$$(D^{a\#0,1,1} + D^{a\#0,1,2} + D^{a\#0,1,3})X_1(D) +$$
$$(D^{a\#0,2,1} + D^{a\#0,2,2} + \ldots + D^{a\#0,2,r2})X_2(D) + \ldots +$$
$$(D^{a\#0,n-1,1} + D^{a\#0,n-1,2} + \ldots + D^{a\#0,n-1,r_{n-t}})X_{n-1}(D) +$$
$$(D^{b\#0,1} + D^{b\#0,2} + \ldots + D^{b\#0,s})P(D) =$$
$$(D^{a\#0,1,3+m\gamma+m\delta} + D^{a\#0,1,3+m\delta} + D^{a\#0,1,3})X_1(D) +$$
$$(D^{a\#0,2,1} + D^{a\#0,2,2} + \ldots + D^{a\#0,2,r2})X_2(D) + \ldots +$$
$$(D^{a\#0,n-1,1} + D^{a\#0,n-1,2} + \ldots + D^{a\#0,n-1,r_{n-1}})X_{n-1}(D) +$$
$$(D^{b\#0,1} + D^{b\#0,2} + \ldots + D^{b\#0,s})P(D) = 0$$
[81]

Figure 37:
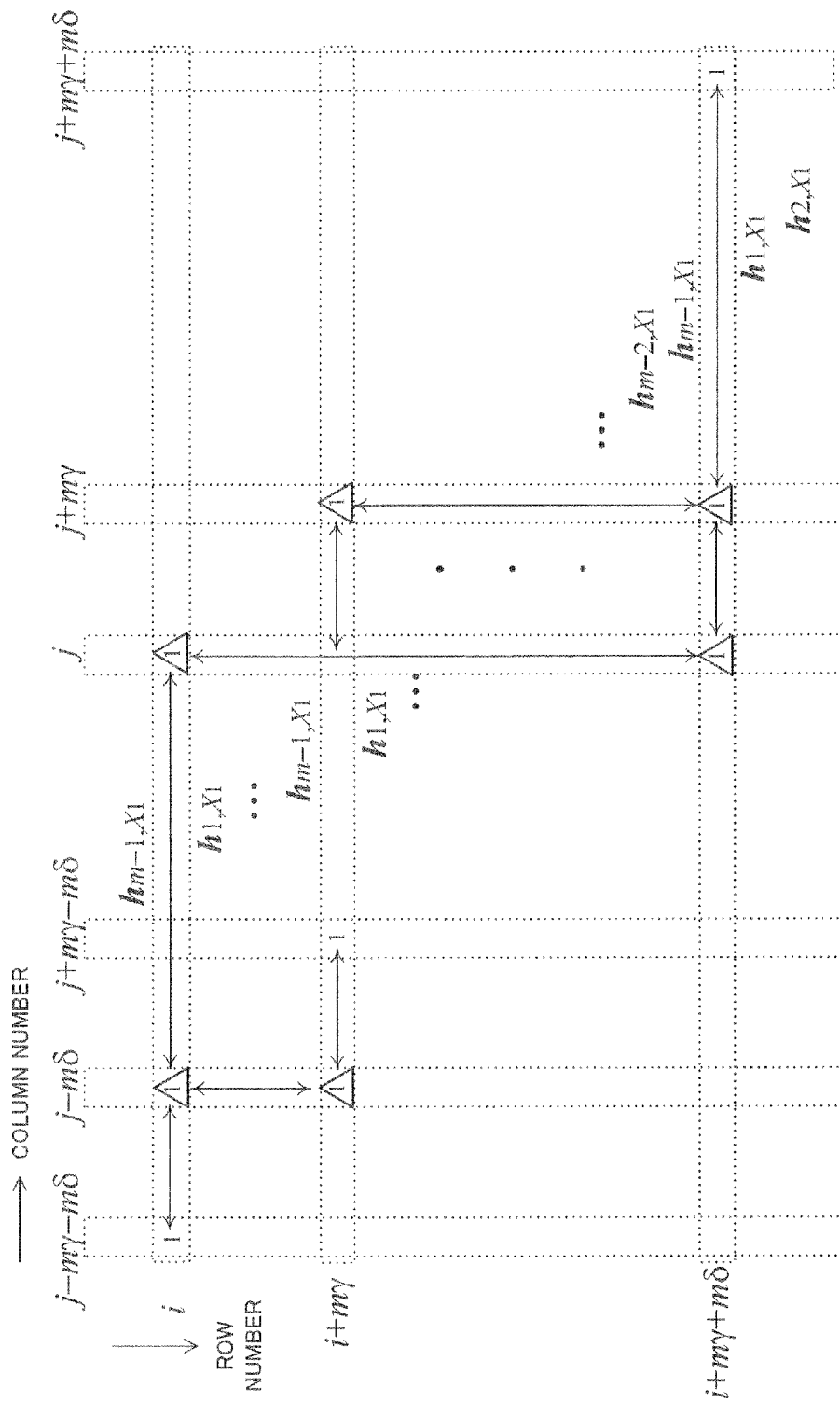
FIG. 37 shows a sub-matrix generated by extracting only parts relating to $X_1(D)$ of parity check matrix H.

Here, even when $a_{\#0,1,1} > a_{\#0,1,2} > a_{0,1,3}$ is assumed, generality is not lost, and γ and δ become natural numbers. At this time, in equation 81, when q=0, the term relating to $X_1(D)$, that is, $(D^{a\#0,1,3+m\gamma+m\delta} + D^{a\#0,1,3+m\delta} + D^{a\#0,1,3})X_1(D)$ is focused upon. At this time, a sub-matrix generated by extracting only a portion relating to $X_1(D)$ in parity check matrix H is represented as shown in FIG. 37. In FIG. 37, $h_{1,X1}$, $h_{2,X1}$, ... $h_{m-1,X1}$ are vectors generated by extracting only portions relating to $X_1(D)$ when q=1, 2, ..., m−1 in the parity check polynomial that satisfies 0 of equation 81, respectively.

At this time, the relationship as shown in FIG. 37 holds true because <1> of feature 1 holds true. Therefore, CL6 formed with "1" shown by the symbol "Δ" as shown in FIG. 37 is always generated only in a sub-matrix generated by extracting only a portion relating to $X_1(D)$ of the parity check matrix in equation 81 regardless of γ and δ values.

When four or more $X_1(D)$-related terms are present, three terms are selected from among four or more terms and if $a_{\#0,1,i} \bmod m = a_{\#0,1,j} \bmod m = a_{\#1,1,k} \bmod m$ holds true in the selected three terms, CL6 is formed as shown in FIG. 37.

As shown above, when q=0, if $a_{\#0,1,i} \bmod m = a_{\#0,1,j} \bmod m = a_{\#0,1,k} \bmod m$ holds true about $X_1(D)$, CL6 is present.

Furthermore, by also substituting $X_1(D)$ for $X_2(D)$, $X_{n-1}(D)$, P(D), at least one CL6 occurs when C#1.1 or C#1.2 holds true.

Furthermore, in the same way of thinking, also for when q=1, ..., m−1, at least one CL6 is present when C#1.1 or C#1.2 is satisfied.

Therefore, in the parity check polynomial that satisfies 0 of equation 80, when C#1.1 or C#1.2 holds true, at least one CL6 is generated.

☐ (end of proof)

The #q-th parity check polynomial that satisfies 0 of a TV-m-LDPC-CC of a coding rate of (n−1)/n, which will be described hereinafter, is provided below based on equation 74 (q=0, ..., m−1):
[82]

$$(D^{a\#q,1,1}+D^{a\#q,1,2}+D^{a\#q,1,3})X_1(D)+(D^{a\#q,2,1}+D^{a\#q,2,2}+D^{a\#q,2,3})X_2(D)+\ldots+(D^{a\#q,n-1,1}+D^{a\#q,n-1,2}+D^{a\#q,n-1,3})X_{n-1}(D)+(D^{b\#q,1}+D^{b\#q,2}+D^{b\#q,3})P(D)=0 \quad \text{(Equation 82)}$$

Here, in equation 82, it is assumed that there are three terms in $X_1(D)$, $X_2(D)$, ..., $X_{n-1}(D)$ and P(D), respectively.

According to theorem 1, to suppress the occurrence of CL6, it is necessary to satisfy {a#q,p,1 mod m≠a#q,p,2 mod m}∩{a#q,p,1 mod m≠a#q,p,3 mod m}∩{a#q,p,2 mod m≠a#q,p,3 mod m} in Xq(D) of equation 82. Similarly, it is necessary to satisfy {b#q,1 mod m≠b#q,2 mod m}∩{b#q,1 mod m≠b#q,3 mod m}∩{b#q,2 mod m≠b#q,3 mod m} in P(D). ∩ represents an intersection.

Then, according to feature 1, the following condition is considered as an example of the condition to be a regular LDPC code.

C#2: for $\forall q$, $(a_{\#q,p,1} \bmod m, a_{\#q,p,2} \bmod m, a_{\#g,p,3} \bmod m) = (N_{p,1}, N_{p,2}, N_{p,3}) \cap (b_{\#q,1} \bmod m, b_{\#q,2} \bmod m, b_{\#q,3} \bmod m) = (M_1, M_2, M_3)$ holds true. However, {$a_{\#q,p,1}$ mod m≠$a_{\#q,p,2}$ mod m}∩{$a_{\#q,p,1}$ mod m≠$a_{\#q,p,3}$ mod m}∩{$a_{\#q,p,2}$ mod m≠$a_{\#q,p,3}$ mod m} and {$b_{\#q,1}$ mod m≠$b_{\#q,2}$ mod m}∩{$b_{\#q,1}$ mod m≠$b_{\#q,3}$ mod m}∩{$b_{\#q,2}$ mod m≠$b_{\#q,3}$ mod m} is satisfied. Here, the symbol "$\forall$" of $\forall q$ is a universal quantifier and $\forall q$ means all q's.

The following discussion will treat a regular TV-m-LDPC-CC that satisfies the condition of C#2.

[Code Design of Regular TV-m-LDPC-CC]

Non-Patent Literature 13 shows a decoding error rate when a uniformly random regular LDPC code is subjected to maximum likelihood decoding in a binary-input output-symmetric channel and shows that Gallager's belief function (see Non-Patent Literature 14) can be achieved by a uniformly random regular LDPC code. However, when BP decoding is performed, it is unclear whether or not Gallager's belief function can be achieved by a uniformly random regular LDPC code.

By the way, an LDPC-CC belongs to a convolutional code. Non-Patent Literature 15 and Non-Patent Literature 16 describe the belief function of the convolutional code and describe that the belief depends on a constraint length. Since the LDPC-CC is a convolutional code, it has a structure specific to a convolutional code in a parity check matrix, but when the time varying period is increased, positions at which "1"s of the parity check matrix exist approximate to uniform randomness. However, since the LDPC-CC is a convolutional code, the parity check matrix has a structure specific to a convolutional code and the positions at which "1"s exist depend on the constraint length.

From these results, inference of inference #1 on a code design is provided in a regular TV-m-LDPC-CC that satisfies the condition of C#2.

Inference #1:

When BP decoding is used, if time varying period m of a TV-m-LDPC-CC increases in a regular TV-m-LDPC-CC that satisfies the condition of C#2, uniform randomness is approximated for positions at which "1"s exist in the parity check matrix and a code of high error correction capability is obtained.

The method of realizing inference #1 will be discussed below.

[Feature of Regular TV-m-LDPC-CC]

A feature will be described that holds true when drawing a tree about equation 82 which is a #q-th parity check polynomial that satisfies 0 of a regular TV-m-LDPC-CC that satisfies the condition of C#2 of a coding rate of (n−1)/n, which will be treated in the present discussion.

Feature 2:

In a regular TV-m-LDPC-CC that satisfies the condition of C#2, when time varying period in is a prime number, consider a case where C#3.1 holds true with attention focused on one of $X_1(D)$, ..., $X_{n-1}(D)$.

C#3.1: In parity check polynomial (82) that satisfies 0 of a regular TV-m-LDPC-CC that satisfies the condition of C#2, $a_{\#q,p,i} \bmod m \neq a_{\#q,p,j} \bmod m$ holds true in $X_p(D)$ for $\forall q$ (q=0, ..., m−1), where i≠j.

In parity check polynomial (82) that satisfies 0 of a regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#3.1.

At this time, according to feature 1, there are check nodes corresponding to all #0 to #m−1 parity check polynomials for $^\forall q$ in a tree whose starting point is a check node corresponding to a #q-th parity check polynomial that satisfies 0 of equation 82.

Similarly, when time varying period m is a prime number in a regular TV-m-LDPC-CC that satisfies the condition of C#2, consider a case where C#3.2 holds true with attention focused on the term of P(D).

C#3.2: In parity check polynomial (82) that satisfies 0 of a regular TV-m-LDPC-CC that satisfies the condition of C#2, $b_{\#q,i}$ mod m≠$b_{\#q,j}$ mod m holds true in P(D) for $^\forall q$, where i≠j.

In parity check polynomial (82) that satisfies 0 of a regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ that satisfy C#3.2.

At this time, according to feature 1, there are check nodes corresponding to all #0 to #m−1 parity check polynomials for $^\forall q$ in a tree whose starting point is a check node corresponding to a #q-th parity check polynomial that satisfies 0 of equation 82.

EXAMPLE

In parity check polynomial (82) that satisfies 0 of a regular TV-m-LDPC-CC that satisfies the condition of C#2, it is assumed that time varying period m=7 (prime number) and $(b_{\#q,1}, b_{\#q,2})$=(2, 0) holds true for $^\forall q$. Therefore, C#3.2 is satisfied.

Figure 38:
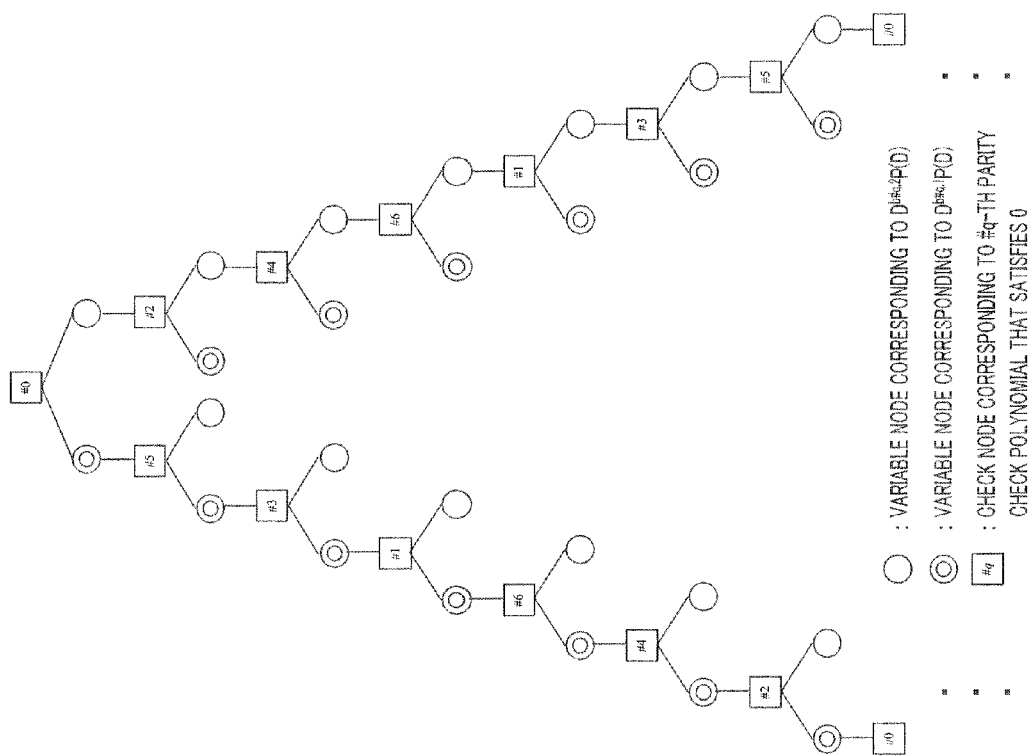
FIG. 38 shows an example of LDPC-CC tree of a time varying period of 7.

When a tree is drawn exclusively for variable nodes corresponding to $D^{b\#q,1}P(D)$ and $D^{b\#q,2}P(D)$, a tree whose starting point is a check node corresponding to a #0-th parity check polynomial that satisfies 0 of equation 82 is represented as shown in FIG. 38. As is clear from FIG. 38, time varying period m=7 satisfies feature 2.

Feature 3:

In a regular TV-m-LDPC-CC that satisfies the condition of C#2, when time varying period m is not a prime number, consider a case where C#4.1 holds true with attention focused on one of $X_1(D), \ldots, X_{n-1}(D)$.

C#4.1: In parity check polynomial (82) that satisfies 0 of a regular TV-m-LDPC-CC that satisfies the condition of C#2, when $a_{\#q,p,i}$ mod m≥$a_{\#q,p,j}$ mod m in $X_p(D)$ for $^\forall q$, |$a_{\#q,p,i}$ mod m−$a_{\#q,p,j}$ mod m| is a divisor other than 1 of m, where i≠j.

In parity check polynomial (82) that satisfies 0 of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#4.1. At this time, according to feature 1, in the tree whose starting point corresponds to the #q-th parity check polynomial that satisfies 0 of equation 82, there is no check node corresponding to all #0 to #m−1 parity check polynomials for $^\forall q$.

Similarly, in the regular TV-m-LDPC-CC that satisfies the condition of C#2, consider a case where C#4.2 holds true when time varying period m is not a prime number with attention focused on the term of P(D).

C#4.2: In parity check polynomial (82) that satisfies 0 of the regular TV-m-LDPC-CC that satisfies the condition of C#2, when mod m≥$b_{\#q,j}$ mod m in P(D) for $^\forall q$, |$b_{\#q,i}$ mod m−$b_{\#q,j}$ mod m| is a divisor other than 1 of m, where i≠j.

In parity check polynomial (82) that satisfies 0 of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ that satisfy C#4.2. At this time, according to feature 1, in the tree whose starting point is a check node corresponds to the #q-th parity check polynomial that satisfies 0 of equation 82, there are not all check nodes corresponding to #0 to #m−1 parity check polynomials for $^\forall q$.

EXAMPLE

In parity check polynomial (82) that satisfies 0 of the regular TV-m-LDPC-CC that satisfies the condition of C#2, it is assumed that time varying period m=6 (not a prime number) and $(b_{\#q,1}, b_{\#q,2})$=(3, 0) holds true for $^\forall q$. Therefore, C#4.2 is satisfied.

Figure 39:
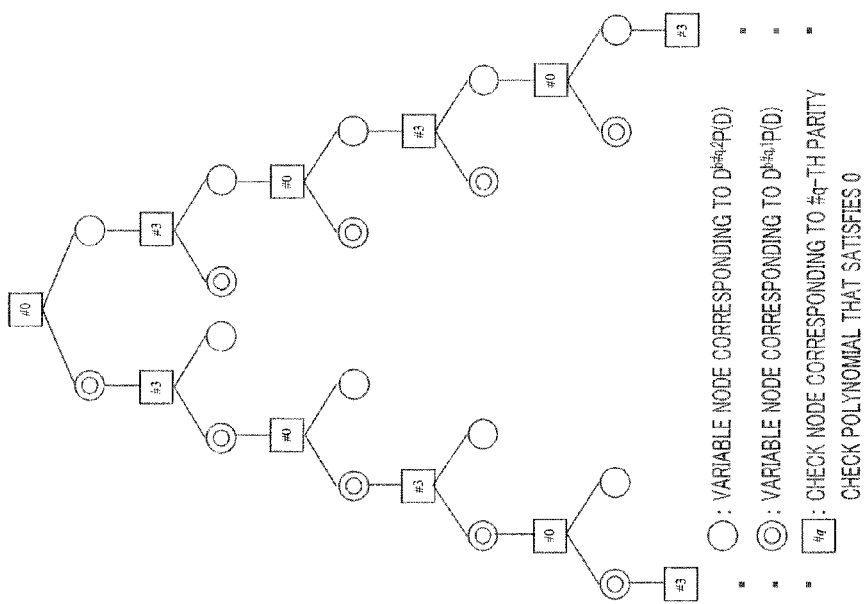
FIG. 39 shows an example of LDPC-CC tree of a time varying period of h of a time varying period of 6.

When a tree is drawn exclusively for variable nodes $D^{b\#q,1}P(D)$ and $D^{b\#q,2}P(D)$, a tree whose starting point is a check node corresponding to #0-th parity check polynomial that satisfies 0 of equation 82 is represented as shown in FIG. 39. As is clear from FIG. 39, time varying period m=6 satisfies feature 3.

Next, in the regular TV-m-LDPC-CC that satisfies the condition of C#2, a feature will be described which particularly relates to when time varying period in is an even number.

Feature 4:

In the regular TV-m-LDPC-CC that satisfies the condition of C#2, when time varying period in is an even number, consider a case where C#5.1 holds true with attention focused on one of $X_1(D)$, $X_{p=1}(D)$.

C#5.1: In parity check polynomial (82) that satisfies 0 of the regular TV-m-LDPC-CC that satisfies the condition of C#2, when $a_{\#q,p,i}$ mod m≥$a_{\#q,p,j}$ mod m in $X_p(D)$ for $^\forall q$, |$a_{\#q,p,i}$ mod m−$a_{\#q,p,j}$ mod m| is an even number, where i≠j.

In parity check polynomial (82) that satisfies 0 of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#5.1. At this time, according to feature 1, when q is an odd number, there are only check nodes corresponding to odd-numbered parity check polynomials in a tree whose starting point is a check node corresponding to the #q-th parity check polynomial that satisfies 0 of equation 82. On the other hand, when q is an even number, there are only check nodes corresponding to even-numbered parity check polynomials in a tree whose starting point is a check node corresponding to the #q-th parity check polynomial that satisfies 0 of equation 82.

Similarly, in the regular TV-m-LDPC-CC that satisfies the condition of C#2, when time varying period m is an even number, consider a case where C#5.2 holds true with attention focused on the term of P(D).

C#5.2: In parity check polynomial (82) that satisfies 0 of the regular TV-m-LDPC-CC that satisfies the condition of C#2, when $b_{\#q,i}$ mod m≥$b_{\#q,j}$ mod m in P(D) for $^\forall q$, |$b_{\#q,i}$ mod m−$b_{\#q,j}$ mod m| is an even number, where i≠j.

In parity check polynomial (82) that satisfies 0 of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ that satisfy C#5.2. At this time, according to feature 1, when q is an odd number, only check nodes corresponding to odd-numbered parity check polynomials are present in a tree whose starting point is a check node corresponding to the #q-th parity check polynomial that satisfies 0 of equation 82. On the other hand, when q is an even number, only check nodes corresponding to even-numbered parity check polynomials are present in a tree whose starting point is a check node corresponding to the #q-th parity check polynomial that satisfies 0 of equation 82.

[Design Method of Regular TV-m-LDPC-CC]

A design policy will be considered for providing high error correction capability in the regular TV-m-LDPC-CC that satisfies the condition of C#2. Here, a case of C#6.1, C#6.2 or the like will be considered.

C#6.1: In parity check polynomial (82) that satisfies 0 of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ (where i≠j). At this time, all check nodes corresponding to #0 to #m−1 parity check polynomials for $^\forall q$ are not present in a tree whose starting point is a check node corresponding to the #q-th parity check polynomial that satisfies 0 of equation 82.

C#6.2: In parity check polynomial (82) that satisfies 0 of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ (where i≠j). At this time, all check nodes corresponding to #0 to #m−1 parity check polynomials for $^\forall q$ are not present in a tree whose starting point is a check node corresponding to the #q-th parity check polynomial that satisfies 0 of equation 82.

In such cases as C#6.1 and C#6.2, since "all check nodes corresponding to #0 to #m−1 parity check polynomials for $^\forall q$ are not present," the effect in inference #1 when the time varying period is increased is not obtained. Therefore, with the above description taken into consideration, the following design policy is given to provide high error correction capability.

[Design policy]: In the regular TV-m-LDPC-CC that satisfies the condition of C#2, a condition of C#7.1 is provided with attention focused on one of $X_1(D), \ldots, X_{n-1}(D)$.

C#7.1: A case will be considered where a tree is drawn exclusively for variable nodes corresponding to $D^{a\#q,p,i}X_p(D)$ and $D^{a\#q,p,j}X_p(D)$ in parity check polynomial (82) that satisfies 0 of a regular TV-m-LDPC-CC that satisfies the condition of C#2 (where i≠j). At this time, check nodes corresponding to all #0 to #m−1 parity check polynomials are present in a tree whose starting point is a check node corresponding to the #q-th parity check polynomial that satisfies 0 of equation 82 for $^\forall q$.

Similarly, in the regular TV-m-LDPC-CC that satisfies the condition of C#2, the condition of C#7.2 is provided with attention focused on the term of P(D).

C#7.2: In parity check polynomial (82) that satisfies 0 of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ (where i≠j). At this time, check nodes corresponding to all #0 to #m−1 parity check polynomials are present in a tree whose starting point is a check node corresponding to the #q-th parity check polynomial that satisfies 0 of equation 82 for $^\forall q$.

In the present design policy, it is assumed that C#7.1 holds true for $^\forall (i, j)$ and also holds true for $^\forall p$, and C#7.2 holds true for $^\forall (i, j)$.

Inference #1 is then satisfied.

Next, a theorem relating to the design policy will be described.

Theorem 2: Satisfying the design policy requires $a_{\#q,p,i}$ mod m≠$a_{\#q,p,j}$ mod m and $b_{\#q,i}$ mod m≠$b_{\#q,j}$ mod m to be satisfied, where i≠j.

Proof: When a tree is drawn exclusively for variable nodes corresponding to $D^{a\#q,p,i}X_p(D)$ and $D^{a\#q,p,j}X_p(D)$ in equation 82 of the parity check polynomial that satisfies 0 of the regular TV-m-LDPC-CC that satisfies the condition of C#2, if theorem 2 is satisfied, check nodes corresponding to all #0 to #m−1 parity check polynomials are present in a tree whose starting point is a check node corresponding to the #q-th parity check polynomial that satisfies 0 of equation 82. This holds true for all p's. Similarly, when a tree is drawn exclusively for variable nodes corresponding to $D^{b\#q,i}P(D)$ and $D^{b\#q,j}P(D)$ in equation 82 of the parity check polynomial that satisfies 0 of the regular TV-m-LDPC-CC that satisfies the condition of C#2, if theorem 2 is satisfied, check nodes corresponding to all #0 to #m−1 parity check polynomials are present in a tree whose starting point is a check node corresponding to the #q-th parity check polynomial that satisfies 0 of equation 82. Therefore, theorem 2 is proven.

☐ (end of proof)

Theorem 3: In the regular TV-m-LDPC-CC that satisfies the condition of C#2, when time varying period in is an even number, there is no code that satisfies the design policy.

Proof: In parity check polynomial (82) that satisfies 0 of the regular TV-m-LDPC-CC that satisfies the condition of C#2, when p=1, if it is possible to prove that the design policy is not satisfied, this means that theorem 3 has been proven. Therefore, the proof is continued assuming p=1.

In the regular TV-m-LDPC-CC that satisfies the condition of C#2, $(N_{p,1}, N_{p,2}, N_{p,3})$=("o", "o", "o")∪("o", "o", "e")∪("o", "e", "e")∪("e", "e", "e") can represent all cases. However, "o" represents an odd number and "e" represents an even number. Therefore, $(N_{p,1}, N_{p,2}, N_{p,3})$=("o", "o", "o")∪("o", "o", "e")∪("o", "e", "e")∪("e", "e", "e") shows that C#7.1 is not satisfied. ∪ represents a union.

When $(Np_{,1}, Np_{,2}, Np_{,3})$=("o", "o", "o"), C#5.1 is satisfied so that i, j=1, 2, 3 (i≠j) is satisfied in C#5.1 no matter what the value of the set of (i, j) may be.

When $(Np_{,1}, Np_{,2}, Np_{,3})$=("o", "o", "e"), C#5.1 is satisfied when (i, j)=(1, 2) in C#5.1.

When $(Np_{,1}, Np_{,2}, Np_{,3})$=("o", "e", "e"), C#5.1 is satisfied when (i, j)=(2, 3) in C#5.1.

When $(Np_{,1}, Np_{,2}, Np_{,3})$=("e", "e", "e"), C#5.1 is satisfied so that i, j=1, 2, 3 (i≠j) is satisfied in C#5.1 no matter what the value of the set of (i, j) may be.

Therefore, when $(Np_{,1}, Np_{,2}, Np_{,3})$=("o", "o", "o")∪("o", "o", "e")∪("o", "e", "e")∪("e", "e", "e"), there are always sets of (i, j) that satisfy C#5.1. Thus, theorem 3 has been proven according to feature 4.

☐ (end of proof)

Therefore, to satisfy the design policy, time varying period in must be an odd number. Furthermore, to satisfy the design policy, the following conditions are effective according to feature 2 and feature 3.

Time varying period m is a prime number.

Time varying period m is an odd number and the number of divisors of m is small.

Especially, when the condition that "time varying period m is an odd number and the number of divisors of m is small" is taken into consideration, the following cases can be considered as examples of conditions under which codes of high error correction capability are likely to be achieved:

(1) The time varying period is assumed to be α×β, where α and β are odd numbers other than 1 and are prime numbers.

(2) The time varying period is assumed to be $\alpha^n$, where α is an odd number other than 1 and is a prime number, and n is an integer equal to or greater than 2.

(3) The time varying period is assumed to be α×β×γ, where α, β and γ are odd numbers other than 1 and are prime numbers.

However, when z mod m (z is an integer equal to or greater than 0) is computed, there are in values that can be taken, and therefore the number of values taken when z mod m is computed increases as m increases. Therefore, when m is increased, it is easier to satisfy the above-described design policy. However, when time varying period in is assumed to be an even number, this does not mean that a code having high error correction capability cannot be obtained.

4: Example of code search and characteristic evaluation
Example of Code Search

Table 9 shows examples of LDPC-CC (#1 and #2 in Table 9) based on parity check polynomials of time varying periods of 2 and 3 discussed so far. In addition, Table 9 also shows an example of regular TV11-LDPC-CC (#3 in Table 9) of a time varying period of 11 that satisfies the aforementioned design policy. However, it is assumed that the coding rate set for the code search is R=2/3 and maximum constraint length $K_{max}$ is 600.

TABLE 9

Example of LDPC-CC based on parity check polynomial of codding rate R = 2/3

| Index | Codes | $K_{max}$ | R | |
|---|---|---|---|---|
| #1 | TV2 | 600 | 2/3 | $(A_{X1,0}(D), A_{X2,0}(D), B_0(D)) = (D^{490} + D^{269} + D^{33} + 1, D^{260} + D^{198} + D^{10} + 1, D^{548} + D^{267} + D^{223} + 1)$ |
| | | | | $(A_{X1,1}(D), A_{X2,1}(D), B_1(D)) = (D^{558} + D^{215} + D^{124} + 1, D^{591} + D^{154} + D^7 + 1, D^{594} + D^{425} + D^{137} + 1)$ |
| #2 | TV3 | 600 | 2/3 | $(A_{X1,0}(D), A_{X2,0}(D), B_0(D)) = (D^{500} + D^{310} + 1, D^{506} + D^{145} + 1, D^{502} + D^{188} + 1)$ |
| | | | | $(A_{X1,1}(D), A_{X2,1}(D), B_1(D)) = (D^{413} + D^{175} + 1, D^{455} + D^{178} + 1, D^{514} + D^{452} + 1)$ |
| | | | | $(A_{X1,2}(D), A_{X2,2}(D), B_2(D)) = (D^{523} + D^{164} + 1, D^{568} + D^{140} + 1, D^{257} + D^{208} + 1)$ |
| #3 | TV11 | 600 | 2/3 | $(A_{X1,0}(D), A_{X2,0}(D), B_0(D)) = (D^{552} + D^{150} + 1, D^{575} + D^{83} + 1, D^{588} + D^{23} + 1)$ |
| | | | | $(A_{X1,1}(D), A_{X2,1}(D), B_1(D)) = (D^{585} + D^{392} + 1, D^{597} + D^{523} + 1, D^{254} + D^{49} + 1)$ |
| | | | | $(A_{X1,2}(D), A_{X2,2}(D), B_2(D)) = (D^{541} + D^{469} + 1, D^{520} + D^{17} + 1, D^{408} + D^{115} + 1)$ |
| | | | | $(A_{X1,3}(D), A_{X2,3}(D), B_3(D)) = (D^{563} + D^{282} + 1, D^{531} + D^{281} + 1, D^{544} + D^{474} + 1)$ |
| | | | | $(A_{X1,4}(D), A_{X2,4}(D), B_4(D)) = (D^{579} + D^{541} + 1, D^{575} + D^{292} + 1, D^{335} + D^{155} + 1)$ |
| | | | | $(A_{X1,5}(D), A_{X2,5}(D), B_5(D)) = (D^{596} + D^{271} + 1, D^{575} + D^{523} + 1, D^{529} + D^{302} + 1)$ |
| | | | | $(A_{X1,6}(D), A_{X2,6}(D), B_6(D)) = (D^{552} + D^{62} + 1, D^{545} + D^{531} + 1, D^{595} + D^{566} + 1)$ |
| | | | | $(A_{X1,7}(D), A_{X2,7}(D), B_7(D)) = (D^{596} + D^{557} + 1, D^{520} + D^{193} + 1, D^{148} + D^{144} + 1)$ |
| | | | | $(A_{X1,8}(D), A_{X2,8}(D), B_8(D)) = (D^{596} + D^{524} + 1, D^{575} + D^{358} + 1, D^{357} + D^{298} + 1)$ |
| | | | | $(A_{X1,9}(D), A_{X2,9}(D), B_9(D)) = (D^{552} + D^{150} + 1, D^{564} + D^{39} + 1, D^{463} + D^{60} + 1)$ |
| | | | | $(A_{X1,10}(D), A_{X2,10}(D), B_{10}(D)) = (D^{541} + D^{513} + 1, D^{531} + D^{72} + 1, D^{522} + D^{474} + 1)$ |

Figure 40:
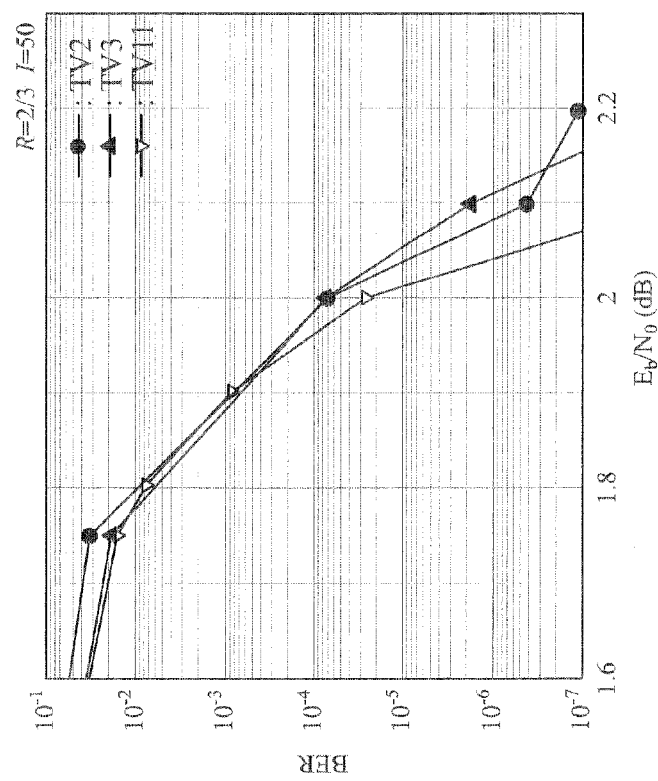
FIG. 40 shows a BER characteristic of regular TV11-LDPC-CCs of #1, #2 and #3 in Table 9.

Evaluation of BER Characteristic:

FIG. 40 shows a relationship of BER (BER characteristic) with respect to $E_b/N_o$ (energy per bit-to-noise spectral density ratio) of a TV2-LDPC-CC (#1 in Table 9), regular TV3-LDPC-CC (#2 in Table 9) and regular TV11-LDPC-CC (#3 in Table 9) of a coding rate of R=2/3 in an AWGN (Additive White Gaussian Noise) environment. However, in simulation, it is assumed that the modulation scheme is BPSK (Binary Phase Shift Keying), BP decoding based on Normalized BP (1/v=0.75) is used as the decoding method and the number of iteration I=50. Here, v is a normalization coefficient.

As shown in FIG. 40, when $E_b/N_o$=2.0 or greater, it is clear that the BER characteristic of the regular TV11-LDPC-CC is better than the BER characteristics of TV2-LDPC-CC and TV3-LDPC-CC.

From above, it is possible to confirm that the TV-m-LDPC-CC of a greater time varying period based on the aforementioned design policy has better error correction capability than that of the TV2-LDPC-CC and TV3-LDPC-CC and confirm the effectiveness of the design policy discussed above.

(Embodiment 7)

The present embodiment will describe a reordering method of the erasure correction coding processing section in a packet layer when an LDPC-CC of a coding rate of (n−1)/n and a time varying period of h (h is an integer equal to or greater than 4) described in Embodiment 1 is applied to an erasure correction scheme. The configuration of the erasure correction coding processing section according to the present embodiment is common to that of the erasure correction coding processing section shown in FIG. 22 or FIG. 23 or the like, and will therefore be described using FIG. 22 or FIG. 23.

Aforementioned FIG. 8 shows an example of parity check matrix when an LDPC-CC of a coding rate of (n−1)/n and a time varying period of m described in Embodiment 1 is used.

A g-th (g=0, 1, . . . , h−1) parity check polynomial of a coding rate of (n−1)/n and a time varying period of h is represented as shown in equation 83.

[83]

$$(D^{a\#g,1,1}+D^{a\#g,1,2}+1)X_1(D)+(D^{a\#g,2,1}+D^{a\#g,2,2}+1)X_2(D)+ \ldots +(D^{a\#g,n-1,1}+D^{a\#g,n-1,2}+1)X_{n-1}(D)+(D^{b\#g,1}+D^{b\#g,2}+1)P(D)=0$$ (Equation 83)

In equation 83, $a_{\#g,p,1}$ and $a_{\#g,p,2}$ are natural numbers equal to or greater than 1, and hold $a_{\#g,p,1} \neq a_{\#g,p,2}$. Also, $b_{\#g,1}$ and $b_{\#g,2}$ are natural numbers equal to or greater than 1 and hold $b_{\#g,1} \neq b_{\#g,2}$ (g=0, 1, 2, . . . , h−2, h−1; p=1, 2, . . . , n−1).

Figure 41:
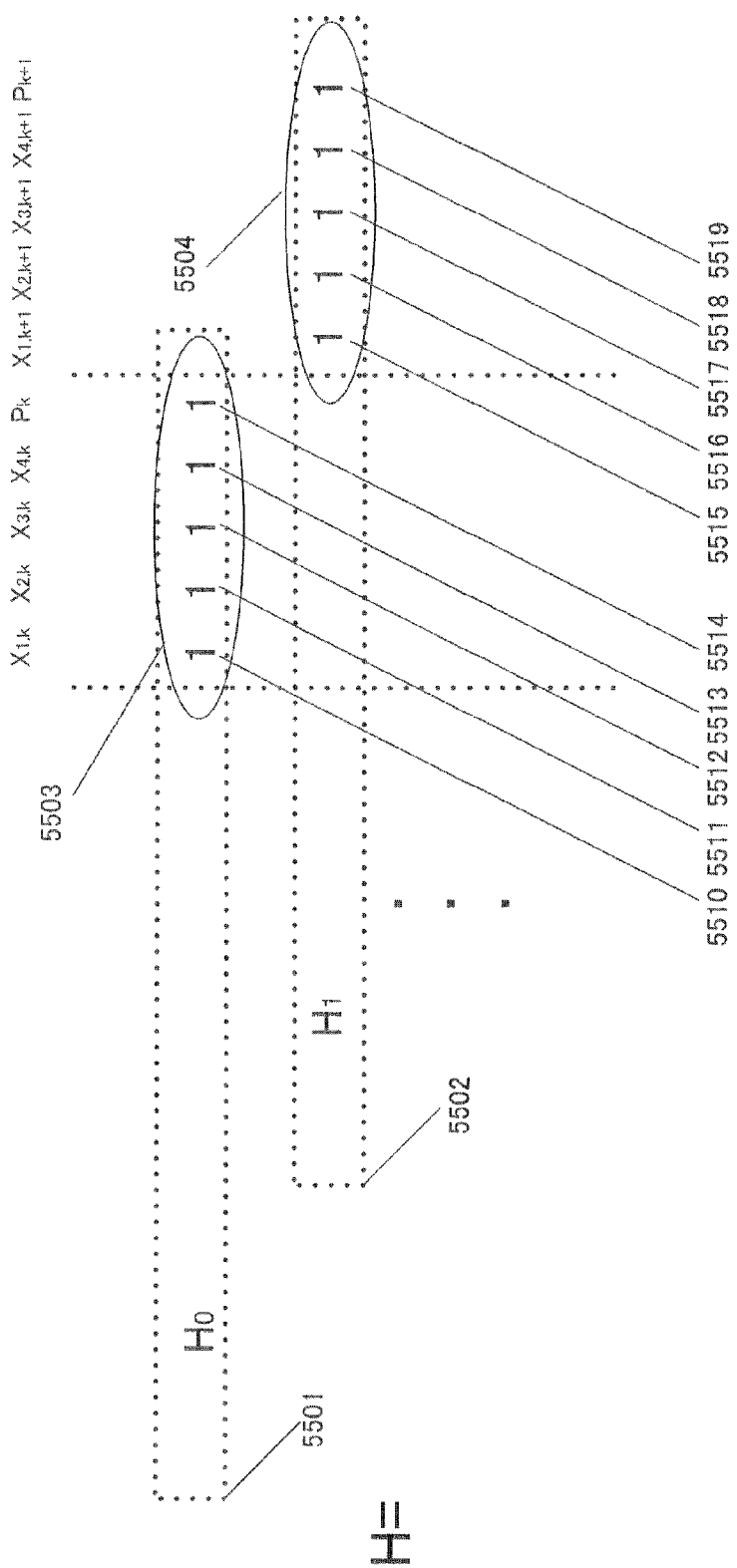
FIG. 41 shows a parity check matrix corresponding to g-th (g=0, 1, . . . , h−1) parity check polynomial (83) of a coding rate of (n−1)/n and a time varying period of h.

Referring to the parity check matrix shown in FIG. 8, the parity check matrix corresponding to the g-th (g=0, 1, . . . , h−1) parity check polynomial (83) of a coding rate of (n−1)/n and a time varying period of h is represented as shown in FIG. 41. At this time, information X1, X2, . . . , Xn−1 and parity P at point in time k are represented by $X_{1,k}, X_{2,k}, \ldots, V_{n-1,k}$, and $P_k$, respectively.

In FIG. 41, a portion assigned reference numeral 5501 is part of a row of the parity check matrix and is a vector corresponding to a 0-th parity check polynomial that satisfies 0 of equation 83. Similarly, a portion assigned reference numeral 5502 is part of a row of the parity check matrix and is a vector corresponding to a first parity check polynomial that satisfies 0 of equation 83.

"11111" assigned reference numeral 5503 corresponds to terms of X1(D), X2(D), X3(D), X4(D) and P(D) of the 0-th parity check polynomial that satisfies 0 of equation 83. When compared with $X_{1,k}, X_{2,k}, \ldots, X_{n-1,k}$, and $P_k$ at point in time k, "1" of reference numeral 5510 corresponds to $X_{1,k}$, "1" of reference numeral 5511 corresponds to $X_{2,k}$, "1" of reference numeral 5512 corresponds to $X_{3,k}$, "1" of reference numeral 5513 corresponds to $X_{4,k}$, and "1" of reference numeral 5514 corresponds to $P_k$ (see equation 60).

Similarly, "11111" assigned reference numeral 5504 corresponds to terms of X1(D), X2(D), X3(D), X4(D) and P(D) of the first parity check polynomial that satisfies 0 of equation 83. When compared with $X_{1,k+1}, X_{2,k+1}, \ldots, X_{n-1,k+1}$, and $P_{k+1}$ at point in time k+1, "1" of reference numeral 5515 corresponds to $X_{1,k+1}$, "1" of reference numeral 5516 corresponds to $X_{2,k+1}$, "1" of reference numeral 5517 corresponds to $X_{3,k+1}$, "1" of reference numeral 5518 corresponds to $X_{4,k+1}$, and "1" of reference numeral 5519 corresponds to $P_{k+1}$ (see equation 60).

Next, the method of reordering information bits of an information packet when information packets and parity packets are configured separately (see FIG. 22) will be described using FIG. 42.

Figure 42:
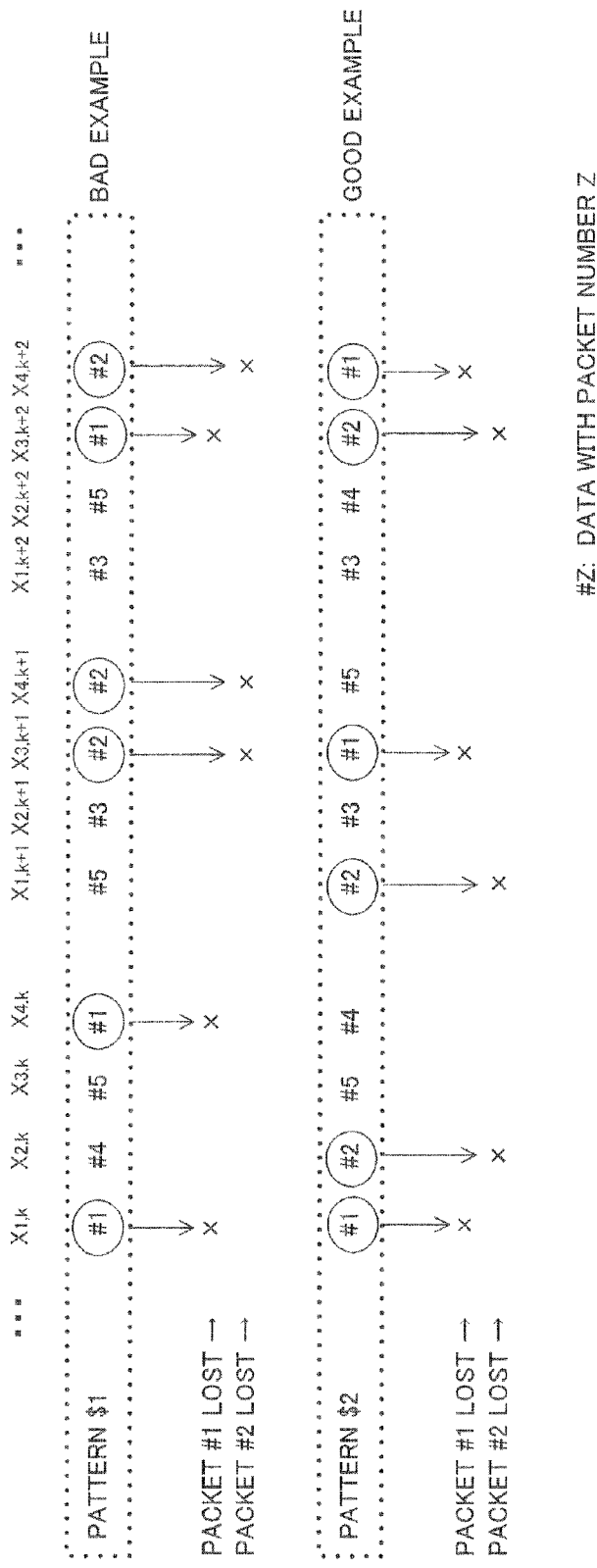
FIG. 42 shows an example of reordering pattern when information packets and parity packets are configured independently.

FIG. 42 shows an example of reordering pattern when information packets and parity packets are configured separately.

Pattern $1 shows a pattern example with low erasure correction capability and pattern $2 shows a pattern example with high erasure correction capability. In FIG. 42, #Z indicates data of a Z-th packet.

In pattern $1, $X_{1,k}$ and $X_{4,k}$ among $X_{1,k}, X_{2,k}, X_{3,k}$, and $X_{4,k}$ at point in time k are data of the same packet (packet #1). Similarly, $X_{3,k+1}$ and $X_{4,k+1}$ at point in time k+1 are also data of the same packet (packet #2). At this time, when, for example, packet #1 is lost (loss), it is difficult to reconstruct lost bits ($X_{1,k}$ and $X_{4,k}$) through row computation in BP decoding. Similarly, when packet #2 is lost (loss), it is difficult to reconstruct lost bits ($X_{3,k+1}$ and $X_{4,k+1}$) through row computation in BP decoding. From the points described above, pattern $1 can be said to be a pattern example with low erasure correction capability.

On the other hand, in pattern $2, with regard to $X_{1,k}, X_{2,k}, X_{3,k}$, and $X_{4,k}$, it is assumed that $X_{1,k}, X_{2,k}, X_{3,k}$, and $X_{4,k}$ are comprised of data with different packet numbers at all points in time k. At this time, since it is more likely to be able to reconstruct lost bits through row computation in BP decoding, pattern $2 can be said to be a pattern example with high erasure correction capability.

In this way, when information packets and parity packets are configured separately (see FIG. 22), reordering section 2215 may adopt pattern $2 described above as the reordering pattern. That is, reordering section 2215 receives information packet 2243 (information packets #1 to #n) as input and may reorder the sequence of information so that data of different packet numbers are assigned to $X_{1,k}, X_{2,k}, X_{3,k}$ and $X_{4,k}$ at all points in time k.

Next, the method of reordering information bits in an information packet when information packets and parity packets are configured without distinction (see FIG. 23) will be described using FIG. 43.

Figure 43:
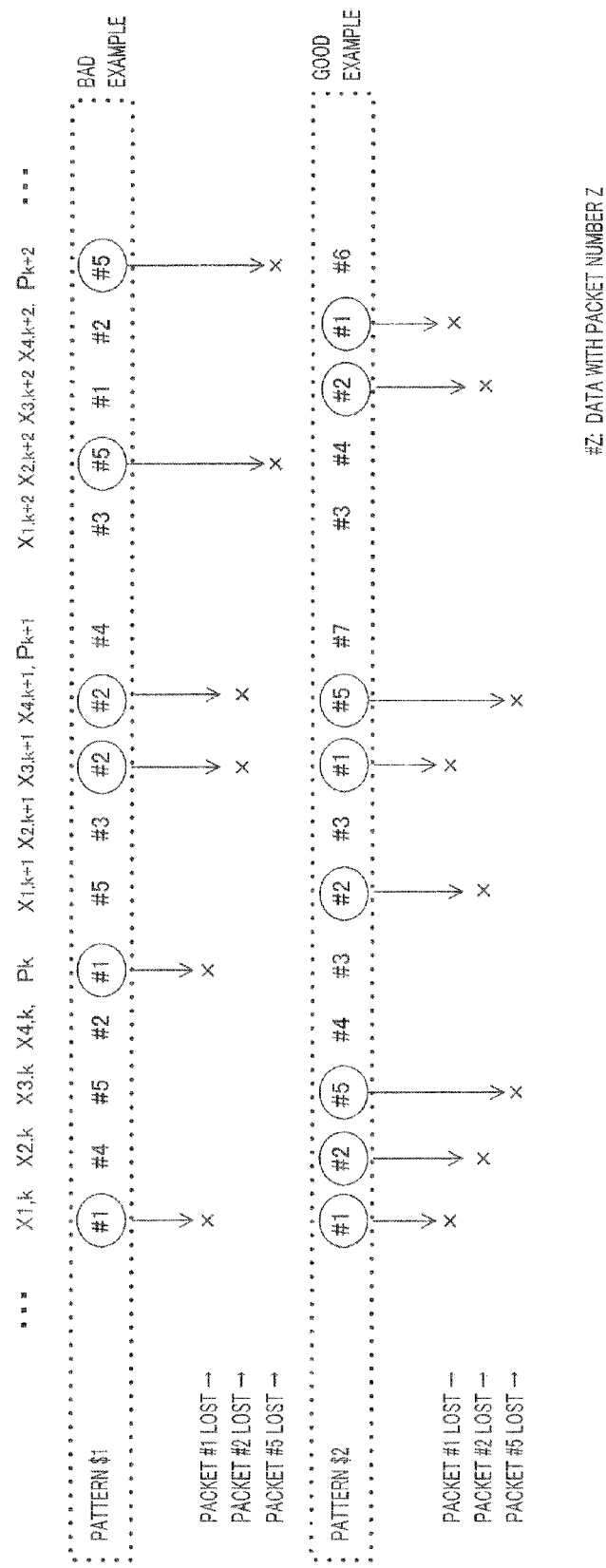
FIG. 43 shows an example of reordering pattern when information packets and parity packets are configured without distinction therebetween.

FIG. 43 shows an example of reordering pattern when information packets and parity packets are configured without distinction.

In pattern $1, $X_{1,k}$, and $P_k$ among $X_{1,k}, X_{2,k}, X_{3,k}, X_{4,k}$, and $P_k$ at point in time k are comprised of data of the same packet. Similarly, $X_{3,k+1}$ and $X_{4,k+1}$ at point in time k+1 are also comprised of data of the same packet and $X_{2,k+2}$, and $P_{k+2}$ at point in time k+2 are also comprised of data of the same packet.

At this time, when, for example, packet #1 is lost, it is difficult to reconstruct lost bits ($X_{1,k}$ and $P_k$) through row computation in BP decoding. Similarly, when packet #2 is lost, it is not possible to reconstruct lost bits ($X_{3,k+1}$ and $X_{4,k+1}$) through row computation in BP decoding, and when packet #5 is lost, it is difficult to reconstruct lost bits ($X_{2,k+2}$ and $P_{k+2}$) through row computation in BP decoding. From the point described above, pattern $1 can be said to be a pattern example with low erasure correction capability.

On the other hand, in pattern $2, with regard to $X_{1,k}, X_{2,k}, X_{3,k}, X_{4,k}$ and $P_k$, it is assumed that $X_{1,k}, X_{2,k}, X_{3,k}, X_{4,k}$ and $P_k$ are comprised of data of different packet numbers at all points in time k. At this time, since it is more likely to be able to reconstruct lost bits through row computation in BP decoding, pattern 2 can be said to be a pattern example with high erasure correction capability.

Thus, when information packets and parity packets are configured without distinction (see FIG. 23), erasure correction coding section 2314 may adopt pattern $2 described above as the reordering pattern. That is, erasure correction coding section 2314 may reorder information and parity so that information $X_{1,k}, X_{2,k}, X_{3,k}, X_{4,k}$ and parity $P_k$ are assigned to packets with different packet numbers at all points in time k.

As described above, the present embodiment has proposed a specific configuration for improving erasure correction capability as a reordering method at the erasure correction coding section in a packet layer when the LDPC-CC of a coding rate of (n−1)/n and a time varying period of h (It is an integer equal to or greater than 4) described in Embodiment 1 is applied to an erasure correction scheme. However, time varying period h is not limited to an integer equal to or greater than 4, but even when the time varying period is 2 or 3, erasure correction capability can be improved by performing similar reordering.

(Embodiment 8)

The present embodiment will describe an encoding method (encoding method at a packet level) in a layer higher than the physical layer in detail.

Figure 44:
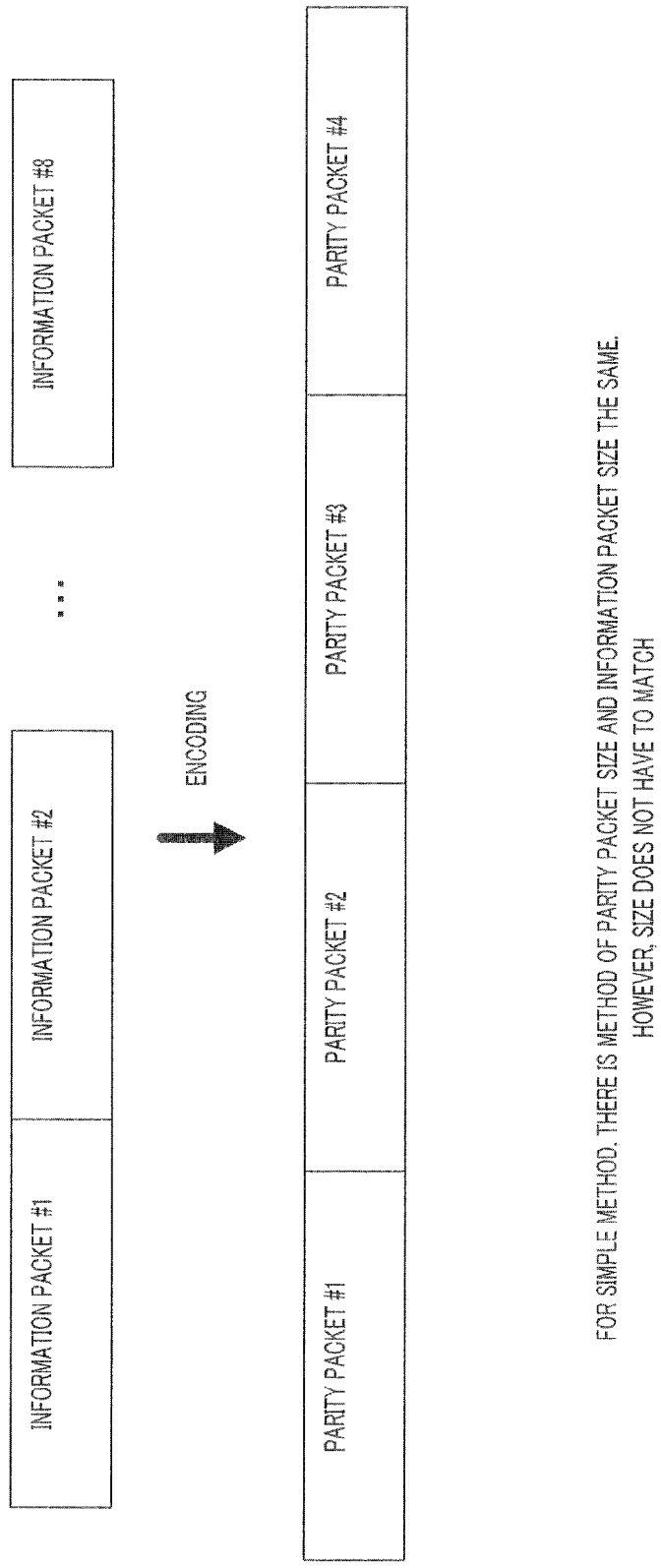
FIG. 44 shows details of the encoding method (encoding method at packet level) in a layer higher than a physical layer.

FIG. 44 shows an example of encoding method in a layer higher than the physical layer. In FIG. 44, it is assumed that the coding rate of an error correction code is 2/3 and the data size except redundant information such as control information and error detection code in one packet is 512 bits.

In FIG. 44, an encoder that performs encoding in a layer higher than the physical layer (encoding at a packet level) performs encoding on information packets #1 to #8 after reordering and obtains parity bits. The encoder then bundles the parity bits obtained into a unit of 512 bits to configure one parity packet. Here, since the coding rate supported by the encoder is 2/3, four parity packets, that is, parity packets #1 to #4 are generated. Thus, the information packets described in the other embodiments correspond to information packets #1 to #8 in FIG. 44 and the parity packets correspond to parity packets #1 to #4 in FIG. 44.

One simple method of setting the size of a parity packet is a method that sets the same size for a parity packet and an information packet. However, these sizes need not be the same.

Figure 45:
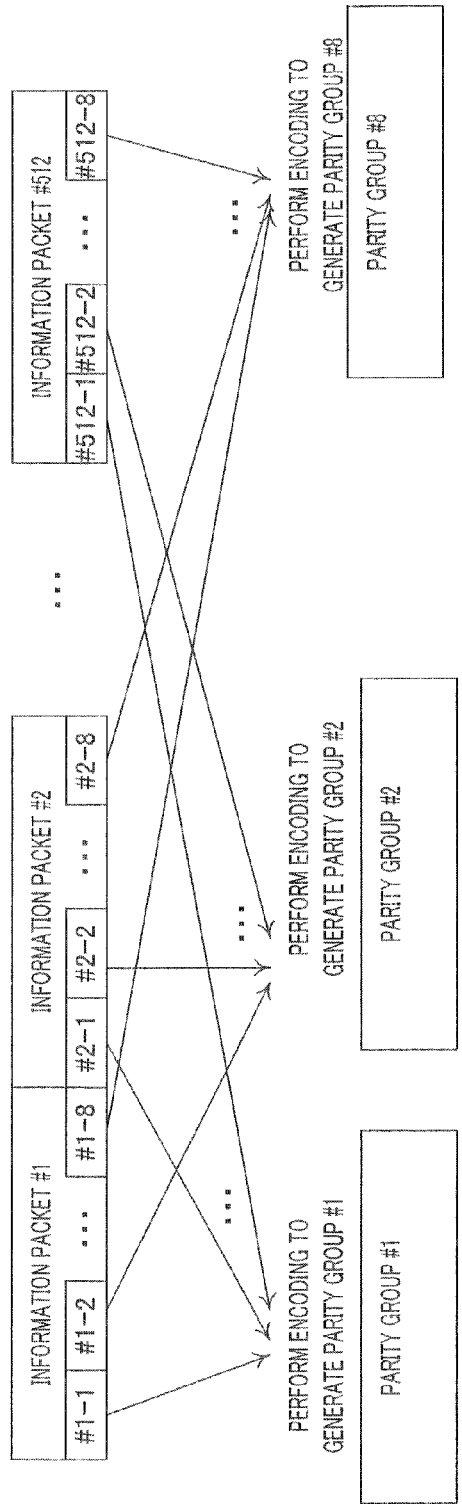
FIG. 45 shows details of another encoding method (encoding method at packet level) in a layer higher than a physical layer.

FIG. 45 shows an example of encoding method in a layer higher than the physical layer different from FIG. 44. In FIG. 45, information packets #1 to #512 are original information packets and the data size of one packet except redundant information such as control information, error detection code is assumed to be 512 bits. The encoder then divides information packet #k (k=1, 2, . . . , 511, 512) into 8 portions and generates sub-information packets #k–1, #k–2, and #k–8.

Figure 46:
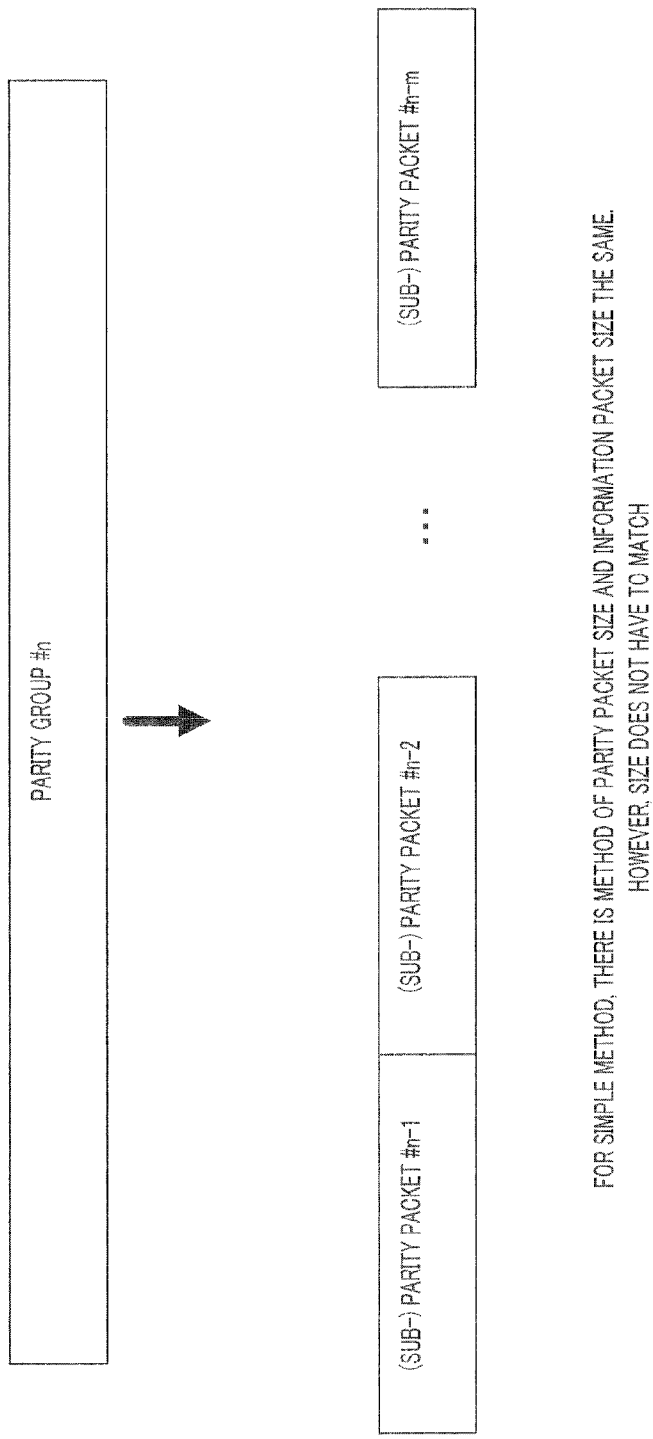
FIG. 46 shows a configuration example of parity group and sub-parity packets.

The encoder then applies encoding to sub-information packets #1-n, #2-n, #3-n, . . . , #511-n, #512-n (n=1, 2, 3, 4, 5, 6, 7, 8) and forms parity group #n. The encoder then divides parity group #n into m portions as shown in FIG. 46 and forms (sub-) parity packets #n–1, #n–2, . . . and #n–m.

Thus, the information packets described in Embodiment 5 correspond to information packets #1 to #512 in FIG. 45 and parity packets are (sub-) parity packets #n–1, #n–2, and #n–m (n=1, 2, 3, 4, 5, 6, 7, 8) in FIG. 37. At this time, one information packet has 512 bits, while one parity packet need not always have 512 bits. That is, one information packet and one parity packet do not always need to have the same size.

The encoder may regard a sub-information packet itself obtained by dividing an information packet as one information packet.

As another method, Embodiment 5 can also be implemented by considering the information packets described in Embodiment 5 as sub-information packets #k–1, #k–2, and #k–8 (k=1, 2, . . . , 511, 512) described in the present embodiment. Particularly, Embodiment 5 has described the method of inserting a termination sequence and the method of configuring a packet. Here, Embodiment 5 can also be implemented by considering "sub-information packets" and "sub-parity packets" in the present embodiment as "sub-information packets" and "parity packets" described in Embodiment 5. However, the embodiment can be more easily implemented if the number of bits constituting a sub-information packet is the same as the number of bits constituting a sub-parity packet.

In Embodiment 5, data other than information (e.g. error detection code) is added to an information packet. Furthermore, in Embodiment 5, data other than parity bits is added to a parity packet. However, the conditions relating to termination shown in equation 62 to equation 70 become important conditions when applied to a case not including data other than information bits and parity bits, and a case relating to the number of information bits of an information packet and a case relating to the number of parity bits of a parity packet.

(Embodiment 9)

Embodiment 1 has described an LDPC-CC having good characteristics. The present embodiment will describe a shortening method that makes a coding rate variable when an LDPC-CC described in Embodiment 1 is applied to a physical layer. "Shortening" refers to generating a code of a second coding rate from a code of a first coding rate (first coding rate >second coding rate).

Hereinafter, a shortening method of generating an LDPC-CC of a coding rate of 1/3 from an LDPC-CC of a time varying period of h (h is an integer equal to or greater than 4) of a coding rate of 1/2 described in Embodiment 1 will be described as an example.

A case will be considered where a g-th (g=0, 1, . . . , h–1) parity check polynomial of a coding rate of 1/2 and a time varying period of h is represented as shown in equation 84.

[84]

$$(D^{a_{\#g,1,1}}+D^{a_{\#g,1,2}}+1)X_1(D)+(D^{b_{\#g,1}}+D^{b_{\#g,2}}+1)P(D)=0 \quad \text{(Equation 84)}$$

It is assumed in equation 84 that $a_{\#g,1,1}$ and $a_{\#g,1,2}$ are natural numbers equal to or greater than 1 and $a_{\#g,1,1} \neq a_{\#g,1,2}$ holds true. Furthermore, it is assumed that $b_{\#g,1}$ and $b_{\#g,2}$ are natural numbers equal to or greater than 1 and $b_{\#g,1} \neq b_{\#g,2}$ holds true (g=0, 1, 2, . . . , h–2, h–1).

Equation 84 is assumed to satisfy <condition #17> below.

"$a_{\#0,1,1}$%h=$a_{\#1,1,1}$%h=$a_{\#2,1,1}$%h=$a_{\#3,1,1}$%h=...=$a_{\#g,1,1}$%h=...=$a_{\#h-2,1,1}$%h=$a_{\#h-1,1,1}$%h=$v_{p=1}$ ($v_{p=1}$: fixed-value)"

"$b_{\#0,1}$%h=$b_{\#1,1}$%h=$b_{\#2,1}$%h=$b_{\#3,1}$%h=...=$b_{\#g,1}$%h=...=$b_{\#h-2,1}$%h=$b_{\#h-1,1}$%h=w (w: fixed-value)"

"$a_{\#0,1,2}$%h=$a_{\#1,1,2}$%h=$a_{\#2,1,2}$%h=$a_{\#3,1,2}$%h=...=$a_{\#g,1,2}$%h=...=$a_{\#h-2,1,2}$%h=$a_{\#h-1,1,2}$%h=$v_{p=1}$ ($v_{p=1}$: fixed-value)"

"$b_{\#0,2}$h=$b_{\#1,2}$%h=$b_{\#2,2}$%h=$b_{\#3,2}$%h=...=$b_{\#g,2}$%h=...=$b_{\#h-2,2}$%h=$b_{\#h-1,2}$%h=z (z: fixed-value)"   <Condition #17>

When a parity check matrix is created as in the case of Embodiment 4, if it is assumed that information and parity at time i are Xi and Pi respectively, codeword w is represented by w=(X0, P0, X1, P1, . . . , Xi, Pi, . . . )$^T$.

At this time, the shortening method of the present embodiment employs the following methods.

[Method #1-1]

Method #1-1 inserts known information (e.g. 0's) in information X on a regular basis (insertion rule of method #1-1). For example, known information is inserted into hk (=h×k) bits of information 2hk (=2×h×k) bits (insertion step) and encoding is performed on information of 2hk bits including known information using an LDPC-CC of a coding rate of 1/2. Parity of 2hk bits is generated (coding step) in this way. At this time, the known information of hk bits of the information of 2hk bits is designated bits not to transmit (transmission step). A coding rate of 1/3 can be realized in this way.

Known information is not limited to 0, but may be 1 or a predetermined value other than 1 and may be reported to a communication apparatus of the communicating party or determined as a specification.

Hereinafter, differences from the insertion rule of method #1-1 will be mainly described.

[Method #1-2]

Figure 47:
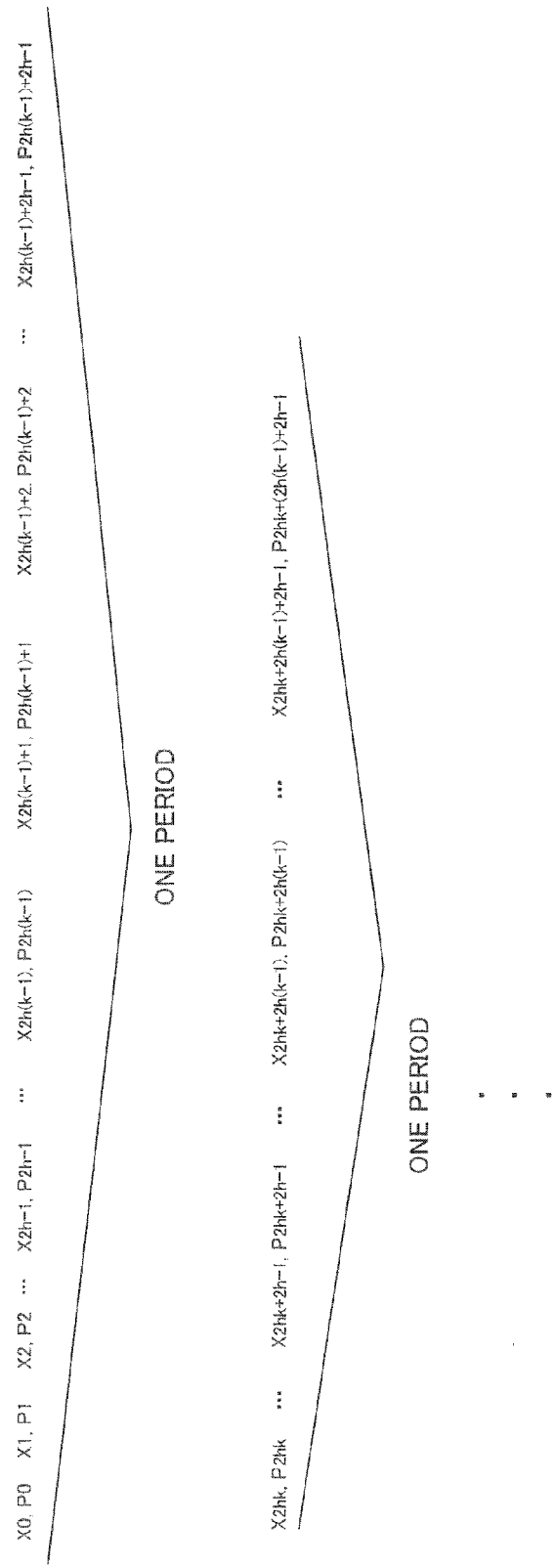
FIG. 47 shows a shortening method [method #1-2]

Unlike method #1-1, as shown in FIG. 47, method #1-2 assumes 2×h×2k bits formed with information and parity as one period and inserts known information at the same position at each period (insertion rule of method #1-2).

The insertion rule for known information (insertion rule of method #1-2) will be described focused on the differences from method #1-1 using FIG. 48 as an example.

Figure 48:
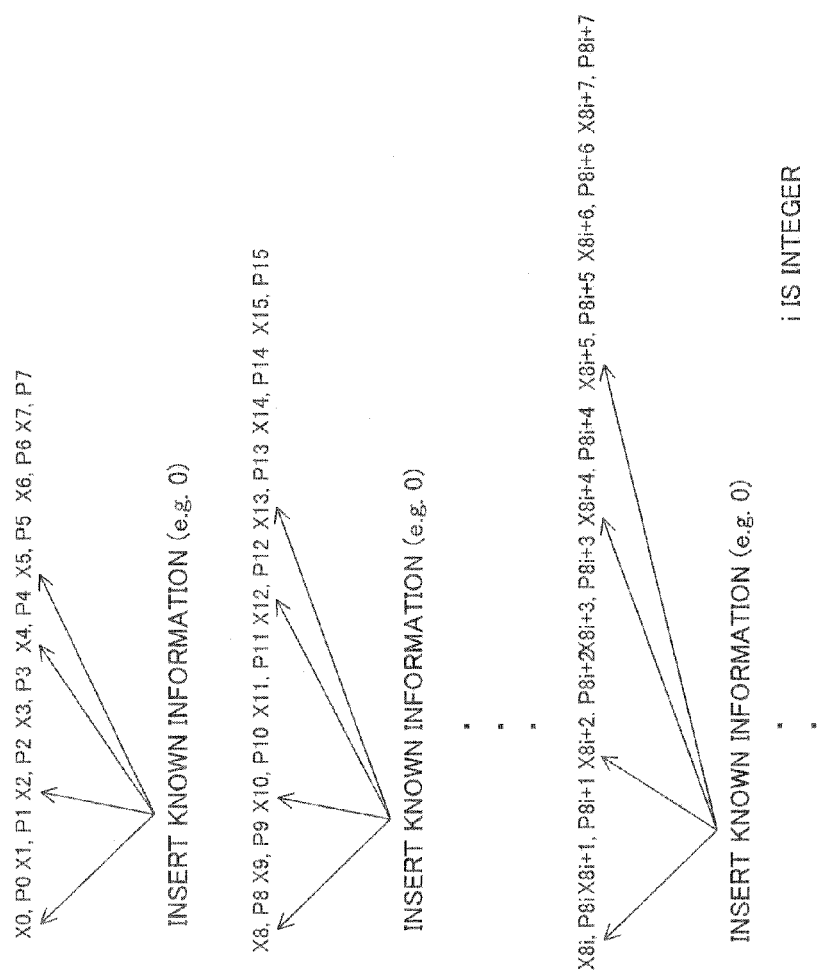
FIG. 48 shows an insertion rule in the shortening method [method #1-2]

FIG. 48 shows an example where when the time varying period is 4, 16 bits formed with information and parity are designated one period. At this time, method #1-2 inserts known information (e.g. 0 (or 1 or a predetermined value)) in X0, X2, X4 and X5 at the first one period.

Furthermore, method #1-2 inserts known information (e.g. 0 (or 1 or a predetermined value)) in X8, X10, X12 and X13 at the next one period, . . . , and inserts known information in X8i, X8i+2, X8i+4 and X8i+5 at an i-th one period. From the i-th one period onward, method #1-2 inserts known information at the same positions at each period.

Next, as with [method #1-1], method #1-2 inserts known information in, for example, hk bits of information 2hk bits and performs encoding on information of 2hk bits including known information using an LDPC-CC of a coding rate of 1/2. Thus, parity of 2hk bits is generated. At this time, when known information of hk bits is assumed to be bits not to transmit, a coding rate of 1/3 can be realized.

Hereinafter, the relationship between positions at which known information is inserted and error correction capability will be described using FIG. 49 as an example.

Figure 49:
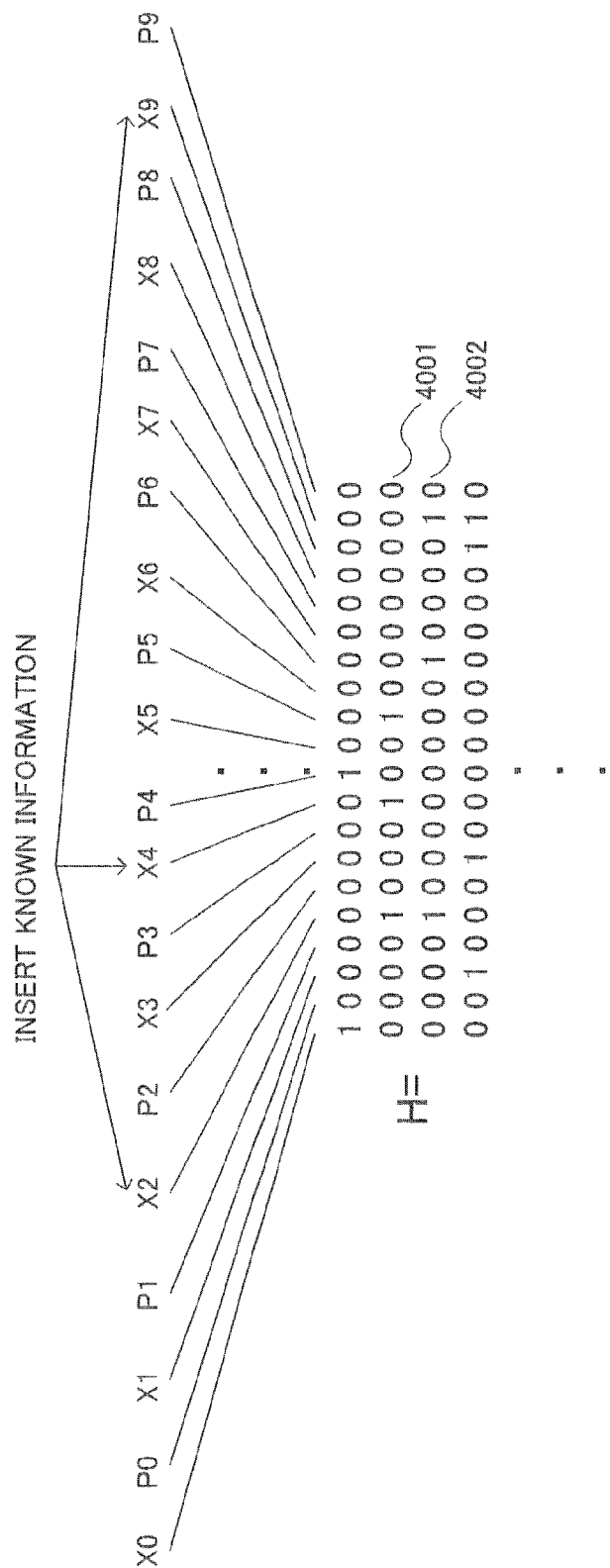
FIG. 49 shows a relationship between positions at which known information is inserted and error correction capability.

FIG. 49 shows the correspondence between part of check matrix H and codeword w (X0, P0, X1, P1, X2, P2, ..., X9, P9). In row 4001 in FIG. 49, elements "1" are arranged in columns corresponding to X2 and X4. Furthermore, in row 4002 in FIG. 49, elements "1" are arranged in columns corresponding to X2 and X9. Therefore, when known information is inserted in X2, X4 and X9, all information corresponding to columns whose elements are "1" in row 4001 and row 4002 is known. Therefore, since unknown values are only parity in row 4001 and row 4002, a log likelihood ratio with high belief can be updated through row computation in BP decoding.

That is, when realizing a lower coding rate than the original coding rate by inserting known information, it is important, from the standpoint of achieving high error correction capability, to increase the number of rows, all of which correspond to known information or rows, a large number of which correspond to known information (e.g. all bits except one bit correspond to known information) of the information out of the parity and information in each row of a check matrix, that is, parity check polynomial.

In the case of a time-varying LDPC-CC, there is regularity in a pattern of parity check matrix H in which elements "1" are arranged. Therefore, by inserting known information on a regular basis at each period based on parity check matrix H, it is possible to increase the number of rows whose unknown values only correspond to parity or rows with fewer unknown information bits when parity and information are unknown. As a result, it is possible to provide an LDPC-CC of a coding rate of 1/3 providing good characteristics.

According to following [method #1-3], it is possible to realize an LDPC-CC having high error correction capability, of a coding rate of 1/3 and a time varying period of h (h is an integer equal to or greater than 4) from the LDPC-CC having good characteristics, of a coding rate of 1/2 and a time varying period of h described in Embodiment 1.

[Method #1-3]

Method #1-3 inserts known information (e.g. 0) in h×k Xj's out of 2×h×k bits of information $X_{2hi}$, $X_{2hi+1}$, $X_{2hi+2}$, ..., $X_{2h+2h-1}$, ..., $X_{2h(i+k-1)}$, $X_{2h(i+k-1)}$, $X_{2h(i+k-11)+2}$, ..., $X_{2h(i+k-1)+h-1}$ for a period of 2×h×2k bits formed with information and parity (since parity is included).

Here, j takes a value of one of 2hi to 2h(i+k−1)+2h−1 and h×k different values are present. Furthermore, known information may be 1 or a predetermined value.

At this time, when known information is inserted in h×k Xj's, it is assumed that, of the remainders after dividing h×k different j's by h, the difference between "the number of remainders that become (0+γ) mod h (where the number of remainders is non-zero)" and "the number of remainders that become ($v_{p=1}$+γ) mod h (where the number of remainders is non-zero)" is 1 or less, the difference between "the number of remainders that become (0+γ) mod h (where the number of remainders is non-zero)" and "the number of remainders that become ($v_{p=1}$+γ) mod h (where the number of remainders is non-zero)" is 1 or less, and the difference between "the number of remainders that become ($v_{p=1}$+γ) mod h (where the number of remainders is non-zero)" and "the number of remainders that become ($y_{p=1}$+γ) mod h (where the number of remainders is non-zero)" is 1 or less. (For $v_{p=1}$, $y_{p=1}$ see <condition #7-1> and <condition #7-2>.) At least one such γ is present.

Thus, by providing a condition for positions at which known information is inserted, it is possible to increase the number of rows in which all information is known information or rows with many pieces of known information (e.g. all bits except one bit correspond to known information) as much as possible in each row of parity check matrix H, that is, a parity check polynomial.

The LDPC-CC of a time varying period of 11 described above satisfies <condition #17>. At this time, since the g-th (g=0, 1, h−1) parity check polynomial is represented as shown in equation 84, the sub-matrix (vector) corresponding to the parity check polynomial of equation 84 in the parity check matrix is represented as shown in FIG. 50.

Figure 50:
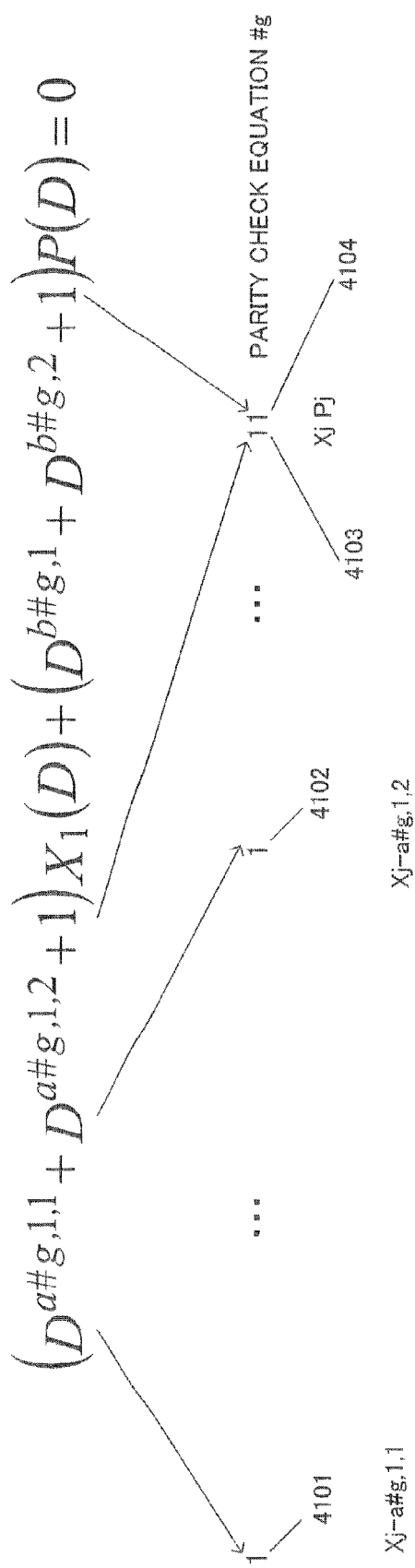
FIG. 50 shows the correspondence between a parity check polynomial and points in time.

In FIG. 50, "1" of reference numeral 4101 corresponds to $D^{a\#g,1,1}X_1(D)$. Furthermore, "1" of reference numeral 4102 corresponds to $D^{a\#g,1,2}X_1(D)$. Furthermore, "1" of reference numeral 4103 corresponds to $X_1(D)$. Furthermore, "1" of reference numeral 4104 corresponds to P(D).

At this time, when "1" of reference numeral 4103 is represented by Xj assuming the point in time thereof to be j, "1" of reference numeral 4101 is represented by Xj−a#g,1,1 and "1" of reference numeral 4102 is represented by Xj−a#g,1,2.

Therefore, when j is considered as a reference position, "1" of reference numeral 4101 is located at a position corresponding to a multiple of $v_{p=1}$ and "1" of reference numeral 4102 is located at a position corresponding to a multiple of $Y_{p=1}$. Furthermore, this does not depend on g.

When this is taken into consideration, the following can be said. That is, [method #1-3] is one of important requirements to "increase the number of rows whose all information is known information or rows with many pieces of known information (e.g. known information except for one bit) as much as possible in each row of parity check matrix H, that is, in the parity check polynomial by providing conditions for positions at which known information is inserted."

As an example, it is assumed that time varying period h=4 and $v_{p=1}$=1, $y_{p=1}$=2. In FIG. 48, a case will be considered where assuming 4×2×2×1 bits (that is, k=1) to be one period, known information (e.g. 0 (or 1 or a predetermined value)) is inserted in $X_{8i}$, $X_{8i+2}$, $X_{8i+4}$, $X_{8i+5}$ out of information and parity $X_{8i}$, $P_{8i}$, $X_{8i+1}$, $P_{8i+1}$, $X_{8i+2}$, $P_{8i+2}$, $X_{8i+3}$, $P_{8i+3}$, $X_{8i+4}$, $P_{8i+4}$, $X_{8i+5}$, $P_{8i+5}$, $X_{8i+6}$, $P_{8i+6}$, $X_{8i+7}$, $P_{8i+7}$.

In this case, as j of Xj in which known information is inserted, there are four different values of 8i, 8i+2, 8i+4 and 8i+5. At this time, the remainder after dividing 8i by 4 is 0, the remainder after dividing 8i+2 by 4 is 2, the remainder after dividing 8i+4 by 4 is 0 and the remainder after dividing 8i+5 by 4 is 1. Therefore, the number of remainders which become 0 is 2, the number of remainders which become $v_{p=1}$=1 is 1, the number of remainders which become $y_{p=1}$=2 is 1, and the insertion rule of above [method #1-3] is satisfied (where γ=0). Therefore, the example shown in FIG. 48 can be said to be an example that satisfies the insertion rule of above [method #1-3].

As a more severe condition of [method #1-3], the following [method #1-3'] can be provided.

[Method #1-3']

Method #1-3' inserts known information (e.g. 0) in h×k Xj's of 2×h×k bits of information $X_{2hi}$, $X_{2hi+1}$, $X_{2hi+2}$, ..., $X_{2hi+2h-1}$, ..., $X_{2h(i+k-1)}$, $X_{2h(i+k-1)+1}$, $X_{2h(i+k-1)+2}$, ..., $X_{2h(i+k-1)+2h-1}$ for a period of 2×h×2k bits formed with information and parity (since parity is included). However, j takes the value of one of 2hi to 2h(i+k−1)+2h−1 and there are h×k different values. Furthermore, known information may be 1 or a predetermined value.

At this time, when known information is inserted in h×k $X_j$'s, it is assumed that, of the remainders after dividing h×k different j's by h, the difference between "the number of remainders that become $(0+\gamma)$ mod h (where the number of remainders is non-zero)" and "the number of remainders that become $(v_{p=1}+\gamma)$ mod h (where the number of remainders is non-zero)" is 1 or less, the difference between "the number of remainders that become $(0+\gamma)$ mod h (where the number of remainders is non-zero)" and "the number of remainders that become $(y_{p=1}+\gamma)$ mod h (where the number of remainders is non-zero)" is 1 or less, and the difference between "the number of remainders that become $(v_{p=1}+\gamma)$ mod h (where the number of remainders is non-zero)" and "the number of remainders that become $(y_{p=1}+\gamma)$ mod h (where the number of remainders is non-zero)" is 1 or less. (For $v_{p=1}$, $y_{p=1}$, see <condition #7-1> and <condition #7-2>.) At least one such γ is present.

For y that does not satisfy the above description, "the number of remainders that become $(0+\gamma)$ mod h," "the number of remainders that become $(v_{p=1}+\gamma)$ mod h" and "the number of remainders that become $(y_{p=1}+\gamma)$ mod h" become 0.

Furthermore, to implement [method #1-3] more effectively, one of the following three conditions may be satisfied in an LDPC-CC based on the aforementioned parity check polynomial with <condition #17> of a time varying period of h (insertion rule of method #1-3'). However, it is assumed that $v_{p=1} < y_{p=1}$ in <condition #17>.

$y_{p=1} - v_{p=1} = v_{p=1} - 0$ that is, $y_{p=1} = 2 \times v_{p=1}$
$v_{p=1} - 0 = h - y_{p=1}$ that is, $v_{p=1} = h - y_{p=1}$
$h - y_{p=1} = y_{p=1} - v_{p=1}$ that is, $h = 2 \times y_{p=1} - v_{p=1}$ When this condition is added, by providing a condition for positions at which known information is inserted, it is possible to increase the number of rows whose all information is known information or rows with many pieces of known information (e.g. all bits except one bit correspond to known information) as much as possible in each row of parity check matrix H, that is, a parity check polynomial. This is because the LDPC-CC has a specific configuration of parity check matrix.

Next, a shortening method will be described which realizes a lower coding rate than a coding rate of $(n-1)/n$ from an LDPC-CC of a time varying period of h (h is an integer equal to or greater than 4) of a coding rate of $(n-1)/n$ (n is an integer equal to or greater than 2) described in Embodiment 1.

A case will be considered where a g-th (g=0, 1, ..., h-1) parity check polynomial of a coding rate of $(n-1)/n$ and a time varying period of h is represented as shown in equation 85.

[85]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad \text{(Equation 85)}$$

In equation 85, it is assumed that $a_{\#g,p,1}$ and $a_{\#g,p,2}$ are natural numbers equal to or greater than 1 and $a_{\#g,p,1} \neq a_{\#g,p,2}$ holds true. Furthermore, it is assumed that $b_{\#g,1}$ and $b_{\#g,2}$ are natural numbers equal to or greater than 1 and $b_{\#g,1} \neq b_{\#g,2}$ holds true (g=0, 1, 2, ..., h-2, h-1; p=1, 2, ..., n-1).

In equation 85, it is assumed that following <condition #18-1> and <condition #18-2> are satisfied.

<Condition #18-1>

"$a_{\#0,1,1}\%h = a_{\#1,1,1}\%h = a_{\#2,1,1}\%h = a_{\#3,1,1}\%h = \ldots = a_{\#g,1,1}\%h = \ldots = a_{\#h-2,1,1}\%h = a_{\#h-1,1,1}\%h = v_{p-1}$ ($v_{p-1}$: fixed-value)"

"$a_{\#0,2,1}\%h = a_{\#1,2,1}\%h = a_{\#2,2,1}\%h = a_{\#3,2,1}\%h = \ldots = a_{\#g,2,1}\%h = \ldots = a_{\#h-2,2,1}\%h = a_{\#h-1,2,1}\%h = v_{p-2}$ ($v_{p-2}$: fixed-value)"

"$a_{\#0,3,1}\%h = a_{\#1,3,1}\%h = a_{\#2,3,1}\%h = a_{\#3,3,1}\%h = \ldots = a_{\#g,3,1}\%h = \ldots = a_{\#h-2,3,1}\%h = a_{\#h-1,3,1}\%h = v_{p-3}$ ($v_{p-3}$: fixed-value)"

"$a_{\#0,4,1}\%h = a_{\#1,4,1}\%h = a_{\#2,4,1}\%h = a_{\#3,4,1}\%h = \ldots = a_{\#g,4,1}\%h = \ldots = a_{\#h-2,4,1}\%h = a_{\#h-1,4,1}\%h = v_{p-4}$ ($v_{p-4}$: fixed-value)"

•
•
•

"$a_{\#0,k,1}\%h = a_{\#1,k,1}\%h = a_{\#2,k,1}\%h = a_{\#3,k,1}\%h = \ldots = a_{\#g,k,1}\%h = \ldots = a_{\#h-2,k,1}\%h = a_{\#h-1,k,1}\%h = v_{p-k}$ ($v_{p-k}$: fixed-value)
(therefore, k = 1, 2, ..., n − 1)"

•
•
•

"$a_{\#0,n-2,1}\%h = a_{\#1,n-2,1}\%h = a_{\#2,n-2,1}\%h = a_{\#3,n-2,1}\%h = \ldots = a_{\#g,n-2,1}\%h = \ldots = a_{\#h-2,n-2,1}\%h = a_{\#h-1,n-2,1}\%q = v_{p-n-2}$
($v_{p-n-2}$: fixed-value)"

"$a_{\#0,n-1,1}\%h = a_{\#1,n-1,1}\%h = a_{\#2,n-1,1}\%h = a_{\#3,n-1,1}\%h = \ldots = a_{\#g,n-1,1}\%h = \ldots = a_{\#h-2,n-1,1}\%h = a_{\#h-1,n-1,1}\%q = v_{p-n-1}$
($v_{p-n-1}$: fixed-value)" and "$b_{\#0,1}\%h = b_{\#1,1}\%h = b_{\#2,1}\%h = b_{\#3,1}\%h = \ldots = b_{\#g,1}\%h = \ldots = b_{\#h-2,1}\%h = b_{\#h-1,1}\%h = w$ (w: fixed-value)"

<Condition #18-2>

"$a_{\#0,1,2}\%h = a_{\#1,1,2}\%h = a_{\#2,1,2}\%h = a_{\#3,1,2}\%h = \ldots = a_{\#g,1,2}\%h = \ldots = a_{\#h-2,1,2}\%h = a_{\#h-1,1,2}\%h = y_{p-1}$ ($y_{p-1}$: fixed-value)"

"$a_{\#0,2,2}\%h = a_{\#1,2,2}\%h = a_{\#2,2,2}\%h = a_{\#3,2,2}\%h = \ldots = a_{\#g,2,2}\%h = \ldots = a_{\#h-2,2,2}\%h = a_{\#h-1,2,2}\%h = y_{p-2}$ ($y_{p-2}$: fixed-value)"

"$a_{\#0,3,2}\%h = a_{\#1,3,2}\%h = a_{\#2,3,2}\%h = a_{\#3,3,2}\%h = \ldots = a_{\#g,3,2}\%h = \ldots = a_{\#h-2,3,2}\%h = a_{\#h-1,3,2}\%h = y_{p-3}$ ($y_{p-3}$: fixed-value)"

"$a_{\#0,4,2}\%h = a_{\#1,4,2}\%h = a_{\#2,4,2}\%h = a_{\#3,4,2}\%h = \ldots = a_{\#g,4,2}\%h = \ldots = a_{\#h-2,4,2}\%h = a_{\#h-1,4,2}\%h = y_{p-4}$ ($y_{p-4}$: fixed-value)"

•
•
•

-continued

"$a_{\#0,k,2}\%h = a_{\#1,k,2}\%h = a_{\#2,k,2}\%h = a_{\#3,k,2}\%h = \ldots = a_{\#g,k,2}\%h = \ldots = a_{\#h-2,k,2}\%h = a_{\#h-1,k,2}\%h = y_{p-k}$ ($y_{p-k}$: fixed-value)
(therefore, k = 1, 2, ..., n − 1)"

●
●
●

"$a_{\#0,n-2,2}\%h = a_{\#1,n-2,2}\%h = a_{\#2,n-2,2}\%h = a_{\#3,n-2,2}\%h = \ldots = a_{\#g,n-2,1}\%h = \ldots = a_{\#h-2,n-2,1}\%h = a_{\#h-1,n-2,1}\%h = y_{p-n-2}$
($y_{p-n-2}$: fixed-value)"
"$a_{\#0,n-1,2}\%h = a_{\#1,n-1,2}\%h = a_{\#2,n-1,2}\%h = a_{\#3,n-1,2}\%h = \ldots = a_{\#g,n-1,2}\%h = \ldots = a_{\#h-2,n-1,2}\%h = a_{\#h-1,n-1,2}\%h = y_{p-n-1}$
($y_{p-n-1}$: fixed-value)" and
"$b_{\#0,2}\%h = b_{\#1,2}\%h = b_{\#2,2}\%h = b_{\#3,2}\%h = \ldots = b_{\#g,2}\%h = \ldots = b_{\#h-2,2}\%h = b_{\#h-1,2}\%h = z$ (z: fixed-value)"

The shortening methods for realizing a lower coding rate than a coding rate of (n−1)/n with high error correction capability using the aforementioned LDPC-CC of a coding rate of (n−1)/n and a time varying period of h are as shown below.

[Method #2-1]

Method #2-1 inserts known information (e.g. 0 (or 1 or a predetermined value)) in information X on a regular basis (insertion rule of method #2-1).

[Method #2-2]

Figure 51:
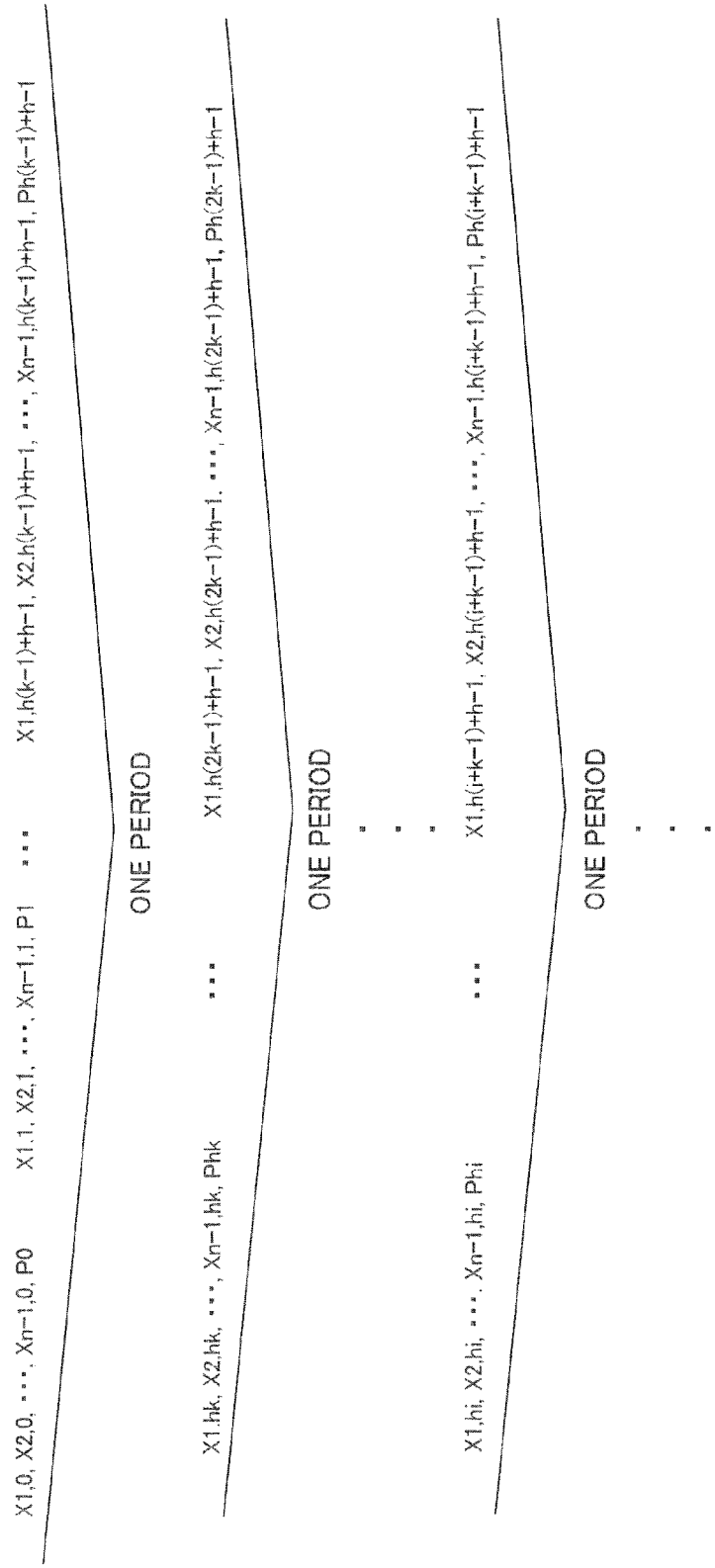
FIG. 51 shows a shortening method [method #2-2]

Unlike method #2-1, method #2-2 uses h×n×k bits formed with information and parity as one period as shown in FIG. 51 and inserts known information at the same positions at each period (insertion rule of method #2-2). "Inserting known information at the same positions at each period" is as has been described in above [method #1-2] using FIG. 48.

[Method #2-3]

Method #2-3 selects Z bits from h×(n−1)×k bits of information. $X_{1,hi}$, $X_{2,hi}$, ..., $X_{n-1,hi}$, ..., $X_{1,h(i+k-1)+h-1}$, $X_{2,h(i+k-1)+h-1}$, ..., $X_{n-1,h(i+k-1)+h-1}$ for a period of h×n×k bits formed with information and parity and inserts known information (e.g. 0 (or 1 or a predetermined value)) of the selected Z bits (insertion rule of method #2-3).

At this time, method #2-3 computes remainders after dividing all j's by h in information (where j takes the value of one of hi to h(i+k−1)+h−1) in which known information is inserted.

Then, it is assumed that: the difference between "the number of remainders that become (0+γ) mod h (where the number of remainders is non-zero)" and "the number of remainders that become ($v_{p=1}$+γ) mod h (where the number of remainders is non-zero)" is 1 or less, the difference between "the number of remainders that become (0+γ) mod h (where the number of remainders is non-zero)" and "the number of remainders that become ($y_{p=1}$+γ) mod h (where the number of remainders is non-zero)" is 1 or less, and the difference between "the number of remainders that become ($v_{p=1}$+γ) mod h (where the number of remainders is non-zero)" and "the number of remainders that become ($y_{p=1}$+γ) mod h (where the number of remainders is non-zero)" is 1 or less. At least one such γ is present.

Similarly, method #2-3 computes remainders after dividing all j's by h in information $X_{2,j}$ (where j takes the value of one of hi to h(i+k−1)+h−1) in which known information is inserted. Then, it is assumed that: the difference between "the number of remainders that become (0+γ) mod h (where the number of remainders is non-zero)" and "the number of remainders that become ($v_{p=2}$+γ) mod h (where the number of remainders is non-zero)" is 1 or less, the difference between "the number of remainders that become (0+γ) mod h (where the number of remainders is non-zero)" and "the number of remainders that become ($y_{p=2}$+γ) mod h (where the number of remainders is non-zero)" is 1 or less, and the difference between "the number of remainders that become ($v_{p=2}$+γ) mod h (where the number of remainders is non-zero)" and "the number of remainders that become ($y_{p=2}$+γ) mod h (where the number of remainders is non-zero)" is 1 or less. At least one such γ is present.

Method #2-3 can be described in a similar way also when information $X_{f,j}$ (f=1, 2, 3, n−1) is assumed. Method #2-3 computes remainders after dividing all j's by h in $X_{f,j}$ (where j takes the value of one of hi to h(i+k−1)+h−1) in which known information is inserted. Then, it is assumed that: the difference between "the number of remainders that become (0+γ) mod h (where the number of remainders is non-zero)" and "the number of remainders that become ($v_{p=f}$+γ) mod h (where the number of remainders is non-zero)" is 1 or less, the difference between "the number of remainders that become (0+γ) mod h (where the number of remainders is non-zero)" and "the number of remainders that become ($y_{p=f}$+γ) mod h (where the number of remainders is non-zero)" is 1 or less, and the difference between "the number of remainders that become ($v_{p=f}$+γ) mod h (where the number of remainders is non-zero)" and "the number of remainders that become ($y_{p=f}$+γ) mod h (where the number of remainders is non-zero)" is 1 or less. At least one such γ is present.

Thus, by providing a condition at positions at which known information is inserted, it is possible to generate more "rows whose unknown values are parity and information bits" in parity check matrix H in the same way as in [method #1-3]. Thus, it is possible to realize a lower coding rate than a coding rate of (n−1)/n with high error correction capability using the above-described LDPC-CC of a coding rate of (n−1)/n and a time varying period of h having good characteristics.

Figure 52:
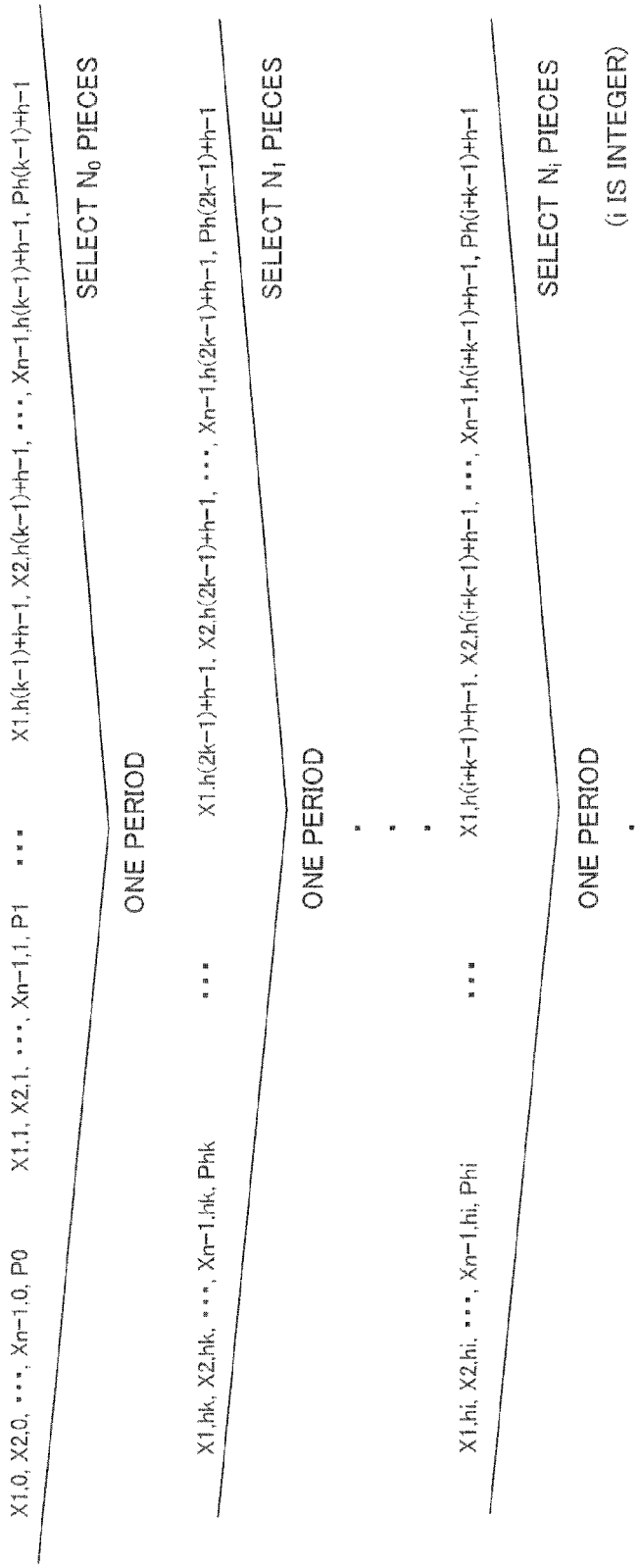
FIG. 52 shows a shortening method [method #2-4]

A case has been described in [method #2-3] where the number of pieces of known information inserted is the same at each period, but the number of pieces of known information inserted may differ from one period to another. For example, as shown in FIG. 52, provision may also be made for $N_0$ pieces of information to be designated known information at the first period, for $N_1$ pieces of information to be designated known information at the next period and for Ni pieces of information to be designated known information at an i-th period.

Thus, when the number of pieces of known information inserted differs from one period to another, the concept of "period" is meaningless. When the insertion rule of method #2-3 is represented without using the concept of "period," the insertion rule is represented as shown in [method #2-4].

[Method #2-4]

Z bits are selected from a bit sequence of information $X_{1,0}$, $X_{2,0}$, ..., $X_{n-1,0}$, ..., $X_{1,v}$, $X_{2,v}$, ..., $X_{n-1,v}$ in a data sequence formed with information and parity, and known information (e.g. 0 (or 1 or a predetermined value)) is inserted in the selected Z bits (insertion rule of method #2-4).

At this time, method #2-4 computes remainders after dividing all j's by h in $X_{1,j}$ (where j takes the value of one of 0 to v) in which known information is inserted. Then, it is assumed that: the difference between "the number of remainders that become $(0+\gamma)$ mod h (where the number of remainders is non-zero)" and "the number of remainders that become $(v_{p=1}+\gamma)$ mod h (where the number of remainders is non-zero)" is 1 or less, the difference between "the number of remainders that become $(0+\gamma)$ mod h (where the number of remainders is non-zero)" and "the number of remainders that become $(y_{p=1}+\gamma)$ mod h (where the number of remainders is non-zero)" is 1 or less, and the difference between "the number of remainders that become $(v_{p=1}+\gamma)$ mod h (where the number of remainders is non-zero)" and "the number of remainders that become $(y_{p=1}+\gamma)$ mod h (where the number of remainders is non-zero)" is 1 or less. At least one such $\gamma$ is present.

Similarly, method #2-4 computes remainders after dividing all j's by h in $X_{2,j}$ (where j takes the value of one of 0 to v) in which known information is inserted. Then, it is assumed that: the difference between "the number of remainders that become $(0+\gamma)$ mod h (where the number of remainders is non-zero)" and "the number of remainders that become $(v_{p=2}+\gamma)$ mod h (where the number of remainders is non-zero)" is 1 or less, the difference between "the number of remainders that become $(0+\gamma)$ mod h (where the number of remainders is non-zero)" and "the number of remainders that become $(y_{p=2}+\gamma)$ mod h (where the number of remainders is non-zero)" is 1 or less, and the difference between "the number of remainders that become $(v_{p=2}+\gamma)$ mod h (where the number of remainders is non-zero)" and "the number of remainders that become $(y_{p=2}+\gamma)$ mod h (where the number of remainders is non-zero)" is 1 or less. At least one such $\gamma$ is present.

That is, method #2-4 computes remainders after dividing all j's by h in $X_{f,j}$ (where j takes the value of one of 0 to v) in which known information is inserted. Then, it is assumed that: the difference between "the number of remainders that become $(0+\gamma)$ mod h (where the number of remainders is non-zero)" and "the number of remainders that become $(v_{p=f}+\gamma)$ mod h (where the number of remainders is non-zero)" is 1 or less, the difference between "the number of remainders that become $(0+\gamma)$ mod h (where the number of remainders is non-zero)" and "the number of remainders that become $(y_{p=f}+\gamma)$ mod h (where the number of remainders is non-zero)" is 1 or less, and the difference between "the number of remainders that become $(v_{p=f}+\gamma)$ mod h (where the number of remainders is non-zero)" and "the number of remainders that become $(y_{p=f}+\gamma)$ mod h (where the number of remainders is non-zero)" is 1 or less (f=1, 2, 3, . . . , n−1). At least one such $\gamma$ is present.

Thus, by providing a condition for positions at which known information is inserted, it is possible to generate more "rows whose unknown values are parity and information bits" in parity check matrix H in the same way as in [method #2-3] even when the number of bits of known information inserted differs from one period to another. Thus, it is possible to realize a lower coding rate than a coding rate of (n−1)/n with high error correction capability using the above-described LDPC-CC of a coding rate of (n−1)/n and a time varying period of h having good characteristics.

Furthermore, to implement [method #2-3] and [method #2-4] more effectively, one of the following three conditions may be satisfied in the aforementioned LDPC-CC based on the parity check polynomial of <condition #18-1> and <condition #18-2> of a time varying period of h. However, it is assumed that $v_{p=s} < y_{p=s}$ (s=1, 2, . . . , n−1) in <condition #18-1> and <condition #18-2>.

$y_{p=s} - v_{p=s} = v_{p=s} - 0$ that is, $y_{p=s} = 2 \times v_{p=s}$ $v_{p=s} - 0 = h - y_{p=s}$ that is, $v_{p=s} = h - y_{p=s}$ $h - y_{p=s} = y_{p=s} - v_{p=s}$ that is, $h = 2 \times y_{p=s} - v_{p=s}$ When this condition is added, by providing a condition for positions at which known information is inserted, it is possible to increase the number of rows whose all information is known information or rows with many pieces of known information (e.g. all bits except one hit correspond to known information) as much as possible in each row of parity check matrix H, that is, a parity check polynomial. This is because the LDPC-CC has a specific configuration of parity check matrix.

As described above, the communication apparatus inserts information known to the communicating party, performs encoding at a coding rate of 1/2 on information including known information and generates parity bits. The communication apparatus then does not transmit known information but transmits information other than known information and the parity bits obtained, and thereby realizes a coding rate of 1/3.

Figure 53:
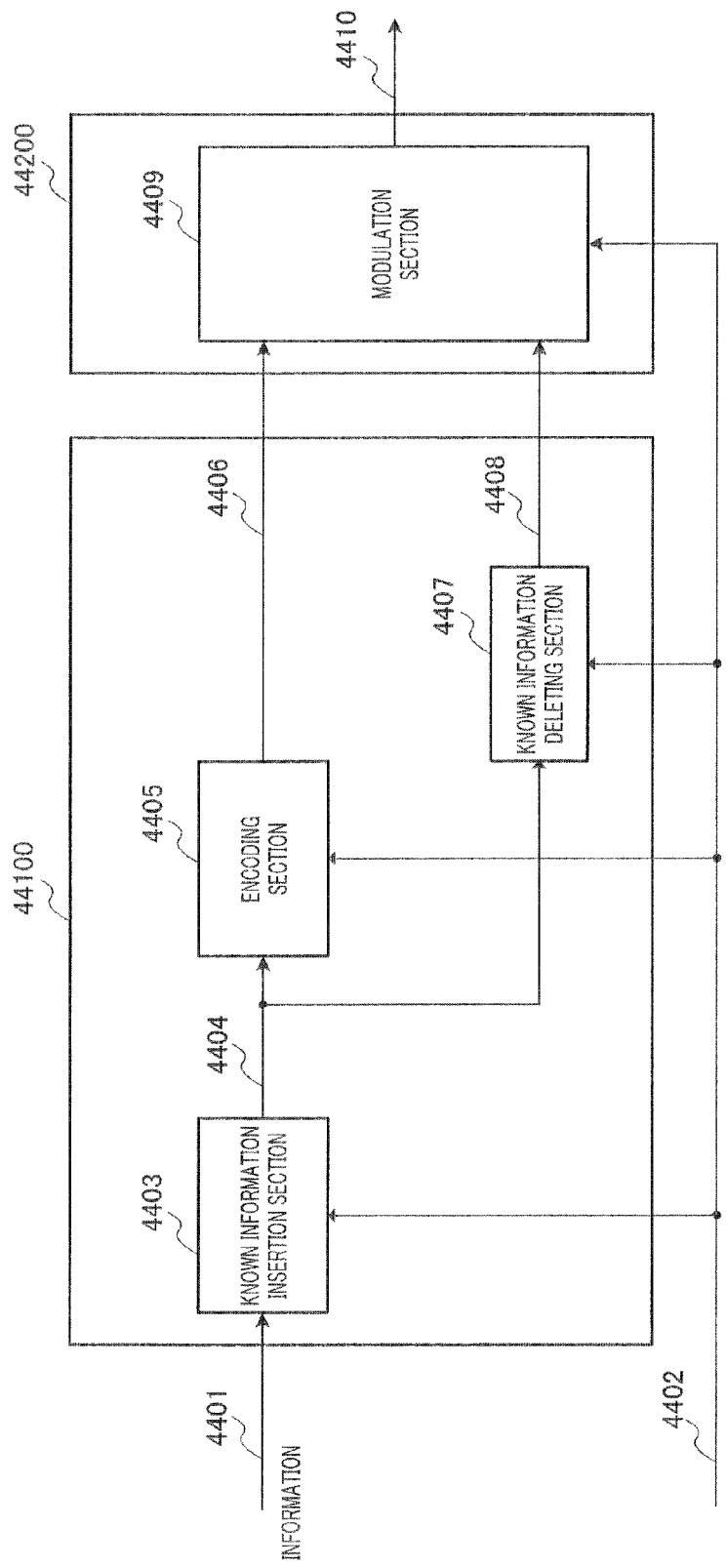
FIG. 53 is a block diagram showing an example of encoding-related part when a variable coding rate is adopted in a physical layer.

FIG. 53 is a block diagram showing an example of configuration of parts relating to encoding (error correction encoding section 44100 and transmitting apparatus 44200) when a variable coding rate is used in the physical layer.

Known information insertion section 4403 receives information 4401 and control signal 4402 as input and inserts known information according to information on the coding rate included in control signal 4402. To be more specific, when the coding rate included in control signal 4402 is smaller than the coding rate supported by encoder 4405 and shortening needs to be performed, known information is inserted according to the aforementioned shortening method and information 4404 after the insertion of known information is outputted. On the other hand, when the coding rate included in control signal 4402 is equal to the coding rate supported by encoder 4405 and shortening need not be performed, known information is not inserted and information 4401 is outputted as information 4404 as is.

Encoder 4405 receives information 4404 and control signal 4402 as input, performs encoding on information 4404, generates parity 4406 and outputs parity 4406.

Known information deleting section 4407 receives information 4404 and control signal 4402 as input, deletes, when known information is inserted to known information insertion section 4403, the known information from information 4404 based on the information on the coding rate included in control signal 4402 and outputs information 4408 after the deletion. On the other hand, when known information is not inserted, known information insertion section 4403 outputs information 4404 as information 4408 as is.

Modulation section 4409 receives parity 4406, information 4408 and control signal 4402 as input, modulates parity 4406 and information 4408 based on information of the modulation scheme included in control signal 4402, and generates and outputs baseband signal 4410.

Figure 54:
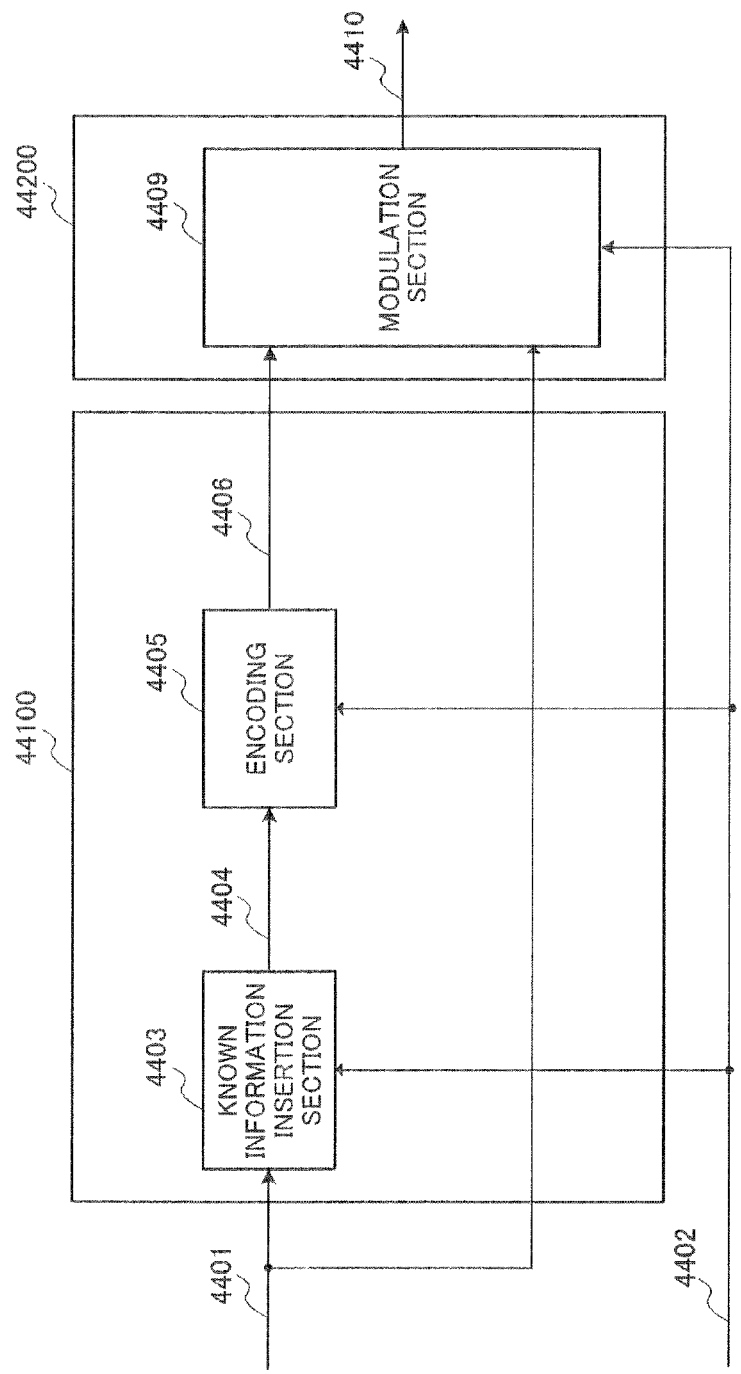
FIG. 54 is a block diagram showing another example of encoding-related part when a variable coding rate is adopted in a physical layer.

FIG. 54 is a block diagram showing another example of configuration of parts relating to encoding (error correction encoding section 44100 and transmitting apparatus 44200) when a variable coding rate is used in a physical layer different from that in FIG. 53. As shown in FIG. 54, by adopting such a configuration that information 4401 inputted to known information insertion section 4403 is inputted to modulation section 4409, a variable coding rate can be used as in the case of FIG. 53 even when known information deleting section 4407 in FIG. 53 is omitted.

Figure 55:
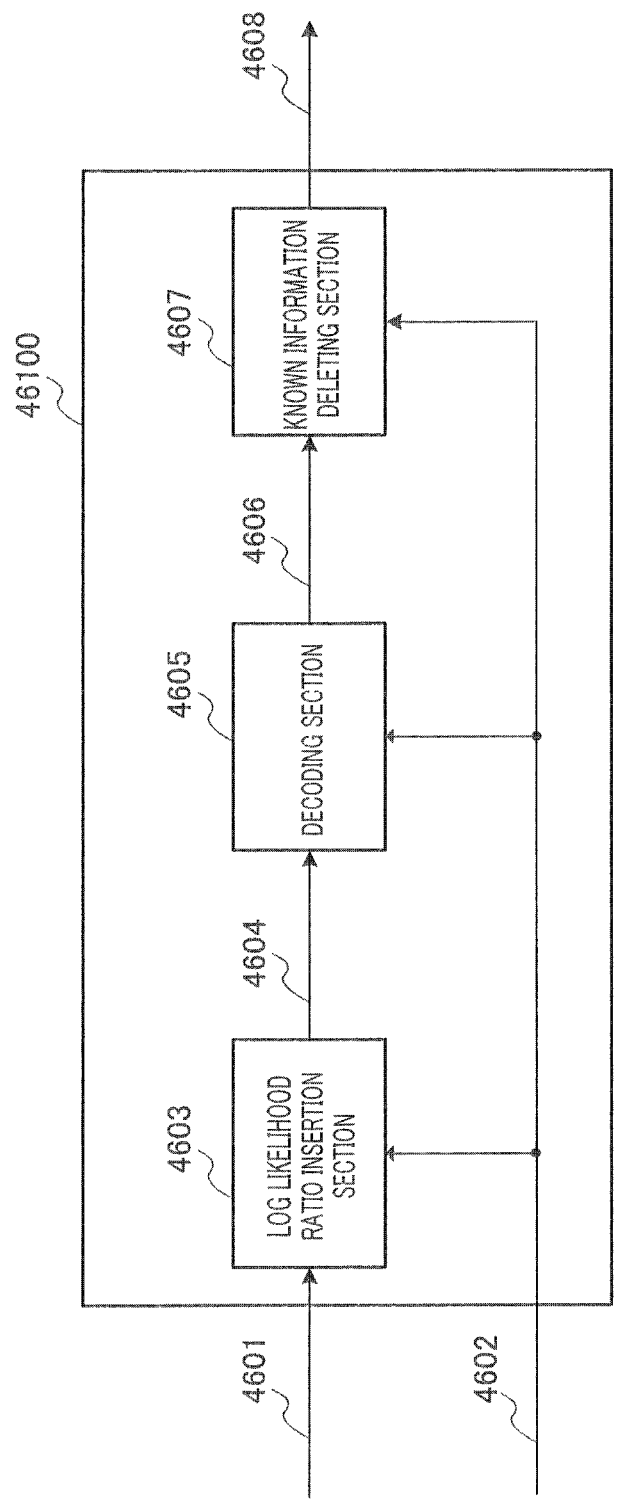
FIG. 55 is a block diagram showing an example of the configuration of the error correction decoding section in the physical layer.

FIG. 55 is a block diagram showing an example of configuration of error correction decoding section 46100 in a physical layer. Log likelihood ratio insertion section 4603 for known information receives log likelihood ratio signal 4601 of received data and control signal 4602 as input. Based on information of the coding rate included in control signal 4602, if a log likelihood ratio of the known information needs to be inserted, log likelihood ratio insertion section 4603 inserts the log likelihood ratio of the known information having high belief to log likelihood ratio signal 4601. Log likelihood ratio insertion section 4603 outputs log likelihood ratio signal 4604 after inserting the log likelihood ratio of the known information. Information of the coding rate included in control signal 4602 is transmitted, for example, from the communicating party.

Decoding section 4605 receives control signal 4602 and log likelihood ratio signal 4604 after inserting the log likelihood ratio of the known information as input, performs decoding based on information of the encoding method such as a coding rate included in control signal 4602, decodes the received data and outputs decoded data 4606.

Known information deleting section 4607 receives control signal 4602 and decoded data 4606 as input, deletes, when known information is inserted, the known information based on the information of the encoding method such as the coding rate included in control signal 4602 and outputs information 4608 after the deletion of the known information.

The shortening method has been described so far which realizes a lower coding rate than the coding rate of the code from an LDPC-CC of a time varying period of h described in Embodiment 1. When the LDPC-CC of a time varying period of h is used in a packet layer described in Embodiment 1, using the shortening method according to the present embodiment makes it possible to improve transmission efficiency and erasure correction capability simultaneously. Even when the coding rate is changed in the physical layer, good error correction capability can be achieved.

In the case of a convolutional code such as LDPC-CC, a termination sequence may be added at the termination of a transmission information sequence to perform termination processing (termination). At this time, encoding section 4405 receives known information (e.g. all zeros) as input and the termination sequence is formed with only a parity sequence obtained by encoding the known information. Thus, the termination sequence may include parts that do not follow the known information insertion rule described in the invention of the, present application. Furthermore, there may be a part following the insertion rule and a part in which known information is not inserted also in parts other than the termination to improve the transmission rate. The termination processing (termination) will be described in Embodiment 11.

(Embodiment 10)

The present embodiment will describe an erasure correction method that realizes a lower coding rate than a coding rate of (n−1)/n with high error correction capability using the LDPC-CC of a coding rate of (n−1)/n and a time varying period of h (h is an integer equal to or greater than 4) described in Embodiment 1. However, the description of the LDPC-CC of a coding rate of (n−1)/n and a time varying period of h (h is an integer equal to or greater than 4) is assumed to be the same as that in Embodiment 9.

[Method #3-1]

Figure 56:
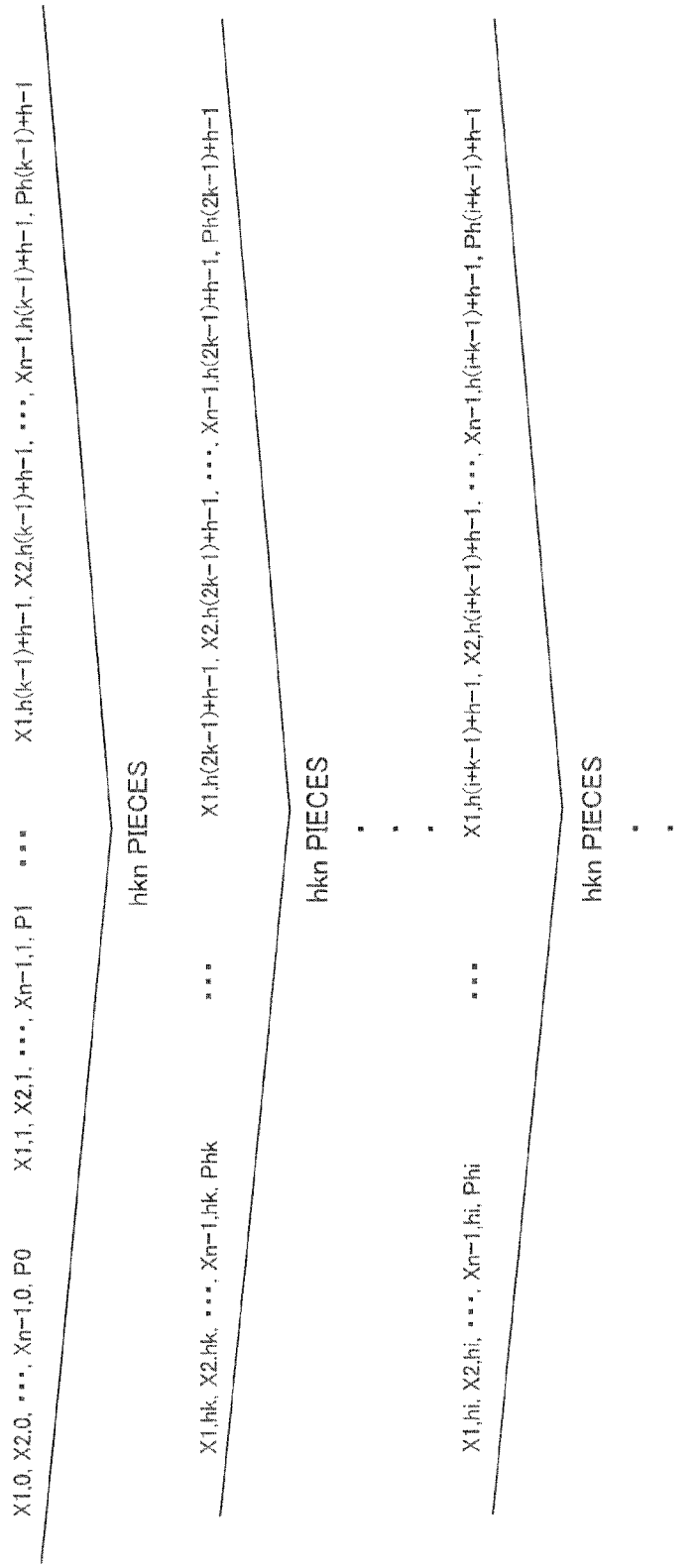
FIG. 56 shows an erasure correction method [method #3-1]

As shown in FIG. 56, method #3-1 assumes h×n×k bits (k is a natural number) formed with information and parity as a period and inserts known information included in a known information packet at the same position at each period (insertion rule of method #3-1). Insertion of known information included in a known information packet at the same position at each period has been described in method #2-2 of Embodiment 9 or the like.

[Method #3-2]

Method #3-2 selects Z bits from h×(n−1)×k bits of information $X_{1,hi}$, $X_{2,hi}$, ..., $X_{n-1,hi}$, ..., $X_{1,h(i+k-1)+h-1}$, $X_{2,h(i+k-1)+h-1}$, ..., $X_{n-1,h(i+k-1)+h-1}$ at a period of h×n×k bits formed with information and parity, and inserts data of a known information packet (e.g. 0 (or 1 or a predetermined value)) in the selected Z bits (insertion rule of method #3-2).

At this time, method #3-2 computes remainders after dividing all j's by h in $X_{1,j}$ (where j takes the value of one of hi to h(i+k−1)+h−1) in which the data of the known information packet is inserted. Then, it is assumed that: the difference between "the number of remainders that become (0+γ) mod h (where the number of remainders is non-zero)" and "the number of remainders that become ($v_{p=1}$+γ) mod h (where the number of remainders is non-zero)" is 1 or less, the difference between "the number of remainders that become (0+γ) mod h (where the number of remainders is non-zero)" and "the number of remainders that become ($y_{p=1}$+γ) mod h (where the number of remainders is non-zero)" is 1 or less, and the difference between "the number of remainders that become ($v_{p=1}$+γ) mod h (where the number of remainders is non-zero)" and "the number of remainders that become ($y_{p=1}$+γ) mod h (where the number of remainders is non-zero)" is 1 or less. At least one such γ is present.

That is, method #3-2 computes remainders after dividing all j's by h in $X_{f,j}$ (where j takes the value of one of hi to h(i+k−1)+h−1) in which the data of the known information packet is inserted. Then, it is assumed that: the difference between "the number of remainders that become (0+γ) mod h (where the number of remainders is non-zero)" and "the number of remainders that become ($v_{p=f}$+γ) mod h (where the number of remainders is non-zero)" is 1 or less, the difference between "the number of remainders that become (0+γ) mod h (where the number of remainders is non-zero)" and "the number of remainders that become ($y_{p=f}$+γ) mod h (where the number of remainders is non-zero)" is 1 or less, and the difference between "the number of remainders that become ($v_{p=f}$+γ) mod h (where the number of remainders is non-zero)" and "the number of remainders that become ($Y_{p=f}$+γ) mod h (where the number of remainders is non-zero)" is 1 or less (f=1, 2, 3, ..., n−1). At least one such γ is present.

Thus, by providing a condition at positions at which known information is inserted, it is possible to generate more "rows whose unknown values are parity and fewer information bits" in parity check matrix H. Thus, it is possible to realize a system capable of changing a coding rate of its erasure correction code with high erasure correction capability and a low circuit scale using the above-described LDPC-CC of a coding rate of (n−1)/n and a time varying period of h.

An erasure correction method using a variable coding rate of a erasure correction code has been described so far as the erasure correction method in a upper layer.

With regard to the configuration of the erasure correction coding-related processing section and erasure correction decoding-related processing section using a variable coding rate of an erasure correction code in a upper layer, the coding rate of the erasure correction code can be changed by inserting a known information packet before erasure correction coding-related processing section 2112 in FIG. 21.

Thus, the coding rate is made variable according to, for example, a communication situation, and it is thereby possible to increase the coding rate when the communication situation is good and improve transmission efficiency. Furthermore, when the coding rate is decreased, it is possible to improve erasure correction capability by inserting known information included in a known information packet according to the check matrix as in the case of [method #3-2].

Figure 57:
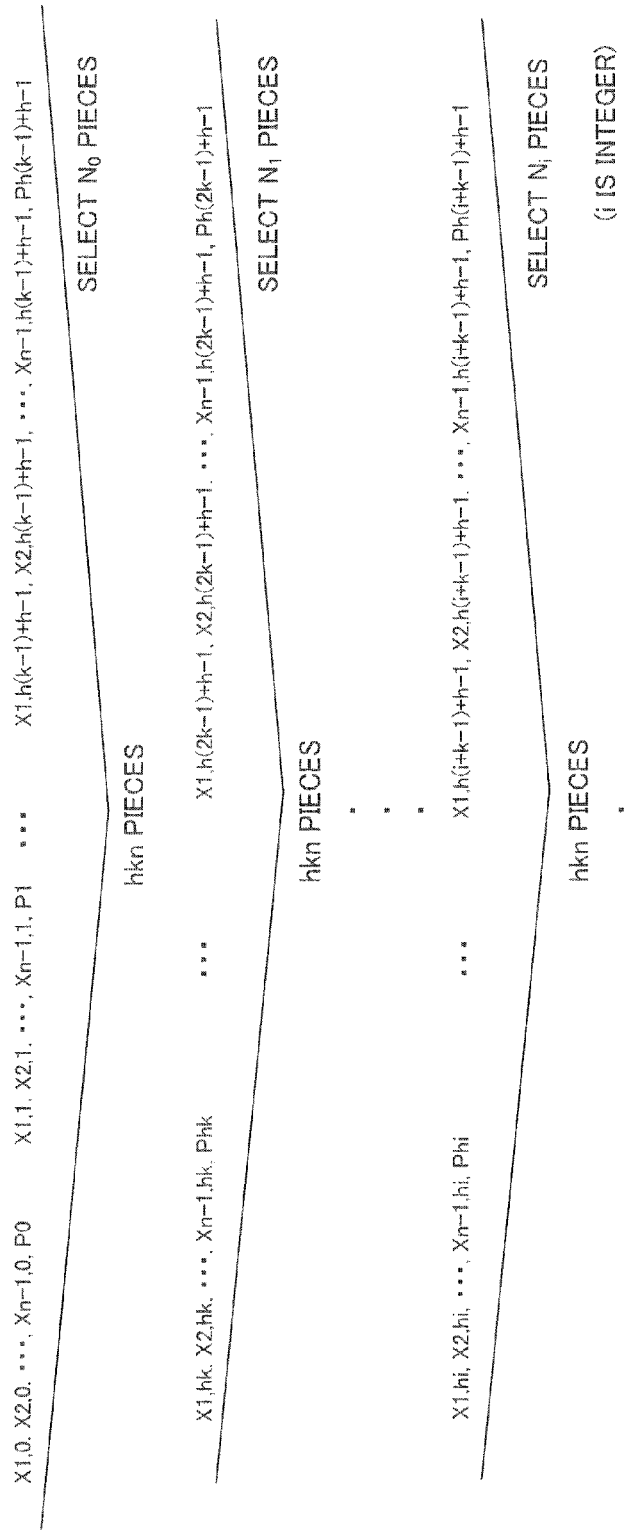
FIG. 57 shows an erasure correction method [method #3-3]

A case has been described with [method #3-2] where the number of pieces of data of a known information packet inserted is the same among different periods, but the number of pieces of data inserted may differ from one period to another. For example, as shown in FIG. 57, it may be assumed that $N_0$ pieces of information is designated data of the known information packet at the first period, $N_1$ pieces of information is designated data of the known information packet at the next period and $N_i$ pieces of information is designated data of the known information packet at an i-th period.

When the number of pieces of data of the known information packet inserted differs from one period to another in this way, the concept of "period" is meaningless. When the insertion rule of method #3-2 is represented without using the concept of "period," the insertion rule is as shown in [method #3-3].

[Method #3-3]

Z bits are selected from a bit sequence of information $X_{1,0}, X_{2,0}, \ldots, X_{n-1,0}, \ldots, X_{1,v}, X_{2,v}, \ldots, X_{n-1,v}$ in a data sequence formed with information and parity, and known information (e.g. 0 (or 1 or a predetermined value)) is inserted in the selected Z bits (insertion rule of method #3-3).

At this time, method #3-3 computes remainders after dividing all j's by h in $X_{1,j}$ (where j takes the value of one of 0 to v) in which known information is inserted. Then, it is assumed that: the difference between "the number of remainders that become $(0+\gamma)$ mod h (where the number of remainders is non-zero)" and "the number of remainders that become $(v_{p=1}+\gamma)$ mod h (where the number of remainders is non-zero)" is 1 or less, the difference between "the number of remainders that become $(0+\gamma)$ mod h (where the number of remainders is non-zero)" and "the number of remainders that become $(y_{p=1}+\gamma)$ mod h (where the number of remainders is non-zero)" is 1 or less, and the difference between "the number of remainders that become $(v_{p=1}+\gamma)$ mod h (where the number of remainders is non-zero)" and "the number of remainders that become $(y_{p=1}+\gamma)$ mod h (where the number of remainders is non-zero)" is 1 or less. At least one such $\gamma$ is present.

That is, method #3-3 computes remainders after dividing all j's by h in $X_{f,j}$ (where j takes the value of one of 0 to v) in which known information is inserted. Then, it is assumed that: the difference between "the number of remainders that become $(0+\gamma)$ mod h (where the number of remainders is non-zero)" and "the number of remainders that become $(v_{p=f}+\gamma)$ mod h (where the number of remainders is non-zero)" is 1 or less, the difference between "the number of remainders that become $(0+\gamma)$ mod h (where the number of remainders is non-zero)" and "the number of remainders that become $(y_{p=f}+\gamma)$ mod h (where the number of remainders is non-zero)" is 1 or less, and the difference between "the number of remainders that become $(v_{p=f}+\gamma)$ mod h (where the number of remainders is non-zero)" and "the number of remainders that become $(Y_{p=f}+\gamma)$ mod h (where the number of remainders is non-zero)" is 1 or less (f=1, 2, 3, . . . , n−1). At least one such $\gamma$ is present.

A system using a variable coding rate of an erasure correction code has been described so far which uses a method of realizing a lower coding rate than the coding rate of a code from an LDPC-CC of a time varying period of h described in Embodiment 1. Using the variable coding rate method of the present embodiment, it is possible to improve transmission efficiency and erasure correction capability simultaneously and achieve good erasure correction capability when the coding rate is changed during erasure correction.

(Embodiment 11)

When an LDPC-CC relating to the present invention is used, termination or tail-biting is necessary to secure belief in decoding of information bits. Thus, the present embodiment will describe a method in detail when termination (referred to as "information-zero-termination" or simply referred to as "zero-termination") is performed.

FIG. 58 is a diagram illustrating "information-zero-termination" of an LDPC-CC of a coding rate of (n−1)/n. Information bits $X_1, X_2, \ldots, X_{n-1}$ and parity bit P at point in time i (i=0, 1, 2, 3, . . . , s) are assumed to be $X_{1,i}, X_{2,i}, \ldots, X_{n-1,i}$ and parity bit $P_i$, respectively. As shown in FIG. 58, $X_{n-1,s}$ is assumed to be a final bit (4901) of information to transmit. However, to maintain receiving quality in the decoder, it is also necessary to encode information from point in time s onward during encoding.

For this reason, when the encoder performs encoding only until point in time s and the transmitting apparatus on the encoding side performs transmission to the receiving apparatus on the decoding side only until $P_s$, receiving quality of information bits in the decoder deteriorates considerably. To solve this problem, encoding is performed assuming information bits (hereinafter "virtual information bits") from final information bit Xn−1,s onward to be "0"s and parity bit (4903) is generated.

To be more specific, as shown in FIG. 58, the encoder performs encoding assuming $X_{1,k}, X_{2,k}, \ldots, X_{n-1,k}$ (k= t1, t2, . . . , tm) to be "0" and obtains $P_{t1}, P_{t2}, \ldots, P_{tm}$. The transmitting apparatus on the encoding side transmits $X_{1,s}, X_{2,s}, \ldots, X_{n-1,s}, P_s$ at point in time s and then transmits $P_{t1}, P_{t2}, \ldots, _{tm}$. From point in time s onward, the decoder performs decoding taking advantage of knowing that virtual information bits are "0"s. A case has been described above where the virtual information bits are "0" as an example, but the present invention is not limited to this and can be likewise implemented as long as the virtual information bits are data known to the transmitting/receiving apparatuses.

It goes without saying that all embodiments of the present invention can also be implemented even when termination is performed.

(Embodiment 12)

The present embodiment will describe an example of a specific method of generating an LDPC-CC based on the parity check polynomials described in Embodiment 1 and Embodiment 6.

Embodiment 6 has described that the following conditions are effective as the time varying period of an LDPC-CC described in Embodiment 1:

The time varying period is a prime number. The time varying period is an odd number and the number of divisors is small with respect to the value of a time varying period.

Here, a case will be considered where the time varying period is increased and a code is generated. At this time, a code is generated using a random number with which the constraint condition is given, but when the time varying period is increased, the number of parameters to be set using a random number increases, resulting in a problem that it is difficult to search a code having high error correction capability. To solve this problem, the present embodiment will describe a method of generating a different code using an LDPC-CC based on the parity check polynomials described in Embodiment 1 and Embodiment 6.

An LDPC-CC design method based on a parity check polynomial of a coding rate of 1/2 and a time varying period of 15 will be described as an example.

Consider equations 86-0 to 86-14 as parity check polynomials (that satisfy 0) of an LDPC-CC of a coding rate of (n−1)/n (n is an integer equal to or greater than 2) and a time varying period of 15.

[86]

$$(D^{a\#0,1,1}+D^{a\#0,1,2}+D^{a\#0,1,3})X_1(D)+(D^{a\#0,2,1}+D^{a\#0,2,2}+D^{a\#0,2,3})X_2(D)+\ldots+(D^{a\#0,n-1,1}+D^{a\#0,n-1,2}+D^{a\#0,n-1,3})X_{n-1}(D)+(D^{b\#0,1}+D^{b\#0,2}+D^{b\#0,3})P(D)=0 \quad \text{(Equation 86-0)}$$

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 86-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 86-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 86-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+\ldots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 86-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+\ldots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 86-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+\ldots+(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Equation 86-6)}$$

$$(D^{a\#7,1,1}+D^{a\#7,1,2}+D^{a\#7,1,3})X_1(D)+(D^{a\#7,2,1}+D^{a\#7,2,2}+D^{a\#7,2,3})X_2(D)+\ldots+(D^{a\#7,n-1,1}+D^{a\#7,n-1,2}+D^{a\#7,n-1,3})X_{n-1}(D)+(D^{b\#7,1}+D^{b\#7,2}+D^{b\#7,3})P(D)=0 \quad \text{(Equation 86-7)}$$

$$(D^{a\#8,1,1}+D^{a\#8,1,2}+D^{a\#8,1,3})X_1(D)+(D^{a\#8,2,1}+D^{a\#8,2,2}+D^{a\#8,2,3})X_2(D)+\ldots+(D^{a\#8,n-1,1}+D^{a\#8,n-1,2}+D^{a\#8,n-1,3})X_{n-1}(D)+(D^{b\#8,1}+D^{b\#8,2}+D^{b\#8,3})P(D)=0 \quad \text{(Equation 86-8)}$$

$$(D^{a\#9,1,1}+D^{a\#9,1,2}+D^{a\#9,1,3})X_1(D)+(D^{a\#9,2,1}+D^{a\#9,2,2}+D^{a\#9,2,3})X_2(D)+\ldots+(D^{a\#9,n-1,1}+D^{a\#9,n-1,2}+D^{a\#9,n-1,3})X_{n-1}(D)+(D^{b\#9,1}+D^{b\#9,2}+D^{b\#9,3})P(D)=0 \quad \text{(Equation 86-9)}$$

$$(D^{a\#10,1,1}+D^{a\#10,1,2}+D^{a\#10,1,3})X_1(D)+(D^{a\#10,2,1}+D^{a\#10,2,2}+D^{a\#10,2,3})X_2(D)+\ldots+(D^{a\#10,n-1,1}+D^{a\#10,n-1,2}+D^{a\#10,n-1,3})X_{n-1}(D)+(D^{b\#10,1}+D^{b\#10,2}+D^{b\#10,3})P(D)=0 \quad \text{(Equation 86-10)}$$

$$(D^{a\#11,1,1}+D^{a\#11,1,2}+D^{a\#11,1,3})X_1(D)+(D^{a\#11,2,1}+D^{a\#11,2,2}+D^{a\#11,2,3})X_2(D)+\ldots+(D^{a\#11,n-1,1}+D^{a\#11,n-1,2}+D^{a\#11,n-1,3})X_{n-1}(D)+(D^{b\#11,1}+D^{b\#11,2}+D^{b\#11,3})P(D)=0 \quad \text{(Equation 86-11)}$$

$$(D^{a\#12,1,1}+D^{a\#12,1,2}+D^{a\#12,1,3})X_1(D)+(D^{a\#12,2,1}+D^{a\#12,2,2}+D^{a\#12,2,3})X_2(D)+\ldots+(D^{a\#12,n-1,1}+D^{a\#12,n-1,2}+D^{a\#12,n-1,3})X_{n-1}(D)+(D^{b\#12,1}+D^{b\#12,2}+D^{b\#12,3})P(D)=0 \quad \text{(Equation 86-12)}$$

$$(D^{a\#13,1,1}+D^{a\#13,1,2}+D^{a\#13,1,3})X_1(D)+(D^{a\#13,2,1}+D^{a\#13,2,2}+D^{a\#13,2,3})X_2(D)+\ldots+(D^{a\#13,n-1,1}+D^{a\#13,n-1,2}+D^{a\#13,n-1,3})X_{n-1}(D)+(D^{b\#13,1}+D^{b\#13,2}+D^{b\#13,3})P(D)=0 \quad \text{(Equation 86-13)}$$

$$(D^{a\#14,1,1}+D^{a\#14,1,2}+D^{a\#14,1,3})X_1(D)+(D^{a\#14,2,1}+D^{a\#14,2,2}+D^{a\#14,2,3})X_2(D)+\ldots+(D^{a\#14,n-1,1}+D^{a\#14,n-1,2}+D^{a\#14,n-1,3})X_{n-1}(D)+(D^{b\#14,1}+D^{b\#14,2}+D^{b\#14,3})P(D)=0 \quad \text{(Equation 86-14)}$$

At this time, $X_1(D), X_2(D), \ldots, X_{n-1}(D)$ are polynomial representations of data (information) $X_1, X_2$, and $P(D)$ is a polynomial representation of parity. In equations 86-0 86-14, when, for example, the coding rate is 1/2, there are only terms of $X_1(D)$ and $P(D)$ and there are no terms of $X_2(D), \ldots, X_{n-1}(D)$. Similarly, when the coding rate is 2/3, there are only terms of $X_1(D)$, $X_2(D)$ and $P(D)$ and there are no terms of $X_3(D), \ldots, X_{n-1}(D)$. Other coding rates may also be considered likewise. Here, equations 86-0 to 86-14 are assumed to be such parity check polynomials that there are three terms in each of $X_1(D), X_2(D), \ldots, X_{n-1}(D)$ and $P(D)$.

Furthermore, it is assumed that the following holds true for $X_1(D), X_2(D), \ldots, X_{n-1}(D)$ and $P(D)$ in equations 86-0 to 86-14.

In equation 86-q, it is assumed that $a_{\#q,p,1}$, $a_{\#q,p,2}$ and $a_{\#q,p,3}$ are natural numbers and $a_{\#q,p,1} \neq a_{\#q,p,2}$, $a_{\#q,p,1} \neq a_{\#q,p,3}$ and $a_{\#q,p,2} \neq a_{\#q,p,3}$ hold true. Furthermore, it is assumed that $b_{\#q,1}$, $b_{\#q,2}$ and $b_{\#q,3}$ are natural numbers and $b_{\#q,1} \neq b_{\#q,2}$, $b_{\#q,1} \neq b_{\#q,3}$ and $b_{\#q,1} \neq b_{\#q,3}$ hold true (q=0, 1, 2, ..., 13, 14; p=1, 2, ..., n−1).

The parity check polynomial of equation 86-q is called "check equation #q" and the sub-matrix based on the parity check polynomial of equation 86-q is called q−th sub-matrix $H_q$. An LDPC-CC of a time varying period of 15 generated from 0-th sub-matrix $H_0$, first sub-matrix $H_1$, second sub-matrix $H_2, \ldots,$ 13-th sub-matrix $H_{13}$ and 14-th sub-matrix $H_{14}$ will be considered. Thus, the code configuring method, parity check matrix generating method, encoding method and decoding method will be similar to those of the methods described in Embodiment 1 and Embodiment 6.

As described above, a case with a coding rate of 1/2 will be described, and therefore there are only terms of $X_1(D)$ and $P(D)$ hereinafter.

In Embodiment 1 and Embodiment 6, assuming that the time varying period is 15, both the time varying period of the coefficient of $X_1(D)$ and the time varying period of the coefficient of $P(D)$ are 15. By contrast, the present embodiment proposes a code configuring method of an LDPC-CC with a time varying period of 15 by setting the time varying period of the coefficients of $X_1(D)$ to 3 and the time varying period of the coefficients of $P(D)$ to 5 as an example. That is, the present embodiment configures a code where the time varying period of the LDPC-CC is LCM($\alpha, \beta$) by setting the time varying period of the coefficients of $X_1(D)$ to $\alpha$ and the time varying period of the coefficients of $P(D)$ to $\beta$ (atm, where LCM(X,Y) is assumed to be a least common multiple of X and Y.

To achieve high error correction capability, the following conditions are provided for the coefficient of $X_1(D)$ as in the cases of Embodiment 1 and Embodiment 6. In the following conditions, "%" means a modulo, and, for example, "$\alpha \% 15$" represents a remainder after dividing $\alpha$ by 15.

"$a_{\#0,1,1}\%15 = a_{\#1,1,1}\%15 = a_{\#2,1,1}\%15 = \ldots = a_{\#k,1,1}\%15 = \ldots = a_{\#14,1,1}\%15 = v_{p=1}$ fixed-value) (therefore k=0, 1, 2, ..., 14)"

"$a_{\#0,1,2}\%15 = a_{\#1,1,2}\%15 = a_{\#2,1,2}\%15 = \ldots = a_{\#k,1,2}\%15 = \ldots = a_{\#14,1,2}\%15 = y_{p=1}$ ($y_{p=1}$: fixed-value) (therefore k=0, 1, 2, ..., 14)"

"$a_{\#0,1,3}\%15 = a_{\#1,1,3}\%15 = a_{\#2,1,3}\%15 = \ldots = a_{\#k,1,3}\%15 = \ldots = a_{\#14,1,3}\%15 = z_{p=1}$ ($z_{p=1}$: fixed-value) (therefore k=0, 1, 2, ..., 14)"  <Condition #19-1>

Furthermore, since the time varying period of the coefficient of $X_1(D)$ is 3, the following condition holds true.

<Condition #19-2>

When i %3=j %3 (i, j=0, 1, ..., 13, 14; i≠j) holds true, the following three equations hold true.

[87]

$$a_{\#i,1,1}=a_{\#j,1,1} \quad \text{(Equation 87-1)}$$

$$a_{\#i,1,2}=a_{\#j,1,2} \quad \text{(Equation 87-2)}$$

$$a_{\#i,1,3}=a_{\#j,1,3} \quad \text{(Equation 87-3)}$$

Similarly, the following conditions are provided for the coefficient of P(D).

"$b_{\#0,1}\%15=b_{\#1,1}\%15=b_{\#2,1}\%15=\ldots=b_{\#k,1}\%15=\ldots=b_{14,1}\%15=d$ ($d$: fixed-value) (therefore $k=0, 1, 2, \ldots, 14$)"

"$b_{\#0,2}\%15=b_{\#1,2}\%15=b_{\#2,2}\%15=\ldots=b_{\#k,2}\%15=\ldots=b_{\#14,2}\%15=e$ ($e$: fixed-value) (therefore $k=0, 1, 2, \ldots, 14$)"

"$b_{\#0,3}\%15=b_{\#1,3}\%15=b_{\#2,3}\%15=\ldots=b_{\#k,3}\%15=\ldots=b_{\#14,3}\%15=f$ ($f$: fixed-value) (therefore $k=0, 1, 2, \ldots, 14$)"  <Condition #20-1>

Furthermore, since the time varying period of the coefficient of P(D) is 5, the following conditions hold true.

<Condition #20-2>

When i %5=j %5 (i, j=0, 1, ..., 13, 14; i≠j) holds true, the following three equations hold true.

[88]

$$b_{\#i,1}=b_{\#j,1} \quad \text{(Equation 88-1)}$$

$$b_{\#i,2}=b_{\#j,2} \quad \text{(Equation 88-2)}$$

$$b_{\#i,3}=b_{\#j,3} \quad \text{(Equation 88-3)}$$

Providing the above-described conditions makes it possible to reduce the number of parameters set using random numbers while increasing the time varying period and achieve the effect of facilitating a code search. <Condition #19-1> and <condition #20-1> are not always necessary conditions. That is, only <condition #19-2> and <condition #20-2> may be provided as conditions. Furthermore, conditions of <condition #19-1'> and <condition #20-1'> may also be provided instead of <condition #19-1> and <condition #20-1>.

"$a_{\#0,1,1}\%3=a_{\#1,1,1}\%3=a_{\#2,1,1}\%3=\ldots=a_{\#k,1,1}\%3=\ldots=a_{\#14,1,1}\%3=v_{p=1}$ (fixed-value) (therefore $k=0, 1, 2, \ldots, 14$)"

"$a_{\#0,1,2}\%3=a_{\#1,1,2}\%3=a_{\#2,1,2}\%3=\ldots=a_{\#k,1,2}\%3=\ldots=a_{\#14,1,2}\%3=y_{p=1}$ ($y_{p=1}$: fixed-value) (therefore $k=0, 1, 2, \ldots, 14$)"

"$a_{\#0,1,3}\%3=a_{\#1,1,3}\%3=a_{\#2,1,3}\%3=\ldots=a_{\#k,1,3}\%3=\ldots=a_{\#14,1,3}\%3z_{p=1}$ ($z_{p=1}$: fixed-value) (therefore $k=0, 1, 2, \ldots, 14$)"  <Condition #19-1'>

"$b_{\#0,1}\%5b_{\#1,1}\%5=b_{\#2,1}\%5=\ldots=b_{\#k,1}\%5=\ldots=b_{\#14,1}\%5=d$ ($d$: fixed-value) (therefore $k=0, 1, 2, \ldots, 14$)"

"$b_{\#0,2}\%5=b_{\#1,2}\%5=b_{\#2,2}\%5=\ldots=b_{\#k,2}\%5=\ldots=b_{\#14,2}\%5=e$ ($e$: fixed-value) (therefore $k=0, 1, 2, \ldots, 14$)"

"$b_{\#0,3}\%5=b_{\#1,3}\%5=b_{2,3}\%5=\ldots=b_{\#k,3}\%5=\ldots=b_{\#14,3}\%5=f$ ($f$: fixed-value) (therefore $k=0, 1, 2, 14$)"  <Condition #20-1'>

Using the above example as a reference and assuming that the time varying period of the coefficient of $X_1(D)$ is α and the time varying period of the coefficient of P(D) is β, the code configuration method of an LDPC-CC of a time varying period of LCM(α, β) will be described, where time varying period LCM(α, β)=s.

An i-th (i=0, 1, 2, ..., s−2, s−1) parity check polynomial that satisfies 0 of an LDPC-CC based on a parity check polynomial of a time varying period of s and a coding rate of 1/2 is represented as shown in the equation below.

[89]

$$(D^{a\#i,1,1}+D^{a\#i,1,2}+D^{a\#i,1,3})X_1(D(D^{b\#i,1}+D^{b\#i,2}+D^{b\#i,3})P(D)=0 \quad \text{(Equation 89-1)}$$

Using the above description as a reference, the following condition becomes important in the code configuration method of the present embodiment.

The following condition is provided for the coefficient of $X_1(D)$.

"$a_{\#0,1,1}\%s=a_{\#1,1,1}\%s=a_{\#2,1,1}\%s=\ldots=a_{\#k,1,1}\%s=\ldots=a_{\#s-1,1,1}\%s=v_{p=1}$ ($v_{p=1}$: fixed-value) (therefore $k=0, 1, 2, \ldots, s-1$)"

"$a_{\#0,1,2}\%s=a_{\#1,1,2}\%s=a_{\#2,1,2}\%s=\ldots=a_{\#k,1,2}\%s=\ldots=a_{\#s-1,1,2}\%s=y_{p=1}$ ($y_{p=1}$: fixed-value) (therefore $k=0, 1, 2, \ldots, s-1$)"

"$a_{\#0,1,3}\%s=a_{\#1,1,3}\%s=a_{\#2,1,3}\%s=\ldots=a_{\#k,1,3}\%s=\ldots=a_{\#s-1,1,3}\%s=z_{p=1}$ ($z_{p=1}$: fixed-value) (therefore $k=0, 1, 2, \ldots, s-1$)"  <Condition #21-1>

Furthermore, since the time varying period of the coefficient of $X_1(D)$ is α, the following condition holds true.

<Condition #21-2>

When i % α=j % α (i, j=0, 1, ..., s−2, s−1; i≠j) holds true, the following three equations hold true.

[90]

$$a_{\#i,1,1}=a_{\#j,1,1} \quad \text{(Equation 90-1)}$$

$$a_{\#i,1,2}=a_{\#j,1,2} \quad \text{(Equation 90-2)}$$

$$a_{\#i,1,3}=a_{\#j,1,3} \quad \text{(Equation 90-3)}$$

Similarly, the following condition is provided for the coefficient of P(D).

"$b_{\#0,1}\%s=b_{\#1,1}\%s=b_{\#2,1}\%s=\ldots=b_{\#k,1}\%s=\ldots=b_{\#s-1,1}\%s=d$ ($d$: fixed-value) (therefore $k=0, 1, 2, \ldots, s-1$)"

"$b_{\#0,2}\%s=b_{\#1,2}\%s=b_{\#2,2}\%s=\ldots=b_{\#k,2}\%s=\ldots=b_{\#s-1,2}\%s=e$ ($e$: fixed-value) (therefore $k=0, 1, 2, \ldots, s-1$)"

"$b_{\#0,3}\%s=b_{\#1,3}\%s=b_{\#2,3}\%s=\ldots=b_{\#k,3}\%s=\ldots=b_{\#s-1,3}\%s=f$ ($f$: fixed-value) (therefore $k=0, 1, 2, \ldots, s-1$)"  <Condition #22-1>

Furthermore, since the time varying period of the coefficient of P(D) is β, the following condition holds true.

<Condition #22-2>

When i % β=j % β (i, j=0, 1, ..., s−2, s−1; i≠j) holds true, the following three equations hold true.

[91]

$$b_{\#i,1}=b_{\#j,1} \quad \text{(Equation 91-1)}$$

$$b_{\#i,2}=b_{\#j,2} \quad \text{(Equation 91-2)}$$

$$b_{\#i,3}=b_{\#j,3} \quad \text{(Equation 91-3)}$$

By providing the following conditions, it is possible to reduce the number of parameters set using random numbers while increasing the time varying period and provide an effect of facilitating a code search. <Condition #21-1> and <condition #22-1> are not always necessary conditions. That is, only <condition #21-2> and <condition #22-2> may be provided as conditions. Furthermore, instead of <condition #21-1> and <condition #22-1>, conditions: <condition #21-1'> and <condition #22-1'> may also be provided.

"$a_{\#0,1,1}$% α=$a_{\#1,1,1}$% α=$a_{\#2,1,1}$% α= ... =$a_{\#k,1,1}$% α= ... =$a_{\#s-1,1,1}$% α=$v_{p=1}$ ($v_{p=1}$: fixed-value) (therefore k=0, 1, 2, ..., s−1)"

"$a_{\#0,1,2}$% α=$a_{\#1,1,2}$% α=$a_{\#2,1,2}$% α= ... = $a_{\#k,1,2}$% α= ... =$a_{\#s-1,1,2}$% α=$y_{p=1}$ ($y_{p=1}$: fixed-value) (therefore k=0, 1, 2, ..., s−1)"

"$a_{\#0,1,3}$% α=$a_{\#1,1,3}$% α=$a_{\#2,1,3}$% α= ... = $a_{\#k,1,3}$% α= ... =$a_{s-1,1,3}$% α=$z_{p=1}$ ($z_{p=1}$: fixed-value) (therefore k=0, 1, 2, ..., s−1)"  <Condition #21-1'>

"$b_{\#0,1}$% β=$b_{\#1,1}$% β=$b_{\#2,1}$% β= ... = $b_{\#k,1}$% β= ... =$b_{\#s-1,1}$% β=d (d: fixed-value) (therefore k=0, 1, 2, ..., s−1)"

"$b_{\#0,2}$% β=$b_{\#1,2}$% β=$b_{\#2,2}$% β= ... = $b_{\#k,2}$% β= ... =$b_{\#s-1,2}$% β=e (e: fixed-value) (therefore k=0, 1, 2, ..., s−1)"

"$b_{\#0,3}$% β=$b_{\#1,3}$% β=$b_{\#2,3}$% β= ... = $b_{\#k,3}$% β= ... =$b_{\#s-1,3}$% β=f (f: fixed-value) (therefore k=0, 1, 2, ..., s−1)"  <Condition #22-1>

The i-th (i=0, 1, 2, ..., s−2, s−1) parity check polynomial that satisfies 0 of an LDPC-CC based on a parity check polynomial of a time varying period of s and a coding rate of 1/2 has been represented as shown in equation 89-i, but when actually used, the parity check polynomial that satisfies 0 is represented by the following equation.

[92]

$$(D^{a\#i,1,1}+D^{a\#i,1,2}+1)X_1(D)+(D^{b\#i,1}+D^{b\#i,2}+1)P(D)=0 \quad \text{(Equation 92-1)}$$

Furthermore, consider generalizing the parity check polynomial. The i-th (i=0, 1, 2, ..., s−2, s−1) parity check polynomial that satisfies 0 is represented as shown in the equation below (Equation 93-1)

$$A_{X1,i}(D)X_1(D) + B_i(D)P(D) = \quad [93]$$
$$(D^{a1,i,1} + D^{a1,i,2} + ... + D^{a1,i,ri})X_1(D) +$$
$$(D^{b_i,1} + D^{b_i,2} + ... + D^{b_i,\omega_i})P(D) =$$
$$X_1(D)\sum_{k=1}^{r_i} D^{a1,i,k} + P(D)\sum_{k=1}^{\omega_i} D^{b_i,k} = 0$$

That is, a case will be considered where the number of terms of $X_1(D)$ and P(D) as the parity check polynomial is not limited to three as shown in equation 93-i. Using the above description as a reference, the following condition becomes important in the code configuration method of the present embodiment.

<Condition #23>

When i % α=j % α (i, j=0, 1, ..., s−2, s−1; i≠j) holds true, the following equation holds true.

[94]

$$A_{X1,i}(D)=A_{Xi,j}(D) \quad \text{(Equation 94)}$$

<Condition #24>

When i % β=j % β (i, j=0, 1, ..., s−2, s−1; i≠j) holds true, the following equation holds true:

[95]

$$B_i(D)=B_j(D) \quad \text{(Equation 95)}$$

Providing the above-described conditions makes it possible to reduce the number of parameters set using random numbers while increasing the time varying period and achieve the effect of facilitating a code search. At this time, to efficiently increase the time varying period, α and β may be "prime to each other" (coprime). The description "α and β being coprime" means that α and β have a relationship of having no common divisor other than 1 (and −1).

At this time, the time varying period can be represented by α×β. However, even when there is no such relationship that α and β are coprime, high error correction capability may be likely to be achieved. Furthermore, based on the description of Embodiment 6, α and β may be odd numbers. However, even when α and β are not odd numbers, high error correction capability may be likely to be achieved.

Next, with regard to an LDPC-CC based on a parity check polynomial of a time varying period of s and a coding rate of (n−1)/n, a code configuration method of an LDPC-CC will be described in which the tune varying period of the coefficient of $X_1(D)$ is $\alpha_1$, the time varying period of the coefficient of $X_2(D)$ is $\alpha_2$, ..., the time varying period of the coefficient of $X_k(D)$ is $\alpha_k$ (k=1, 2, ..., n−2, n−1), ..., the time varying period of the coefficient of $X_{n-1}(D)$ is $\alpha_{n-1}$, and the time varying period of the coefficient of P(D) is β. At this time, time varying period s=LCM($\alpha_1, \alpha_2, ... \alpha_{n-2}, \alpha_{n-1}, \beta$). That is, time varying period s is a least common multiple of $\alpha_1, \alpha_2, ..., \alpha_{n-2}, \alpha_{n-1}, \beta$.

The i-th (i=0, 1, 2, ..., s−2, s−1) parity check polynomial that satisfies 0 of an LDPC-CC based on a parity check polynomial of a time varying period of s and a coding rate of (n−1)/n is a parity check polynomial that satisfies 0 represented as shown in the equation below.

(Equation 96-1)

$$A_{X1,i}(D)X_1(D) + A_{X2,i}(D)X_2(D) + ... + \quad [96]$$
$$A_{X_{n-2},i}(D)X_{n-2}(D) + A_{Xn-1,i}(D)X_{n-1}(D) + B_i(D)P(D) =$$
$$(D^{a1,i,1} + D^{a1,i,2} + ... + D^{a1,i,r1,i})X_1(D) +$$
$$(D^{a2,i,1} + D^{a2,i,2} + ... + D^{a2,i,r2,i})X_2(D) + ... +$$
$$(D^{an-2,i,1} + D^{an-2,i,2} + ... + D^{an-2,i,m-2,i})X_{n-2}(D) +$$
$$(D^{an-1,i,1} + D^{an-1,i,2} + ... + D^{an-1,i,m-1,i})X_{n-1}(D) +$$
$$(D^{b_i,1} + D^{b_i,2} + ... + D^{b_i,\omega_i})P(D) =$$
$$X_1(D)\sum_{k=1}^{r_{1,i}} D^{a1,i,k} + X_2(D)\sum_{k=1}^{r_{2,i}} D^{a2,i,k} + ... + X_{n-2}(D)$$
$$\sum_{k=1}^{r_{n-2,i}} D^{an-2,i,k} + X_{n-1}(D)\sum_{k=1}^{r_{n-1,i}} D^{an-1,i,k} + P(D)\sum_{k=1}^{\omega_i} D^{b_i,k} = 0$$

where $X_1(D), X_2(D), ..., X_{n-1}(D)$ are polynomial representations of information sequences $X_1, X_2, ..., X_{n-1}$ (n is an integer equal to or greater than 2), P(D) is a polynomial representation of a parity sequence.

That is, a case will be considered where the number of terms of $X_1(D), X_2(D), ..., X_{n-2}(D), X_{n-1}(D)$ and P(D) is not limited to three. Using the above description as a reference, the following condition becomes important in the code configuration method according to the present embodiment.

<Condition #25>

When $i \% \alpha_k = j \% \alpha_k$ $(i, j=0, 1, \ldots, s-2, s-1; i \neq j)$ holds true, the following equation holds true.

[97]

$$A_{Xk,i}(D) A_{Xk,j}(D) \quad \text{(Equation 97)}$$

where, $k=1, 2, \ldots, n-2, n-1$.

<Condition #26>

When $i \% \beta = j \% \beta$ $(i, j=0, 1, \ldots, s-2, s-1; i \neq j)$ holds true, the following equation holds true.

[98]

$$B_i(D) = B_j(D) \quad \text{(Equation 98)}$$

That is, the encoding method according to the present embodiment is an encoding method of a low density parity check convolutional code (LDPC-CC) of a time varying period of s, includes a step of supplying an i-th (i=0, 1, ..., s-2, s-1) parity check polynomial represented by equation 96-i and a step of acquiring an LDPC-CC codeword through a linear computation of the 0-th to (s-1)-th parity check polynomials and input data, and it is assumed that a time varying period of coefficient $A_{Xk,i}$ of $X_k(D)$ is $\alpha_k$ ($\alpha_k$ is an integer greater than 1) (k=1, 2, ..., n-2, n-1), a time varying period of coefficient $B_{Xk,i}$ of P(D) is $\beta$ ($\beta$ is an integer greater than 1), time varying period s is a least common multiple of $\alpha_1, \alpha_2, \ldots \alpha_{n-2}, \alpha_{n-1}$, and $\beta$, equation 97 holds true when $i \% \alpha_k = j \% \alpha_k$ $(i, j=0, 1, \ldots, s-2, s-1; i \neq j)$ holds true and equation 98 holds true when $i \% \beta = j \% \beta$ $(i, j=0, 1, \ldots, s-2, s-1; i \neq j)$ holds true (see FIG. 59).

Providing the above-described conditions makes it possible to reduce the number of parameters set using random numbers while increasing the time varying period and achieve the effect of facilitating a code search.

At this time, to efficiently increase the time varying period, if $\alpha 1, \alpha 2, \ldots, \alpha n-2, \alpha n-1$ and $\beta$ are "coprime," the time varying period can be increased. At this time, the time varying period can be represented by $\alpha 1 \times \alpha 2 \times \ldots \times \alpha n-2 \times \alpha n-1 \times \beta$.

However, even if there is no such relationship of being coprime, high error correction capability may be likely to be achieved. Based on the description of Embodiment 6, $\alpha_1, \alpha_2, \ldots, \alpha_{n-2}, \alpha_{n-1}$ and $\beta$ may be odd numbers. However, even when they are not odd numbers, high error correction capability may be likely to be achieved.

(Embodiment 13)

With regard to the LDPC-CC described in Embodiment 12, the present embodiment proposes an LDPC-CC that makes it possible to configure an encoder/decoder with a small circuit scale.

First, a code configuration method of a coding rate of 1/2, 2/3 having the above features will be described.

As described in Embodiment 12, an i-th (i=0, 2, ..., s-2, s-1) parity check polynomial that satisfies 0 of an LDPC-CC based on a parity check polynomial in which the time varying period of $X_1(D)$ is $a_i$, time varying period of P(D) is $\beta$, time varying period s is $LCM(\alpha_1, \beta)$ and coding rate is 1/2 is represented as shown in the equation below.

(Equation 99-1)

$$A_{X1,i}(D)X_1(D) + B_i(D)P(D) = \quad [99]$$
$$(D^{a1,i,1} + D^{a1,i,2} + \ldots + D^{a1,i,ri})X_1(D) +$$
$$(D^{bi,1} + D^{bi,2} + \ldots + D^{bi,\omega i})P(D) =$$
$$X_1(D)\sum_{k=1}^{r_i} D^{a1,i,k} + P(D)\sum_{k=1}^{\omega_i} D^{bi,k} = 0$$

Using Embodiment 12 as a reference, the following condition holds true.

<Condition #26-1>

When $i \% \alpha_1 = j \% \alpha_1$ $(i, j=0, 1, \ldots, s-2, s-1; i \neq j)$ holds true, the following equation holds true.

[100]

$$A_{X1,i}(D) = A_{X1,j}(D) \quad \text{(Equation 100)}$$

<Condition #27>

When $i \% \beta = j \% \beta$ $(i, j=0, 1, \ldots, s-2, s-1; i \neq j)$ holds true, the following equation holds true.

[101]

$$B_i(D) = B_j(D) \quad \text{(Equation 101)}$$

Here, consider an LDPC-CC of a coding rate of 1/2 and an LDPC-CC of a coding rate of 2/3 which allows circuits to be shared between an encoder and a decoder. An i-th (i=0, 1, 2, ..., z-2, z-1) parity check polynomial that satisfies 0 based on a parity check polynomial of a coding rate of 2/3 and a time varying period of z is represented as shown in the equation below.

[102]

$$C_{X1,i}(D)X_1(D) + C_{X2,i}(D)X_2(D) + E_i(D)P(D) = 0 \quad \text{(Equation 102-1)}$$

At this time, conditions of an LDPC-CC based on a parity check polynomial of a coding rate of 1/2 and an LDPC-CC of a coding rate of 2/3 which allows circuits to be shared between an encoder and a decoder based on equation 99-i are described below.

<Condition #28>

In the parity check polynomial that satisfies 0 of equation 102-i, when the time varying period of $X_1(D)$ is $\alpha_1$ and $i \% \alpha_1 = j \% \alpha_1$ (i=0, 1, ..., s-2, s-1, j=0, 1, ..., z-2, z-1) holds true, the following equation holds true.

[103]

$$A_{X1,i}(D) = C_{X1,j}(D) \quad \text{(Equation 103)}$$

<Condition #29>

In the parity check polynomial that satisfies 0 of equation 102-i, when the time varying period of P(D) is $\beta$ and $i \% \beta = j \% \beta$ (i=0, 1, ..., s-2, s-1, j=0, 1, ..., z-2, z-1) holds true, the following equation holds true.

[104]

$$B_i(D) = E_j(D) \quad \text{(Equation 104)}$$

In the parity check polynomial that satisfies 0 of equation 102-i, since the time varying period of $X_2(D)$ may be assumed to be $\alpha_2$, the following condition holds true.

<Condition #30>

[105]

$$C_{X2,i}(D) = C_{X2,j}(D) \quad \text{(Equation 105)}$$

At this time, $\alpha_2$ may be $\alpha_1$ or $\beta$, $\alpha_2$ may be a natural number which is coprime to $\alpha_1$ and $\beta$. However, $\alpha_2$ has a characteristic of enabling the time varying period to be efficiently increased as long as it is a natural number coprime to $\alpha_1$ and $\beta$. Based on the description of Embodiment 6, $\alpha_1$, $\alpha_2$ and $\beta$ are preferably odd numbers. However, even when $\alpha_1$, $\alpha_2$ and $\beta$ are not odd numbers, high error correction capability may be likely to be achieved.

Time varying period z is LCM ($\alpha_1$, $\alpha_2$, $\beta$), that is, a least common multiple of $a_1$, $a_2$ and p.

Figure 60:
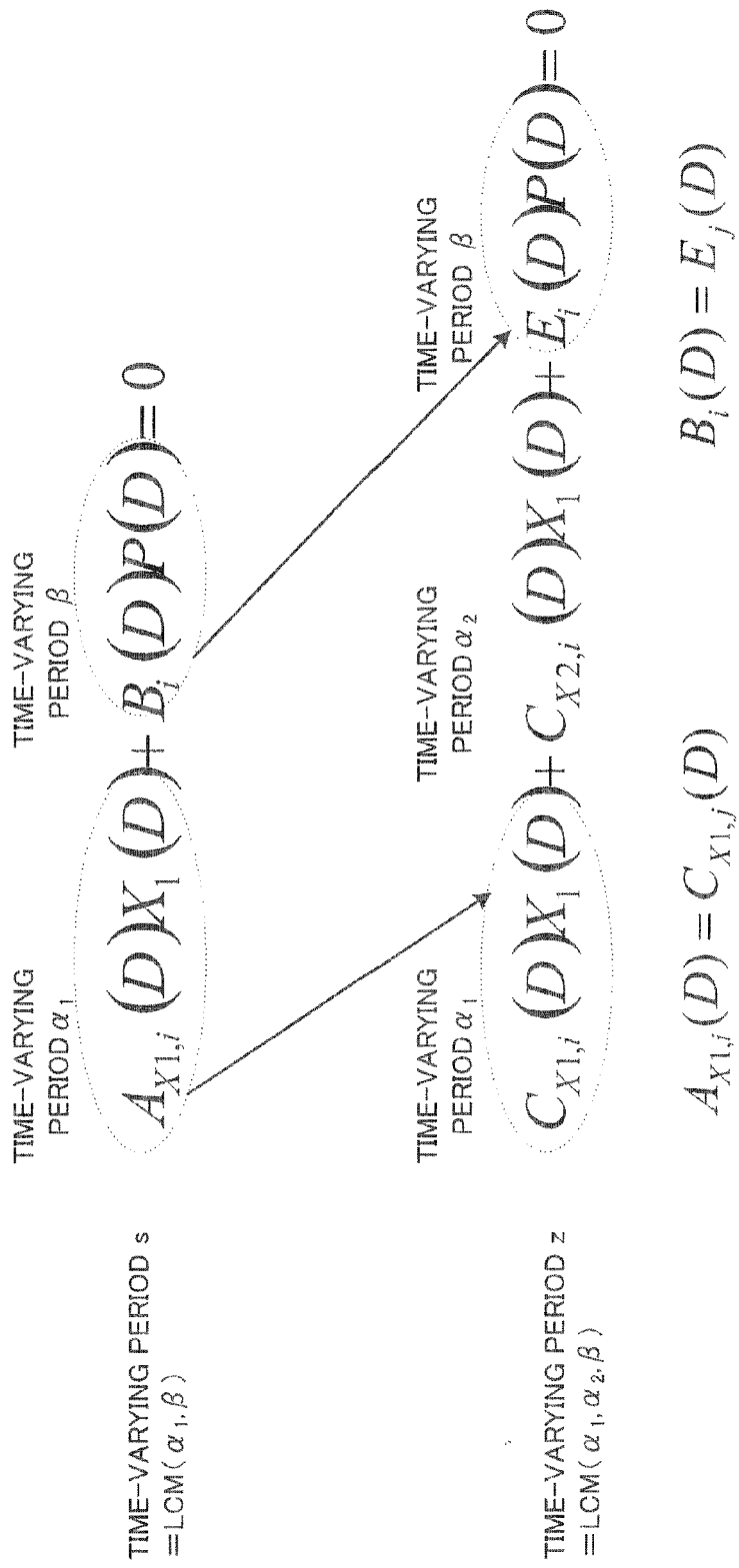
FIG. 60 is a diagram schematically showing a parity check polynomial of LDPC-CC of coding rates of 1/2 and 2/3 that allows the circuit to be shared between an encoder and a decoder.

FIG. 60 schematically shows a parity check polynomial of an LDPC-CC of a coding rate of 1/2, 2/3 that allows circuits to be shared between the encoder and decoder.

An LDPC-CC of a coding rate of 1/2 and an LDPC-CC of a coding rate of 2/3 which allows circuits to be shared between an encoder and a decoder has been described so far. Hereinafter, with further generalization, a code configuration method for an LDPC-CC of a coding rate of (n−1)/n and an LDPC-CC of a coding rate of (m−1)/m (n<m) which allows circuits to be shared between an encoder and a decoder will be described.

An i-th (i=0, 1, 2, . . . , s−2, s−1) parity check polynomial that satisfies 0 of an LDPC-CC based on a parity check polynomial of (n−1)/n in which the time varying period of $X_1(D)$ is $\alpha_1$, time varying period of $X_2(D)$ is $\alpha_2$, time varying period of $X_{n-1}(D)$ is $\alpha_{n-1}$, time varying period of P(D) is $\beta$, time varying period s is LCM ($\alpha_1$, $\alpha_2$, . . . , $\alpha_{n-1}$, =), that is, a least common multiple of $\alpha_1$, $\alpha_2$, . . . , $\alpha_{n-1}$, $\beta$ is represented as shown in the equation below.

(Equation 106-1)

$$A_{X1,i}(D)X_1(D) + A_{X2,i}(D)X_2(D) + \ldots + A_{Xn-1,i}(D)X_{n-1}(D) + \\ B_i(D)P(D) = (D^{a1,i,1} + D^{a1,i,2} + \ldots + D^{a1,i,ri,1})X_1(D) + \\ (D^{a2,i,1} + D^{a2,i,2} + \ldots + D^{a2,i,ri,2})X_2(D) + \ldots + \\ (D^{an-1,i,1} + D^{an-1,i,2} + \ldots + D^{an-1,i,ri,n-1})X_{n-1}(D) + \\ (D^{bi,1} + D^{bi,2} + \ldots + D^{bi,\omega i})P(D) = \\ X_1(D)\sum_{k=1}^{r_{i,1}} D^{a1,i,k} + X_2(D)\sum_{k=1}^{r_{i,2}} D^{a2,i,k} + \ldots + \\ X_{n-1}(D)\sum_{k=1}^{r_{i,n-1}} D^{an-1,i,k} + P(D)\sum_{k=1}^{\omega_i} D^{bi,k} = 0$$

[106]

Using Embodiment 12 as a reference, the following condition holds true:

<Condition #31>

When i % $\alpha_k$=j % $\alpha_k$ (i, j=0, 1, . . . , s−2, s−1; holds true, the following equation holds true.

[107]

$$A_{Xk,i}(D)=A_{Xk,j}(D) \quad \text{(Equation 107)}$$

where, k=1, 2, . . . , n−1.

<Condition #32>

When i % $\beta$=j % $\beta$ (i, j=0, 1, . . . , s−2, s−1; i·j); holds true, the following equation holds true.

[108]

$$B_i(D)=B_j(D) \quad \text{(Equation 108)}$$

Here, consider an LDPC-CC of a coding rate of (n−1)/n and an LDPC-CC of a coding rate of (m−1)/m which allows circuits to be shared between an encoder and a decoder. The i-th (i=0, 1, 2, . . . , z−2, z−1) parity check polynomial that satisfies 0 based on a parity check polynomial of a coding rate of (m−1)/m and a time varying period of z is represented as shown in the equation below.

(Equation 109-1)

$$C_{X1,i}(D)X_1(D) + C_{X2,i}(D)X_2(D) + \ldots + C_{Xn-1,i}(D)X_{n-1}(D) + \\ C_{Xn,i}(D)X_n(D) + \ldots + C_{Xm-1,i}(D)X_{m-1}(D) + \\ E_i(D)P(D) = (D^{c1,i,1} + D^{c1,i,2} + \ldots + D^{c1,i,ri,1})X_1(D) + \\ (D^{c2,i,1} + D^{c2,i,2} + \ldots + D^{c2,i,ri,2})X_2(D) + \ldots + \\ (D^{cn-1,i,1} + D^{cn-1,i,2} + \ldots + D^{cn-1,i,ri,n-1})X_{n-1}(D) + \\ (D^{cn,i,1} + D^{cn,i,2} + \ldots + D^{cn,i,ri,n})X_n(D) + \ldots + \\ (D^{cm-1,i,1} + D^{cm-1,i,2} + \ldots + D^{cm-1,i,ri,m-1})X_{m-1}(D) + \\ (D^{ei,1} + D^{ei,2} + \ldots + D^{ei,\omega i})P(D) = \\ X_1(D)\sum_{k=1}^{r_{i,1}} D^{c1,i,k} + X_2(D)\sum_{k=1}^{r_{i,2}} D^{c2,i,k} + \ldots + \\ X_{n-1}(D)\sum_{k=1}^{r_{i,n-1}} D^{cn-1,i,k} + X_n(D)\sum_{k=1}^{r_{i,n}} D^{cn,i,k} + \\ \ldots + X_m(D)\sum_{k=1}^{r_{i,m}} D^{cm,i,k} + P(D)\sum_{k=1}^{\omega_i} D^{ei,k} = 0$$

[109]

At this time, conditions of the LDPC-CC based on the parity check polynomial of a coding rate of (n−1)/n represented by equation 106-i and the LDPC-CC of a coding rate of (m−1)/m that allows circuits to be shared between an encoder and a decoder are described below.

<Condition #33>

In the parity check polynomial that satisfies 0 of equation 109-i, when the time varying period of $X_k(D)$ is $\alpha_k$ (k=1, 2, . . . , n−1) and % $\alpha_k$=j % $\alpha_k$ (i=0, 1, . . . , s−2, s−1; j=0, 1, . . . , z−2, z−1) holds true, the following equation holds true.

[110]

$$A_{Xk,i}(D)=C_{Xk,j}(D) \quad \text{(Equation 110)}$$

<Condition #34>

In the parity check polynomial that satisfies 0 of equation 109-i, when the time varying period of P(D) is $\beta$ and i % $\beta$=j % $\beta$ (i=0, 1, . . . , s−2, s−1; j=0, 1, . . . , z−2, z−1) holds true, the following equation holds true.

[111]

$$B_i(D)=E_j(D) \quad \text{(Equation 111)}$$

In the parity check polynomial that satisfies 0 of equation 109-i, since the time varying period of $X_h(D)$ may be set to $\alpha_h$ (h=n, n+1, . . . , m−1), the following condition holds true.

<Condition #35>

When i % $\alpha_h$=j % $\alpha_h$ (i, j=0, 1, . . . , z−2, z−1; i≠j) holds true, the following equation holds true.

[112]

$$C_{Xh,i}(D)=C_{Xh,j}(D) \quad \text{(Equation 112)}$$

At this time, $a_h$ may be a natural number. If all $\alpha_1$, $\alpha_2$, . . . , $\alpha_{n-1}$, $\alpha_n$, . . . , $\alpha_{m-1}$, and $\beta$ are natural numbers coprime to each other, there is a characteristic of enabling the time varying period to be efficiently increased. Furthermore, based on the description of Embodiment 6, $\alpha_1$, $\alpha_2$, . . . , $\alpha_{n-1}$, $\alpha_n$, . . . , $\alpha_{m-1}$, and $\beta$ are preferably odd numbers. However, even when these are not odd numbers, high error correction capability may be likely to be achieved.

Time varying period z is LCM $(\alpha_1, \alpha_2, \ldots, \alpha_{n-1}, \alpha_n, \ldots, \alpha_{m-1}, \beta$, that is, a least common multiple of $\alpha_1, \alpha_2, \ldots, \alpha_{n-1}, \alpha_n, \ldots, a_{m-1}, \beta$.

Next, a specific encoder/decoder configuration method for the aforementioned LDPC-CC supporting a plurality of coding rates which can configure an encoder/decoder with a small circuit scale will be described.

First, in the encoder/decoder according to the present invention, the highest coding rate among coding rates intended for the sharing of circuits is assumed to be (q−1)/q. When, for example, coding rates supported by the transmitting/receiving apparatus are assumed to be 1/2, 2/3, 3/4 and 5/6, it is assumed that the codes of coding rates of 1/2, 2/3 and 3/4 allow circuits to be shared between the encoder and decoder and a coding rate of 5/6 is not intended for the sharing of circuits between the encoder and decoder. At this time, the aforementioned highest coding rate of (q−1)/q is 3/4. Hereinafter, an encoder for creating an LDPC-CC of a time varying period of z (z is a natural number) will be described which can support a plurality of coding rates of (r−1)/r (r is an integer equal to or greater than 2 and equal to or smaller than q).

Figure 61:
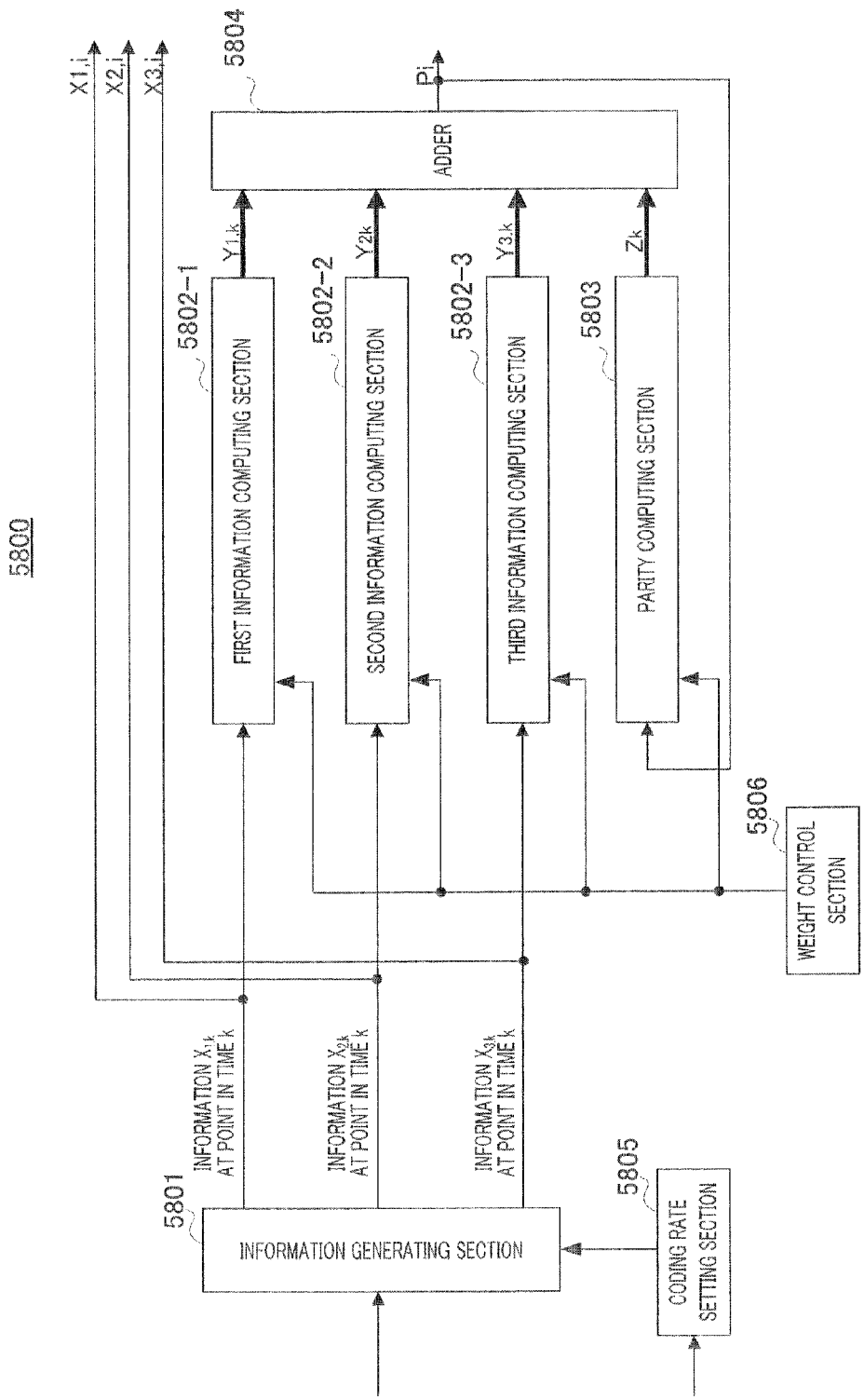
FIG. 61 is a block diagram showing an example of main components of an encoder according to Embodiment 13.

FIG. 61 is a block diagram showing an example of the main components of an encoder according to the present embodiment. Encoder 5800 shown in FIG. 61 is an encoder supporting coding rates of 1/2, 2/3 and 3/4. Encoder 5800 shown in FIG. 61 is mainly provided with information generating section 5801, first information computing section 5802-1, second information computing section 5802-2, third information computing section 5802-3, parity computing section 5803, adding section 5804, coding rate setting section 5805 and weight control section 5806.

Information generating section 5801 sets information $X_{1,k}$, information $X_{2,k}$ and information $X_{3,k}$ at point in time k according to a coding rate designated by coding rate setting section 5805. When, for example, coding rate setting section 5805 sets the coding rate to 1/2, information generating section 5801 sets input information data $S_j$ in information $X_{1,k}$ at point in time k and sets 0 in information $X_{2,k}$ at point in time k and information $X_{3,k}$ at point in time k.

Furthermore, when the coding rate is 2/3, information generating section 5801 sets input information data $S_j$ in information $X_{1,k}$ at point in time k, sets input information data $S_{j+1}$ in information $X_{2,k}$ at point in time k and sets 0 in information $X_{3,k}$ at point in time k.

Furthermore, when the coding rate is 3/4, information generating section 5801 sets input information data $S_j$ in information $X_{1,k}$ at point in time k, sets input information data $S_{j+1}$ in information $X_{2,k}$ at point in time k and sets input information data $S_{j+2}$ in information $X_{3,1}$ at point in time k.

Thus, information generating section 5801 sets input information data in information $X_{1,k}$, information $X_{2,k}$ and information $X_{3,k}$ at point in time k according to the coding rate set by coding rate setting section 5805, outputs set information $X_{1,k}$ to first information computing section 5802-1, outputs set information $X_{2,k}$ to second information computing section 5802-2 and outputs set information $X_{3,k}$ to third information computing section 5802-3.

First information computing section 5802-1 computes $X_1(D)$ according to $A_{X1,i}(D)$ of equation 106-i (also corresponds to equation 109-i because equation 110 holds true). Similarly, second information computing section 5802-2 computes $X_2(D)$ according to $A_{X2,i}(D)$ of equation 106-2 (also corresponds to equation 109-i because equation 110 holds true). Similarly, third information computing section 580-3 computes $X_3(D)$ according to $C_{X3,i}(D)$ of equation 109-i.

At this time, as described above, since equation 109-i satisfies <condition #33> and <condition #34>, even when the coding rate is changed, it is necessary to change neither the configuration of first information computing section 5802-1 nor the configuration of second information computing section 5802-2.

Therefore, when a plurality of coding rates are supported, by using the configuration of the encoder of the highest coding rate as a reference among coding rates for sharing encoder circuits, the other coding rates can be supported by the above operations. That is, the aforementioned LDPC-CC has an advantage of being able to share first information computing section 5802-1 and second information computing section 5802-2 which are main parts of the encoder regardless of the coding rate.

Figure 62:
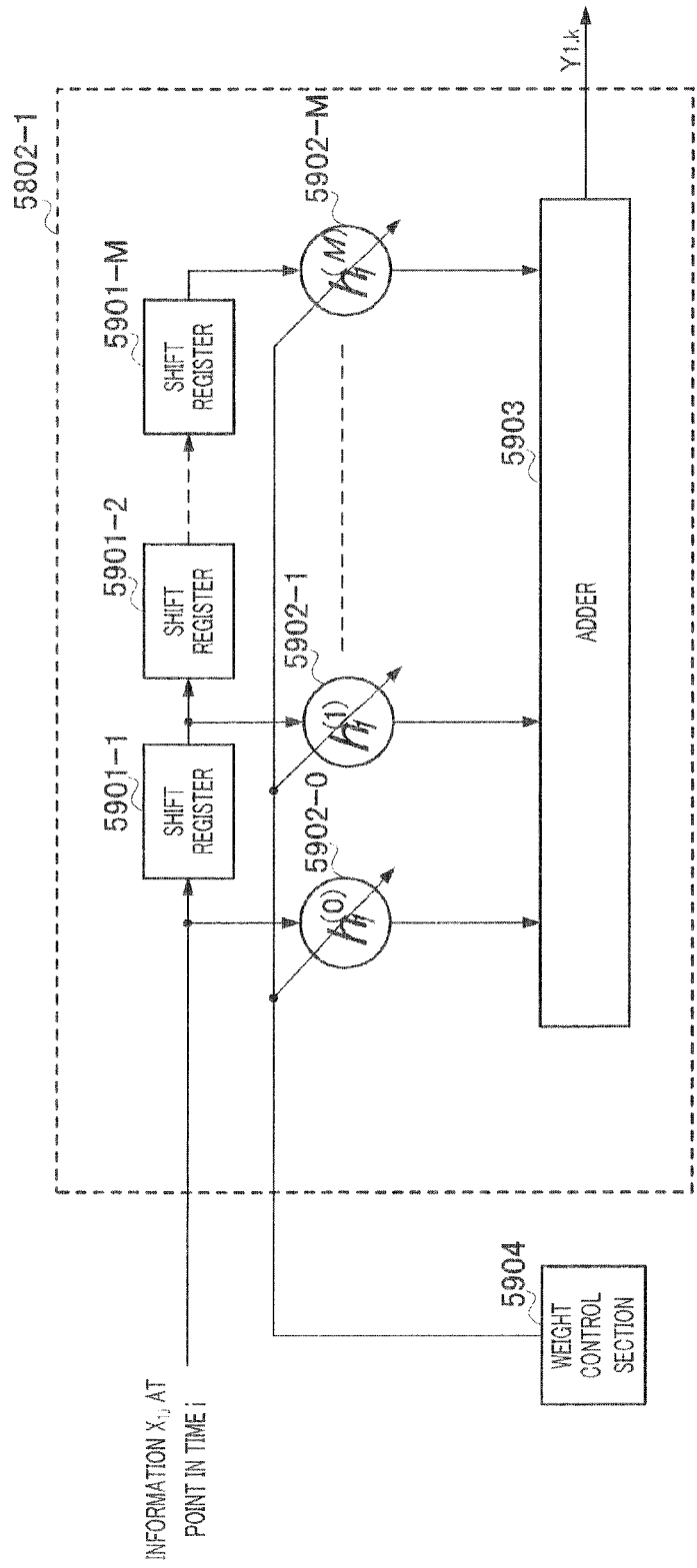
FIG. 62 shows an internal configuration of a first information computing section.

FIG. 62 shows the configuration inside first information computing section 5802-1. First information computing section 5802-1 in FIG. 62 is provided with shift registers 5901-1 to 5901-M, weight multipliers 5902-0 to 5902-M and adder 5903.

Shift registers 5901-1 to 5901-M are registers that store $X_{1,i-t}$ (t=0, ..., M−1), respectively, send a stored value when the next input is entered to a shift register on the right side and store a value outputted from a shift register on the left side.

Weight multipliers 5902-0 to 5902-M switch the value of $h_1^{(t)}$ to 0 or 1 according to a control signal outputted from weight control section 5904.

Adder 5903 performs an exclusive OR operation on the outputs of weight multipliers 5902-0 to 5902-M, computes computation result $Y_{1,k}$ and outputs computed $Y_{1,k}$ to adder 5804 in FIG. 61.

Also, the configurations inside second information computing section 5802-2 and third information computing section 5802-3 are the same as first information computing section 5802-1, and therefore their explanation will be omitted. Second information computing section 5802-2 computes computation result $Y_{2,k}$ as in the case of first information computing section 5802-1 and outputs computed $Y_{2,k}$ to adder 5804 in FIG. 61. Third information computing section 5802-3 computes computation result $Y_{3,k}$ as in the case of first information computing section 5802-1 and outputs computed $Y_{3,k}$ to adder 5804 in FIG. 61.

Parity computing section 5803 in FIG. 61 computes $P(D)$ according to $B_i(D)$ of equation 106-i (which also corresponds to equation 109-i because Equation (111) holds true)).

Figure 63:
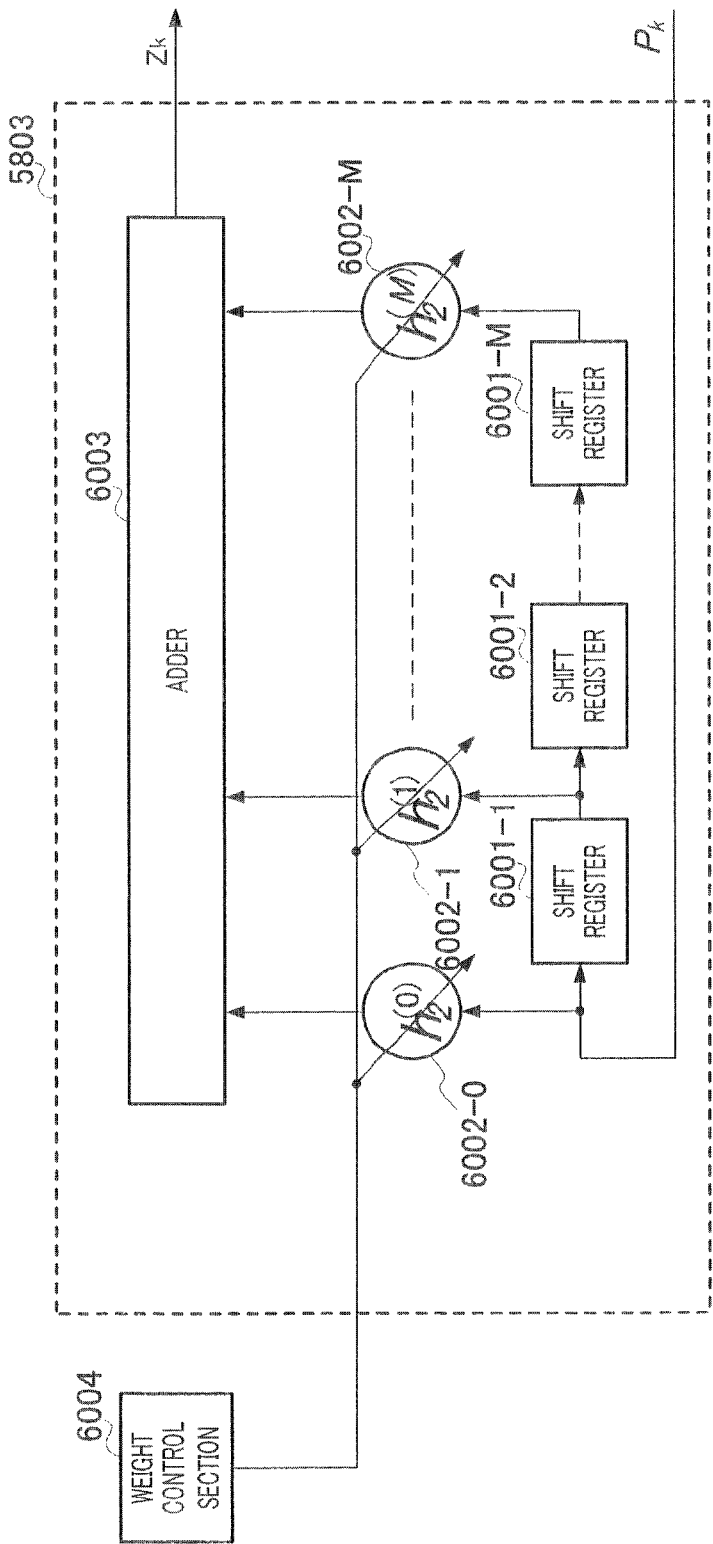
FIG. 63 shows an internal configuration of a parity computing section.

FIG. 63 shows the configuration inside parity computing section 5803 in FIG. 61. Parity computing section 5803 in FIG. 63 is provided with shift registers 6001-1 to 6001-M, weight multipliers 6002-0 to 6002-M and adder 6003.

Shift registers 6001-1 to 6001-M are registers that store $P_{i-t}$ (t=0, ..., M−1), respectively, send a stored value when the next input is entered to a shift register on the right side and store a value outputted from a shift register on the left side.

Weight multipliers 6002-0 to 6002-M switch the value of $h_2^{(t)}$ to 0 or 1 according to a control signal outputted from weight control section 6004.

Adder 6003 performs an exclusive OR operation on the outputs of weight multipliers 6002-0 to 6002-M, computes computation result $Z_k$ and outputs computed $Z_k$ to adder 5804 in FIG. 61.

Returning to FIG. 61 again, adder 5804 performs exclusive OR operation on computation results $Y_{1,k}$, $Y_{2,k}$, $Y_{3,k}$ and $Z_k$ outputted from first information computing section 5802-1, second information computing section 5802-2, third information computing section 5802-3 and parity computing section

5803, obtains parity $P_k$ at time k and outputs parity $P_k$. Adder 5804 also outputs parity $P_k$ at time k to parity computing section 5803.

Coding rate setting section 5805 sets the coding rate of encoder 5800 and outputs coding rate information to information generating section 5801.

Weight control section 5806 outputs the value of $h_1(m)$ at time k based on a parity check polynomial that satisfies 0 of equation 106-i and equation 109-i stored in weight control section 5806 to first information computing section 5802-1, second information computing section 5802-2, third information computing section 5802-3 and parity computing section 5803. Furthermore, weight control section 5806 outputs the value of $h_2^{(m)}$ at the timing to 6002-0 to 6002-M based on a parity check polynomial that satisfies 0 corresponding to equation 106-i and equation 109-i stored in weight control section 5806.

Figure 64:
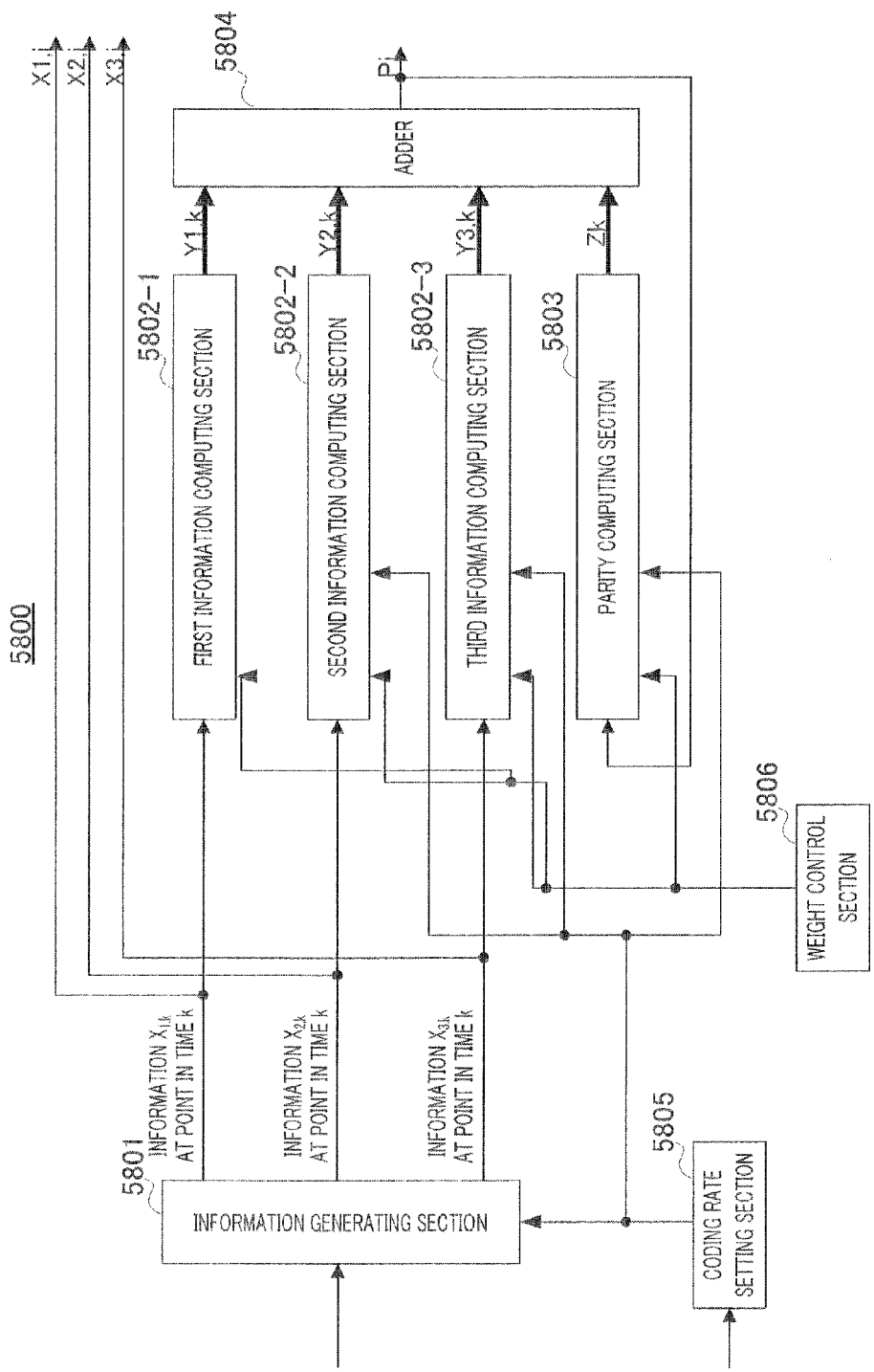
FIG. 64 shows another configuration example of the encoder according to Embodiment 13.

Also, FIG. 64 shows another configuration of an encoder according to the present embodiment. In the encoder of FIG. 64, the same components as in the encoder of FIG. 61 are assigned the same reference numerals.

Encoder 5800 in FIG. 64 is different from encoder 5800 in FIG. 61 in that coding rate setting section 5805 outputs information of coding rates to first information computing section 5802-1, second information computing section 5802-2, third information computing section 5802-3 and parity computing section 5803.

When the coding rate is 1/2, second information computing section 5802-2 does not perform computation processing and outputs 0 to adder 5804 as computation result $Y_{2,k}$. On the other hand, when the coding rate is 1/2 or 2/3, third information computing section 5802-3 does not perform computation processing and outputs 0 to adder 5804 as computation result $Y_{3,k}$.

In encoder 5800 in FIG. 61, information generating section 5801 sets information $X_{2,i}$ and information $X_{3,i}$ at point in time i to 0 according to the coding rate, whereas in encoder 5800 in FIG. 64, second information computing section 5802-2 and third information computing section 5802-3 stop computation processing according to the coding rate, output 0 as computation results $Y_{2,k}$ and $Y_{3,k}$, and therefore the computation results obtained is the same as those in encoder 5800 in FIG. 61.

Thus, in encoder 5800 of FIG. 64, second information computing section 5802-2 and third information computing section 5802-3 stops computation processing according to a coding rate, so that it is possible to reduce computation processing, compared to encoder 5800 of FIG. 61.

As shown in the specific example above, with regard to the codes of the LDPC-CC of a coding rate of (n−1)/n described using equation 106-i and equation 109-i and the LDPC-CC of a coding rate of (m−1)/m (n<m) which allows the circuits to be shared between the encoder and decoder, it is possible to share the encoder circuits by providing an encoder of an LDPC-CC of a large coding rate of (m−1)/m, setting the computation output relating to Xk(D) (where k=n, n+1, . . . , m−1) to 0 when the coding rate is (n−1)/n and calculating parity when the coding rate is (n−1)/n.

Next, the method of sharing decoder circuits of the LDPC-CC described in the present embodiment will be described in further detail.

Figure 65:
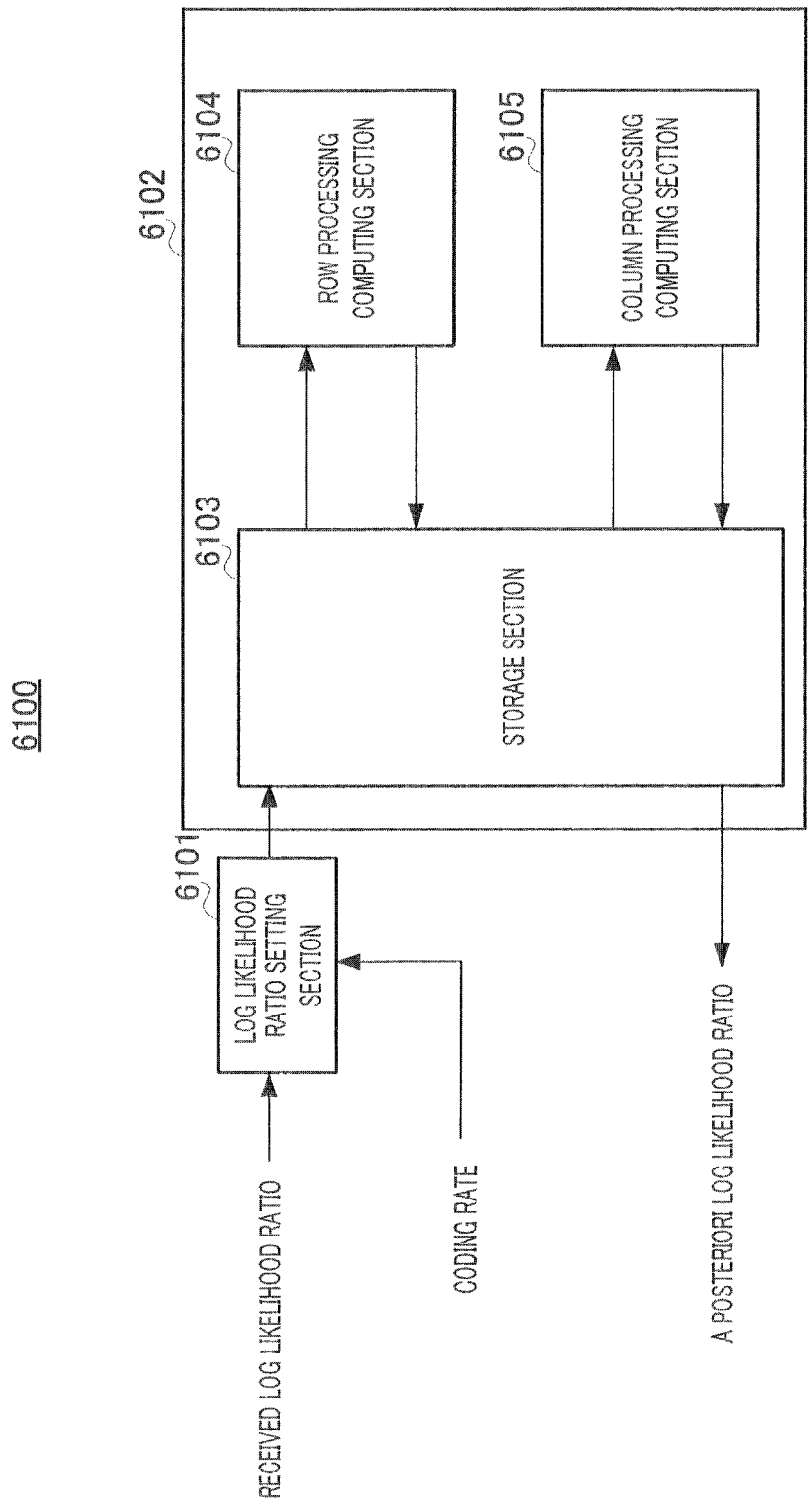
FIG. 65 is a block diagram showing an example of main components of the decoder according to Embodiment 13.

FIG. 65 is a block diagram showing the main components of a decoder according to the present embodiment. Here, decoder 6100 shown in FIG. 65 refers to a decoder that can support coding rates of 1/2, 2/3 and 3/4. Decoder 6100 of FIG. 65 is mainly provided with log likelihood ratio setting section 6101 and matrix processing computing section 6102.

Log likelihood ratio setting section 6101 receives as input a reception log likelihood ratio and coding rate calculated in a log likelihood ratio computing section (not shown), and inserts a known log likelihood ratio in the reception log likelihood ratio according to the coding rate.

When, for example, the coding rate is 1/2, this corresponds to encoder 5800 transmitting "0"s as $X_{2,k}$ and $X_{3,k}$, and therefore log likelihood ratio setting section 6101 inserts a fixed log likelihood ratio corresponding to known bits "0"s as log likelihood ratios of $X_{2,k}$ and $X_{3,k}$ and outputs the log likelihood ratios inserted to matrix processing computing section 6102. This will be explained below using FIG. 66.

Figure 66:
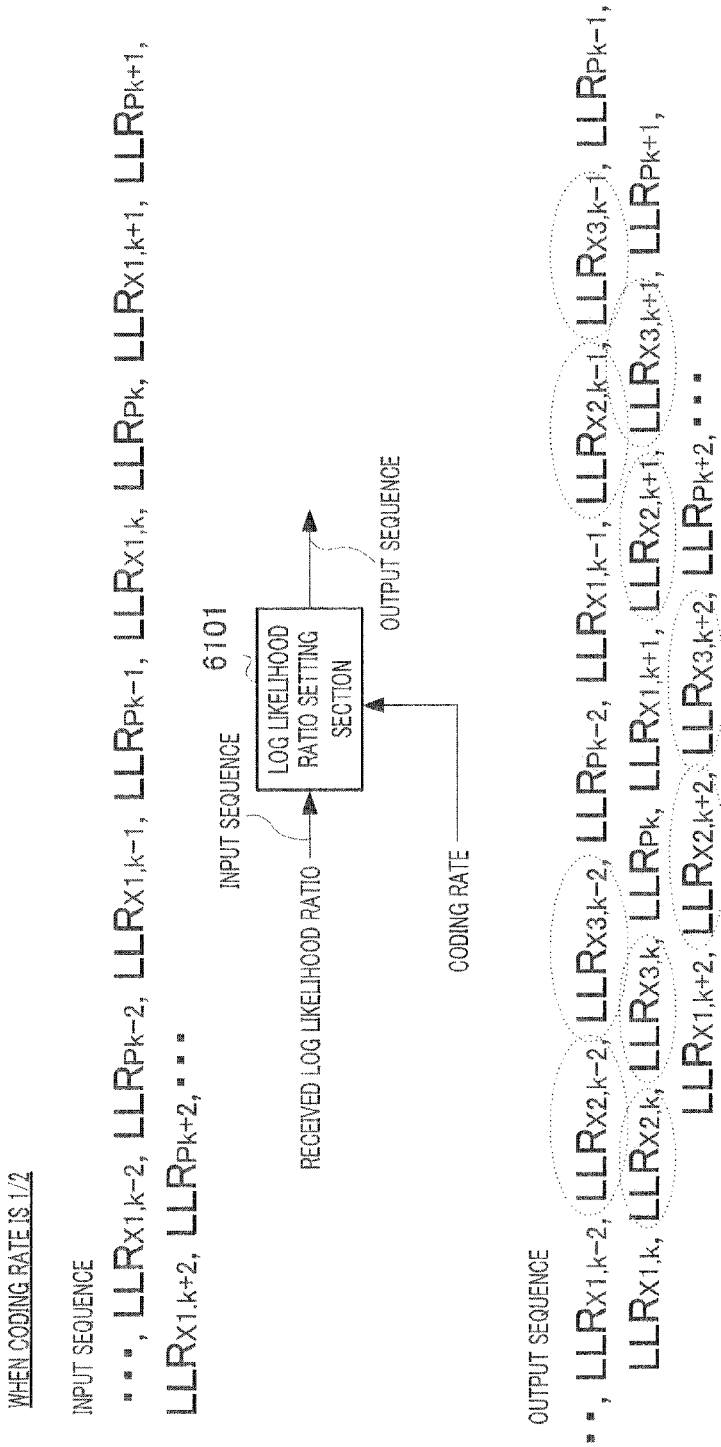
FIG. 66 illustrates operations of a log likelihood ratio setting section in a case of a coding rate of 1/2

As shown in FIG. 66, when the coding rate is 1/2, log likelihood ratio setting section 6101 receives as input received log likelihood ratios $LLR_{X1,k}$ and $LLR_{Pk}$ corresponding to $X_{1,k}$ and $P_k$ at point in time k. Log likelihood ratio setting section 6101 then inserts received log likelihood ratios $LLR_{X2,k}$ and $LLR_{X3,k}$ corresponding to $X_{2,k}$ and $X_{3,k}$. In FIG. 66, the received log likelihood ratios encircled by dotted lines represent received log likelihood ratios $LLR_{X2,k}$ and $LLR_{X3,k}$ inserted by log likelihood ratio setting section 6101. Log likelihood ratio setting section 6101 inserts log likelihood ratios of fixed values as received log likelihood ratios $LLR_{X2,k}$ and $LLR_{X3,k}$.

Furthermore, when the coding rate is 2/3, this corresponds to encoder 5800 transmitting "0" as $X_{3,k}$, and therefore log likelihood ratio setting section 6101 inserts a fixed log likelihood ratio corresponding to known bit "0" as a log likelihood ratio of $X_{3,k}$ and outputs the inserted log likelihood ratio to matrix processing computing section 6102. This will be explained using FIG. 67.

Figure 67:
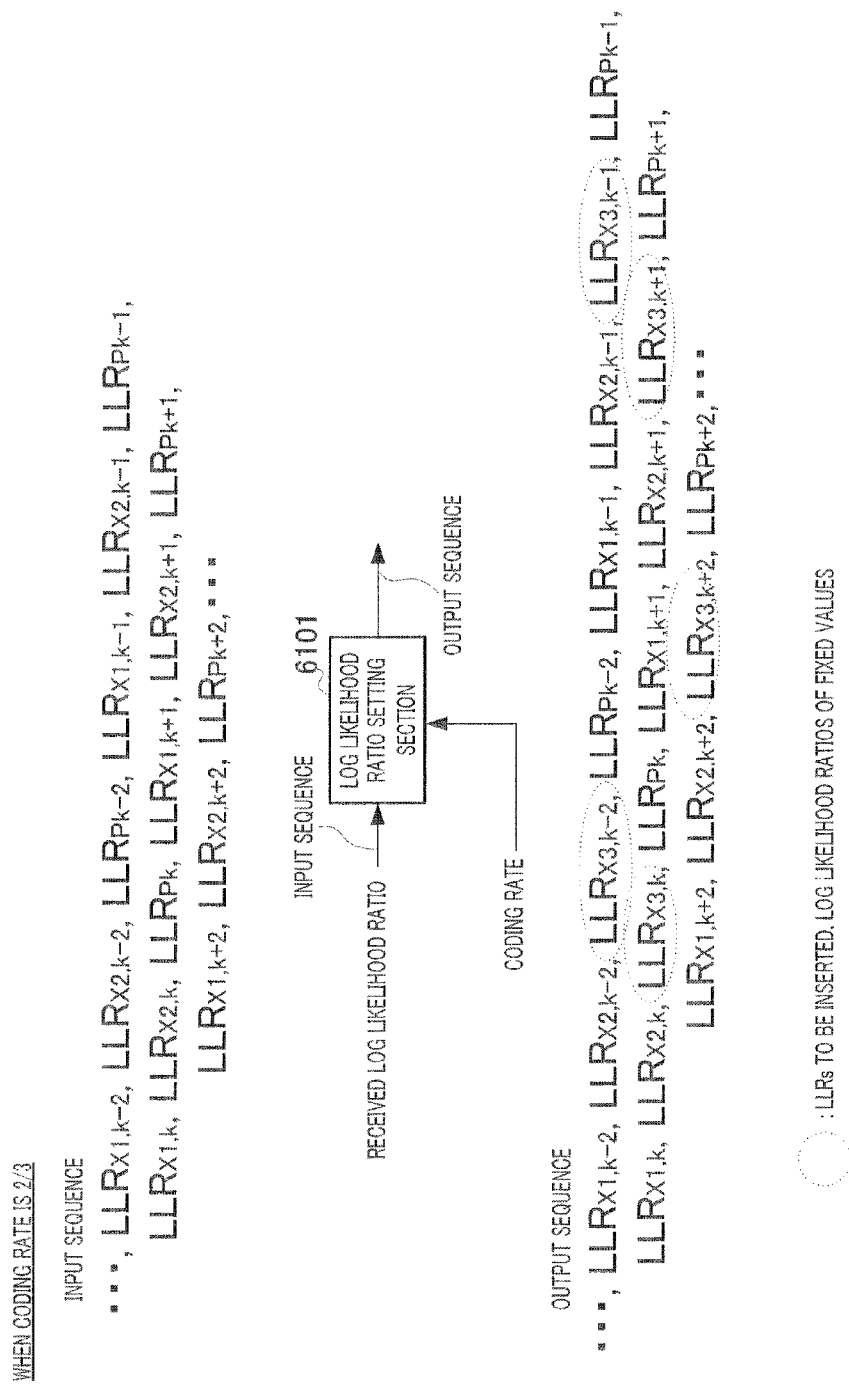
FIG. 67 illustrates operations of a log likelihood ratio setting section in a case of a coding rate of 2/3.

As shown in FIG. 67, when the coding rate is 2/3, log likelihood ratio setting section 6101 receives as input received log likelihood ratios $LLR_{X1,k}$, $LLR_{X2,k}$ and $LLR_{Pk}$ corresponding to $X_{1,k}$, $X_{2,k}$ and $P_k$. Thus, log likelihood ratio setting section 6101 inserts received log likelihood ratio $LLR_{X3,k}$ corresponding to $X_{3,k}$. In FIG. 67, the received log likelihood ratios encircled by dotted lines represent received log likelihood ratio $LLR_{X3,k}$ inserted by log likelihood ratio setting section 6101. Log likelihood ratio setting section 6101 inserts a log likelihood ratio of a fixed value as received log likelihood ratio $LLR_{X3,k}$.

Matrix processing computing section 6102 in FIG. 65 is provided with storage section 6103, row processing computing section 6104 and column processing computing section 6105.

Storage section 6103 stores an log likelihood ratio, external value $\alpha_{mn}$ obtained by row processing and a priori value $\beta_{mn}$ obtained by column processing.

Row processing computing section 6104 holds the row-direction weight pattern of LDPC-CC check matrix H of the maximum coding rate of 3/4 among coding rates supported by encoder 5800. Row processing computing section 6104 reads a necessary priori value $\beta_{mn}$ from storage section 6103, according to that row-direction weight pattern, and performs row processing computation.

In row processing computation, row processing computation section 6104 decodes a single parity check code using a priori value $\beta_{mn}$, and finds external value $\alpha_{mn}$.

Processing of the m-th row will be explained.

Here, binary M×N matrix H={$H_{mn}$} is assumed to be a check matrix of an LDPC code to be decoded. Extrinsic value $\alpha_{mn}$ is updated using the following update equation for all sets (m, n) that satisfy $H_{mn}=1$.

(Equation 113)

$$\alpha_{mn} = \left( \prod_{n' \in A(m)\backslash n} \text{sign}(\beta_{mn'}) \right) \Phi\left( \sum_{n' \in A(m)\backslash n} \Phi(|\beta_{mn'}|) \right) \quad [113]$$

where $\Phi(x)$ is called a Gallager f function, and is defined by the following equation.

(Equation 114)

$$\Phi(x) = \ln \frac{\exp(x)+1}{\exp(x)-1} \quad \text{(Equation 114)}$$

Column processing computing section 6105 holds the column-direction weight pattern of LDPC-CC check matrix H of the maximum coding rate of 3/4 among coding rates supported by encoder 5800. Column processing computing section 6105 reads a necessary external value $\alpha_{mn}$ from storage section 321, according to that column-direction weight pattern, and finds a priori value $\beta_{mn}$.

In column processing computation, column processing computing section 6105 performs iterative decoding using input log likelihood ratio $\lambda n$ and external value $\alpha mn$, and finds a priori value $\beta mn$.

Processing of the m-th column will be explained.

$\beta_{mn}$ is updated using the following update equation for all sets (m, n) that satisfy $H_{mn}=1$. However, initial computation is performed assuming $\alpha_{mn}=0$.

(Equation 115)

$$\beta_{mn} = \lambda_n + \sum_{m' \in B(n)/m} \alpha_{m'n} \quad \text{(Equation 115)}$$

Decoder 6100 obtains a posteriori log likelihood ratio by repeating the aforementioned row processing and column processing a predetermined number of times.

As described above, the present embodiment assumes the highest coding rate among coding rates that can be supported to be (m−1)/m, and when coding rate setting section 5805 sets the coding rate to (n−1)/n, information generating section 5801 sets information from information $X_{n,k}$ to information $X_{m−1,k}$ to 0.

When, for example, the supported coding rates are 1/2, 2/3 and 3/4 (m=4), first information computing section 5802-1 receives information $X_{1,k}$ at point in time k as input and computes the $X_1(D)$ term. Furthermore, second information computing section 5802-2 receives information $X_{2,k}$ at point in time k as input and computes the $X_2(D)$ term. Furthermore, third information computing section 5802-3 receives information $X_{3,k}$ at point in time k as input and computes the $X_3(D)$ term.

Furthermore, parity computing section 5803 receives parity $P_{k−1}$ at point in time k−1 as input and computes the P(D) term. Furthermore, adder 5804 obtains an exclusive OR of the computation results of first information computing section 5802-1, second information computing section 5802-2 and third information computing section 5802-3 and the computation result of parity computing section 5803 as parity $P_k$ at time k.

With this configuration, upon creating an LDPC-CC supporting different coding rates, it is possible to share the configurations of information computing sections according to the above explanation, so that it is possible to provide an LDPC-CC encoder and decoder that can support a plurality of coding rates in a small computational complexity.

By adding log likelihood ratio setting section 6101 to the configuration of the decoder corresponding to the maximum coding rate from among coding rates supporting the sharing of the encoder/decoder circuits, it is possible to perform decoding supporting a plurality of coding rates. Log likelihood ratio setting section 6101 sets log likelihood ratios corresponding to information from information $X_{n,k}$ to information $X_{m−1,k}$ at point in time k to predetermined values according to the coding rate.

Although a case has been described above where a maximum coding rate supported by encoder 5800 is 3/4, the maximum coding rate supported is not limited to this, but a coding rate of (m−1)/m (m is an integer equal to or greater than 5) may also be supported (naturally a maximum coding rate may also be 2/3). In this case, encoder 5800 may be configured to include first to (m−1)-th information computing sections and adder 5804 may be configured to obtain an exclusive OR of the computation results of the first to $(m^{−1})$-th information computing sections and the computation result of parity computing section 5803 as parity $P_k$ at time k.

Furthermore, when all the coding rates supported by the transmitting/receiving apparatus (encoder/decoder) are codes based on the aforementioned method, providing the encoder/decoder of the highest coding rate among the supported coding rates can support coding and decoding at a plurality of coding rates, and the effect of reducing the scale of computation at this time is considerably large.

Furthermore, although sum-product decoding has been described above as an example of decoding scheme, the decoding method is not limited to this, but the present invention can be likewise implemented by using a decoding method (BP decoding) using a message-passing algorithm such as min-sum decoding, normalized BP (Belief Propagation) decoding, shuffled BP decoding, offset BP decoding described in Non-Patent Literature 4 to Non-Patent Literature 6.

Next, a case will be explained where the present invention is applied to a communication apparatus that adaptively switches the coding rate according to the communication condition. Also, an example case will be explained where the present invention is applied to a radio communication apparatus, the present invention is not limited to this, but is equally applicable to a PLC (Power Line Communication) apparatus, a visible light communication apparatus or an optical communication apparatus.

Figure 68:
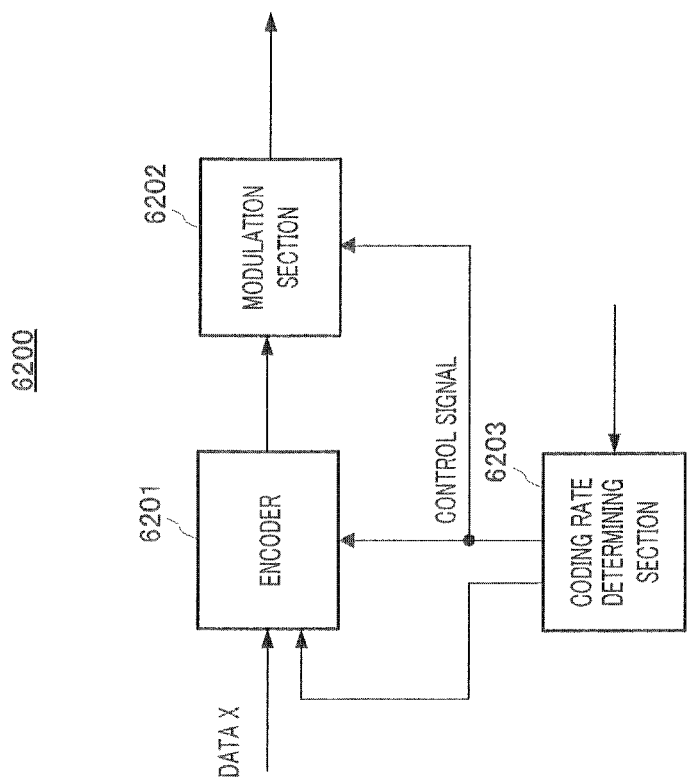
FIG. 68 shows an example of the configuration of a communication apparatus equipped with the encoder according to Embodiment 13.

FIG. 68 shows the configuration of communication apparatus 6200 that adaptively switches a coding rate. Coding rate determining section 6203 of communication apparatus 6200 in FIG. 68 receives as input a received signal transmitted from a communication apparatus of the communicating party (e.g. feedback information transmitted from the communicating party), and performs reception processing of the received signal. Further, coding rate determining section 6203 acquires information of the communication condition with the communication apparatus of the communicating party, such as a bit error rate, packet error rate, frame error rate and reception field intensity (from feedback information, for example), and determines a coding rate and modulation scheme from the information of the communication condition with the communication apparatus of the communicating party.

Further, coding rate determining section 6203 outputs the determined coding rate and modulation scheme to encoder 6201 and modulating section 6202 as a control signal. However, the coding rate need not always be determined based on the feedback information from the communicating party.

Figure 69:
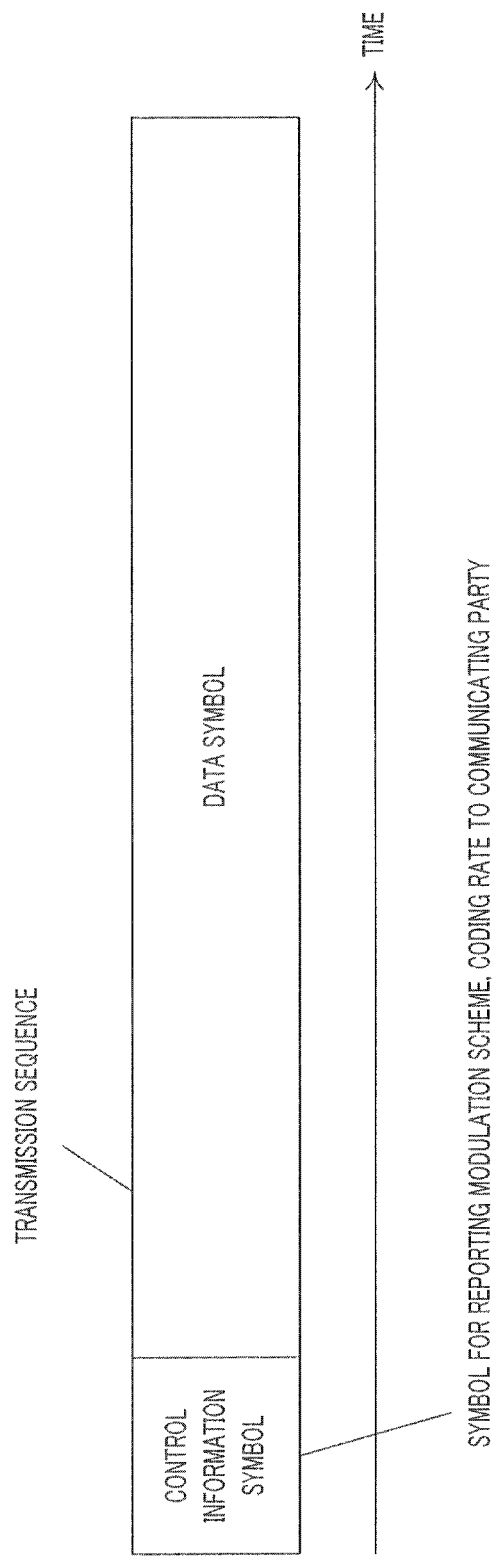
FIG. 69 shows an example of a transmission format.

Using, for example, the transmission format shown in FIG. 69, coding rate determining section 6203 includes coding rate information in control information symbols and reports the coding rate used in encoder 6201 to the communication apparatus of the communicating party. Here, as is not shown in FIG. 69, the communicating party includes, for example, known signals (such as a preamble, pilot symbol and reference symbol), which are necessary in demodulation or channel estimation.

In this way, coding rate determining section 6203 receives a modulation signal transmitted from communication apparatus 6300 (see FIG. 70) of the communicating party, and, by determining the coding rate of a transmitted modulation signal based on the communication condition, switches the coding rate adaptively. Encoder 6201 performs LDPC-CC coding in the above steps, based on the coding rate designated by the control signal. Modulating section 6202 modulates the encoded sequence using the modulation scheme designated by the control signal.

Figure 70:
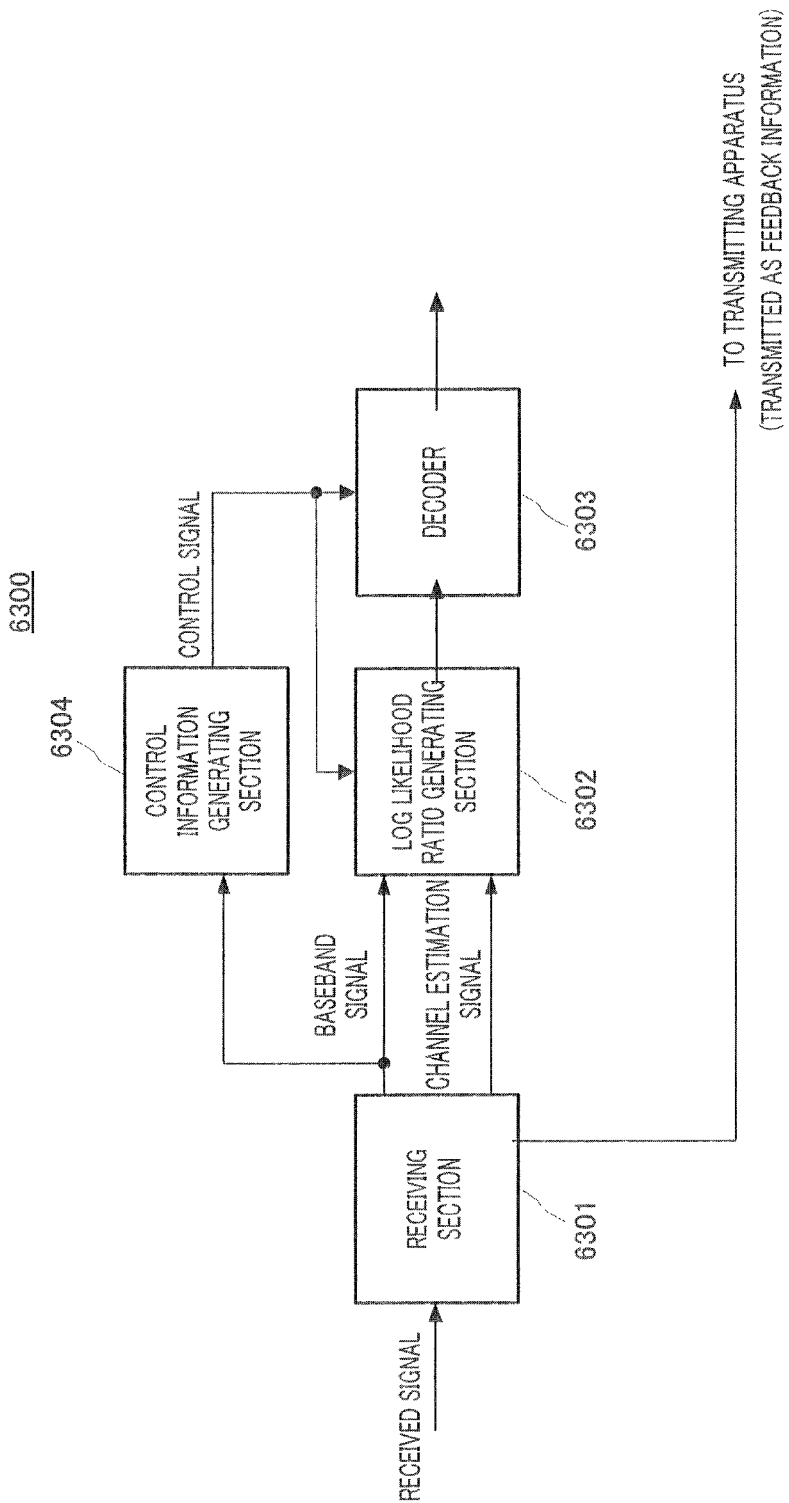
FIG. 70 shows an example of the configuration of the communication apparatus equipped with the encoder according to Embodiment 13.

FIG. 70 shows a configuration example of a communication apparatus of the communicating party that communicates with communication apparatus 6200. Control information generating section 6304 of communication apparatus 6300 in FIG. 70 extracts control information from a control information symbol included in a baseband signal. The control information symbol includes coding rate information. Control information generating section 6304 outputs the extracted coding rate information to log likelihood ratio generating section 6302 and decoder 6303 as a control signal.

Receiving section 6301 acquires a baseband signal by applying processing such as frequency conversion and quadrature demodulation to a received signal for a modulation signal transmitted from communication apparatus 6200, and outputs the baseband signal to log likelihood ratio generating section 6302. Also, using known signals included in the baseband signal, receiving section 6301 estimates channel variation in a channel (e.g. radio channel) between communication apparatus 6200 and communication apparatus 6300, and outputs an estimated channel estimation signal to log likelihood ratio generating section 6302.

Also, using known signals included in the baseband signal, receiving section 6301 estimates channel variation in a channel (e.g. radio channel) between communication apparatus 6200 and communication apparatus 6300, and generates and outputs feedback information (such as channel variation itself, which refers to channel state information, for example) for deciding the channel condition. This feedback information is transmitted to the communicating party (i.e. communication apparatus 6200) via a transmitting apparatus (not shown), as part of control information. Log likelihood ratio generating section 6302 calculates the log likelihood ratio of each transmission sequence using the baseband signal, and outputs the resulting log likelihood ratios to decoder 6303.

As described above, according to the coding rate of $(s-1)/s$ designated by a control signal, decoder 6303 sets the log likelihood ratios for information from information $X_{s,k}$ to information $X_{m-1,k}$ at point in time k, to predetermined values, and performs BP decoding using the LDPC-CC check matrix based on the maximum coding rate among coding rates to share decoder 6303 circuits.

In this way, the coding rates of communication apparatus 6200 and communication apparatus 6300 of the communicating party to which the present invention is applied, are adaptively changed according to the communication condition.

Here, the method of changing the coding rate is not limited to the above, and communication apparatus 6300 of the communicating party can include coding rate determining section 6203 and designate a desired coding rate. Also, communication apparatus 6300 can estimate channel variation from a modulation signal transmitted from communication apparatus 6200 and determine the coding rate. In this case, the above feedback information is not necessary.

One aspect of the encoding method of the present invention is an encoding method that performs low density parity check convolutional coding (LDPC-CC: Low-Density Parity-Check Convolutional Code) of a time varying period of q using a parity check polynomial of a coding rate of $(n-1)/n$ (where n is an integer equal to or greater than 2), the time varying period of q being a prime number greater than 3, the method receiving an information sequence as input and encoding the information sequence using equation 116 as the g-th $(g=0, 1, \ldots, q-1)$ parity check polynomial that satisfies 0.

[116]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,n-1,3})X_{n-1}(D)+(D^{b\#g,1}+D^{b\#g,2}+1)P(D)=0 \quad \text{(Equation 116)}$$

In equation 116, "%" means "modulo" and coefficient satisfies the following with respect to $k=1, 2, \ldots, n-1$:

"$a_{0,k,1}\% q = a_{\#1,k,1}\% q = a_{\#2,k,1}\% q = a_{\#3,k,1}\%$
$q = \ldots = a_{\#g,k,1}\% q = \ldots = a_{\#q-2,k,1}\% q = a_{\#q-1,k,1}\% q = v_{p=k}$ ($v_{p=k}$: fixed-value)"

"$b_{\#0,1}\% q = b_{\#1,1}\% q = b_{\#2,1}\% q = b_{\#3,1}\% q = \ldots = b_{\#g,1}\% q = \ldots = b_{\#q-2,1}\% q = b_{\#q-1,1}\% q = w$ ($w$: fixed-value)"

"$a_{\#0,k,2}\% q = a_{\#1,k,2}\% q = a_{\#2,k,2}\% q = a_{\#3,k,2}\%$
$q = \ldots = a_{\#g,k,2}\% q = \ldots = a_{\#q-2,k,2}\% q = a_{\#q-1,k,2}\% q = y_{p=k}$ ($y_{p=k}$: fixed-value)"

"$b_{\#0,2}\% q = b_{\#1,2}\% q = b_{\#2,2}\% q = b_{\#3,2}\% q = \ldots = b_{\#g,2}\% q = \ldots = b_{\#q-2,2}\% q = b_{\#q,-1,2}\% q = z$ ($z$: fixed-value)"

"$a_{\#0,k,3}\% q = a_{\#1,k,3}\% q = a_{\#2,k,3}\% q = a_{\#3,k,3}\%$
$q = \ldots = a_{\#g,k,3}\% q = \ldots = a_{\#q-2,k,3}\% q = a_{\#q-1,k,3}\% q = s_{p=k}$ ($s_{p=k}$: fixed-value)"

In equation 116, $a_{\#g,k,1}$, $a_{\#g,k,2}$, $a_{\#g,k,3}$ are natural numbers equal to or greater than 1, and $a_{\#g,k,1} \neq a_{\#g,k,2}$, $a_{\#g,k,1} \neq a_{\#g,k,3}$, $a_{\#g,k,2} \neq a_{\#g,k,3}$ hold. Also, $b_{\#g,1}$, $b_{\#g,2}$ are natural numbers equal to or greater than 1, and $b_{\#g,1} \neq b_{\#g,2}$ hold.

Also, in equation 116, $v_{p=k}$, $y_{p=k}$ are natural numbers equal to or greater than 1.

One aspect of the encoding method of the present invention is an encoding method of performing low density parity check convolutional coding (LDPC-CC: Low-Density Parity-Check Convolutional Code) of a time varying period of q using a parity check polynomial of a coding rate of $(n-1)/n$ (where n is an integer equal to or greater than 2), the time varying period of q being a prime number greater than 3, the method receiving an information sequence as input and encoding the information sequence using a parity check polynomial that satisfies:

"$a_{\#0,k,1}\% q = a_{\#1,k,1}\% q = a_{\#2,k,1}\% q = a_{\#3,k,1}\%$
$q = \ldots = a_{\#g,k,1}\% q = \ldots = a_{\#q-2,k,1}\% q = a_{\#q-1,k,1}\% q = v_{p=k}$ ($v_{p=k}$: fixed-value),"

"$b_{\#0,1}\% q=b_{\#1,1}\% q=b_{\#2,1}\% q=b_{\#3,1}\% q=\ldots = b_{\#g,1}\% q=\ldots =b_{\#q-2,1}\% q=b_{\#q-1,1}\%$ q=w ($w$: fixed-value),"

"$a_{\#0,k,2}\% q=a_{\#1,k,2}\% q=a_{\#2,k,2}\% q=a_{\#3,k,2}\% q=\ldots =a_{\#g,k,2}\% q=\ldots =a_{\#q-2,k,2}\% q=a_{\#q-1,k,2}\%$ q=$y_{p=k}$ ($y_{p=k}$: fixed-value),"

"$b_{\#0,2}\% q=b_{\#1,2}\% q=b_{\#2,2}\% q=b_{\#3,2}\% q=\ldots = b_{\#g,2}\% q=\ldots =b_{\#q-2,2}\% q=b_{\#q-1,2}\%$ q=z ($z$: fixed-value)," and "$a_{\#0,k,3}\% q=a_{\#1,k,3}\% q=a_{\#2,k,3}\% q=a_{\#3,k,3}\% q=\ldots =a_{\#g,k,3}\% q=\ldots =a_{\#q-2,k,3}\% q=a_{\#q-1,k,3}\%$ q=$s_{p=k}$ ($s_{p=k}$: fixed-value)"

of a g-th (g=0, 1, ..., q−1) parity check polynomial that satisfies 0 represented by equation 117 for k=1, 2, ..., n−1.

[117]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,n-1,3})X_{n-1}(D)+(D^{b\#g,1}+D^{b\#g,2}+1)P(D)=0 \quad \text{(Equation 117)}$$

One aspect of the encoder of the present invention is an encoder that performs low density parity check convolutional coding (LDPC-CC: Low-Density Parity-Check Convolutional Code) of a time varying period of q using a parity check polynomial of a coding rate of (n−1)/n (where n is an integer equal to or greater than 2), the time varying period of q being a prime number greater than 3, including a generating section that receives information bit $X_r[i]$ (r=1, 2, ..., n−1) at point in time i as input, designates an equation equivalent to the g-th (g=0, 1, ..., q−1) parity check polynomial that satisfies 0 represented by equation 116 as equation 118 and generates parity bit P[i] at point in time i using an equation with k substituting for g in equation 118 when i % q=k and an output section that outputs parity bit P[i].

[118]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus \ldots \oplus X_{n-1}[i]\oplus X_{n-1}[i-a_{\#g,n-1,1}]\oplus X_{n-1}[i-a_{\#g,n-1,2}]\oplus P[i-b_{\#g,1}]\oplus P[i-b_{g,2}] \quad \text{(Equation 118)}$$

One aspect of the decoding method of the present invention is a decoding method corresponding to the above-described encoding method for performing low density parity check convolutional coding (LDPC-CC: Low-Density Parity-Check Convolutional Code) of a time varying period of q (prime number greater than 3) using a parity check polynomial of a coding rate of (n−1)/n (where n is an integer equal to or greater than 2), for decoding an encoded information sequence encoded using equation 116 as the g-th (g=0, 1, ..., q−1) parity check polynomial that satisfies 0, the method receiving the encoded information sequence as input and decoding the encoded information sequence using belief propagation (BP) based on a parity check matrix generated using equation 116 which is the g-th parity check polynomial that satisfies 0.

One aspect of the decoder of the present invention is a decoder corresponding to the above-described encoding method for performing low density parity check convolutional coding (LDPC-CC: Low-Density Parity-Check Convolutional Code) of a time varying period of q (prime number greater than 3) using a parity check polynomial of a coding rate of (n−1)/n (where n is an integer equal to or greater than 2), that performs decoding an encoded information sequence encoded using equation 116 as the g-th (g=0, 1, ..., q−1) parity check polynomial that satisfies 0, including a decoding section that receives the encoded information sequence as input and decodes the encoded information sequence using belief propagation (BP) based on a parity check matrix generated using equation 116 which is the g-th parity check polynomial that satisfies 0.

One aspect of the encoding method of the present invention is an encoding method for a low density parity check convolutional code (LDPC-CC: Low-Density Parity-Check Convolutional Code) of a time varying period of s, including a step of supplying an i-th (i=0, 1, ..., s−2, s−1) parity check polynomial represented by equation 98-i and a step of acquiring an LDPC-CC codeword through linear computation between the 0-th to (s−1)-th parity check polynomials and input data, wherein a time varying period of coefficient $A_{X_k,i}$ of $X_k(D)$ is $\alpha_k$ ($\alpha_k$ is an integer greater than 1) (k=1, 2, ..., n−2, n−1), a time varying period of coefficient $B_{X_k,i}$ of P(D) is $\beta$ ($\beta$ is an integer greater than 1), time varying period s is a least common multiple of $\alpha 1, \alpha_2, \ldots \alpha_{n-2}, \alpha_{n-1}$, and $\beta$, equation 97 holds true when i % $\alpha_k$=j % $\alpha_k$ (i, j=0, 1, ..., s−2, s−1; i≠j) holds true and equation 98 holds true when i % $\beta$=j % $\beta$ (i, j=0, 1, ..., s−2, s−1; i≠j) holds true.

One aspect of the encoding method of the present invention is the above-described encoding method, wherein time varying periods $\alpha_1, \alpha_2, \ldots, \alpha_{n-1}$, and $\beta$ are coprime to each other.

One aspect of the encoder of the present invention is an encoder for a low density parity check convolutional code (LDPC-CC: Low-Density Parity-Check Convolutional Code), including a parity computing section that computes a parity sequence using the above-described encoding method.

One aspect of the decoding method of the present invention is a decoding method for decoding an encoded information sequence encoded using equation 98-i as the i-th (i=0, 1, ..., s−1) parity check polynomial that satisfies 0 in the above-described encoding method for performing low density parity check convolutional coding (LDPC-CC: Low-Density Parity-Check Convolutional Code) of a time varying period of s, the method receiving the encoded information sequence as input and decoding the encoded information sequence using belief propagation (BP) based on a parity check matrix generated using equation 98-i which is the i-th parity check polynomial that satisfies 0.

One aspect of the decoder of the present invention is a decoder that decodes a low density parity check convolutional code (LDPC-CC: Low-Density Parity-Check Convolutional Code) using belief propagation (BP), including a row processing computing section that performs row processing computation using a check matrix corresponding to the parity check polynomial used in the above-described encoder, a column processing computing section that performs column processing computation using the check matrix and a determining section that estimates a codeword using the computation results in the row processing computing section and the column processing computing section.

One aspect of the encoding method of the present invention is an encoding method for generating a low density parity check convolutional code of a coding rate of 1/3 and a time varying period of h from a low density parity check convolutional code (LDPC-CC: Low-Density Parity-Check Convolutional Code) defined based on a g-th (g=0, 1, ..., h−1) parity check polynomial of a coding rate of 1/2 and a time varying period of h represented by equation 119, the method including a step of selecting Z-bit information $X_j$ from a bit sequence of the information in a data sequence formed with information and parity bits which are encoded outputs using the low density parity check convolutional code of the coding rate of 1/2 and the time varying period of h (point in time j is a point in time included in point in time $j_1$ to point in time $j_2$, both $j_1$ and $j_2$ are even numbers or odd numbers and Z=($j_2$− j$_1$)/2), a step of inserting known information in selected Z-bit information X$_j$ and a step of obtaining the parity bit from the information including the known information, wherein in the selecting step, Z-bit information X$_j$ is selected based on each of the number of h types of remainders obtained by dividing all j's included in j$_1$ to j$_2$ by h.

[119]

$$(D^{a\#g,1,1}+D^{a\#g,1,2}+1)X(D)+(D^{b\#g,1}+D^{b\#g,2}+1)P)(D)=0 \quad \text{(Equation 119)}$$

In equation 119, X(D) is a polynomial representation of information X and P(D) is a polynomial representation of parity. Also, a$_{\#g,1,1}$ and a$_{\#g,1,2}$ are natural numbers equal to or greater than 1, a$_{\#g,1,1}$≠a$_{\#g,1,2}$ hoods. Also, b$_{\#g,1}$ and b$_{\#g,2}$ are natural numbers equal to or greater than 1, b$_{\#g,1}$≠b$_{\#g,2}$ holds (g=0, 1, 2, . . . , h−2, h−1).

In equation 119, following <Condition #17> is fulfilled. Here, "c % d"i is a remainder after dividing c by d.

"a$_{\#0,1,1}$% h=a$_{\#1,1,1}$% h=a$_{\#2,1,1}$% h=a$_{\#3,1,1}$% h= . . .
a$_{\#g,1,1}$% h= . . . =a$_{\#h-2,1,1}$% h=a$_{\#h-1,1,1}$% h=v$_{p=1}$
(v$_{p-1}$: fixed-value)"

"b$_{\#0,1}$% h=b$_{\#1,1}$% h=b$_{\#2,1}$% h=b$_{\#3,1}$% h= . . . =
b$_{\#g,1}$% h= . . . =b$_{\#h-2,1}$% h=b$_{\#h-1,1}$% h=w (w:
fixed-value)"

"a$_{\#0,1,2}$% h=a$_{\#1,1,2}$% h=a$_{\#2,1,2}$% h=a$_{\#3,1,2}$%
h= . . . =a$_{\#g,1,2}$% h= . . . =a$_{\#h-2,1,2}$% h=
a$_{\#h-1,1,2}$% h=y$_{p=1}$ (y$_{p=1}$: fixed-value)"

"b$_{\#0,2}$% h=b$_{\#1,2}$% h=b$_{\#2,2}$% h=b$_{\#3,2}$% h= . . . =
b$_{\#g,2}$% h= . . . =b$_{\#h-2,2}$% h=b$_{\#h-1,2}$% h=z (z:
fixed-value)"  <Condition #17>

In one aspect of the encoding method of the present invention, point in time j$_1$ is point in time 2hi, point in time j$_2$ is point in time 2h(i+k−1)+2h−1, the Z bits are hk bits, and in the selecting step, Z-bit information X$_j$ is selected from 2×h×k bits of information X$_{2hi}$, X$_{2hi+1}$, X$_{2hi+2}$, . . . , X$_{2hi+2h-1}$, . . . , X$_{2h(i+k-1)}$, X$_{2h(i+k-1)+1}$, X$_{2h(i+k-1)+2}$, . . . , X$_{2h(i+k-1)+2h-1}$ such that among remainders after dividing all points in time j included in point in time j$_1$ to point in time j$_2$ by h, at least one γ is present that satisfies a condition under which the difference between "the number of remainders that become (0+γ) mod h (where the number of remainders is non-zero)" and "the number of remainders that become (v$_{p=1}$+γ) mod h (where the number of remainders is non-zero)" is 1 or less, the difference between "the number of remainders that become (0+γ) mod h (where the number of remainders is non-zero)" and "the number of remainders that become (v$_{p=1}$+γ) mod h (where the number of remainders is non-zero)" is 1 or less and the difference between "the number of remainders that become (v$_{p=1}$+γ) mod h (where the number of remainders is non-zero)" and "the number of remainders that become (y$_{p=1}$+γ) mod h (where the number of remainders is non-zero)" is 1 or less.

In one aspect of the encoding method of the present invention, with γ that does not satisfy the condition, "the number of remainders that become (0+γ) mod h," "the number of remainders that become (v$_{p=1}$+γ) mod h" and "the number of remainders that become (y$_{p=1}$+γ) mod h" are 0.

One aspect of the decoding method of the present invention is a decoding method for decoding an encoded information sequence encoded using equation 119 as the g-th (i=0, 1, . . . , h−1) parity check polynomial that satisfies 0 in the encoding method according to claim 1 for performing low density parity check convolutional coding (LDPC-CC: Low-Density Parity-Check Convolutional Code) of a time varying period of h, the method receiving the encoded information sequence as input and decoding the encoded information sequence using belief propagation (BP) based on a parity check matrix generated using equation 119 which is the g-th parity check polynomial that satisfies 0.

One aspect of the encoder of the present invention is an encoder that creates a low density parity check convolutional code (LDPC-CC: Low-Density Parity-Check Convolutional Code) from a convolutional code and includes a computing section that computes parity using the above-described encoding method.

One aspect of the decoder of the present invention is a decoder that decodes a low density parity check convolutional code (LDPC-CC: Low-Density Parity-Check Convolutional Code) using belief propagation (BP), including a row processing computing section that performs row processing computation using a check matrix corresponding to the parity check polynomial used in the above-described encoder, a column processing computing section that performs column processing computation using the check matrix, and a determining section that estimates a codeword using the computation results in the row processing computing section and the column processing computing section.

One aspect of the encoding method of the present invention is an encoding method for generating a low density parity check convolutional code of a lower coding rate than a coding rate of (n−1)/n and a time varying period of h from a low density parity check convolutional code (LDPC-CC: Low-Density Parity-Check Convolutional Code) defined based on a g-th (g=0, 1, . . . , h−1) parity check polynomial of a coding rate of (n−1)/n and a time varying period of h represented by equation 120-g, the method including a step of selecting Z-bit information X$_{f,j}$ (f=−1, 2, 3, . . . , n−1, j is a time) from a bit sequence of the information in a data sequence formed with information and parity bits which are encoded outputs using the low density parity check convolutional code of the coding rate of (n−1)/n and the time varying period of h, a step of inserting known information in selected information X$_{f,j}$ and a step of obtaining the parity bit from the information including the known information, wherein in the selecting step, information X$_{f,j}$ is selected based on a remainder after dividing all times j by h and the number of times j at which the remainder is calculated.

[120]

$$(D^{a\#g,1,1}+D^{a\#g,1,2}+1)X_1(D)+(D^{a\#g,2,1}+D^{a\#g,2,2}+1)X_2(D)+ \ldots +(D^{a\#g,n-1,1}+D^{a\#g,n-1,2}+1)X_{n-1}(D)+(D^{b\#g,1}+D^{b\#g,2}+1)P(D)=0 \quad \text{(Equation 120-g)}$$

In equation 120-g, X$_p$(D) is a polynomial representation of information X and P(D) is a polynomial representation of parity (p=1, 2, . . . , n−1). Also, a$_{\#g,p,1}$ and a$_{\#g,p,2}$ are natural numbers equal to or greater than 1, and a$_{\#g,p,1}$≠a$_{\#g,p,2}$ holds. Also, b$_{\#g,1}$ and b$_{\#g,2}$ are natural numbers equal to or greater than 1, and b$_{\#g,1}$≠b$_{\#g,2}$ holds (g=0, 1, 2, . . . , h−2, h−1; p=1, 2, . . . , n−1).

Also, in equation 120-g, following <condition #18-1> and <condition #18-2> are met. Here, "c % d" represents "remainder after dividing c by d."

"a$_{\#0,k,1}$% h=a$_{1,k,1}$% h=a$_{\#2,k,1}$% h=a$_{\#3,k,1}$%
h= . . . =a$_{\#g,k,1}$% h= . . . =a$_{\#h-2,k,1}$% h=
a$_{\#h-1,k,1}$% h=v$_{p=k}$ (v$_{p=k}$: fixed-value)
(k=1, 2, . . . , n−1)" and "b$_{\#0,1}$% h=b$_{\#1,1}$% h=b$_{\#2,1}$% h=b$_{\#3,1}$% h= . . . =
b$_{\#g,1}$% h= . . . =b$_{\#h-2,1}$% h=b$_{\#h-1,1}$% h=w (w:
fixed-value)"  <Condition #18-1>

"$a_{\#0,k,2}\% h = a_{\#1,k,2}\% h = a_{\#2,k,2}\% h = a_{\#3,k,2}\%$
$h = \ldots = a_{\#g,k,2}\% h = \ldots = a_{\#h-2,k,2}\% h =$
$a_{\#h-1,k,2}\% h = y_{p=k}$ ($y_{p=k}$: fixed-value)
(k=1, 2, ..., n−1)" and "$b_{\#0,2}\% h = b_{\#1,2}\% h = b_{\#2,2}\% h = b_{\#3,2}\% h = \ldots =$
$b_{\#g,2}\% h = \ldots = b_{\#h-2,2}\% h = b_{\#h-1,2}\% h = z$ (z:
fixed-value)"  <Condition #18-2>

One aspect of the encoding method of the present invention is the above-described encoding method, wherein time j is a time that takes the value of one of hi to h(i+k−1)+h−1, and in the selecting step, Z-bit information $X_{f,j}$ is selected from h×(n−1)×k bits of information $X_{1,hi}$, $X_{2,hi}$, ..., $X_{n-1,hi}$, ..., $X_{1,h(i+k-1)+h-1}$, $X_{2,h(i+k-1)+h-1}$, ..., $X_{n-1,h(i+k-1)+h-1}$ and such information $X_{f,j}$ is selected so that among remainders after dividing Z-bit information $X_{f,j}$ by h for all times j, the difference between "the number of remainders that become (0+γ) mod h (where the number of remainders is non-zero)" and "the number of remainders that become $(v_{p=f}+\gamma)$ mod h (where the number of remainders is non-zero)" is 1 or less, the difference between "the number of remainders that become (0+γ) mod h (where the number of remainders is non-zero)" and "the number of remainders that become $(y_{p=f}+\gamma)$ mod h (where the number of remainders is non-zero)" is 1 or less and the difference between "the number of remainders that become $(v_{p=f}+\gamma)$ mod h (where the number of remainders is non-zero)" and "the number of remainders that become $(y_{p=f}+\gamma)$ mod h (where the number of remainders is non-zero)" is 1 or less (f=1, 2, 3, ..., n−1) and at least one such γ is present.

In one aspect of the encoding method of the present invention is the above-described encoding method, wherein time j takes the value of one of 0 to v, and in the selecting step, Z-bit information $X_{f,j}$ is selected from a bit sequence of information $X_{1, 0}$, $X_{2, 0}$, ..., $X_{n-1, 0}$, ..., $X_{1,v}$, $X_{2,v}$, ..., $X_{n-1,v}$, and such information $X_{f,j}$ is selected so that among remainders after dividing Z-bit information $X_{f,j}$ by h for all times j, the difference between "the number of remainders that become (0+γ) mod h (where the number of remainders is non-zero)" and "the number of remainders that become $(v_{p=f}+\gamma)$ mod h (where the number of remainders is non-zero)" is 1 or less, the difference between "the number of remainders that become (0+γ) mod h (where the number of remainders is non-zero)" and "the number of remainders that become $(y_{p=f}+\gamma)$ mod h (where the number of remainders is non-zero)" is 1 or less and the difference between "the number of remainders that become $(v_{p=f}+\gamma)$ mod h (where the number of remainders is non-zero)" and "the number of remainders that become $(y_{p=f}+\gamma)$ mod h (where the number of remainders is non-zero)" is 1 or less (f=1, 2, 3, ..., n−1) and at least one such γ is present.

One aspect of the decoding method of the present invention is a decoding method for decoding an encoded information sequence encoded using equation 120-g as the g-th (i=0, 1, ..., h−1) parity check polynomial that satisfies 0 in the above-described encoding method for performing low density parity check convolutional coding (LDPC-CC: Low-Density Parity-Check Convolutional Code) of a time varying period of h, the method receiving the encoded information sequence as input and decoding the encoded information sequence using belief propagation (BP) based on a parity check matrix generated using equation 120-g which is the g-th parity check polynomial that satisfies 0.

One aspect of the encoder of the present invention is an encoder that creates a low density parity check convolutional code (LDPC-CC: Low-Density Parity-Check Convolutional Code) from a convolutional code, including a computing section that computes parity using the above-described encoding method.

One aspect of the decoder of the present invention is a decoder that decodes a low density parity check convolutional code (LDPC-CC: Low-Density Parity-Check Convolutional Code) using belief propagation (BP), including a row processing computing section that performs row processing computation using a check matrix corresponding to the parity check polynomial used in the above-described encoder, a column processing computing section that performs column processing computation using the check matrix and a determining section that estimates a codeword using the computation results in the row processing computing section and the column processing computing section.

The present invention is not limited to the above-described embodiments, and can be implemented with various changes. For example, although the above-described embodiments have mainly described a case where the present invention is applied to a case where an encoder is realized, the present invention is not limited to this, but is also applicable to a case where a communication apparatus is realized. (The present invention can also be configured by an LSI (Large Scale Integration).

It is also possible to implemented the encoding method and decoding method as software. For example, provision may be made for a program that executes the above-described encoding method and communication method to be stored in ROM (Read Only Memory) beforehand, and for this program to be run by a CPU (Central Processing Unit).

Furthermore, a program that executes the above-described encoding method may be stored in a computer-readable storage medium, the program stored in the storage medium may be recorded in RAM (Random Access Memory) of the computer and the computer may be operated according to the program.

It goes without saying that the present invention is not limited to radio communication, and is also useful in power line communication (PLC), visible light communication, and optical communication.

The present specification describes "time varying period" and this is a period during which a time-varying LDPC-CC is formed.

The disclosures of Japanese Patent Application No. 2009-260503, filed on Nov. 13, 2009, Japanese Patent Application No. 2010-157991, filed on Jul. 12, 2010, Japanese Patent Application No. 2010-172577, filed on Jul. 30, 2010, and Japanese Patent Application No. 2010-231807, filed on Oct. 14, 2010, including the specifications, drawings and abstracts, are incorporated herein by reference in their entirety.

Industrial Applicability

The encoding method and encoder or the like according to the present invention have high error correction capability, and can thereby secure high data receiving quality.

Reference Signs List

100, 2907, 2914, 3204, 3103, 3208, 3212 LDPC-CC encoder
110 Data computing section
120 Parity computing section
130 Weight multipliers
140 mod2 adder (exclusive OR operator)
111-1 to 111-M, 121-1 to 121-M, 221-1 to 221-M, 231-1 to 231-M Shift register
112-0 to 112-M, 122-0 to 122-M, 222-0 to 222-M, 232-0 to 232-M Weight multiplier
1910, 2114, 2617, 2605 Transmitting apparatus
1911, 2900, 3200 Encoder 1192 Modulating section
1920, 2131, 2609, 2613 receiving apparatus
1921 Receiving section
1922 Log likelihood ratio generating section
1923, 3310 Decoder
2110, 2130, 2600, 2608 Communication apparatus
2112, 2312, 2603 Erasure correction coding-related processing section
2113, 2604 Error correction encoding section
2120, 2607 Communication channel
2132, 2610 Error correction decoding section
2133, 2433, 2611 Erasure correction decoding-related processing section
2211 Packet generating section
2215, 2902, 2909, 3101, 3104, 3202, 3206, 3210 Reordering section
2216 Erasure correction encoder (parity packet generating section)
2217, 2317 Error detection code adding section
2314 Erasure correction encoding section
2316, 2560 Erasure correction encoder
2435 Error detection section
2436 Erasure correction decoder
2561 First erasure correction encoder
2562 Second erasure correction encoder
2563 Third erasure correction encoder
2564 Selection section
3313 BP decoder
4403 Known information insertion section
4405 Encoder
4407 Known information deleting section
4409 Modulating section
4603 Log likelihood ratio insertion section
4605 Decoding section
4607 Known information deleting section
44100 Error correction encoding section
44200 Transmitting apparatus
46100 Error correction decoding section
5800 Encoder
5801 Information generating section
5802-1 First information computing section
5802-2 Second information computing section
5802-3 Third information computing section
5803 Parity computing section
5804, 5903, 6003 Adder
5805 Coding rate setting section
5806, 5904, 6004 Weight control section
5901-1 to 5901-M, 6001-1 to 6001-M Shift register
5902-0 to 5902-M, 6002-0 to 6002-M Weight multiplier
6100 Decoder
6101 Log likelihood ratio setting section
6102 Matrix processing computing section
6103 Storage section
6104 Row processing computing section
6105 Column processing computing section
6200, 6300 Communication apparatus
6201 Encoder
6202 Modulating section
6203 Coding rate determining section
6301 Receiving section
6302 Log likelihood ratio generating section
6303 Decoder
6304 Control information generating section

The invention claimed is:

1. A transmission apparatus comprising:
an erasure correction coder configured to determine whether or not to perform an erasure correction coding processing for an information packet assigned an identification number, and (i) when the erasure correction coder determines to perform the erasure correction coding processing, performs the erasure correction coding processing for the information packet assigned the identification number to generate one or more parity packets assigned identification numbers and (ii) when the erasure correction coder determines not to perform the erasure correction coding processing, does not generate said one or more parity packets;
an error correcting encoder configured to:
(i) when the erasure correction coder determines to perform the erasure correction coding processing, perform an error correcting encoding processing for the information packet assigned the identification number and the parity packet assigned the identification number to generate a first transmission data and
(ii) when the erasure correction coder determines not to perform the erasure correction coding processing, perform the error correcting encoding processing for the information packet assigned the identification number to generate a second transmission data; and
a transmitter configured to (i) when the erasure correction coder determines to perform the erasure correction coding processing, transmit the first transmission data and (ii) when the erasure correction coder determines not to perform the erasure correction coding processing, transmit the second transmission data.

2. The transmission apparatus according to claim 1, wherein the information packet assigned the identification number has a same size as said one or more parity packets assigned the identification numbers.

3. The transmission apparatus according to claim 1, further comprising:
a reorderer configured to reorder each information packet assigned the identification number, to a group configured by information packets of different identification numbers,
wherein the erasure correction coding section determines whether or not to perform the erasure correction coding processing for the group configured by the information packets of the different identification numbers.

4. A transmission method comprising:
(a) determining, by a processor, whether or not to perform an erasure correction coding processing for an information packet assigned an identification number;
(b) when step (a) determines to perform the erasure correction coding processing:
performing the erasure correction coding processing for the information packet assigned the identification number to generate one or more parity packets assigned identification numbers,
performing an error correcting encoding processing for the information packet assigned the identification number and the parity packet assigned the identification number to generate a first transmission data, and
transmitting the first transmission data; and
(c) when step (a) determines not to perform the erasure correction coding processing:
performing none of the erasure correction coding processing for the information packet assigned the identification number and generating none of said one or more parity packets,
performing the error correcting encoding processing for the information packet assigned the identification number to generate a second transmission data, and
transmitting the second transmission data.

5. The transmission method according to claim 4, wherein the information packet assigned the identification number has a same size as said one or more parity packets assigned the identification numbers.

6. The transmission method according to claim 4, further comprising:
- reordering each information packet assigned the identification number, to a group configured by information packets of different identification numbers,
- wherein step (a) comprises determining whether or not to perform the erasure correction coding processing for the group configured by the information packets of the different identification numbers.

* * * * *